US010826525B1

(12) United States Patent
Far

(10) Patent No.: US 10,826,525 B1
(45) Date of Patent: Nov. 3, 2020

(54) NONLINEAR DATA CONVERSION FOR MULTI-QUADRANT MULTIPLICATION IN ARTIFICIAL INTELLIGENCE

(71) Applicant: Ali Tasdighi Far, San Jose, CA (US)

(72) Inventor: Ali Tasdighi Far, San Jose, CA (US)

( * ) Notice: Subject to any disclaimer, the term of this patent is extended or adjusted under 35 U.S.C. 154(b) by 0 days.

(21) Appl. No.: 16/746,895

(22) Filed: Jan. 19, 2020

Related U.S. Application Data

(63) Continuation-in-part of application No. 16/381,245, filed on Apr. 11, 2019, now Pat. No. 10,594,334.

(Continued)

(51) Int. Cl.
| | |
|---|---|
| *H03M 1/66* | (2006.01) |
| *H03M 7/32* | (2006.01) |
| *H03M 1/68* | (2006.01) |
| *H03M 1/74* | (2006.01) |
| *H03M 1/06* | (2006.01) |

(52) U.S. Cl.
CPC ........ *H03M 7/3013* (2013.01); *H03M 1/0604* (2013.01); *H03M 1/687* (2013.01); *H03M 1/745* (2013.01); *H03M 1/747* (2013.01)

(58) Field of Classification Search
CPC ...... H03M 1/687; H03M 1/745; H03M 1/747; H03M 1/0604; H03M 1/0602; H03M 1/0651; H03M 1/682; H03M 1/685; H03M 1/785; H03M 1/68; H03M 1/0695; H03M 1/765; H03M 3/502; H03M 7/3004; H03M 1/0682; H03M 1/1057; H03M 1/1061;

(Continued)

(56) References Cited

U.S. PATENT DOCUMENTS

| 4,677,369 A | 6/1987 | Bowers et al. |
| 4,827,260 A | 5/1989 | Sugawa et al. |

(Continued)

OTHER PUBLICATIONS

A. Far, "Small size class AB amplifier for energy harvesting with ultra low power, high gain, and high CMRR," 2016 IEEE International Autumn Meeting on Power, Electronics and Computing (ROPEC), Ixtapa, 2016, pp. 1-5.

(Continued)

*Primary Examiner* — Linh V Nguyen

(57) ABSTRACT

Multipliers and Multiply-Accumulate (MAC) circuits are fundamental building blocks in signal processing, including in emerging applications such as machine learning (ML) and artificial intelligence (AI) that predominantly utilize digital-mode multipliers and MACs. Generally, digital multipliers and MACs can operate at high speed with high resolution, and synchronously. As the resolution and speed of digital multipliers and MACs increase, generally the dynamic power consumption and chip size of digital implementations increases substantially that makes them impractical for some ML and AI segments, including in portable, mobile, near edge, or near sensor applications. The multipliers and MACs utilizing the disclosed current mode data-converters are manufacturable in main-stream digital CMOS process, and they can have medium to high resolutions, capable of low power consumptions, having low sensitivity to power supply and temperature variations, as well as operating asynchronously, which makes them suitable for high-volume, low cost, and low power ML and AI applications.

13 Claims, 46 Drawing Sheets

Related U.S. Application Data

(60) Provisional application No. 62/856,889, filed on Jun. 4, 2019, provisional application No. 62/880,885, filed on Jul. 31, 2019, provisional application No. 62/912,407, filed on Oct. 8, 2019, provisional application No. 62/865,845, filed on Jun. 24, 2019, provisional application No. 62/862,772, filed on Jun. 18, 2019, provisional application No. 62/658,678, filed on Apr. 17, 2018.

(58) Field of Classification Search
CPC ...... H03M 1/145; H03M 1/365; H03M 1/664; H03M 1/76; H03M 1/88
USPC ................................. 341/144, 145, 153, 154
See application file for complete search history.

(56) References Cited

U.S. PATENT DOCUMENTS

| | | |
|---|---|---|
| 5,283,579 A | 2/1994 | Tasdighi |
| 5,294,927 A | 3/1994 | Levinson et al. |
| 5,495,245 A | 2/1996 | Ahe |
| 5,619,444 A | 4/1997 | Agranat et al. |
| 5,640,084 A | 6/1997 | Tero et al. |
| 5,668,710 A | 9/1997 | Caliboso et al. |
| 5,703,588 A | 12/1997 | Rivoir et al. |
| 5,734,260 A | 3/1998 | Tasdighi et al. |
| 5,734,291 A | 3/1998 | Tasdighi et al. |
| 5,760,726 A | 6/1998 | Koifman et al. |
| 5,801,655 A | 9/1998 | Imamura |
| 5,814,995 A | 9/1998 | Tasdighi |
| 5,831,566 A | 11/1998 | Ginetti |
| 5,870,049 A | 2/1999 | Huang et al. |
| 5,923,208 A | 7/1999 | Tasdighi et al. |
| 5,969,658 A | 10/1999 | Naylor |
| 6,002,354 A | 12/1999 | Itoh et al. |
| 6,005,374 A | 12/1999 | Tasdighi |
| 6,052,074 A | 4/2000 | Iida |
| 6,054,823 A | 4/2000 | Collings et al. |
| 6,072,415 A | 6/2000 | Cheng |
| 6,122,284 A | 9/2000 | Tasdighi et al. |
| 6,163,288 A | 12/2000 | Yoshizawa |
| 6,225,929 B1 | 5/2001 | Beck |
| 6,243,033 B1 | 6/2001 | Mizuno |
| 6,329,941 B1* | 12/2001 | Farooqi ................. H03M 1/687 341/144 |
| 6,384,763 B1 | 5/2002 | Leung et al. |
| 6,392,574 B1 | 5/2002 | Toosky |
| 6,424,283 B2* | 7/2002 | Bugeja ................. H03M 1/066 341/145 |
| 6,448,917 B1 | 9/2002 | Leung et al. |
| 6,489,905 B1 | 12/2002 | Lee et al. |
| 6,507,304 B1* | 1/2003 | Lorenz ................. H03M 1/687 341/118 |
| 6,542,098 B1 | 4/2003 | Casper et al. |
| 6,583,744 B2* | 6/2003 | Bright ................. H03M 1/0604 341/118 |
| 6,906,652 B2* | 6/2005 | Bugeja ................. H03M 1/0643 341/145 |
| 6,967,609 B1 | 11/2005 | Bicakei et al. |
| 7,076,384 B1* | 7/2006 | Radulov ............. H03M 1/1057 324/601 |
| 7,136,002 B2 | 11/2006 | Dempsey et al. |
| 7,312,740 B2 | 12/2007 | Chou |
| 7,466,252 B1* | 12/2008 | Radulov ............. H03M 1/1061 341/120 |
| 7,903,016 B1 | 3/2011 | Wyatt |
| 7,928,881 B1* | 4/2011 | Baek ..................... H03M 1/682 341/145 |
| 8,416,112 B2 | 4/2013 | Aude et al. |
| 8,558,727 B2 | 10/2013 | McGowan |
| 8,981,981 B1 | 3/2015 | Mossawir |
| 9,069,995 B1 | 6/2015 | Cronie |
| 9,384,168 B2 | 7/2016 | Mortensen |
| 9,519,304 B1 | 12/2016 | Far |
| 9,780,652 B1 | 10/2017 | Far |
| 9,921,600 B1 | 3/2018 | Far |
| 10,177,713 B1 | 1/2019 | Far |
| 10,198,022 B1 | 2/2019 | Far |
| 10,411,597 B1 | 9/2019 | Far |
| 10,491,167 B1 | 11/2019 | Far |
| 2001/0026236 A1 | 10/2001 | Toda |
| 2001/0056455 A1 | 12/2001 | Lin |
| 2004/0183706 A1 | 9/2004 | Brauns et al. |
| 2004/0263373 A1* | 12/2004 | Horsky ................. H03M 1/682 341/145 |
| 2005/0125477 A1 | 6/2005 | Genov et al. |
| 2007/0252739 A1* | 11/2007 | Carroll ................. H03M 1/0695 341/144 |
| 2009/0045993 A1 | 2/2009 | Tokumaru et al. |
| 2009/0184855 A1 | 7/2009 | Tokumaru et al. |
| 2010/0072821 A1 | 3/2010 | Yamaguchi et al. |
| 2010/0283642 A1 | 11/2010 | Lai et al. |
| 2015/0091784 A1 | 4/2015 | Kwon et al. |

OTHER PUBLICATIONS

A. Far, "Compact ultra low power class AB buffer amplifier," 2017 IEEE International Autumn Meeting on Power, Electronics and Computing (ROPEC), Ixtapa, 2017, pp. 1-6.

A. Far, "Subthreshold current reference suitable for energy harvesting: 20ppm/C and 0.1%/V at 140nW," 2015 IEEE International Autumn Meeting on Power, Electronics and Computing (ROPEC), Ixtapa, 2015, pp. 1-4.

A. Far, "Amplifier for energy harvesting: Low voltage, ultra low current, rail-to-rail input-output, high speed," 2016 IEEE International Autumn Meeting on Power, Electronics and Computing (ROPEC), Ixtapa, 2016, pp. 1-6.

A. Far, "Class AB amplifier with noise reduction, speed boost, gain enhancement, and ultra low power," 2018 IEEE 9th Latin American Symposium on Circuits & Systems (LASCAS), Puerto Vallarta, Mexico, 2018, pp. 1-4.

A. Far, "Low noise rail-to-rail amplifier runs fast at ultra low currents and targets energy harvesting," 2017 IEEE International Autumn Meeting on Power, Electronics and Computing (ROPEC), Ixtapa, 2017, pp. 1-6.

A. Far, "A 5vW fractional CMOS bandgap voltage and current reference," 2013 IEEE Global High Tech Congress on Electronics, Shenzhen, 2013, pp. 7-11.

A. Far, "A 400nW Cmos bandgap voltage reference," 2013 International Conference on Electrical, Electronics and System Engineering (ICEESE), Kuala Lumpur, 2013, pp. 15-20.

A. Far, "Enhanced gain, low voltage, rail-to-rail buffer amplifier suitable for energy harvesting," 2017 IEEE International Autumn Meeting on Power, Electronics and Computing (ROPEC), Ixtapa, 2017, pp. 1-6.

A. Far, "Subthreshold bandgap voltage reference aiming for energy harvesting: 100na, 5 ppm/c, 40 ppm/v, psrr-88db," 2015 IEEE 5th International Conference on Consumer Electronics—Berlin (ICCE-Berlin), Berlin, 2015, pp. 310-313.

A. Far, "A 220nA bandgap reference with 80dB PSRR targeting energy harvesting," 2016 IEEE Canadian Conference on Electrical and Computer Engineering (CCECE), Vancouver, BC, 2016, pp. 1-4.

A. Far, "Sub-1 volt class AB amplifier with low noise, ultra low power, high-speed, using winner-take-all," 2018 IEEE 9th Latin American Symposium on Circuits & Systems (LASCAS), Puerto Vallarta, Mexico, 2018, pp. 1-4.

A. Far, "A low supply voltage 2vW half bandgap reference in standard sub-v CMOS," 2014 IEEE International Conference on Electronics, Computing and Communication Technologies (CONECCT), Bangalore, 2014, pp. 1-5.

A. Far, "Current reference for energy harvesting: 50um per side, At 70 nW, regulating to 125C," 2014 IEEE International Autumn

(56) References Cited

OTHER PUBLICATIONS

Meeting on Power, Electronics and Computing (ROPEC), Ixtapa, 2014, pp. 1-5.

* cited by examiner

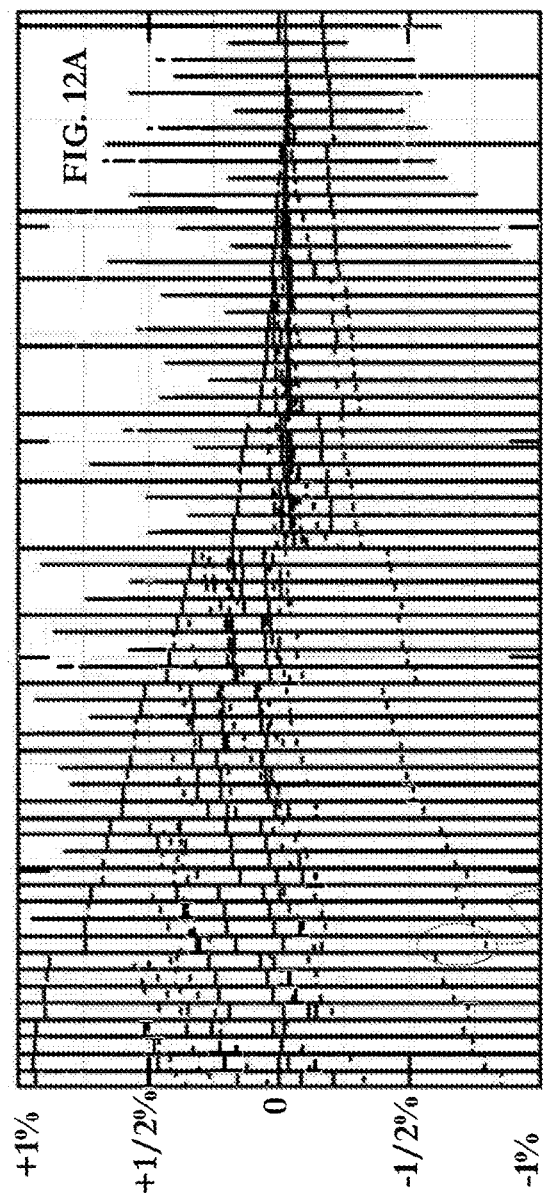
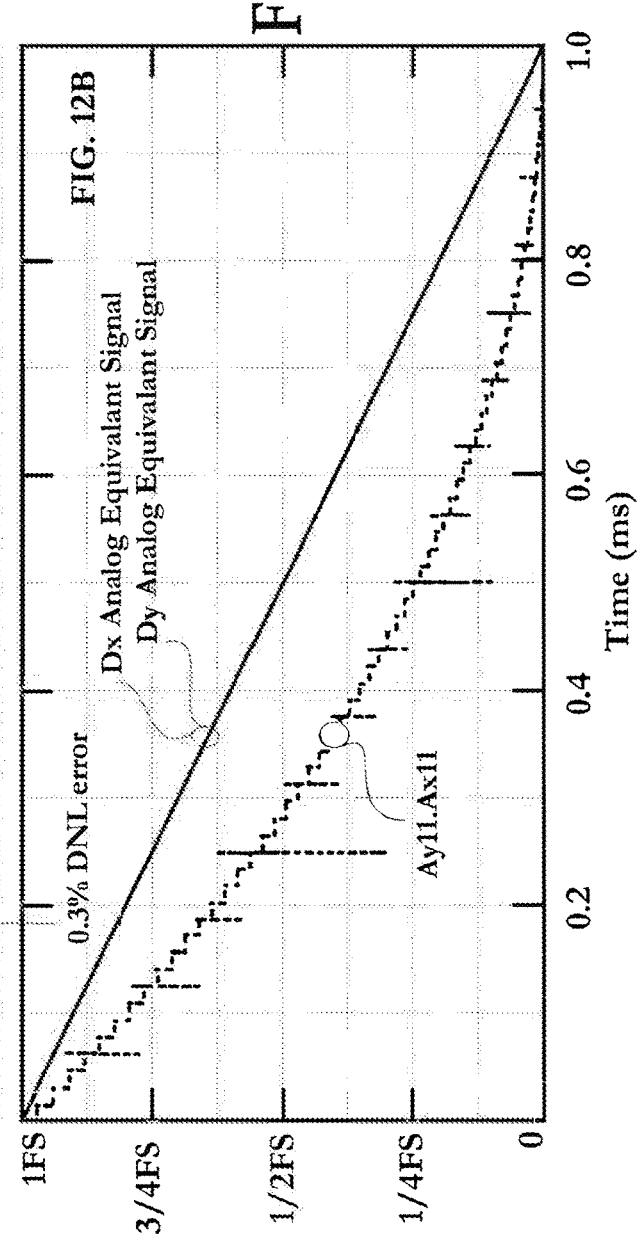
FIG. 12A
FIG. 12B

NONLINEAR DATA CONVERSION FOR MULTI-QUADRANT MULTIPLICATION IN ARTIFICIAL INTELLIGENCE

CROSS-REFERENCE TO RELATED PATENT APPLICATIONS

The present disclosure claims priority from U.S. Provisional Patent Application Ser. No. 62/856,889 filed Jun. 4, 2019 and which is herein specifically incorporated by reference in its entirety. Furthermore, the present disclosure claims priority from U.S. Provisional Patent Application Ser. No. 62/880,885 filed Jul. 31, 2019 and which is herein specifically incorporated by reference in its entirety. Moreover, the present disclosure claims priority from U.S. Provisional Patent Application Ser. No. 62/912,407 filed Oct. 8, 2019 and which is herein specifically incorporated by reference in its entirety. The present disclosure claims priority from U.S. Provisional Patent Application Ser. No. 62/865,845 filed Jun. 24, 2019 and which is herein specifically incorporated by reference in its entirety. Furthermore, the present disclosure claims priority from U.S. Provisional Patent Application Ser. No. 62/862,772 filed Jun. 18, 2019 and which is herein specifically incorporated by reference in its entirety. The present invention is a continuation-in-part of and claims the benefit of priority from U.S. patent application Ser. No. 16/381,245 filed on Apr. 11, 2019; which claims priority from U.S. Provisional Patent Application Ser. No. 62/658,678 filed on Apr. 17, 2018, and which are herein specifically incorporated by reference in their entirety.

FIELD OF DISCLOSURE

This disclosure relates to improvements in mixed-signal data-converters, multipliers, and multiply-accumulate for use in integrated circuits (ICs) in general. The disclosure more specifically relates to emerging artificial intelligence and machine learning (AI & ML) applications that are mobile, portable, and near edge and or on sensors, which require ultra-low-power, small-size, low cost (for high-volumes) and asynchronous operations.

BACKGROUND

One-size-fit-all and standard digital solutions for AI & ML applications offer ease of interface compatibility, programming flexibility, and fast time to market advantages. However, as AI & ML applications expand their foot-print closer to the edge of the network and or on intelligent sensors (where signals are gathered and processed together), more application specific and custom solutions may be required to meet low-power, low-cost, and high-volume objectives. Majority of digital AI & ML chips that are generally deployed on the cloud require bleeding edge deep sub-micron (e.g., 20 nano-meter and smaller) manufacturing which are expensive and power hungry. As such, to deploy AI &ML solutions closer to the edge of communication networks or near sensors and mobile devices, the high cost and high-power consumption of bleeding edge digital solutions become prohibitive. Approximate computing, that can utilize analog and mixed-signal processing, enables AI & ML solutions including in for example in robotics, medical, mobile, drone, portable and private surveillance, and other near sensor applications that need privacy, cannot afford latency, require low cost and low power consumption along with asynchronous signal processing. Moreover, cheaper main-stream manufacturing (e.g., 45 nano-meter to 90 nano-meter) can be sufficient for analog and mixed-signal processors to perform AI & ML operations at lower power consumptions with substantially lower costs.

An objective of the present disclosure is to provide data-converters that can be integrated with and seamlessly interface with standard digital logic (e.g., sea of gates), including for hybrid AI & ML signal processing (e.g., main digital signal processors combined with analog mixed-signal accelerators and or co-processors).

Another objective of the present disclosure is to provide current-mode data-converters, multipliers, and multiply-accumulate circuits that can interface with digital systems and that can perform some of the signal processing functions in analog and or mixed-signal for AI & ML applications, and at low power consumption and cost effectively. Such current-mode data-converters, multipliers, and multiply-accumulate circuits can also be used in conjunction with fully-digital systems to facilitate hybrid mixed-signal, analog, and digital signal processing (or as acceleration IC engines) for AI & ML applications.

Another objective of the present disclosure is to perform some of the signal condition functions of AI & ML asynchronously by utilizing clock-free data-converters, multipliers, and multiply-accumulate circuits, which frees signal processing and computations from clock related cycle-time delay, dynamic power consumption, and noise related to free running clocks.

Substantial amount of current consumption in ML & AI computation (based on conventional digital processors) is consumed during memory read-write cycle of conventional digital signal processing. Another objective of this disclosure is to facilitate mixed-mode signal processing for ML & AI that is memory free and thus reduces power consumption.

Conventional AI & ML digital signal processing rely on central processors on the cloud which increases the overall application power consumption due in part to the back-and-forth communications with the cloud-based digital processors. This introduces computation latency that may be unacceptable in some applications such as medical. Another objective of this disclosure is to facilitate low power and low cost mixed-mode signal processing for ML & AI that can be performed at the edge or on sensors to help eliminate the latency.

Generally, performing AI & ML signal processing on the cloud has privacy risks.

Another objective of the present disclosure is to enable low power and low-cost AI & ML analog and mixed signal processing at the edge or on the sensors to avoid sending and receiving information to and from the cloud.

Another objective of the present disclosure is to provide AI & ML signal processing and computation platforms, with current-mode data-converters, multipliers, and multiply-accumulate circuits that can be manufactured in main-stream Complementary-Metal-Oxide-Semiconductor (CMOS) fabrication which is not only low cost, rugged, and proven but also that is compatible with digital systems, which facilitates ease of interface with existing digital hardware and software platforms.

Another objective of this disclosure is to provide AI & ML signal processing and computation platforms utilizing current-mode data-converters, multipliers, and multiply-accumulate circuits that can operate with low voltage power supplies suitable for portable and battery-operated AI& ML applications.

Another objective of this disclosure is to provide AI & ML signal processing and computation in current-mode, which is inherently fast (in part) because voltage swings are kept to a minimal in current-mode signal processing. Moreover, current-mode signal processing enables current-mode data-converters, multipliers, and multiply-accumulate circuits to operate with low voltage power supplies suitable for some portable and battery-operated AI& ML applications.

Another objective of the disclosed invention is to provide AI & ML signal processing and computation platforms, utilizing analog and mixed-signal solutions whose input signal zero-scale to full-scale dynamic ranges are not limited to high levels or low levels of current. For example, some analog signal processing units may rely on operating transistors in the subthreshold regions which restricts the input and or output dynamic range of analog signal processing circuits to low current signals. Also, some other analog signal processing units may rely on operating transistors with high currents in the saturation regions which restricts the input and or output dynamic range of analog signal processing circuits to higher current signals.

Another objective of the disclosed invention is to provide small size current-mode data-converters, multipliers, and multiply-accumulate circuits for AI & ML applications that require plurality of such circuits to occupy small areas and can be manufactured at low cost.

Another objective of the present disclosure is to provide data-converters that can be arranged with minimal digital circuitry (i.e., be digital-light), thereby saving on die size and reducing dynamic power consumption.

Another objective of the disclosed invention is to provide low glitch and low dynamic power consuming current-mode data-converters, multipliers, and multiply-accumulate circuits utilized in mixed-mode multipliers for AI & ML applications, which accordingly reduce the glitch and dynamic power consumption of for signal processing in AI & ML end-applications.

Another objective of the disclosed invention is to perform analog signal processing in current-mode wherein functions such as addition or subtraction can take small area (e.g., addition of two current signals requires just the coupling of two signals), in addition to being inherently fast.

Another objective of the disclosed invention is to perform analog signal processing without using any resistors or capacitors, which reduces manufacturing size and cost for signal processing in AI & ML end-applications.

Another objective of the disclosed invention is to achieve higher accuracy multiplication results while utilizing lower resolutions current-mode data converters (which are utilized in the mixed-signal multipliers). For example, for AI & ML end-applications that require plurality of such multipliers, it is advantageous to attain higher accuracy multiplication results by utilizing low resolution iDACs that occupy small areas but still achieve higher accuracy multiply-accumulate performance at lower costs.

Another objective of the disclosed invention is to provide current-mode data-converters, multipliers, and multiply-accumulate circuits which are symmetric, matched, and scaled. Such arrangement facilitates device parameters to track each other over process, temperature, and operating condition variations. Accordingly, temperature coefficient, power supply coefficient, and AC power supply rejection performance of multipliers (that utilize such data converters) for AI & ML applications can be enhanced.

Another objective of the disclosed invention is to provide current-mode analog and mixed-signal signal processing (utilizing data-converters, multipliers, and multiply-accumulate circuits) that can be asynchronous, consumes low power, have small die size, and provide approximate computation as a function of input frequency, for example.

Analog and mixed-signal processing may experience errors that can result in approximate computation but avoid total failures, which can provide the end-application with approximate results to work with instead of experiencing failed results in most (all) digital based computations.

Another objective of the disclosed invention is to take advantage of attenuated contribution of component's random errors in a summation node. Summing current outputs of a plurality of iDACs would attenuate the statistical contribution of the cumulative iDAC's random errors (such as random noise, offset, mismatches, linearity, gain, drift, etc.) at the summing node where the iDAC's current outputs are coupled. The statistical contribution of such cumulative iDAC's random errors, at the summing node, is the square root of the sum of the squares of such random error terms.

Another objective of the disclosed invention is to provide analog and mixed signal processors for AI & ML that neither require very expensive nor bleeding-edge deep sub-micron (e.g., 10 nano-meter geometries) manufacturing. Generally, purely digital AI & ML systems can achieve high-speed and high-density relying chiefly on very expensive bleeding-edge deep sub-micron manufacturing (whose transistors are fast and dense) whose costs may be prohibitive in non-cloud high-volume AI & ML applications near the edge or on sensors with intelligence. Moreover, signal processors on the edge or on sensors may not need very high computation speeds given their more dedicated and smaller AI & ML related tasks, in part because such processors may not need to be shared or multi-tasked on edge devices or sensors. Therefore, utilizing analog and mixed signal processing for AI & ML on edge devices and sensors, which can perform to specifications by using inexpensive main-stream manufacturing, avoids the unnecessary (fast and dense) and very expensive bleeding-edge deep sub-micron manufacturing that is generally required by digital AI & ML processors.

Another objective of the disclosed invention is to provide plurality of (data-converters, multipliers, and multiply-accumulate circuits to perform) analog and mixed signal processors for AI & ML application, wherein the analog and mixed signal processors can be made small, but their precision can be enhanced via a shared centrally calibrated (or trimmed) network.

BRIEF DESCRIPTION OF THE DRAWINGS

FIG. 12, including FIG. 12A and FIG. 12B, is a (Simulation Program with Integrated Circuits Emphasis) SPICE circuit simulation showing the linearity waveforms of the mixed-signal current-mode digital-input to analog-current-output multiplier ($XD_iI_o$) that is illustrated in FIG. 11.

FIG. 32' is another simplified block diagram illustrating the meshed digital-to-analog multiplication (mD$_i$S$_o$) method that is disclosed in section 32.

FIG. 36' is a simplified block diagram illustrating a second non-linear digital-to-analog converter (NDAC) method, which utilizes the meshed digital-to-analog multiplication (mD$_i$S$_o$) method that is discussed in section 32.

SUMMARY OF THE DISCLOSURE

Figure 1:
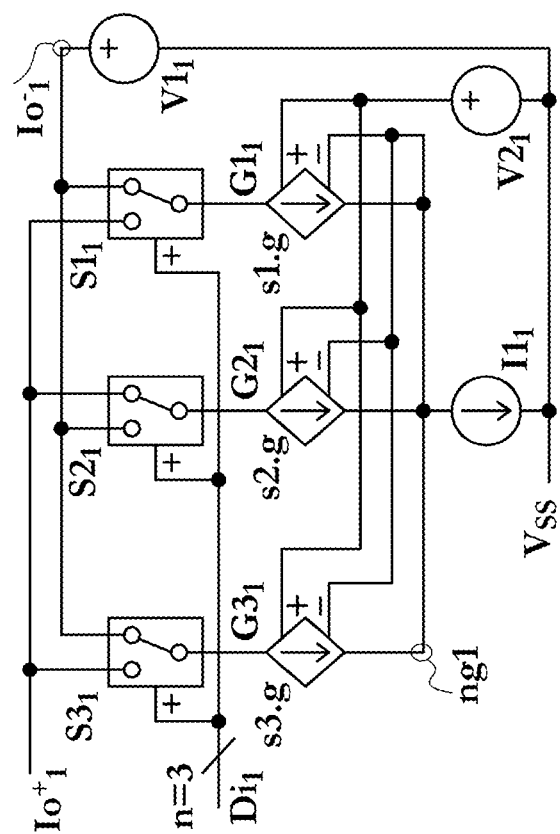
FIG. 1 is a simplified block diagram illustrating a floating current-mode (i) digital-to-analog-converter (iDAC) method.

An aspect of the present disclosure is a floating current-mode digital-to-analog converter (iDAC) method in an integrated circuit, the floating iDAC method comprising: programming a plurality of voltage-controlled-current sources (VCCS) to generate a plurality of current signals to be at least one of equally weighted currents, binarily weighted currents, non-linear weighted currents, and individually weighted currents; summing the plurality of current signals to create a summation current signal (S$_{SUM}$) at a reference current input port (A$_R$); wherein the floating iDAC has a digital input word (D$_i$) that controls a plurality of current switches (iSW) that respectively steer the plurality of current signals to at least one of a positive current output port (I$_O^+$), and a negative current output port (I$_O^-$) of the floating iDAC; wherein the currents flowing through the I$_O^+$ port and the I$_O^-$ port are proportional to the current signal flowing through the A$_R$ port, and responsive to the D$_i$ word of the floating iDAC. Further aspects of the floating current-mode digital-to-analog converter (iDAC) method in an integrated circuit, the floating iDAC method further comprising: receiving current signals from respective I$_O^+$ ports and I$_O^-$ ports, of at least one of a subsequent iDAC, into the respective at least one of the I$_O^+$ port, and the I$_O^-$ port of the floating iDAC; wherein the A$_R$ port receives a reference current signal (S$_R$); wherein the reference input signal of each of the subsequent iDACs is proportional to the S$_R$ signal; and wherein the at least one of the subsequent iDACs effectively increases the resolution of the floating iDAC. Further aspects of the floating current-mode digital-to-analog converter (iDAC) method in an integrated circuit, the floating iDAC method further comprising: receiving the current signal from a first iDAC into a reference input port of a second iDAC, wherein at least one of the first iDAC and the second iDAC is the floating iDAC; generating a multiplicand output current signal ($S_{MULT}$) at an output port of the second iDAC; and wherein the $S_{MULT}$ signal is proportional to the $S_R$ signal and responsive to the product of a digital input word of the first iDAC and, a digital input word of the second iDAC. Further aspects of the floating current-mode digital-to-analog converter (iDAC) method in an integrated circuit, the floating iDAC method further comprising: generating a plurality of $S_{MULT}$ signals; and combining the plurality of $S_{MULT}$ signals to generate a multiply-accumulate current signal ($S_{MAC}$), wherein the $S_{MAC}$ signal is a summation of the plurality of the $S_{MULT}$ signals. Further aspects of the floating current-mode digital-to-analog converter (iDAC) method in an integrated circuit, the floating iDAC method further comprising: combining the $S_{MAC}$ signal with a bias current signal ($S_B$) from a bias current iDAC to generate a biased multiply-accumulate current signal ($S_{BMAC}$), wherein the $S_{BMAC}$ signal is the summation of the $S_{MAC}$ signal and the $S_B$ signal. Further aspects of the floating current-mode digital-to-analog converter (iDAC) method in an integrated circuit, the floating iDAC method further comprising: digitizing the $S_{BMAC}$ signal in a current-mode analog-to-digital converter (iADC). Further aspects of the floating current-mode digital-to-analog converter (iDAC) method in an integrated circuit, the floating iDAC method further comprising: combining a plurality of $S_{BMAC}$ signals, wherein the combining the plurality of $S_{BMAC}$ signals forms a current-mode artificial neural network (iANN). Further aspects of the floating current-mode digital-to-analog converter (iDAC) method in an integrated circuit, the floating iDAC method further comprising: receiving currents from $I_O^+$ port and $I_O^-$ port, of a plurality of subsequent floating iDACs, into the respective $I_O^+$ port and the $I_O^-$ port of the floating iDAC to generate an $I_{Op}^+$ and an $I_{Op}^-$; generating a plurality of reference current sources ($S_R$)s to be at least one of equally weighted currents, binarily weighted currents, non-linear weighted currents, and individually weighted currents; receiving each of the plurality of $S_R$ signals respectively into the $I_{SR}$ port of each subsequent floating iDAC; receiving a X digital word of width m, and a Y digital word of width n, wherein each bit weight of the X word of width m corresponds to the respective weight of each of the plurality of reference currents corresponding respectively to each of the floating iDACs, and wherein each bit weight of the Y word of width n corresponds to the digital input word $D_i$ of the plurality of floating iDACs; generating a multiplicand output current signal ($S_{MULT}$) in at least one of the $I_{Op}^+$ port and $I_{Op}^-$ port; wherein the $I_{iMULT}$ current is proportional to the magnitude of $S_R$ source, and responsive to the product of the X word and the Y word; and wherein the X word and Y word are interchangeable.

Another aspect of the present disclosure is a floating current-mode digital-to-analog converter (iDAC) method in an integrated circuit, the floating iDAC method comprising: generating a plurality of currents in a plurality of metal-oxide-semiconductor-field-effect-transistors (MOSFETs), wherein a weighting relationship among each of the plurality of currents in the MOSFETs is at least one of equally weighted, binarily weighted, non-linear weighted, and individually weighted; steering each of the plurality of current signals in the plurality of MOSFETs respectively through each input terminal of a plurality of current switches (iSW); steering each of the plurality of current signals through the plurality of iSWs respectively to each output terminal of the plurality of current switches (iSW) to at least one of a positive current output port ($I_O^+$), and a negative current output port ($I_O^-$); receiving a digital input word ($D_i$), and respectively controlling the steering of each of the plurality of current signals through the plurality of iSWs by the $D_i$; wherein respective source ports of the plurality of MOSFETs are coupled together, and coupled to a reference current source ($S_R$); wherein respective gate terminals of the plurality of MOSFETs are coupled together, and coupled to a voltage source ($V_B$); and wherein the currents flowing through the $I_O^+$ port and the $I_O^-$ port are proportional to the magnitude of the $S_R$ source, and responsive to the $D_i$ word of a floating iDAC. Further aspects of the floating current-mode digital-to-analog converter (iDAC) method in an integrated circuit, the floating iDAC method further comprising: receiving into the at least one of the $I_O^+$ port, and the $I_O^-$ port of the floating iDAC, currents from respective $I_O^+$ ports and $I_O^-$ ports from at least one of a subsequent iDAC, wherein the at least one of the subsequent iDAC effectively increases the resolution of the floating iDAC. Further aspects of the floating current-mode digital-to-analog converter (iDAC) method in an integrated circuit, the floating iDAC method further comprising: receiving the output current signal from a first iDAC into a reference input port of a second iDAC, wherein at least one of the first iDAC and the second iDAC is the floating iDAC; and generating a multiplicand output current signal ($S_{MULT}$) at an output of the second iDAC. Further aspects of the floating current-mode digital-to-analog converter (iDAC) method in an integrated circuit, the floating iDAC method further comprising: generating a plurality of $S_{MULT}$ signals; and combining the plurality of $S_{MULT}$ signals to generate a multiply-accumulate current signal ($S_{MAC}$), wherein the $S_{MAC}$ signal is a summation of the plurality of the $S_{MULT}$ signals. Further aspects of the floating current-mode digital-to-analog converter (iDAC) method in an integrated circuit, the floating iDAC method further comprising: generating a bias current signal ($S_B$) by an iDAC; and combining the $S_{MAC}$ signal with the $S_B$ signal to generate a biased multiply-accumulate current signal ($S_{BMAC}$), wherein the $S_{BMAC}$ signal is a summation of the $S_{MAC}$ signal and the $S_B$ signal. Further aspects of the floating current-mode digital-to-analog converter (iDAC) method in an integrated circuit, the floating iDAC method further comprising: digitizing the $S_{BMAC}$ signal in a current-mode analog-to-digital converter (iADC). Further aspects of the floating current-mode digital-to-analog converter (iDAC) method in an integrated circuit, the floating iDAC method further comprising: combining a plurality of $S_{BMAC}$ signals, wherein the combining the plurality of $S_{BMAC}$ signals forms a current-mode artificial neural network (iANN).

Another aspect of the present disclosure is a mixed-signal current-mode multiply-accumulate (iMAC) method in integrated circuits, the mixed-signal iMAC method comprising: generating a plurality of first current output signals ($S1_o$)s by a plurality of first current-mode digital-to-analog converters (iDAC1)s; receiving the plurality of $S1_o$ signals into a respective plurality of reference input ports ($A2_R$) of a plurality of second current-mode digital-to-analog-converters (iDAC2)s; generating a plurality of multiplicand output current signals ($S_{MULT}$)s at the plurality of $A2_R$ ports; combining a plurality of $S_{MULT}$ signals together to generate a multiply-accumulate current signal ($S_{MAC}$); and wherein the $S_{MAC}$ signal is a summation of a plurality of second current output signals ($S2_o$)s of the plurality of iDAC2s. Further aspects of the mixed-signal current-mode multiply-accumulate (iMAC) method in integrated circuits, the mixed-signal iMAC method further comprising: generating a bias current signal ($S_B$) by a bias iDAC; and combining the $S_{MAC}$ signal with the $S_B$ signal to generate a biased multiply-accumulate current signal ($S_{BMAC}$), wherein the $S_{BMAC}$ signal is a summation of the $S_{MAC}$ signal and the $S_B$ signal. Further aspects of the mixed-signal current-mode multiply-accumulate (iMAC) method in integrated circuits, the mixed-signal iMAC method further comprising: digitizing the $S_{BMAC}$ signal in a current-mode analog-to-digital converter (iADC). Further aspects of the mixed-signal current-mode multiply-accumulate (iMAC) method in integrated circuits, the mixed-signal iMAC method further comprising: combining a plurality of $S_{BMAC}$ signals, wherein the combining the plurality of $S_{BMAC}$ signals forms a current-mode artificial neural network (iANN).

Another aspect of the present disclosure is a factorized current-mode digital-to-analog converter (iDAC) method in an integrated circuit, the factorized iDAC method comprising: generating a scaled top output current signal ($A_t F_t$) as a product of a top scale factor ($F_t$) and a top output current signal ($A_t$) of a top iDAC (iDAC$_t$), wherein the iDAC$_t$ receives a top digital word ($D_t$) that is t-bits wide, and wherein the iDAC$_t$ receives a top reference current signal ($t_R$), and wherein the iDAC$_t$ is binary weighted and wherein $F_t$ and t are each between zero and eight; generating a scaled middle output current signal ($A_m F_m$) as a product of a middle scale factor ($F_m$) and a middle output current signal ($A_m$) of a middle iDAC (iDAC$_t$), wherein the iDAC$_m$ receives a middle digital word ($D_m$) that is m-bits wide, and wherein the iDAC$_m$ receives a middle reference current signal ($m_R$), and wherein iDAC$_m$ is binary weighted and wherein the $F_m$ and m are each between zero and eight; combining the $A_t F_t$ and the $A_m F_m$ signals to generate a summation analog output current signal ($A_{Otm}$) of a factorized iDAC; wherein a digital input word ($D_i$) of the factorized iDAC is t+m bits wide, and wherein the $D_t$ is the most-significant-bits bank of the $D_i$, and wherein the $D_m$ is a remaining-bits bank of the $D_i$, and wherein the factorized iDAC$_t$ is binary weighted; and wherein $A_{Otm}=A_tF_t+F_m$ wherein $(F_t/F_m)\times(m_R/t_R)=2^t$; and wherein the $t_R$, and $m_R$ signals are proportional to one another and proportional to a reference input signal ($S_R$) of the factorized iDAC.

Another aspect of the present disclosure is a factorized current-mode digital-to-analog converter (iDAC) method in an integrated circuit, the factorized iDAC method comprising: generating a scaled top output current signal ($A_t F_t$) as a product of a top scale factor ($F_t$) and a top output current signal ($A_t$) of a top iDAC (iDAC$_t$), wherein the iDAC$_t$ receives a top digital word ($D_t$) that is t-bits wide, and wherein the iDAC$_t$ receives a top reference current signal ($t_R$), and wherein iDAC$_t$ is binary weighted, and wherein $F_t$ and t are each between zero and eight; generating a scaled middle output current signal ($A_m F_m$) as a product of a middle scale factor ($F_m$) and a middle output current signal ($A_m$) of a middle iDAC (iDAC$_t$), wherein the iDAC$_m$ receives a middle digital word ($D_m$) that is m-bits wide, and wherein the iDAC$_m$ receives a middle reference current signal ($m_R$), and wherein iDAC$_m$ is binary weighted, and wherein the $F_m$ and m are each between zero and eight; generating a scaled bottom output current signal ($A_b F_b$) by scaling a bottom binary iDAC (DAC$_b$) output current signal ($A_b$) by a bottom scale factor $F_b$, wherein the iDAC$_b$ receives a bottom digital word ($D_b$) that is b-bits wide, and wherein the iDAC$_b$ receives a bottom reference current signal ($b_R$), and wherein the $F_b$ and b are each integers greater than one and less than eight; combining the $A_tF_t$, the $A_mF_m$, and the $A_bF_b$ signals to generate a summation analog output current signal ($A_{Otm}$) of a factorized iDAC; wherein $A_{Otm}=A_tF_t+A_mF_m+A_bF_b$; wherein $(F_t/F_b)\times(b_R/t_R)=2^{t+m}$; wherein the digital input ($D_i$) of the factorized iDAC is t+m+b bits wide, and wherein the $D_t$ is the most-significant-bits (MSBs) bank of the $D_i$, and wherein the $D_m$ is the intermediate-bits (ISBs) bank of the $D_i$, and wherein the $D_b$ is the least-significant-bits (LSBs) bank of the $D_i$; and wherein the $t_R$, $m_R$, and $b_R$ signals are proportional to one another and proportional to a reference input signal ($S_R$) of the factorized iDAC. Further aspects of the factorized current-mode digital-to-analog converter (iDAC) method in an integrated circuit, the factorized iDAC method further comprising: receiving the output current signal from a first iDAC into a reference input port of a second iDAC, wherein at least one of the first iDAC and the second iDAC is the factorized iDAC; generating a multiplicand output current signal ($S_{MULT}$) at an output port of the second iDAC; and wherein the $S_{MULT}$ signal is proportional to the $S_R$ signal and responsive to the product of digital input words of the first iDAC and the second iDAC. Further aspects of the factorized current-mode digital-to-analog converter (iDAC) method in an integrated circuit, the factorized iDAC method further comprising: generating a plurality of $S_{MULT}$ signals; and combining the plurality of $S_{MULT}$ signals to generate a multiply-accumulate current signal ($S_{MAC}$), wherein the $S_{MAC}$ signal is a summation of the plurality of the $S_{MULT}$ signals. Further aspects of the factorized current-mode digital-to-analog converter (iDAC) method in an integrated circuit, the factorized iDAC method further comprising: generating a bias current signal ($S_B$) by a bias iDAC; and combining the $S_{MAC}$ signal with the $S_B$ signal to generate a biased multiply-accumulate current signal ($S_{BMAC}$), wherein the $S_{BMAC}$ signal is a summation of the $S_{MAC}$ signal and the $S_B$ signal. Further aspects of the factorized current-mode digital-to-analog converter (iDAC) method in an integrated circuit, the factorized iDAC method further comprising: digitizing the $S_{BMAC}$ signal in a current-mode analog-to-digital converter (iADC). Further aspects of the factorized current-mode digital-to-analog converter (iDAC) method in an integrated circuit, the factorized iDAC method further comprising: combining a plurality of $S_{BMAC}$ signals, wherein the combining the plurality of $S_{BMAC}$ signals forms a current-mode artificial neural network (iANN).

Another aspect of the present disclosure is a mixed-signal scalar current-mode multiply-accumulate (iMAC) method in an integrated circuit, the mixed-signal scalar iMAC method comprising: generating a scalar current ($S_S$) by a first current-mode DAC (iDAC); replicating the $S_S$ signal to generate a plurality of scalar current replica signals ($S_{SD}$); receiving the plurality of $S_{SD}$ signals respectively into a reference input of each of a plurality of second iDACs; and generating a plurality of current output Signals ($S_o$)s of the plurality of the second iDACs; combining the plurality of $S_o$ signals of the plurality of second iDACs to generate a multiply-accumulate current ($S_{MAC}$); and wherein the $S_{MAC}$ is a summation of the respective plurality of $S_o$ signals. Further aspects of the mixed-signal scalar current-mode multiply-accumulate (iMAC) method in an integrated circuit, the mixed-signal scalar iMAC method further comprising: combining the $S_{MAC}$ signal with a bias current signal ($S_B$) from a bias current iDAC to generate a biased multiply-accumulate current signal ($S_{BMAC}$), wherein the $S_{BMAC}$ signal is the summation of the $S_{MAC}$ signal and the $S_B$ signal. Further aspects of the mixed-signal scalar current-mode multiply-accumulate (iMAC) method in an integrated circuit, the mixed-signal scalar iMAC method further comprising: digitizing the $S_{BMAC}$ signal in a current-mode analog-to-digital converter (iADC). Further aspects of the mixed-signal scalar current-mode multiply-accumulate (iMAC) method in an integrated circuit, the mixed-signal scalar iMAC method further comprising: combining a plurality of $S_{BMAC}$ signals, wherein the combining the plurality of $S_{BMAC}$ signals forms a current-mode artificial neural network (iANN).

Another aspect of the present disclosure is a mixed-signal scalar current-mode multiply-accumulate (iMAC) method in an integrated circuit, the mixed-signal scalar iMAC method comprising: receiving a first and subsequent reference current signals, each respectively to a reference port ($A_R$) of each of first current mode iDAC of a plurality of first current mode iDACs; generating a plurality of output current signals ($S_o$)s by the plurality of first current-mode DACs (iDAC); combining the plurality of $S_O$ signals of the plurality of first iDACs to generate a current signal ($S_{Osum}$), wherein the $S_{Osum}$ is a summation of the plurality of $S_O$ signals; mirroring the $S_{Osum}$ signal to create a mirrored $S_{Osum}$ signal, $S_{Osumm}$; receiving the $S_{Osumm}$ signal into a reference input port of a scalar iDAC; and generating a multiply-accumulate current signal ($S_{MAC}$) at the output port of the scalar iDAC. Further aspects of the mixed-signal scalar current-mode multiply-accumulate (iMAC) method in integrated circuits, the mixed-signal scalar iMAC method further comprising: combining the $S_{MAC}$ signal with a bias current signal ($S_B$) from a bias current iDAC to generate a biased multiply-accumulate current signal ($S_{BMAC}$), wherein the $S_{BMAC}$ signal is the summation of the $S_{MAC}$ signal and the $S_B$ signal. Further aspects of the mixed-signal scalar current-mode multiply-accumulate (iMAC) method in an integrated circuit, the mixed-signal scalar iMAC method further comprising: digitizing the $S_{BMAC}$ signal in a current-mode analog-to-digital converter (iADC). Further aspects of the mixed-signal scalar current-mode multiply-accumulate (iMAC) method in an integrated circuit, the mixed-signal scalar iMAC method further comprising: combining a plurality of $S_{BMAC}$ signals, wherein the combining the plurality of $S_{BMAC}$ signals forms a current-mode artificial neural network (iANN).

Another aspect of the present disclosure is a non-linear digital-to-analog conversion (NDAC) method in an integrated circuit, the method comprising: generating a non-linear Most-Significant-Portion (MSP) analog output signal ($So_{MPS}^N$) that is proportional to a MSP reference signal ($Sr_{MSP}$), and is responsive to a bank of Most-Significant-Bits (MSBs) of a digital input word ($Di_{MSP}$); generating a linear Least-Significant-Portion (LSP) analog output signal ($So_{LSP}^L$) that is proportional to a LSP reference signal ($Sr_{LSP}$), and is responsive to a bank of Least-Significant-Bits (LSBs) of a digital word ($Di_{LSP}$), and is responsive to the $Di_{MSP}$ word; combining the $So_{MPS}^N$ signal and the $So_{LSP}^L$ signal to generate a non-linear analog output signal ($So_N$) that is proportional to a reference signal ($S_R$), and is responsive to a digital word ($D_I$); wherein the $So_{LSP}^L$ signal is a straight-line approximation between non-linear segments of the $So_{MPS}^N$ signal; wherein the $Sr_{MSP}$ signal, and the $Sr_{LSP}$ signal, are each proportional to the $S_R$ signal; and wherein the $D_I$ word is comprised of the $Di_{MSP}$ word and the $Di_{LSP}$ word. Further aspects of the non-linear digital-to-analog conversion (NDAC) method in an integrated circuit, the method further comprising: wherein the $So_{MPS}^N$ signal is generated by a non-linear MSP digital-to-analog converter ($DAC_{MSP}^N$) having a reference network comprised of a sequence of scaled MSP reference signals ($Sr_{MSP}^N$); and wherein the sequence of scaled $Sr_{MSP}^N$ signals are at least one of squarely weighted, logarithmically weighted, non-linearly weighted, and individually weighted. Further aspects of the non-linear digital-to-analog conversion (NDAC) method in an integrated circuit, the method further comprising: generating the $So_{LSP}^L$ signal by a plurality of linear LSP Digital-to-Analog Converters ($DAC_{LSP}^L$)s comprised of a first linear LSP DAC ($DAC1_{LSP}^L$), and a second linear LSP DAC ($DAC2_{LSP}^L$); generating an output signal ($So1_{LSP}^L$) by the $DAC1_{LSP}^L$ that is proportional to a first LSP reference signal ($Sr1_{LSP}$), and is responsive to the $Di_{MSP}$ word; combining the $So1_{LSP}^L$ signal with a reference offset signal ($Sr1_{LSP}$) to generate a second reference signal ($Sr2_{LSP}^L$); receiving the $Sr2_{LSP}^L$ signal into a reference input port ($Ar2_{LSP}^L$) of the $DAC2_{LSP}^L$; and generating the $So_{LSP}^L$ signal at an output port ($Ao2_{LSP}^L$) of the $DAC2_{LSP}^L$ that is responsive to the $Di_{LSP}$ word and the $Di_{MSP}$ word. Further aspects of the non-linear digital-to-analog conversion (NDAC) method in an integrated circuit, the method further comprising: multiplying the $Di_{LSP}$ word and the $Di_{MSP}$ word to generate a multiplicand digital word ($Di_{LSP} \times Di_{MSP}$); generating an output signal ($So1_{LSP}^L$) by a first LSP Digital-to-Analog Converter ($DAC1_{LSP}^L$), wherein the $So1_{LSP}^L$ signal is proportional to a first LSP reference signal ($Sr1_{LSP}$), and is responsive to the $Di_{LSP} \times Di_{MSP}$ word; generating an output offset signal ($Sfo_{LSP}^L$) by a second LSP Digital-to-Analog-Converter ($DAC2_{LSP}^L$), wherein $Sfo_{LSP}^L$ signal is proportional to a second LSP reference signal ($Sr2_{LSP}$), and is responsive to the $Di_{LSP}$ word; and combining the $So1_{LSP}$ signal and the $Sfo_{LSP}^L$ signal to generate the $So_{LSP}^L$ signal. Further aspects of the non-linear digital-to-analog conversion (NDAC) method in an integrated circuit, the method further comprising: receiving the $Di_{LSP}$ word and the $Di_{MSP}$ word into a linearly meshed digital-input to analog-output multiplier ($mDiSo_{LSP}^L$) to generate an output signal ($So1_{LSP}^L$) that is proportional to a first LSP reference signal ($Sr1_{LSP}$); generating an output offset signal ($Sfo_{LSP}^L$) by a second LSP Digital-to-Analog-Converter ($DAC2_{LSP}^L$) that is proportional to a second LSP reference signal ($Sr2_{LSP}$), and is responsive to the $Di_{LSP}$ word; and combining $So1_{LSP}^L$ signal and the $Sfo_{LSP}^L$ signal to generated the $So_{LSP}^L$ signal. Further aspects of the non-linear digital-to-analog conversion (NDAC) method in an integrated circuit, the method further comprising: generating at least one $So_{MPS}^N$ by at least one non-linear MSP Digital-to-Analog Converter ($DAC_{MSP}^N$); generating at least one $So_{LSP}^L$ by at least one linear LSP Digital-to-Analog Converter ($DAC_{LSP}^L$); generating at least one $So_N$ signal that is proportional to the reference signal ($S_R$), wherein the at least one $So_N$ signal is responsive to at least one $D_i$ word; wherein the reference network of each of the $DAC_{MSP}^N$ is comprised of a sequence of non-linearly scaled MSP reference signals ($Sr_{MSP}^N$) that are proportional to the $Sr_{MSP}$ signal; wherein the reference network of each of the $DAC_{LSP}^L$ is comprised of a sequence of scaled LSP reference signals ($Sr_{LSP}^L$) that are proportional to the $Sr_{LSP}$ signal; wherein each of the sequence of $Sr_{MSP}^N$ signals is at least one of squarely weighted, logarithmically weighted, non-linearly weighted, and individually weighted; wherein each of the sequence of $Sr_{LSP}^L$ signals is at least one of binary weighted, linearly weighted, and individually weighted; and wherein each of the sequence of $Sr_{MSP}^N$ signals and each of the sequence of $Sr_{LSP}^L$ signals are biased from a common reference bias network (RBN). Further aspects of the non-linear digital-to-analog conversion (NDAC) method in an integrated circuit, the method further comprising: wherein a plurality of the at least one $So_N$ signal has a square profile; wherein a p-channel $So_N$ signal, of the plurality of $So_N$ signals, is responsive to a p-channel D word; wherein a q-channel $So_N$ signal, of the plurality of $So_N$ signals, is responsive to a q-channel D word; wherein the p-channel $So_N$ and the q-channel $So_N$ signals are subtracted from one another to generate a scaled $So_{xy}$ signal; wherein the p-channel D word is comprised of a scaled X digital word and a scaled Y digital word that are added to one another; wherein the q-channel D word is comprised of a scaled Y digital word and a scaled Y digital word that are subtracted from one another; and wherein the scaled $So_{xy}$ signal is proportional to the $S_R$, and is an analog representation of a scaled multiplication product of the scaled X digital word and the scaled Y digital word.

Another aspect of the present disclosure is a non-linear digital-to-analog converter (NDAC) system in an integrated circuit, the system comprising: a first non-linear Digital-to-Analog-Converter ($DAC_{QM}$), the $DAC_{QM}$ including a digital input port ($D_{QM}$), an analog output port ($Ao_{QM}$), and an analog reference input port ($Ar_{QM}$); a first linear Digital-to-Analog-Converter ($DAC_{1L}$), the $DAC_{1L}$ having a digital input port ($D_{1L}$), an analog output port ($Ao_{1L}$), and an analog reference input port ($Ar_{1L}$); a second linear Digital-to-Analog-Converter ($DAC_{2L}$), the $DAC_{2L}$ having a digital input port ($D_{2L}$), an analog output port ($Ao_{2L}$), and an analog reference input port ($Ar_{2L}$); a digital input word (D) comprised of a Most-Significant-Bits (MSB)s bank word ($D_{MSP}$), and a Least-Significant-Bits (LSB)s bank word ($D_{LSP}$); a digital multiplier ($X_{ML}$), the $X_{ML}$ having an M input digital word port (M), an N input digital word port (N), and an output digital word port (M×N); the M port coupled to the $D_{MSP}$ bank word; the N port coupled to the $D_{LSP}$ bank word; the $D_{1L}$ port coupled to the output digital word port M×N; the $D_{2L}$ port coupled to the digital word N port; the $D_{QM}$ port coupled to the digital word M port; wherein a first reference signal ($Sr_{QM}$) is coupled to the $Ar_{QM}$ port; wherein a second reference signal ($Sr_{1L}$) is coupled to the $Ar_{1L}$ port; wherein a third reference signal ($Sr_{2L}$) is coupled to the $Ar_{2L}$ port; wherein a sum of signals at the $Ao_{1L}$ and $Ao_{2L}$ ports is a straight-line approximation between non-linear segments of a signal at the $Ao_{QM}$ port; wherein a sum of signals at the $Ao_{QM}$, $Ao_{1L}$, and $Ao_{2L}$ ports generates a non-linear analog output signal ($So_N$) at an analog output port $Ao_N$; wherein an analog reference signal ($S_R$) is proportionally scaled to an $Sr_{QM}$, the $Sr_{1L}$, and the $Sr_{2L}$ signals; wherein a sequence of non-linear reference signals ($Sr_{MSP}^N$), which form a transfer function of the $DAC_{QM}$, are proportional to the $S_R$ signal; wherein the sequence of $Sr_{MSP}^N$ signals are at least one of squarely weighted, logarithmically weighted, non-linearly weighted, and individually weighted; wherein a sequence of linear reference signals ($Sr_{LSP}^L$), which form a transfer function of the $DAC_{1L}$ and $DAC_{2L}$, are proportional to the $S_R$ signal; wherein the sequence of $Sr_{LSP}^L$ signals are at least one of binary weighted, linearly weighted, and individually weighted; and wherein the $So_N$ signal substantially follows one of a square, logarithmic, and non-linear profile, is proportional to the $S_R$ signal, and responsive to the D word. Further aspects of the non-linear digital-to-analog converter (NDAC) system in an integrated circuit, the system further comprising: wherein the sequence of $Sr_{MSP}^N$ signals, and the sequence of $Sr_{LSP}^L$ signals, are biased from a common reference bias network (RBN). Further aspects of the non-linear digital-to-analog converter (NDAC) system in an integrated circuit, the system further comprising: a plurality of $So_N$ signals having a square profile; wherein a p-channel $So_N$ signal, of the plurality of $So_N$ signals, is responsive to a p-channel D word; wherein a q-channel $So_N$ signal, of the plurality of $So_N$ signals, is responsive to a q-channel D word; wherein the p-channel $So_N$ and the q-channel $So_N$ signals are subtracted from one another to generate a scaled $So_{xy}$ signal; wherein the p-channel D word is comprised of a scaled X digital word and a scaled Y digital word that are added to one another; wherein the q-channel D word is comprised of a scaled Y digital word and a scaled Y digital word that are subtracted from one another; and wherein the scaled $So_{xy}$ signal is proportional to the $S_R$, and is an analog representation of a scaled multiplication product of the scaled X digital word and the scaled Y digital word. Further aspects of the non-linear digital-to-analog converter (NDAC) system in an integrated circuit, the system further comprising: the $Ao_{QM}$ port, $Ao_{1L}$ port, and $Ao_{2L}$ port are coupled to an output port $Ao_Q$; and wherein the $DAC_{QM}$, $DAC_{1L}$, and $DAC_{2L}$ operate in current mode.

Another aspect of the present disclosure is a non-linear digital-to-analog converter (NDAC) system in an integrated circuit, the system comprising: a first non-linear digital-to-analog-converter ($DAC_{QM}$), the $DAC_{QM}$ having a digital input port ($D_{QM}$), an analog output port ($Ao_{QM}$), and an analog reference input port ($Ar_{QM}$); a first linear digital-to-analog-converter ($DAC_{1L}$), the $DAC_{1L}$ having a digital input port ($D_{1L}$), an analog output port ($Ao_{1L}$), and an analog reference input port ($Ar_{1L}$); a second linear digital-to-analog-converter ($DAC_{2L}$), the $DAC_{2L}$ having a digital input port ($D_{2L}$), an analog output port ($Ao_{2L}$), and an analog reference input port ($Ar_{2L}$); a digital input word (D) comprised of a Most-Significant-Bits (MSB)s bank word ($D_{MSP}$) and a Least-Significant-Bits (LSB)s bank word ($D_{LSP}$); an MSB bank port (M) coupled to the $D_{MSP}$ word; an LSB bank port (N) coupled to the $D_{LSP}$ word; the $D_{1L}$ port coupled to the M port; the $D_{2L}$ port coupled to the N port; the $D_{QM}$ port coupled to the M port; wherein a first reference signal ($Sr_{QM}$) is coupled to the $Ar_{QM}$ port; wherein a second reference signal ($Sr_{1L}$) is coupled to the $Ar_{1L}$ port; wherein a signal at the $Ao_{1L}$ port ($So_{1L}$) is combined with a third reference offset signal ($Sfr_{2L}$) and combination of which is coupled to the $Ar_{2L}$ port; wherein a signal at the $Ao_{2L}$ port is a straight-line approximation between non-linear segments of a signal at the $Ao_{QM}$ port; wherein a sum of signals at the $Ao_{QM}$ and the $Ao_{2L}$ ports generates a non-linear analog output signal ($So_N$) at an analog output port $Ao_N$; wherein an analog reference signal ($S_r$) is proportionally scaled to the $Sr_{QM}$, the $Sr_{1L}$, and the $Sr_{2L}$ signals; wherein a sequence of non-linear reference signals ($Sr_{MSP}^N$), which form the transfer function of the $DAC_{QM}$, are proportional to the $S_R$ signal; wherein the sequence of $Sr_{MSP}^N$ signals are at least one of squarely weighted, logarithmically weighted, non-linearly weighted, and individually weighted; wherein the sequence of linear reference signals ($Sr_{LSP}^L$), which form the transfer function of the $DAC_{1L}$ are proportional to the $S_R$ signal; wherein the sequence of $Sr_{LSP}^L$ signals are at least one of binary weighted, linearly weighted, and individually weighted; and wherein the $So_N$ signal substantially follows one of a square, logarithmic, and non-linear profile, is proportional to the $S_R$ signal, and responsive to the D word. Further aspects of the non-linear digital-to-analog converter (NDAC) system in an integrated circuit, the system further comprising: wherein each of the sequence of $Sr_{MSP}^N$ signals, and each of the sequence of $Sr1_{LSP}^L$ signals are biased from a common reference bias network (RBN). Further aspects of the non-linear digital-to-analog converter (NDAC) system in an integrated circuit, the system further comprising a plurality of $So_N$ signals having a square profile; wherein a p-channel $So_N$ signal, of the plurality of $So_N$ signals, is responsive to a p-channel D word; wherein a q-channel $So_N$ signal, of the plurality of $So_N$ signals, is responsive to a q-channel D word; wherein the p-channel $So_N$ and the q-channel $So_N$ signals are subtracted from one another to generate a scaled $So_{xy}$ signal; wherein the p-channel D word is comprised of a scaled X digital word and a scaled Y digital word that are added to one another; wherein the q-channel D word is comprised of a scaled Y digital word and a scaled Y digital word that are subtracted from one another; and wherein the scaled $So_{xy}$ signal is proportional to the $S_R$ and is an analog representation of a scaled multiplication product of the scaled X digital word and the scaled Y digital word.

Further aspects of the non-linear digital-to-analog converter (NDAC) system in an integrated circuit, the system further comprising: the $Ao_{QM}$ port and $Ao_{2L}$ port are coupled to an output port $Ao_Q$; and wherein the $DAC_{QM}$, $DAC_{1L}$, and $DAC_{2L}$ operate in current mode.

Another aspect of the present disclosure is a non-linear digital-to-analog converter (NDAC) system in an integrated circuit, the system comprising: a first non-linear Digital-to-Analog-Converter ($DAC_{QM}$), the $DAC_{QM}$ having a digital input port ($D_{QM}$), an analog output port ($Ao_{QM}$), and an analog reference input port ($Ar_{QM}$); a first linear Digital-to-Analog-Converter ($DAC_{1L}$), the $DAC_{1L}$ having a digital input port ($D_{1L}$), an analog output port ($Ao_{1L}$), and an analog reference input port ($Ar_{1L}$); a linearly meshed digital-input to analog-output multiplier ($mDiSo_{LSP}{}^L$), the $mDiSo_{LSP}{}^L$ having an M digital input port (M) and a N digital port (N), an analog output port ($Ao_{2L}$), and an analog reference input port ($Ar_{2L}$); a digital input word (D) comprised of a Most-Significant-Bits (MSB)s bank word ($D_{MSP}$) and a Least-Significant-Bits (LSB)s bank word ($D_{LSP}$); the M port coupled to the $D_{MSP}$ word; the N port coupled to the $A_{sp}$ word; the $D_{1L}$ port coupled to the N port; the $D_{QM}$ port coupled to the M port; wherein a first reference signal ($Sr_{QM}$) is coupled to the $Ar_{QM}$ port; wherein a second reference signal ($Sr_{1L}$) is coupled to the $Ar_{1L}$ port; wherein a third reference signal ($Sr_{2L}$) is coupled to the $Ar_{2L}$ port; wherein a sum of signals at the $Ao_{1L}$ and $Ao_{2L}$ ports is a straight-line approximation between non-linear segments of a signal at the $Ao_{QM}$ port; wherein a sum of signals at the $Ao_{QM}$, $Ao_{1L}$, and $Ao_{2L}$ ports generates a non-linear analog output signal ($So_N$) at an analog output port $Ao_N$; wherein an analog reference signal ($S_R$) is proportionally scaled to the $Sr_{QM}$, the $Sr_{1L}$, and the $Sr_{2L}$ signals; wherein a sequence of non-linear reference signals ($Sr_{MSP}{}^N$), which form the transfer function of the $DAC_{QM}$, are proportional to the $S_R$ signal, wherein the sequence of $Sr_{MSP}{}^N$ signals are at least one of squarely weighted, logarithmically weighted, non-linearly weighted, and individually weighted; wherein the sequence of linear reference signals ($Sr_{LSP}{}^L$), which form the transfer functions of the $DAC_{1L}$ and the $mDiSo_{LSP}{}^L$, are proportional to the $S_R$ signal; wherein the sequence of $Sr_{LSP}{}^L$ signals are at least one of binary weighted, linearly weighted, and individually weighted; wherein the $So_N$ signal substantially follows one of a square, logarithmic, and non-linear profile, is proportional to the $S_R$ signal, and responsive to the D word. Further aspects of the non-linear digital-to-analog converter (NDAC) system in an integrated, the system further comprising: wherein each of the sequence of $Sr_{MSP}{}^N$ signals, each of the sequence of $Sr1_{LSP}{}^L$ signals, and each of the sequence of $Sr2_{LSP}{}^L$ signals are biased from a common reference bias network (RBN). Further aspects of the non-linear digital-to-analog converter (NDAC) system in an integrated circuit, the system further comprising: a plurality of $So_N$ signals having a square profile; wherein a p-channel $So_N$ signal, of the plurality of $So_N$ signals, is responsive to a p-channel D word; wherein a q-channel $So_N$ signal, of the plurality of $So_N$ signals, is responsive to a q-channel D word; wherein the p-channel $So_N$ and the q-channel $So_N$ signals are subtracted from one another to generate a scaled $So_{xy}$ signal; wherein the p-channel D word is comprised of a scaled X digital word and a scaled Y digital word that are added to one another; wherein the q-channel D word is comprised of a scaled Y digital word and a scaled Y digital word that are subtracted from one another; and wherein the scaled $So_{xy}$ signal is proportional to the $S_R$, and is an analog representation of a scaled multiplication product of the scaled X digital word and the scaled Y digital word. Further aspects of the non-linear digital-to-analog converter (NDAC) system in an integrated circuit, the system further comprising: the $Ao_{QM}$ port, $Ao_{1L}$ port, and $Ao_{2L}$ port are coupled to an output port $Ao_Q$; and wherein the $DAC_{QM}$, $DAC_{1L}$, and $DAC_{2L}$ operate in current mode.

Another aspect of the present disclosure is a multiple channel current-mode data converter method in an integrated circuit, the method comprising: generating a sequence of reference bias current signals ($Si_{Rb}$) from a reference bias network (RBN); mirroring the sequence of $Si_{Rb}$ signals from the RBN into at least one iDC; wherein the scaling of the mirroring of the sequence of $Si_{Rb}$ signals from the RBN into at least one iDC, is individually scaled; wherein the sequence of $Si_{Rb}$ signals from the RBN is weighted at least equally, binarily, non-linearly, and individually; wherein each $Si_{Rb}$ signal from the sequence of $Si_{Rb}$ signals from the RBN is scaled proportionately to a reference current signal ($S_R$); wherein each $Si_{Rb}$ signal from the sequence of $Si_{Rb}$ signals from the RBN is mirrored from the $S_R$ signal; wherein the sequence of $Si_{Rb}$ signals, from the RBN in the at least one iDC, program the reference current network of the at least one iDC, which establishes the input-to-output transfer function of the at least one iDC; wherein the at least one iDC is at least one of current-mode Digital-to-Analog-Converter (iDAC) and current-mode Analog-to-Digital-Converter (iADC); wherein if the at least one iDC includes an iDAC, then the analog output current signal of each iDAC is proportional to the $S_R$ signal received by that iDAC, and responsive to a digital input word received by that iDAC; and wherein if the at least one iDC includes an iADC, then a digital output word of each iADC is responsive to the analog input current signal of that iADC and proportional to the $S_R$ signal received by that iADC. Further aspects of the multiple channel current-mode data converter method in an integrated circuit, the method further comprising: regulating the $S_R$ signal from the RBN; wherein the analog ports of the at least one iDC substantially track power supply voltage variations; and wherein if the at least one iDC includes an iDAC, then the analog output current signal of each iDAC is substantially desensitized with respect to power supply variations; and wherein if the at least one iDC includes an iADC, then a digital output word of each iADC is substantially desensitized with respect to power supply variations. Further aspects of the multiple channel current-mode data converter method in an integrated circuit, the method further comprising: wherein if the at least one iDC includes an iDAC: generating at least one pair of current output signals ($S_X$ and $S_Y$) from at least one pair of iDACs ($iDAC_X$, and $iDAC_Y$), that are proportional to the $S_R$ signal, and responsive to the respective digital input words ($D_X$ and $D_Y$) of the at least one pair of iDACs; receiving the at least one pair of $S_X$ and $S_Y$ signals, respectively, into current input ports $A_{mX}$ and $A_{mY}$ of at least one analog current multiplier (iMULT); receiving at least one $Si_{Rb}$ signal from the sequence $Si_{Rb}$ signals from the RBN into a reference current input port ($A_{mR}$) of the at least one iMULT; and wherein an input-output transfer function of the at least one iMULT follows the relationship $S_Y/S_R = S_X/S_X$, and wherein $S_O$ signal is at least one output current signal of the at least one iMULT. Further aspects of the multiple channel current-mode data converter method in an integrated circuit, the method further comprising: wherein at least one of $S_R$, $S_Y$, $S_X$, and $S_O$ signals is generated without cascode. Further aspects of the multiple channel current-mode data converter method in an integrated circuit, the method further comprising: wherein the respective voltages at $A_{mR}$ and $A_{mY}$ ports track power supply voltage variations in substantial proportion to one another; wherein the respective voltages at $A_{mX}$ and $A_{mO}$ ports track power supply voltage variations in substantial proportion to one another; and wherein the at least one $S_O$ signal of the at least one iMULT is substantially insensitive to power supply voltage variations. Further aspects of the multiple channel current-mode data converter method in an integrated circuit, the method further comprising: wherein if the at least one iDC includes an iDAC: wherein the sequence of $Si_{Rb}$ signals from the RBN is weighted squarely; summing at least one pair of digital input words ($D_x$ and $D_y$) together to generate at least a scaled $D_{x+y}$ digital word; subtracting the at least one pair of digital input words $D_x$ and $D_y$ from one another to generate at least one scaled $D_{x-y}$ digital word; receiving at least one pair of scaled digital input words ($D_{x+y}$ and $D_{x-y}$) respectively into each of at least one pair of iDACs (iDAC$_{(x+y)^2}$ and iDAC$_{(x-y)^2}$); generating at least one pair of current output signals ($S_{(x+y)^2}$ and $S_{(x-y)^2}$) that are proportional to the $S_R$, and responsive to the at least one pair of the scaled $D_{x+y}$ and $D_{x-y}$ words of the at least one pair of iDAC$_{(x+y)^2}$ and iDAC$_{(x-y)^2}$; subtracting from one another, each of the $S_{(x+y)^2}$ and $S_{(x-y)^2}$ signals of the at least one pair of iDACs (iDAC$_{(x+y)^2}$ and iDAC$_{(x-y)^2}$), to generate at least one multiplicand output current signal ($S_{iMULT}$), wherein $S_{iMULT}$ is the analog representation of a scaled product digital word ($D_x \times D_y$). Further aspects of the multiple channel current-mode data converter method in an integrated circuit, the method further comprising: wherein if the at least one iDC includes an iDAC: wherein the sequence of $Si_{Rb}$ signals from the RBN is weighted logarithmically; receiving at least one pair of digital input words ($D_X$ and $D_Y$) respectively into at least one pair of the iDACs (iDAC$_{log\ X}$ and iDAC$_{log\ Y}$); generating at least one pair of current output signals ($S_{log\ X}$ and $S_{log\ Y}$) that are proportional to the $S_R$ signal, and responsive to the at least one pair of $D_x$ and $D_y$ words; and summing the $S_{log\ X}$ and $S_{log\ Y}$ signals to generate at least one multiplicand output current ($S_{logMULT}$), wherein $S_{logMULT}$ is the analog representation of a digital logarithmic word (log $D_x \times D_y$).

Another aspect of the present disclosure is a power supply desensitization method in a current-mode digital-to-analog converter (iDAC) in an integrated circuit, the method comprising: receiving a digital input word ($D_X$) into a x-channel iDAC (iDAC$_X$) having an analog output current signal ($S_X$), and a reference input signal ($S_{RX}$), wherein the iDAC$_X$ is without cascodes; receiving a digital input word ($D_Y$) into a y-channel iDAC (iDAC$_Y$) having an analog output current signal ($S_Y$), and a reference input signal ($S_{RY}$), wherein the iDAC$_Y$ is without cascodes; receiving the $S_X$ signal into an input port of a power supply desensitization (PSR) circuit; regulating and generating the $S_{RY}$ reference input signal at an output port of the PSR circuit, wherein the $S_Y$ signal is desensitized from power supply variations; and generating a multiplicand output current ($S_{iMULT}$) at the $S_Y$ signal, wherein the $S_{iMULT}$ signal is an analog representation of the product of the $D_X$ and $D_Y$ digital words.

Another aspect of the present disclosure is a multiple channel current-mode data converter system in an integrated circuit, the method comprising: a Metal-Oxide-Semiconductor-Field-Effect-Transistors (MOSFET)s each having a gate-port, a drain-port, and a source port, and each having a scale (W/L); a sequence of diode-connected MOSFETs, wherein the gate port and the drain port of each MOSFET in the sequence of the MOSFET are coupled together and coupled to a sequence of gate-drain ports; at least one current-mode Data-Converter (iDC), whose input-output transfer function profiles is programmed by a network of current reference signals of the at least one iDC, wherein the network of current reference signals of the at least one iDC is the network of sequence of signals at a sequence of drain ports of a sequence of mirroring MOSFETs; the sequence of gate-drain ports of the sequence of diode-connected MOSFETs coupled to a sequence of gate ports of the mirroring MOSFETs; wherein each $S_{sR}$ signal in a sequence of $S_{sR}$ signals is proportional to a current reference signal ($S_R$); wherein the sequence of $S_{sR}$ signals is coupled to the respective sequence of gate-drain ports of sequence of diode-connected MOSFETs; wherein the sequence of scaled $S_{sR}$ signals are scaled at least one of equally weighted currents, binarily weighted currents, non-linear weighted, and individually weighted currents; wherein the W/L scale of each MOSFET is programmed individually; wherein the iDC is at least one of current-mode Digital-to-Analog-Converter (iDAC) and current-mode Analog-to-Digital-Converter (iADC); wherein if the at least one iDC includes an iDAC, then the analog output current signal of each iDAC is proportional to the $S_R$ signal received by that iDAC, and responsive to a digital input word received by that iDAC; and wherein if the at least one iDC includes an iADC, then a digital output word of each iADC is responsive to the analog input current signal of that iADC and proportional to the $S_R$ signal received by that iADC.

Another aspect of the present disclosure is a multiple channel current-mode data converter system in an integrated circuit, the system comprising: a sequence of current mirrors (iCM), each iCM having a current mirror input port ($Ai_{iCM}$) for receiving a sequence of scaled reference current signals $S_R$, a current mirror output port ($Ao_{iCM}$), and an input-to-output gain factor ($G_{iCM}$); a current mode data converter (iDC) having a sequence of reference input ports ($Ar_{iDC}$); the $Ao_{iCM}$ port of each of the sequence of iCMs coupled to the respective $Ar_{iDC}$ port of the sequence of $Ar_{iDC}$ ports of the iDC; wherein each scaled reference current $S_R$ of a sequence of scaled $S_R$ signals is coupled respectively to the $Ai_{iCM}$ port of each iCM of the sequence of iCMs; wherein the $G_{iCM}$ of each iCM of the sequence of iCM is programmed individually; wherein the iDC is at least one of current-mode Digital-to-Analog-Converter (iDAC), and current-mode Analog-to-Digital-Converter (iADC); wherein the sequence of scaled $S_R$ signals are scaled at least one of equally weighted currents, binarily weighted currents, non-linear weighted currents, and individually weighted currents; wherein if one or more iDC includes an iDAC, then the analog output current signal of each iDAC is proportional to the $S_R$ signal received by that iDAC, and responsive to a digital input word received by that iDAC; and wherein if one or more iDC includes an iADC, then a digital output word of each iADC is responsive to the analog input current signal of that iADC and proportional to the $S_R$ signal received by that iADC.

Another aspect of the present disclosure is a multiple channel current-mode data converter system in an integrated circuit, the system comprising: a sequence of current mirrors (iCM), each iCM having a current mirror input port (Ai$_{iCM}$) for receiving a sequence of scaled reference current signals (S$_R$)s, a current mirror output port (Ao$_{iCM}$), and an input-to-output gain factor (G$_{iCM}$); one or more current mode data converters (iDC), each of the one or more iDCs having a sequence of reference input ports (Ar$_{iDC}$); each of the one or more Ao$_{iCM}$ ports of each iCM of the sequence of iCMs respectively coupled to the Ar$_{iDC}$ port of the sequence of Ar$_{iDC}$ ports of the one or more iDCs; wherein each scaled S$_R$ signal of a sequence of scaled S$_R$ signals is coupled respectively to the Ai$_{iCM}$ port of each iCM of the sequence of iCMs; wherein the G$_{iCM}$ of each iCM of the sequence of iCMs is programmed individually; wherein the one or more iDCs is at least one of a current-mode Digital-to-Analog-Converter (iDAC), and a current-mode Analog-to-Digital-Converter (iADC); wherein the sequence of scaled S$_R$ signals are scaled at least one of equally weighted currents, binarily weighted currents, non-linear weighted currents, and individually weighted currents; wherein if one or more iDC includes an iDAC, then the analog output current signal of each iDAC is proportional to the S$_R$ signal received by that iDAC, and responsive to a digital input word received by that iDAC; and wherein if one or more iDC includes an iADC, then a digital output word of each iADC is responsive to the analog input current signal of that iADC and proportional to the S$_R$ signal received by that iADC.

Another aspect of the present disclosure is a multiple channel current-mode data converter system in an integrated circuit, the system comprising: a sequence of Current-Controlled-Voltage-Sources (CCVS)s, each CCVS in the sequence of the CCVSs having an input current port (Ai$_{ccvs}$) for receiving a sequence of scaled reference current signals (S$_R$)s, an output port (Ao$_{ccvs}$) for providing an output voltage signal (So$_{ccvs}$), and an input-current to output-voltage gain factor (G$_{ccvs}$); a plurality of current mode data converters (iDC); each iDC of the plurality of iDCs having a sequence of Voltage-Controlled-Current-Sources (VCCS)s; each VCCS of the sequence of VCCSs, in each iDC of the plurality of iDCs, having an input voltage port (Ai$_{ccvs}$), an output current port (Ao$_{ccvs}$) for providing an output current signal (So$_{ccvs}$), and an input-voltage to output-current gain factor (G$_{ccvs}$); each Ao$_{ccvs}$ port of the sequence of CCVSs, respectively coupled to each Ai$_{ccvs}$ port of the sequence of VCCSs, in each iDC of the plurality of iDCs; wherein each scaled S$_R$ source of a sequence of scaled S$_R$ sources is coupled respectively to the Ai$_{ccvs}$ port of each CCVS of the sequence of CCVSs; wherein the sequence of VCCS in each iDC arranges the reference current network of each respective iDC which establishes the input-to-output transfer function of each respective iDC; wherein the G$_{ccvs}$ of each CCVS of the sequence of CCVSs is programmed individually; wherein the G$_{ccvs}$ of each VCCS of the sequence of VVCSs in each iDC of the plurality of iDCs is programmed individually; wherein the one or more iDC of each iDC of the plurality of iDCs is at least one of a current-mode Digital-to-Analog-Converter (iDAC), and a current-mode Analog-to-Digital-Converter (iADC); wherein the sequence of scaled S$_R$ sources are scaled at least one of equally weighted currents, binarily weighted currents, non-linear weighted currents, and individually weighted currents; wherein if one or more iDC includes an iDAC, then the analog output current signal of each iDAC is proportional to the S$_R$ signal received by that iDAC, and responsive to a digital input word received by that iDAC; and wherein if one or more iDC includes an iADC, then a digital output word of each iADC is responsive to the analog input current signal of that iADC and proportional to the S$_R$ signal received by that iADC.

Another aspect of the present disclosure is a multiple channel current-mode data converter method in an integrated circuit, the method comprising: generating a sequence of reference bias current signals (Si$_{Rb}$); receiving the sequence of Si$_{Rb}$ signals into a sequence of Current-Controlled-Voltage-Sources (CCVS)s to generate a sequence of reference bias voltage signals (Sv$_{Rb}$); receiving the sequence of Sv$_{Rb}$ signals into at least one sequence of Voltage-Controlled-Current-Sources (VCCS)s in at least one current mode data converter (iDC), wherein the at least one sequence of VCCSs replicates the sequence of Si$_{Rb}$ signals; wherein the sequence of Si$_{Rb}$ signals is weighted at least one of equally, binarily, non-linearly, and individually, and wherein each S$_{Rb}$ signal is scaled proportionately to a reference current signal (S$_R$); wherein the sequence of VCCS in the at least one iDC arranges the reference current network of each respective iDC which establishes the input-to-output transfer function of each respective iDC; wherein the at least one iDC is at least one of current-mode Digital-to-Analog-Converter (iDAC) and current-mode Analog-to-Digital-Converter (iADC); wherein the analog output current signal of the iDAC is proportional to S$_R$ signal and responsive to the digital input word of the iDAC; wherein the digital output word of the at least one iADC is responsive to the analog input current signal of the at least one iADC and proportional to the S$_R$ signal; wherein if the at least one iDC includes an iDAC, then the analog output current signal of each iDAC is proportional to the S$_R$ signal received by that iDAC, and responsive to a digital input word received by that iDAC; and wherein if the at least one iDC includes an iADC, then a digital output word of each iADC is responsive to the analog input current signal of that iADC and proportional to the S$_R$ signal received by that iADC.

Another aspect of the present disclosure is a meshed multiplier system in an integrated circuit, the system comprising: a first digital input port having a of width of M bits of a first digital input word D$_X$; a second digital input port having a width of N bits of a second digital input word D$_Y$; a plurality of N scaled current source banks, each scaled current source bank uniquely corresponding to a bit of D$_Y$; each of the N scaled current source banks comprising a plurality of M scaled current sources, each scaled current source having a corresponding first switch and a corresponding second switch, each current source uniquely corresponding to a bit of the first digital input word D$_X$; each scaled current source in each scaled current source bank coupled to an input of its corresponding first switch, the first switch responsive to the bit of the first digital input word D$_X$ corresponding to the scaled current source; the first switch having an output coupled to an input of its corresponding second switch, the second switch responsive to the bit of the second digital input word D$_Y$ corresponding to the scaled current source bank; the second switch having an output coupled to an output node; wherein the N scaled current source banks, are at least one of binarily weighted, linearly weighted, and individually weighted; wherein the plurality of M scaled current sources in each scaled current source bank, are at least one of binarily weighted, linearly weighted, and individually weighted; and wherein M is less than 17, and N is less than 17. Further aspects of the meshed multiplier system in an integrated circuit, the system further comprising: wherein M and N are equal.

Another aspect of the present disclosure is a meshed multiplier method in an integrated circuit, the method comprising: receiving a first digital input word $D_X$ of width of M bits, wherein M is less than 17; receiving a second digital input word $D_Y$ of width of N bits, wherein N is less than 17; activating one bank of N banks of M scaled current sources responsive to a bit of $D_Y$ corresponding to the one bank of N banks, thereby activating each of the M scaled current sources; receiving current into an output node from one of the activated M scaled current sources responsive to a corresponding bit of $D_X$. Further aspects of the meshed multiplier system in an integrated circuit, the system further comprising: wherein M and N are equal.

Another aspect of the present disclosure is a meshed digital-input to analog current-output multiplier system in an integrated circuit, the system comprising: a digital-input to analog-output multiplier ($XD_iI_o$) comprised of a $Ao_{XY}$ port, a first digital input port ($D_X$) wherein the $D_X$ port is M-bit wide, a second digital input port ($D_Y$) wherein the $D_Y$ port is N-bit wide, and a reference port for receiving a $S_{Ru}$ signal; the $XD_iI_o$ comprising: a sequence of M meshed digital-input to analog current-output sub-multipliers ($mD_iI_o$), wherein each $mD_iI_o$ is comprised of a first switch bank ($iSW_1^B$), a second switch bank ($iSW_2^B$), a current reference signals bank ($S_R^B$), and a first digital 1-bit wide port ($B_M$); for each $mD_iI_o$, each $iSW_1^B$ switch bank comprised of a sequence of N switches, wherein the N control-ports of the N switches coupled together, and coupled to a 1-bit wide $B_M$ port; for each $mD_iI_o$, each $iSW_2^B$ switch bank comprised of a sequence of N switches, wherein the gate-ports respectively coupled to the $D_Y$ port. for each $mD_iI_o$, the output ports of the first sequence of N switches of the $iSW_1^B$ switch bank coupled to the input ports of the second sequence of N switches of the $iSW_2^B$ switch bank; for each $mD_iI_o$, each $S_R^B$ signal bank comprised of a sequence of N current reference signal ports ($A_R$) for receiving sequence of N scaled current reference signals ($S_R$), wherein the sequence of N scaled $S_R$ signals is at least one of binarily weighted, linearly weighted, and individually weighted, and wherein each scaled $S_R$ signal is proportional to the $S_{Ru}$ signal; for each $mD_iI_o$, the sequence of N scaled $S_R$ sources of the $S_R^B$ signal banks coupled respectively to the sequence of N input ports of the $iSW_1^B$ switch bank; for each $mD_iI_o$, the sequence of N output ports of the $iSW_2^B$ switch bank coupled to the $Ao_{XY}$ port; for each $mD_iI_o$, the sequence of M 1-bit wide $B_M$ ports coupled to the respective M-bit wide $D_X$ ports; wherein for each $mD_iI_o$, a sum of the sequence of N of scaled $S_R$ sources of the $S_R^B$ banks is at least one of binarily weighted, linearly weighted, and individually weighted; and wherein the $XD_iI_o$ generates an analog multiplicand signal at the $Ao_{XY}$ port, that is proportional to the $S_{Ru}$ signal, and responsive to the multiplication product of digital words at the $D_X$ and the $D_Y$ ports.

Further aspects of the meshed digital-input to analog current-output multiplier system in an integrated circuit, the system further comprising: a plurality of the $XD_iI_o$; the $Ao_{XY}$ port from each of the plurality of $XD_iI_o$s coupled to an $Ao_{MAC}$ port; wherein a signal through the $Ao_{MAC}$ port is a multiply-accumulate current signal ($So_{MAC}$), wherein the $So_{MAC}$ signal is a summation of signals through the plurality of $Ao_{XY}$ ports; and wherein the $So_{MAC}$ is proportional to the $S_{Ru}$ source and responsive to a plurality of digital words that are the multiplication product of pairs of digital words inputted to a plurality of pairs of $D_X$ and $D_Y$ ports. Further aspects of the meshed digital-input to analog current-output multiplier system in an integrated circuit, the system further comprising: a bias current-mode Digital-to-Analog-Converter (iDAC) for generating a bias current signal ($S_B$), the bias current signal ($S_B$) coupled to the $So_{MAC}$ signal to generate a biased multiply-accumulate current signal ($So_{BMAC}$), wherein the $So_{BMAC}$ signal is the summation of the $So_{MAC}$ signal and the $S_B$ signal. Further aspects of the meshed digital-input to analog current-output multiplier system in an integrated circuit, the system further comprising: a current-mode Analog-to-Digital Converter (iADC) for digitizing the $So_{BMAC}$ signal to generate a $Do_{BMAC}$ word that is a digital representation of the $So_{BMAC}$ signal. Further aspects of the meshed digital-input to analog current-output multiplier system in an integrated circuit, the system further comprising: each scaled $S_R$ source, of the sequence of N scaled $S_R$ sources of each of the $S_R^B$ signal bank of each $mD_iI_o$, is biased from a common reference bias network (RBN). Further aspects of the meshed digital-input to analog current-output multiplier system in an integrated circuit, the system further comprising: a Metal-Oxide-Semiconductor-Field-Effect-Transistors (MOSFET)s each having a gate-port, a drain-port, and a source port, and each having a scale (W/L); and each switch, of the $iSW_1^B$ switch bank of each $mD_iI_o$, is a MOSFET wherein the input of the switch is the source-port of the MOSFET, the output of the switch is the drain-port of the MOSFET, and the control port of the switch is the gate-port of the MOSFET.

Another aspect of the present disclosure is a meshed digital-input to analog current-output multiplier system in an integrated circuit, the system comprising: a digital-input to analog-output multiplier ($XD_iI_o$) comprised of a $Ao_{XY}$ port, a first digital input port ($D_X$) wherein the $D_X$ port is w-bit wide, a second digital input port ($D_t$) wherein the $D^Y$ port is z-bit wide, and a reference input port for receiving a $S_R$ signal; the $XD_iI_o$ comprising: a plurality of Metal-Oxide-Semiconductor-Field-Effect-Transistors (MOSFET)s, each having a gate-port, a drain-port, and a source port, and each having a scale (W/L); a sequence of M meshed digital-input to analog current-output sub-multipliers ($mD_iI_o$), wherein each $mD_iI_o$ is comprised of a first MOSFET bank ($M_1^B$), a second MOSFET bank ($M_2^B$), a current reference signals bank ($S_R^B$), and a first digital 1-bit wide port ($B_W$); for each $mD_iI_o$, each $M_1^B$ comprised of a sequence of z MOSFETs, the gate-ports of the z MOSFETs coupled together, and coupled to a 1-bit wide $B_M$ port; for each $mD_iI_o$, each $M_2^B$ comprised of a sequence of z MOSFETs, the gate-ports respectively coupled to the $D_Y$ port; for each $mD_iI_o$, the drain ports of the first sequence of z MOSFETs coupled to the source ports of the second sequence of z MOSFETs; for each $mD_iI_o$, each $S_R^B$ signal bank comprised of a sequence of z current reference signal ports ($A_R$) for receiving z sequence of scaled current reference signals ($S_R$), wherein the sequence of z scaled $S_R$ signals is at least one of binarily weighted, linearly weighted, and individually weighted, and wherein each scaled $S_R$ signal is proportional to the $S_{Ru}$ signal; for each $mD_iI_o$, the sequence of z scaled $S_R^B$ sources of the $S_R^B$ signal banks coupled respectively to the sequence of z input ports of the $M_2^B$ switch bank; for each $mD_iI_o$, the sequence of z output ports of the MY switch bank coupled to the $Ao_{XY}$ port; for each $mD_iI_o$, the sequence of w 1-bit wide $B_W$ ports coupled to the respective w-bit $D_X$ ports; wherein for each $mD_iI_o$, a sum of the sequence of z of scaled $S_R$ sources of the $S_R^B$ banks is at least one of binarily weighted, linearly weighted, and individually weighted; and wherein the $XD_iI_o$ generates an analog multiplicand signal at the $Ao_{XY}$ port, that is proportional to the $S_{Ru}$ signal, and responsive to the multiplication product of digital words at the $D_X$ and the $D_Y$ ports.

DETAILED DESCRIPTION

Numerous embodiments are described in the present application and are presented for illustrative purposes only and is not intended to be exhaustive. The embodiments were chosen and described to explain principles of operation and their practical applications. The present disclosure is not a literal description of all embodiments of the disclosure(s). The described embodiments also are not, and are not intended to be, limiting in any sense. One of ordinary skill in the art will recognize that the disclosed embodiment(s) may be practiced with various modifications and alterations, such as structural, logical, and electrical modifications. For example, the present disclosure is not a listing of features which must necessarily be present in all embodiments. On the contrary, a variety of components are described to illustrate the wide variety of possible embodiments of the present disclosure(s). Although particular features of the disclosed embodiments may be described with reference to one or more particular embodiments and/or drawings, it should be understood that such features are not limited to usage in the one or more particular embodiments or drawings with reference to which they are described, unless expressly specified otherwise. The scope of the disclosure is to be defined by the claims.

Although process (or method) steps may be described or claimed in a particular sequential order, such processes may be configured to work in different orders. In other words, any sequence or order of steps that may be explicitly described or claimed does not necessarily indicate a requirement that the steps be performed in that order. The steps of processes described herein may be performed in any order possible. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to the embodiment(s). In addition, although a process may be described as including a plurality of steps, that does not imply that all or any of the steps are essential or required. Various other embodiments within the scope of the described disclosure(s) include other processes that omit some or all of the described steps. In addition, although a circuit may be described as including a plurality of components, aspects, steps, qualities, characteristics and/or features, that does not indicate that any or all of the plurality are essential or required. Various other embodiments may include other circuit elements or limitations that omit some or all of the described plurality.

Consider that all the figures comprised of circuits, blocks, or systems illustrated in this disclosure are powered up by positive and negative power supplies, $V_{DD}$ and $V_{SS}$ (and $V_{SS}$ can be connected to the ground potential or zero volts for single supply applications), respectively (unless otherwise specified), and they are not shown for illustrative clarity of the disclosed figures. Terms FET is field-effect-transistor; MOS is metal-oxide-semiconductor; MOSFET is MOS FET; PMOS is p-channel MOS; NMOS is n-channel MOS; BiCMOS is bipolar CMOS. Throughout this disclosure, the body terminal of NMOSFET can be connected to the source terminal of NMOSFET or to $V_{SS}$. Also, the body terminal of PMOSFET can be connected to the source terminal of PMOSFET or to $V_{DD}$. The term $V_{GS}$ is gate-to-source port voltage of a MOSFET. The term $V_{DS}$ is drain-to-source port voltage of a MOSFET. The term $I_S$ or $I_D$ is drain current of a MOSFET. The term $V_A$ is a device parameter, and the early voltage a MOSFET.

All the data-converters including, analog-to-digital-converters (ADC) as well as digital-to-analog-converters (DAC) may not show, for illustrative clarity, a positive reference and a negative reference input, where the negative reference input can be connected to the ground potential or zero volts. A current-mode DAC is iDAC, and a current-mode ADC is iADC. A current analog switch (iSW) has one input, one digital control signal, and either one or two output ports that receive the iSW input signal. An iSW with two output ports, steer the iSW's input signal to either of iSW's output ports depending on the polarity of the iSW digital control signal. An iSW with one output, steer the iSW's input signal to iSW's the positive output port or blocks it depending on the polarity of the iSW digital control signal. Most-Significant-Bit is MSB and Least-Significant-Bit is LSB, pertaining to data-converters digital bits. Most-Significant-Portion is MSP and Least-Significant-Portion is LSP, pertaining to the portions of signals represented by the MSB bank digital-word and LSB bank digital-word of data-converters, wherein the data-converter's whole digital word is comprised of the LSB bank digital-word plus the MSB bank digital-word.

The term non-linear data-converter (DAC or ADC) refers to a data-converter whose transfer function (as arranged by the data-converter's reference network) is non-linearly weighted (e.g., square or logarithmic or individually weighted). Similarly, the term linear data-converter (DAC or ADC) refers to a data-converter whose transfer function (as arranged by the data-converter's reference network) is linearly weighted (e.g., binary or equally weighted thermometer).

Throughout this disclosure, for demonstrative and descriptive clarity, data-converter that may be illustrated with 2 to 8 bits of resolution, but they can be arranged with higher resolutions, unless otherwise specified (e.g., disclosed data-converters can have higher resolutions where 16-bits of resolution is practical). Moreover, for descriptive clarity illustrations are simplified, where their modifications for improvements would be obvious to one skilled in the arts, such as for example cascading current sources by stacking MOSFETs to increase their output impedance. In some instances, analog switches are shown as single FETs with one input, one output, and a control input. In such instances, the one FET acting as a switch can be replaced with two FETs with a common input but opposite control polarity to manage the switch input's on and off voltage span and improve on-off glitch transients.

Consider that other manufacturing technologies, such as Bipolar, BiCMOS, and others can utilize the disclosure in whole or part.

Unless otherwise specified, the illustrated data-converters are generally asynchronous (i.e., they are clock free) which eliminates the need for a free running clock and improves dynamic power consumption with lower clock noise. However, the methods, systems, or circuits disclosed generally are applicable to data-converters that are synchronous (i.e., requiring clocks).

This disclosure presents several SPICE circuit simulations showing the various waveforms attributed to the disclosed data-converts and multipliers. The simulations are performed in order to demonstrate functionality of the disclosed embodiments. These simulations are not intended to guarantee the embodiment's performance to a particular range of specifications. Be mindful that circuit simulations use the TOPSPICE simulator, and are based on approximate device models for a typical standard mainstream 0.18 µm CMOS process fabrication.

Throughout this disclosure, data-converters utilized in multipliers and multiply-accumulate circuits operate in current-mode and generally have the following benefits:

First, data-converters operating in current-mode are inherently fast.

Second, current signal processing that occurs within the nodes of data-converters, generally, have small voltage swings which enables operating the current-mode data-converters with lower power supply voltages.

Third, operating at low supply voltage reduces power consumption of current-mode data-converters.

Fourth, current input and current output zero-scale to full-scale spans of current-mode data-converters are less restricted by power supply voltage levels (e.g., current input and outputs can generally span to full-scale at minimum power supply voltages)

Fifth, current mode CMOS data-converters can operate in subthreshold that enables reducing power consumption further.

Sixth, summation and subtraction functions in analog current-mode is generally simple and takes small chip area. For example, summation of two analog currents could be accomplished by coupling the current signals. Depending on accuracy and speed requirements, subtraction of analog current signals could be accomplished by utilizing a current mirror where the two analog current signals are applied to the opposite side of the current mirror, for example.

Seventh, current-mode data-converters can operate internally in mixed-mode and externally have compatible interface with conventional digital processors. For example, digital-to-analog converters and multipliers can operate in current mode analog and or mixed-mode and subsequently have their current mode computations be converted to digital in order to seamlessly interface with standard digital processors via current-mode analog-to-digital converters.

Eight, accuracy of mixed-signal current-mode data-converters, depending on the architecture, generally depends (at least in part) on the matching between FET current sources in the data-converter's current reference or bias network that programs their transfer function. Moderate conversions speeds with typical accuracies up to 16-bits with trimming or calibration and up to 10-bits without trimming or calibration may be achievable in standard CMOS manufacturing, where non-minimum size FETs are utilized to form the data-converter's current reference or bias network. Such accuracies can be sufficient for a range of near-edge or near-sensor machine learning and artificial intelligence (ML & AI) applications that may also not require extremely fast computation speeds. As such, some near-edge or near-sensor ML & AI applications can benefit from the low-cost and low-power of mixed-signal current-mode computation that only requires low cost conventional CMOS manufacturing, as compared to high-speed power-hungry high-precision digital processors that require the substantially more expensive deep-sub-micron CMOS technologies.

Section 1—Description of FIG. 1

FIG. 1 is a simplified block diagram illustrating a floating current-mode (i) digital-to-analog-converter (iDAC) method.

The disclosed floating iDAC method, substantially equalizes a reference current signal ($I1_1$) with the sum of a plurality of currents that are generated by plurality of floating voltage controlled current sources (VCCS). The plurality of VCCS's currents are scaled by programming each of the VCCS's voltage-to-current transconductance gains (G). Moreover, the plurality of VCCS's currents are selected by a plurality of respective current switches (iSWs) wherein the iSWs are controlled by the iDAC's digital input word, to steer the iSW's respective outputs to iDAC's outputs ($I_O^+$ and $I_O^-$).

The floating iDAC method can be utilized in an iDAC having a n-bit (n≤16) wide digital word ($Di_1$), a current reference signal ($I1_1$), and two analog current outputs such as a first analog current output terminal $Io_1^+$ and a second analog current output terminal $Io_1^-$ (coupled with a bias voltage source such as $V1_1$). The floating iDAC method is illustrated in a system diagram of FIG. 1 having plurality (e.g., n=3) of VCCSs or voltage controlled current sources (e.g., $G1_1$, $G2_1$, and $G3_1$). Each VCCS has a positive input voltage terminal and a negative input voltage terminal ($VCCS_V^+$, and $VCCS_V^-$) and a positive output current terminal and a negative output current terminal ($VCCS_I^+$, and $VCCS_I^-$). The respective VCCS's output currents (e.g., $I_{G3_1}$, $I_{G2_1}$, and $I_{G1_1}$) flow-in is the respective VCCS's positive current output terminals VCCSs and flow-out of the respective VCCS's negative current output terminals $VCCS_I^-$s. At node ng 1, the floating iDAC method receives a reference current signal $I1_1$. Each of the negative input voltage terminals of the plurality of VCCSs, and each of the negative output current terminals of plurality of VCCSs are coupled together at node ng 1. Each of the positive input voltage terminal of the plurality of VCCSs are coupled together that is also coupled with a voltage signal from a voltage source $V2_1$. Consider that, $I_{G3_1}$, $I_{G2_1}$, and $I_{G1_1}$ current sources are floating on $I1_1$ which is a floating iDAC's reference current source. There is a plurality of current switches (iSW) each with a digital control input, an analog current input, and two analog current output terminals. The respective digital control inputs of the plurality of iSWs are coupled with the respective plurality of iDAC's digital input bits (that make up the digital word $Di_i$). When the iSW's digital control input is enabled (e.g., positive polarity), then the iSW's analog input current is routed to $Io_1^+$ which a first analog current output of iDAC. When the iSW's digital control input is disabled (e.g., negative polarity), then the iSW's analog input current is routed to the second analog current output of iDAC or $Io_1^-$.

In illustration of FIG. 1, given $V2_1 - V_{ng_1} = V_{fl}$, then $I_{G1_1} = V_{fl} \times S_1 \times g$, $I_{G2_1} = V_{fl} \times S_2 \times g$, and $I_{G3_1} = V_{fl} \times S_3 \times g$. As noted earlier, the plurality of output currents (e.g., $I_{G1_1}$, $I_{G2_1}$, and $I_{G3_1}$) of the respective VCCSs (e.g., $G1_1$, $G2_1$, and $G3_1$, respectively) are fed onto the respective plurality of iSW's inputs. Accordingly, $I_{G1_1} + I_{G2_1} + I_{G3_1} = I1_1 = I_R$, where $I_R$ is the reference current to the iDAC and establishes the full-scale out of the iDAC. The $V_{fl}$ is the voltage input to each of the VCCSs. The transconductance gain of a single unit VCCS is g, which is scaled by programming the gain scale factors (e.g., $s_1$, $s_2$, and $s_3$) for each respective VCCS.

Let's consider programming the VCCS's gain factors for a binary weighted iDACs. In a general, a simplified transfer function for an iDAC is:

$$I_o = I_R \sum_{i=1}^{n} D_i / 2^i = (I_R / 2^n) \sum_{i=1}^{n} D_i \times 2^{i-1} = \Delta_R \sum_{i=1}^{n} D_i \times 2^{i-1},$$

where for the iDAC, $I_o$ is the analog output current, $I_R$ is the reference input current that can set the full-scale value of $I_o$, $D_i$ is the digital input word (that is n-bits) wide, and $\Delta_R = (I_R / 2^n)$ is the analog LSB current weight of $I_o$. For an iDAC with n=3, by programming gain scale factors $s_1 = 1$, $s_2=2$, and $s_3=4$, then $I_{G1_1}=I_{G1_2}/2=I_{G1_3}/4$ which is a binary weighted current source network, whose binary weighted current sources are selected by iSWs in accordance with the $Di_1$ digital input word of the iDAC. Note that the iDAC's full scale is $I_R=I1_1=I_{G1_1}+I_{G1_2}/2+I_{G1_3}/4$. Note also that the VCCS's gain scale factors can be programmed to other ratios, including but not limited to, substantially equal ratio (which enables making a thermometer coded current-mode DAC), or non-linear ratio (which enables making for example a logarithmic current-mode DAC or a current-mode DAC with a square transfer fiction). Some of the benefits of the floating iDAC method is highlighted in its embodiment disclosed in FIG. 2 section 2 next.

Figure 2:
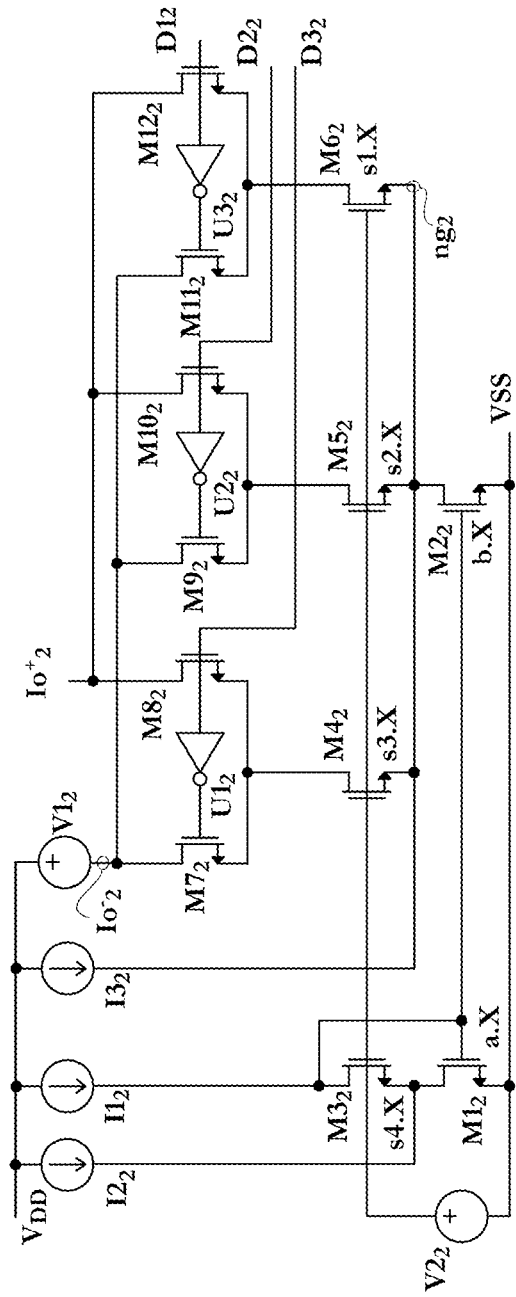
FIG. 2 is a simplified circuit schematic diagram illustrating an embodiment of an iDAC that utilizes the floating iDAC method illustrated in FIG. 1.

Section 2—Description of FIG. 2

FIG. 2 is a simplified circuit schematic diagram illustrating an embodiment of an iDAC that utilizes the floating iDAC method illustrated in FIG. 1.

As noted earlier, for illustrated clarity, a n=3 bits binary weighted iDAC is described but n can be as large of 16 bits. Bias voltage $V2_2$ provides the positive input voltage to the gate terminal of 3 field-effect-transistors (FETs) $M4_2$, $M5_2$, and $M6_2$, which perform the function of the three VCCSs (corresponding to $G1_1$, $G2_1$, and $G3_1$ functions in FIG. 1, respectively) as floating current sources. By the scaling width over length ratios (W/L) of $M4_2$, $M5_2$, and $M6_2$, the respective plurality of VCCS's transconductance gain factors can be programmed. Bear in mind that, $I_{M4_2}$, $I_{M5_2}$, and $I_{M6_2}$ may be described as floating current sources on $I_{M2_2}$. For nomenclature clarity consider that, as an example, $I_{M2_2}$ refers to the drain-to-source current of MOSFET $M2_2$, which is a manner of terminology is applied throughout out this disclosure. In a binary weighted iDAC, the gain factors $s_1=1$, $s_2=2$, and $s_3=4$, and as a result $I_{M6_2}=I_{M5_2}/2=I_{M4_2}/4$. Consider that $s_4$ scale ratio of $M3_2$ is not critical and can be programmed to, for example, 1 in the binary weighted iDAC case, so long as the drain-to-source voltage ($V_{DS}$) of $M1_2$ and $M2_2$ are matched close enough to keep the FET's early voltage ($V_A$) mismatch error within design objectives. By operation of the Kirchhoff's current law (KCL) at node $ng_2$, $I_{M6_2}+I_{M5_2}+I_{M4_2}=I_{M2_2}$, which substantially equalizes the full-scale current of the iDAC to $I_{M2_2}=I_R$, (notice that $I_{M2_2}$ of FIG. 2 is analogous to equivalent of $I_R=I1_1$ of FIG. 1). The iDAC's digital-input words, from Most-Significant-Bit (MSB) $D3_2$ to Least-Significant-Bit (LSB) $D1_2$ control the respective iDAC's iSWs: $M7_2$-$M8_2$, $M9_2$-$M10_2$, and $M11_2$-$M12_2$. For example, when $D3_2$ is in high state (i.e., MSB is on), then the iSW $M8_2$ is on and iSW $M7_2$ is off and accordingly $I_{M4_2}$ is steered through $M8_2$ to the iDAC's current output port $Io_{2+}$. If $D3_2$ is in low state, then $M4_2$'s current is steered through $M7_2$ to the iDAC's second current output port Joy. Similarly, and in accordance with the polarity of the iDAC's digital input words, the iSWs steer the respective iDAC's binary weighted currents $I_{M4_2}$, $I_{M5_2}$, and $I_{M6_2}$ onto either the $Io_2^+$ port (which is the iDAC's first analog current output port) or the second iDAC analog current output port $Io_2^-$ (that is in this case shunted onto voltage source $V1_2$).

For illustrative clarity, programming current mirror scale factor $a=b=1$, then $I1_2=I_{M1_2}=I_{M2_2}=I_R$. The injection currents $I2_2=I3_2$ are applied to both side of $M1_2$-$M2_2$ current mirror to prevent the said mirror from shutting off, thus improving its dynamic response, when $I1_2$ is pulsed between zero and full scale. Also, consider that by utilizing the floating iDAC method, the scaling of iDAC reference current network (e.g., $M4_2$, $M5_2$, and $M6_2$) are decoupled from the scaling of $I1_2$ through $M1_2$-$M2_2$ mirror W/L ratios. Such decoupling of current reference network scaling, reduces FET's sizes and lowers the capacitance associated with the small scaled FETs which also improves the iDAC's transient response and lowers glitch.

Note that the floating iDAC disclosed in FIG. 2 generally utilizes NMOSFETs, including for iSWs and for the floating current reference transfer function network. Variations of this disclosure would be obvious to one skilled in the art, including to utilize a complementary floating iDAC comprising of NMOS current reference sources and PMOS iSWs, or combination thereof.

In summary, some of the benefits of the floating iDAC method disclosed in section 1 FIG. 1, and such benefits flowing into the embodiment of the floating iDAC of FIG. 2, which are as follows:

First, the floating VCCSs generate the scaled current reference network for the iDAC, that can be decoupled from the scaling of $I_{M1_2}$, $I_{M2_2}$ mirror and $I1_2$ reference current. The decoupling of scaling of current reference network provides a degree of freedom that helps the iDAC reduce FET scaling and sizes which saves die are, lowers cost, and also lowers the capacitance attributed to larger size FETs in the iDAC's current reference network which in turn improve the transient response of the iDAC.

The decoupling of scaling of current reference network, also provides simple means to improve the dynamic response of the iDAC when its reference input signal $I1_2$ is pulsed between zero and full scales. This is accomplished by injecting currents $b \times I2_2=a \times I3_2$ to both side of $M1_2$-$M2_2$ current mirror to prevent the mirror from shutting off, and hence improving its dynamic response.

Second, the iDAC operating in current-mode is inherently fast.

Third, voltage swings in current-mode signal processing are small, which enables operating the iDAC with lower power supply voltage and retain the speed and dynamic rage benefits. Also, floating iDAC can operate with low power supplies since its operating headroom can be limited by a FET's VGS+VDS. Additionally, the flexibility to run the CMOSFETs in subthreshold enables a floating iDAC to operate with ultra-low currents, even lower power supplies, and ultra-low power consumption suitable for mobile applications, especially in AI and ML applications that may require numerous ultra-low power and low power supply DACs for computation.

Fourth, operating at low supply voltage reduces power consumption.

Fifth, signal processing such as addition or subtraction, in current mode, are also small and fast.

Sixth, the VCCS's gain factor can be programmed for an objective iDAC's transfer function such as binary weighted, thermometer, logarithmic, square function, or other non-linear iDAC transfer functions, as required by the application.

Seventh, by substantially equalizing the terminal voltages at $Io_2^+$ and $Io_2^-$ (e.g., to $V1_2$), the iSW's transient and glitch responses are improved since the two outputs of iSW at $Io_2^+$ and $Io_2^-$, could swing between approximately equal voltages, during on and off iDAC's digital input code transitions.

Eight, there are no passive devices in the embodiment of FIG. 2, and as such there is no need for resistors or capacitors, which reduces die size and manufacturing cost. Not requiring any capacitors nor any resistors would facilitates fabricating a floating iDAC in standard digital CMOS manufacturing that is not only low cost, but also mainstream and readily available for high-volume mass production applications, and proven for being rugged and having high quality.

Ninth, the precision of the iDAC can be improved by for example utilizing current source segmentation (along with digital binary-to-thermometer logic decoding of iDAC's digital input code), or cascading the iDAC's reference current mirrors to improve their output impedance.

Tenth, a floating iDAC can be arranged free of clock, suitable for asynchronous (clock free) computation.

Eleventh, a floating iDAC can utilize same type of MOSFET current sources and MOSFET switches that are arranged in a symmetric, matched, and scaled manner. This trait facilitates devices parameters to track each other over process, temperature, operating condition variations. Accordingly, the iDAC's temperature coefficient, power supply coefficient, and AC power supply rejection performance can be enhanced.

Twelfth, the embodiment disclosed here is not restricted by FETs having to operate either in saturation (high-currents) or subthreshold (low currents) regions. For example, some analog signal processing units rely on operating transistors in the subthreshold regions which restricts the dynamic range of analog signal processing circuits to low current signals. Also, some other analog signal processing units rely on operating transistors with high currents in the saturation regions which restricts the dynamic range of analog signal processing circuits to higher current signals.

Figure 3:
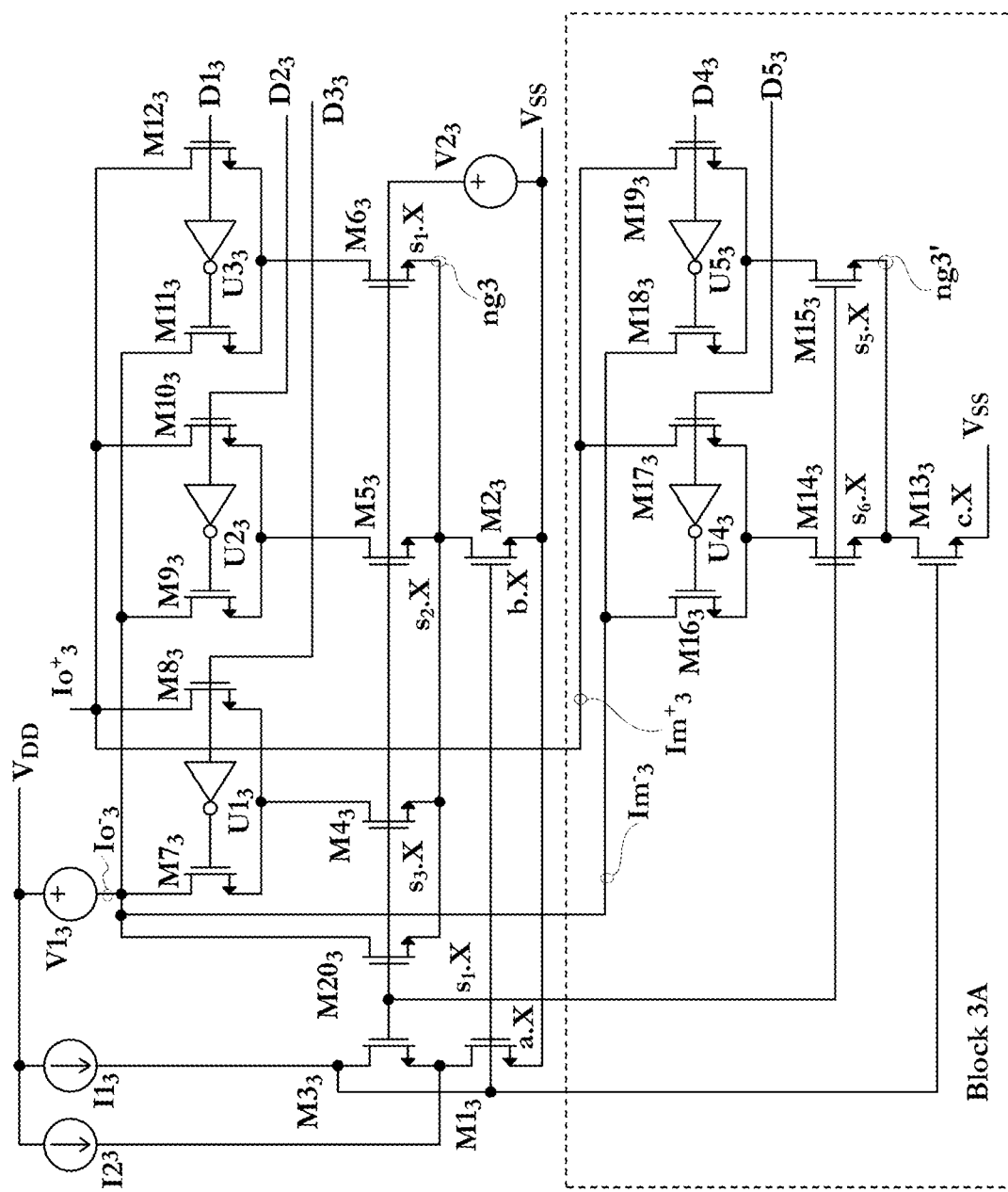
FIG. 3 is a simplified circuit schematic diagram illustrating an embodiment of an iDAC that combines a plurality of iDACs in order to arrange a higher resolution iDAC, wherein at least one of the plurality of iDACs utilizes the floating iDAC method illustrated in FIG. 1.

Section 3—Description of FIG. 3

FIG. 3 is a simplified circuit schematic diagram illustrating an embodiment of an iDAC that combines a plurality of iDACs to arrange a higher resolution iDAC, wherein at least one of the plurality of iDACs utilizes the floating iDAC method illustrated in FIG. 1.

The individual floating iDACs utilized in FIG. 3 are arranged in a similar manner as that of FIG. 2 in section 2. FIG. 3 illustrates a 5-bit iDAC but higher resolutions iDACs can be arranged and up to 16-bits of resolution is practical. The ID AC of FIG. 3 is comprising of a first 2-bits floating iDAC that is a most-significant bank (MS bank iDAC) and a second 3-bits floating iDAC that is a least-significant bank (LS bank iDAC). Here, the full-scale output current weight of the MS bank iDAC is $2^2=4$ times bigger than that of the LS bank iDAC. The MSB of the 5-bit iDAC is $D5_3$ and the LSB of the 5-bit iDAC is $D1_3$. The 5-bit iDAC's reference current in FIG. 3 is $I1_3$ and the iDAC's output currents are $Io_3^+$ and $Io_3^-$.

The upper half of FIG. 3 (that is outside the Block 3A dotted area) is the LS bank iDAC (with $D1_3$, $D2_3$, and $D3_3$ as its respective digital inputs) that is similar to that of FIG. 2 described in section 2. The lower half of FIG. 3 that is inside the Block 3A dotted area is a 2-bit floating iDAC which is the MS bank iDAC (with $D4_3$, and $D5_3$ as its respective digital input bits) generating a positive and a negative output currents $Im_3^+$ and $Im_3^-$ (respectively) that are added to (coupled with) the iDAC's output currents to produce the total $Io_3^+$ and $Io_3^-$.

To optimize for cost-performance objective, the embodiment illustrated in FIG. 3 has the flexibility to program the reference current value and iDAC's input-to-output transfer function. For descriptive clarity of the operations of FIG. 3, let's program the 5-bit iDAC as binary weighted (instead of a non-linear or thermometer input-out transfer function for the iDAC, for example). As an example, with the reference current $I1_3=8I_R$, let's program the reference current mirror scale factors in the iDAC's transfer function network as follow: $M13_3$'s c=3, $M2_3$'s b=1, and $M1_3$'s a=1. Also, let's program $s_6=2\times s_5$ and analogous to the example in section 2 (pertaining to FIG. 2) $s_3=2\times s_2=4\times s_1$. Notice that, $I_{M14_3}$ and $I_{M15_3}$ can be viewed as floating current sources on $I_{M13_3}$. Similarly, $I_{M4_3}$, $I_{M5_3}$, $I_{M6_3}$, and $I_{M20_3}$ can be viewed as floating current sources on $I_{M23}$. With scale factors programmed as noted above, a binary weighted current reference network can be arranged as follows: $I_{M13_3}=24I_R \rightarrow I_{M14_3}=16I_R$, $I_{M15_3}=8I_R$ for the MS bank iDAC. Also, $I_{M1_3}=I_{M2_3}=8I_R \rightarrow I_{M4_3}=4I_R$, $I_{M5_3}=2I_R$, and $I_{M6_3}=I_R$ for the LS bank iDAC. Consider that with $I_{M2_3}=8I_R$ and $M20_3$'s $S_1=1$, then $I_{M20_3}=I_R$ which leaves $7I_R$ to be split in accordance with programmed scaled factors $s_3=2\times s_2=4\times s_1$ between $I_{M4_3}=4I_R$, $I_{M5_3}=2I_R$, and $I_{M6_3}=I_R$.

Additionally, bear in mind that $I_{M20_3}=I_R$ is terminated in $Io_3^-$ in this example, but $I_{M20_3}$ can be terminated in $Io_3^+$ depending on zero-scale or full scale (LSB current) offset requirement of the end-application. Moreover, note that the same voltage source $V2_3$ biases the gate terminals of $M14_3$, $M15_3$, and $M20_3$. As means for improving the transient recovery time of $M1_3$, if and when $I1_3=8I_R$ is pulsed between zero and full scale, a proportional constant current ($Ij_3$ which is not shown but) can be added onto $I1_3$, to keep $M1_3$ alive, plus two scaled $Ij_3$ can be injected into nodes $ng_3$ and $ng_3$. Also consider that similar to FIG. 2 in section 2, the purpose of utilizing $V1_3$ in FIG. 3 is to substantially equalize the $Io_3^+$ and $Io_3^-$ terminal voltages for better matching and dynamic response (e.g., if $Io_3^+$ is terminated into a diode connected current mirror, then $V_{GS}$ of a diode connected FET can also be utilized to set the $V1_3$ for $Io_3^-$).

Notice that the floating iDAC disclosed in FIG. 3 generally utilizes NMOSFETs, including for iSWs and the floating current source transfer function network. It would be obvious to one skilled in the art to utilize a complementary floating iDAC comprising of PMOS or a combination of PMOS and NMOS current reference transfer function and PMOS iSWs.

In addition to some of the benefits of the floating iDAC method disclosed in section 2 FIG. 2, the embodiment of FIG. 3 illustrates that the floating iADC method is scalable and can be expanded in combination with other iDACs to attain higher resolutions.

Figure 4:
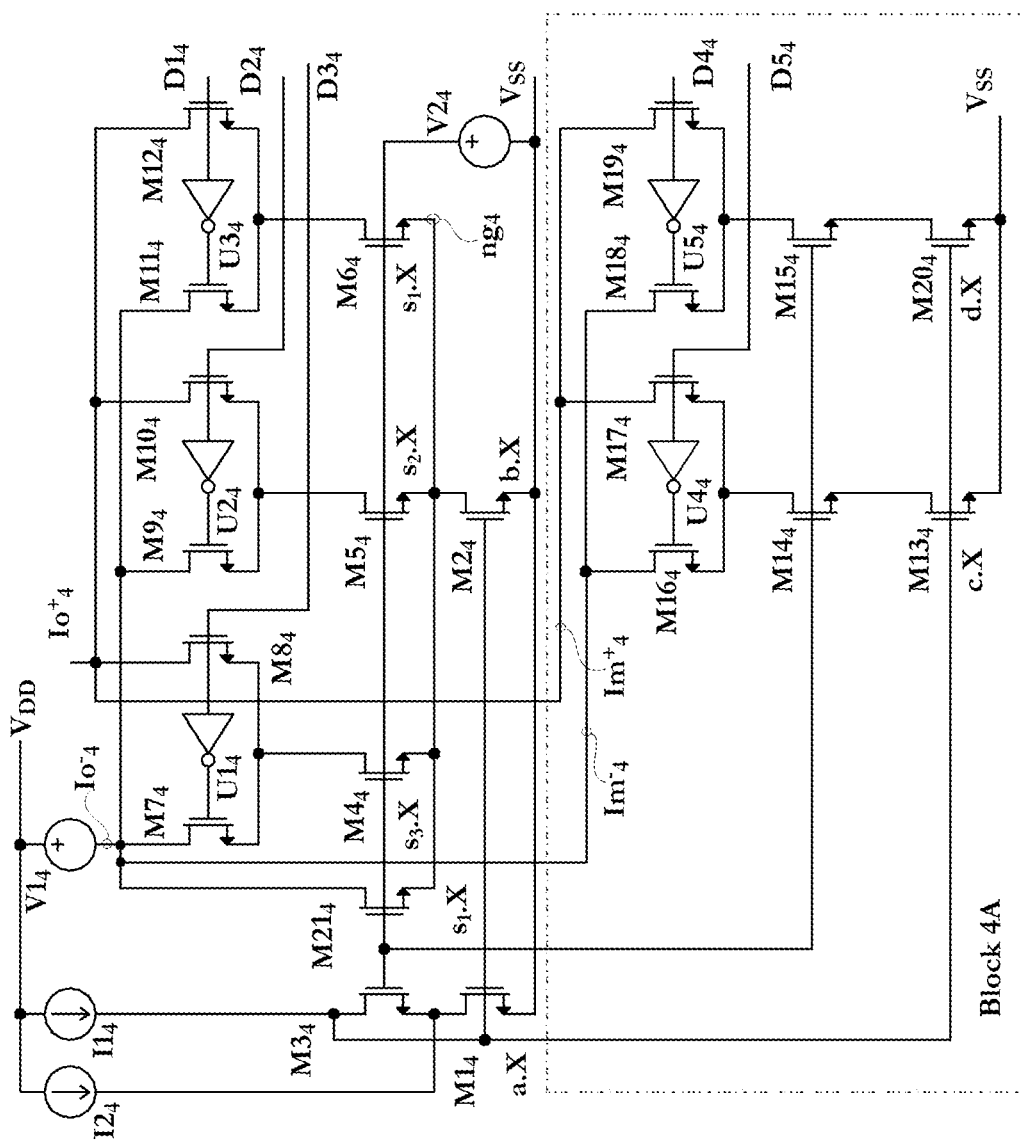
FIG. 4 is a simplified circuit schematic diagram illustrating another embodiment of an iDAC that combines a plurality of iDACs in order to arrange a higher resolution iDAC, wherein at least one of the plurality of iDACs utilizes the floating iDAC method illustrated in FIG. 1.

Section 4—Description of FIG. 4

FIG. 4 is a simplified circuit schematic diagram illustrating another embodiment of an iDAC that combines a plurality of iDACs to arrange a higher resolution iDAC, wherein at least one of the plurality of iDACs utilizes the floating iDAC method illustrated in FIG. 1.

The iDAC illustrated in FIG. 4 is similar to the iDAC described in FIG. 3 section 3 with the difference being the MS bank iDAC is not a floating iDAC. FIG. 4 illustrates a 5-bit iDAC but higher resolutions iDACs can be arranged and up to 16-bits of resolution is practical. The iDAC of FIG. 4 is comprising of a first 2-bits iDAC that is a most significant bank (MS bank iDAC shown inside the dotted line as Block 4A). The iDAC of FIG. 4 is also comprising of a second 3-bits floating iDAC that is a least significant bank (LS bank iDAC). In iDAC of FIG. 4 the full-scale output current weight of the MS bank iDAC is $2^2=4$ times bigger than that of the LS bank iDAC. The MSB of the 5-bit iDAC in FIG. 4 is $D5_4$ and the LSB of the 5-bit iDAC is $D1_4$. The 5-bit iDAC's reference current in FIG. 4 is $I1_4$ and the iDAC's output currents are $Io_4^+$ and $Io_4^-$.

The upper half of FIG. 4 (that is outside the Block 4A dotted area) is the LS bank iDAC (with D1$_4$, D2$_4$, and D3$_4$ as its respective digital inputs) similar to that of FIG. 2 and FIG. 3 that were described in sections 2 and 3, respectively. As noted earlier, the lower half of FIG. 4 that is inside the Block 4A dotted area is another 2-bit floating iDAC which is the MS bank iDAC (with D4$_4$, and D5$_4$ as its respective digital inputs) generating a positive and a negative output currents Im$_4^+$ and Im$_4^-$ (respectively) which are added to (by being coupled with) the first iDAC's output currents Io$_4^+$ and Io$_4^-$.

To optimize for cost-performance objective, there is flexibility in programming the iDAC's reference current value and input-output transfer function network of the iDAC in FIG. 4. To describe the operations of FIG. 4, let's program the 5-bit iDAC as binary weighted for the purpose of the disclosure's descriptive clarity. As an example, with the reference current I1$_4$=8I$_R$, let's program the reference current mirror W/L scales as follow: M13$_4$'s c=2, M20$_4$'s d=1, M2$_4$'s b=1, and M1$_4$'s a=1. Let's program S$_3$=2×S$_2$=4×S$_1$ in FIG. 4. With W/L scales programmed as such, a binary weighted current reference network is arranged comprising of I$_{M13_4}$=16I$_R$, I$_{M20_4}$=8I$_R$ for the MS bank iDAC. As noted earlier, I$_{M4_4}$, I$_{M5_4}$, I$_{M6_4}$, and I$_{M21_4}$ current sources can be viewed as floating on I$_{M2_4}$. Also, I$_{M1_4}$=I$_{M2_4}$=8I$_R$→I$_{M4_4}$=4I$_R$, I$_{M5_4}$=2I$_R$, and I$_{M6_4}$=I$_R$ for the LS bank iDAC in FIG. 4. Given that I$_{M2_4}$=8I$_R$ and M21$_4$'s S$_1$=1, then I$_{M21_4}$=I$_R$ which leaves 7I$_R$ to be split in accordance with programmed scaled factors S$_3$=2×S$_2$=4×S$_1$ between I$_{M4_4}$=4I$_R$, I$_{M5_4}$=2I$_R$, and I$_{M6_4}$=I$_R$.

Additionally, consider that in FIG. 4, I$_{M21_4}$=I$_R$ is terminated in Io$_4^-$ in this example, but I$_{M21_4}$ can be terminated in Io$_4^+$ depending on zero-scale or full scale (LSB current) offset requirement of the application. Moreover, consider that the same voltage source V2$_4$ biases the gate terminals of M14$_4$, M15$_4$, and M20$_4$. As means for improving the transient recovery time of M1$_4$, when I1$_4$=8I$_R$ is pulsed between full and zero scales, a proportional constant injection DC current (Ij$_4$ which is not shown but) can be added onto I1$_4$, to keep M1$_4$ alive, plus two scaled Ij$_4$ can be injected into nodes ng$_4$ and the drain terminals of FETs M13$_4$ and M20$_4$. Also bear in mind that similar to FIG. 2 in section 2, the purpose of utilizing V1$_4$ in FIG. 4 is to substantially equalize the Io$_4^+$ and Io$_4^-$ terminal voltages for better matching and dynamic response (e.g., if Io$_4^+$ is terminated into a diode connected current mirror, then V$_{GS}$ of a diode connected FET can also be utilized as the V1$_4$ for Io$_4^-$).

In addition to some of the benefits of the floating iDAC method disclosed in section 2 FIG. 2, the embodiment of FIG. 4 illustrates that the floating iADC method is scalable and can be expanded through combination with other iDACs to attain higher resolutions.

Figure 5:
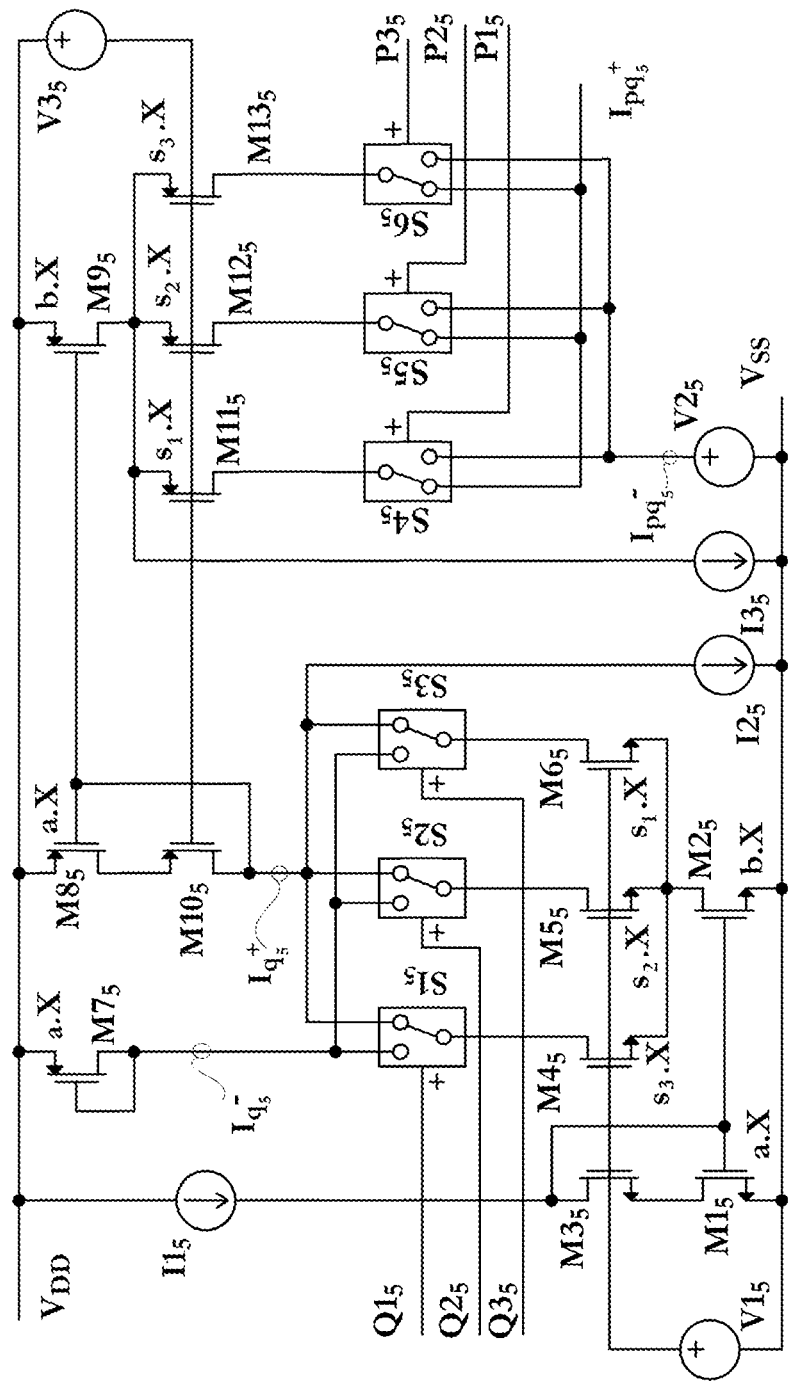
FIG. 5 is a simplified schematic diagram illustrating a mixed-signal current-mode digital-input to analog-current-output multiplier ($XD_iI_o$) comprising of a first iDAC whose output is coupled to the reference input of a second iDAC, wherein the first and second iDACs utilize the floating iDAC method illustrated in FIG. 1.

Section 5—Description of FIG. 5

FIG. 5 is a simplified schematic diagram illustrating a mixed-signal current-mode digital-input to analog-current-output multiplier (XD$_i$I$_o$) comprising of a first iDAC whose output supplies the reference input to a second iDAC, wherein the first and second iDACs utilize the floating iDAC method illustrated in FIG. 1

The first and second floating iDACs embodiments are similar to the floating iDAC described and illustrated in section 2 FIG. 2.

For clarity of description, both floating iDACs of FIG. 5 are arranged as binary-weighted, and accordingly the current reference transfer-function is programmed for FET W/L scales s$_3$=2×s$_2$=4×s$_1$.

For illustrative clarity, instead of showing iSWs with FET level circuit schematics (e.g., FIG. 2 section 2 where MSB current switch comprising M7$_2$, U1$_2$, and M8$_2$ etc.), the iSWs in FIG. 5 are shown as block diagrams (e.g., MSB current switch S1$_5$, etc.) utilized in floating iDACs. Additionally, bear in mind that the XD$_i$I$_o$ illustrates a 3-bit digital input word Q being multiplied with a 3-bit digital word P, but each P and Q digital input words can be up to 16-bits.

The left side of FIG. 5 illustrates the first floating iDAC (Q-iDAC) with its Q$_D$ digital-input word (comprising of 3-bits Q1$_5$, Q2$_5$, and Q3$_5$ where Q1$_5$ is the MSB and Q3$_5$ is the LSB), and its reference input current I$_R$=I1$_5$. The I1$_5$ is fed onto a diode connected FET M1$_5$ whose current is scaled and mirrored onto M2$_5$ in accordance with the programmed W/L scales a and b of M1$_5$ and M2$_5$, respectively. For clarity of this description, let's set a=b=1, and thus I$_R$=I1$_5$=I$_{M15}$=I$_{M25}$.

The Q-iDAC's positive and negative analog output currents Iq$_5^+$ and Iq$_5^-$ are generated as a function of its Q digital-input word and I1$_5$. The digital-input to analog-current-output transfer-function of the Q-iDAC, which is binary weighted in FIG. 5's illustration, can mathematically be expressed as $$Iq_5^+ = (I_R/2^n) \times \sum_{i=1}^{n} Q_{i_5} \times 2^{i-1} = \Delta_R \times \sum_{i=1}^{n} Q_{i_5} \times 2^{i-1}.$$

Here, for a=b=1, Iq$_5^+$=I$_{M8_5}$=I$_{M9_5}$ is the analog-output current of the Q-floating iDAC. Also, $\Delta_R$=I$_R$/2$^n$) with I$_R$=I1$_5$, and n=3 is the resolution of the Q-floating iDAC. Lastly, Q$_{i_5}$ is 0 or 1 representing the value of the i$^{th}$ digital input bits (with 3-bits Q1$_5$, Q2$_5$, and Q3$_5$) of the Q-floating iDAC. Let's simplify the Q-floating transfer function representation as Iq$_5^+$=I1$_5$×f(Q$_D$). Consider that the Iq$_5^+$ is fed onto a diode-connected FET M8$_5$ whose current is scaled and mirrored onto M9$_5$ to supply the reference current signal for the P-iDAC.

The right side of FIG. 5 illustrates the P-iDAC with its P$_D$ digital-input word (comprising 3-bits P1$_5$, P2$_5$, and P3$_5$ where P1$_5$ is the MSB and P3$_5$ is the LSB) and its reference input current I$_{M8_5}$=Iq$_5^+$=I1$_5$×f(Q$_D$)=I$_{M9_5}$ considering the programmed W/L scales arrangement where a=b=1. Consider that in FIG. 5's illustration, the iSWs in P-iDACs are PMOSFETs whereas the iSWs in Q-iDACs are NMOSFETs. Accordingly, the Q$_D$ and P$_D$ digital-input words are properly arranged to apply the complementary digital-input signs to the FIG. 5's iSW s.

The P-iDAC's positive and negative analog output currents Ipq$_5^+$ and Ipq$_5^-$ are generated as a function of its P-digital-word and I$_{M9_5}$. The digital-input to current analog-output transfer-function of the P-iDAC (that is binary weighted in the illustration of FIG. 5) can also mathematically be expressed as:

$$Ipq_5^+ = (I_{R'}/2^m) \times \sum_{j=1}^{m} P_{j_5} \times 2^{j-1} =$$

-continued $$\Delta_{R'} \times \sum_{j=1}^{m} P_{j_5} \times 2^{j-1} = I_{M9_5}/2^m \times \sum_{j=1}^{m} P_{j_5} \times 2^{j-1}$$

where $Ipq_5^+$ is the positive analog output current of the P-iDAC, $I_{M9_5} = I_{q_{5=n^5}} \times f(Q_D)$, and m=3 is the resolution of the P-iDAC and $P_{j_5}$ is 0 or 1 representing the value of the $j^{th}$ digital input bits (with 3-bits $P1_5$, $P2_5$, and $P3_5$) of the P-iDAC. Therefore, the P-iDAC transfer function can be represented in the simplified form: $Ipq_5^+ = I1_5 \times f(Q_D) \times f(P_D)$ or $f(Q_D) \times f(P_D) = I_{pq_5}/I1_5$ which is an expression that represents the multiplication results of two digital-input words $Q_D$ and $P_D$, where the multiplication result is represented as an analog-output current $I_{pq_5}$ proportional to a current proportional to $I1_5$ which is proportional to a reference current $(I_R)$.

Bear in mind that the $Ipq_5^-$ is fed onto a voltage source $V2_5$ to match terminal voltage at $Ipq_5^+$. Furthermore, as means to enhance the dynamic response of reference mirror current signals that is subjected to a pulse, $I2_5$ is added as a constant current injection ($Ij_5$) to keep $M8_5$ alive when for example $Ipq_5^+$ transitions between zero and full scale. As such, a proportional $I3_5$ is added to $M9_5$ to balance the current mirror $M8_5$-$M9_5$.

In summary some of the benefits of the $XD_iI_o$ utilizing the floating iDAC method are as follows:

First, the decoupling of scaling of current reference network, helps reduce FET sizes which saves die are, lowers cost. This trait also lowers the capacitance attributed to large size FETs in the iDAC's current reference network, which in turn improves the transient response of the floating iDAC and the multiplier $XD_iI_o$ that utilizes such iDACs. The decoupling of scaling of current reference network, also provides simple means to improve the dynamic response of the iDAC and that of the multiplier $XD_iI_o$ when the iDAC's reference input signal is pulsed. One mean of accomplishing this goal is by injecting a scaled DC current on each side of the current mirror that supplies the iDAC's reference current, which helps prevent the mirror from shutting off, and thus improving its dynamic response.

Second, the $XD_iI_o$ operating in current-mode is inherently fast.

Third, voltage swings in current-mode signal processing are small, which enables operating the $XD_iI_o$ with lower power supply voltage.

Fourth, operating at low supply voltage reduces power consumption of the $XD_iI_o$. Additionally, the flexibility to run the CMOSFETs in subthreshold enables the iDAC to operate with ultra-low currents, even lower power supplies, and ultra-low power consumption suitable for mobile applications, especially in AI and ML applications that may require numerous ultra-low power and low power supply DACs for computation.

Fifth, $XD_iI_o$'s output signal processing in current-mode such as addition or subtraction functions are also small and fast, which for example is important in ML & AI applications requiring plurality of multiplier's outputs to be (summed) accumulated. For example, to sum plurality of signals in current-mode simply involves coupling the current signals together.

Sixth, by substantially equalizing the terminal voltages at the positive and negative current output of the iDAC, it would improve the iSW's transient response and reduces glitch between the iSW's on to off transitions, which helps the transient response of the $XD_iI_o$.

Seventh, there are no passive devices in the embodiment of FIG. 5, and as such there is no need for resistors or capacitors, which reduces manufacturing size and cost of the $XD_iI_o$.

Eighth, the precision of the iDAC and hence the precision of the $XD_iI_o$ multiplier can be improved by for example utilizing current source segmentation (along with digital binary-to-thermometer coding) in the iDAC's reference current transfer-function, or cascading the iDAC's reference current mirrors to improve their output impedance.

Ninth, utilizing lower resolution iDACs (e.g., 3-bits or 5-bits) in the $XD_iI_o$ multiplier, that occupy smaller areas, but have higher accuracy (e.g., 8-bits of resolution corresponding to accuracy of ±0.4%) is beneficial. For example, higher than 3 of 5 bits of accuracy is attainable in standard CMOS fabrication. With proper W/L scaling of FETs used in the current source transfer function of iDACs, 8-bits of accuracy or ±0.4% matching may be achievable. As such, this disclosure can utilize low resolution iDACs that occupy small areas and achieve higher accuracy $P_A \times Q_A$ multiplication at lower cost.

Tenth, the $XD_iI_o$ that utilizes floating iDAC can be arranged free of clock, suitable for asynchronous (clock free) computation.

Eleventh, the $XD_iI_o$ that utilizes same type of MOSFET current sources and MOSFET switches in the respective floating iDACs, which are symmetric, matched, and scaled. This trait facilitates devices parameters to track each other over process, temperature, and operating conditions variations. Accordingly, the $XD_iI_o$'s temperature coefficient, power supply coefficient, and AC power supply rejection performance can be enhanced.

Twelfth, the embodiment disclosed here is not restricted by FETs having to operate either in saturation (high-currents) or subthreshold (low currents) regions. For example, some analog signal processing units rely on operating transistors in the subthreshold regions which restricts the dynamic range of analog signal processing circuits to low current signals. Also, some other analog signal processing units rely on operating transistors with high currents in the saturation regions which restricts the dynamic range of analog signal processing circuits to higher current signals Section 6—Description of FIG. 6

Figure 6:
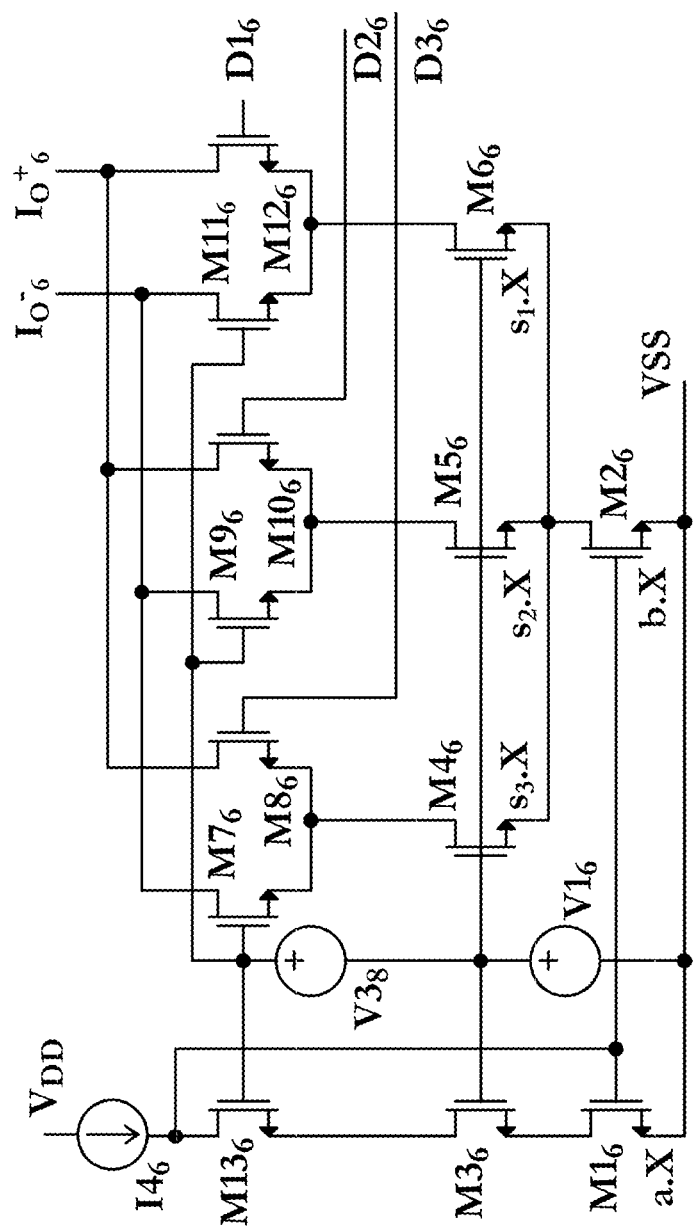
FIG. 6 is a simplified circuit schematic diagram illustrating another embodiment of an iDAC that utilizes the floating iDAC method illustrated in FIG. 1.

FIG. 6 is a simplified circuit schematic diagram illustrating another embodiment of an iDAC that utilizes the floating iDAC method illustrated in FIG. 1.

The embodiment of floating iDAC illustrated in FIG. 6 is similar to that of the floating iDAC embodiment disclosed and illustrated in section 2 and FIG. 2. The difference is a smaller iSW arrangement which simplifies the iDAC, reduces its size, and lowers its dynamic power consumption. Small size of iDAC is critical in machine learning and artificial intelligence applications that could require numerous iDACs for multiplication purposes. The iSW here is, for example, comprising of $M8_6$ and $M7_6$, where in $M8_6$ receives the digital bit $D3_6$ whereas $M7_6$'s gate terminal is biased at a fixed $V1_6 + V3_6$. As such, the inverter (compared to, for example, $U1_2$ in FIG. 2. Section 2) is eliminated which saves are and lowers transient power consumption when digital-inputs are updated. Note that, in this example, $V1_6 + V3_6$ can be programmed such that digital voltage swings at $D3_6$ terminal properly turn $M8_6$ on and off when $D3_6$ bit toggles. Also, depending on cost-performance goals, $M13_6$, $M3_6$, and $M1_6$ as well as the iSW's FET pairs (e.g., $M7_6$-$M8_6$, $M9_6$-$M10_6$, and $M11_6$-$M12_6$) can be sized to optimize for FETs to operate at or near saturation with increased output impedance, which could improve performance of the current reference transfer function network.

In addition to some of the benefits of the floating iDAC method disclosed in section 2 FIG. 2, the embodiment of FIG. 6 illustrates another embodiment of floating iDAC with smaller size and lower dynamic power consumption.

Figure 7:
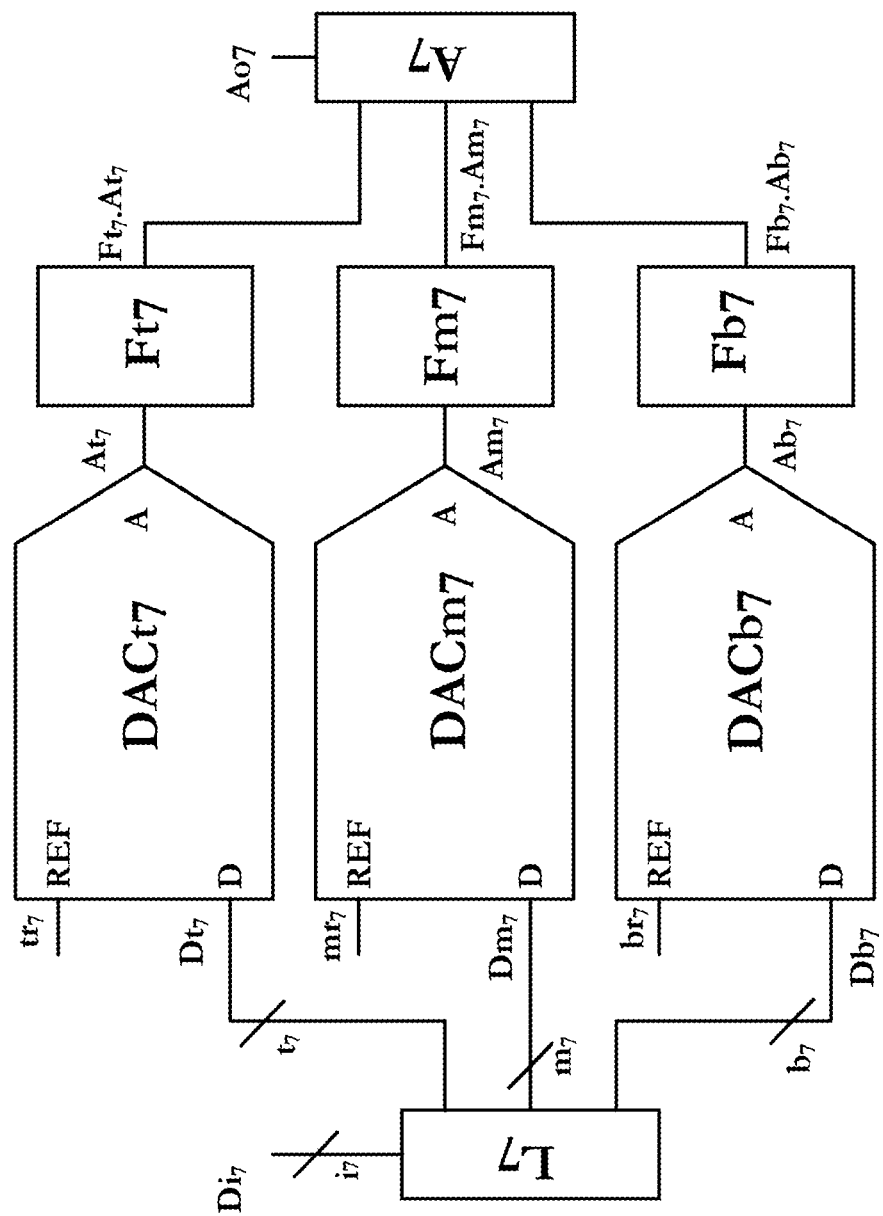
FIG. 7 is a simplified functional block diagram illustrating a factorized iDAC method.

Section 7—Description of FIG. 7

FIG. 7 is a simplified functional block diagram illustrating a factorized iDAC method.

As noted earlier, a DAC's input-to-output transfer function can be described as follow:

$$A_o = (A_r/2^j) \times \sum_{i=1}^{n} [D_i \times 2^{i-1}],$$

where $A_o$ is the DAC's analog output signal, $A_r$ is the DAC's analog reference signal, $D_i$ is the DAC's digital inputs signal that are n-bits wide. For example, for n=6, and $A_r$=1 units which establishes $A_o$'s full scale value of 1 unit. For a ½ unit or half-scale of a 6-bit wide digital word corresponds to $D_i$=100000 or $D_6$=1, and $D_5$=$D_4$=$D_3$=$D_2$=$D_1$=0, the DAC's input-to-output transfer function would be as follows: $A_o$= $(A_r/2^6) \times [D_1 \times 2^0 + D_2 \times 2^1 + D_3 \times 2^2 + D_4 \times 2^3 + D_5 \times 2^4 + D_6 \times 2^5]$= $(A_r/2^6) \times [0 \times 2^0 + 0 \times 2^1 + 0 \times 2^2 + 0 \times 2^3 + 0 \times 2^4 + 1 \times 2^5] = (A_r/2^6) \times [1 \times 2^5] = A_r/2 = ½$ full-scale.

Notice that the term $(A_r/2^6)$ carries the analog equivalent weight of a least significant bit (LSB) or $A_{LSB}$, which is binarily weighted (up to $2^{i-1}$ with 1<i<n=6 where i is an integer) to generate the DAC's $A_o$ (that is proportional to the DAC's $A_r$) and in accordance with the DAC's $D_i$. Here, let $2^{i-1} = 2j \times 2^k = w_i \times f_i$ where $w_i$ and $f_i$ represent the factors of $2^{i-1}$, and where there can be found a pair of $w_i$ and $f_i$ factors whose sum is the smallest compared to $w_i \times f_i$. In other words, there can be found a pair of $w_i$ and $f_i$ where $w_i + f_i \ll w_i \times f_i$. For example, for n=i=6→$2^{i-1} = 2^5 = 32 = 2^j \times 2^k = 2^3 \times 2^2 = w_6 \times f_6 = 16 \times 2 = 8 \times 4$ where the sum of the pairs of factors here are the smallest compared to the multiplication of the pairs of factors (e.g., with j=2, k=3 or $w_6$=8 and $f_6$=4 for which 4+8≪8×4).

The factorized DAC method factorizes a respective binary DAC weights, which reduces the DAC's area and cost. The respective binary DAC weights ($2^{i-1}$) can be generated by feeding the respective binary DAC weight's factor ($2^j = w_i$) into its other factor ($2^k = f_i$) wherein $2^{i-1} = 2^j \times 2^k = w_i \times f_i$. Utilizing the factorized DAC method, the circuit area occupied by the respective binary DAC weight's factors ($2^j = w_i$ and $2^k = f_i$ in aggregate) can be optimized to occupy a smaller area compared to that of the conventional respective binary DAC weights ($2^{i-1}$).

For example, a standard 6-bit iDAC is comprised of a plurality of binary scaled switching current source (cells) where each current source cell carries a current weight of $A_r/2^6$ which is a Least-Significant-Bit or LSB. The current source cells are binarily and respectively scaled in parallel to arrange the standard iDAC's binary weighted current switching reference network. For example, the standard iDAC's Most-Significant-Bit (MSB) analog current portion is generated by placing in parallel 32 of LSB current source cells $(A_r/2^6)$ which generates $32 \times A_r/2^6 = A_r/2$. Accordingly, the MSB of a 6-bit standard iDAC's switching current sources would occupy the size of $2^{i-1} = 2^5 = 32$ of LSB switching current source cells that are arranged in parallel.

In comparison, the disclosed factorized iDAC method generates the same $32 \times A_r/2^6 = A_r/2$ or the MSB analog current portion with more area efficiently. The factorized iDAC method, feeds the output current of $2^j = 2^3 = w_6 = 8$ parallel LSB current switches (where each current switch carries a current with the weight of an $A_{LSB}$) onto a current mirror with a gain of $2^k = 2^2 = f_6 = 4$. The current mirrors can be arranged to have the same size as the factorized iDAC's LSB current source cells for matching purposes. As such, for the factorized iDAC method, the MSB analog current portion of $32 \times A_r/2^6 = A_r/2$, while occupying an equivalent aggregate current switch area of $2^j + 2^k = 2^3 + 2^2 = 8 + 4 = 12$ LSB current source cells. In comparison, and as noted earlier, an equivalent aggregate current source cell $2^5 = 32$ LSB current cells would be required for a standard iDAC.

Note that there is a trade-off between reducing the area achieved by utilizing the factorized DAC method, and reducing the accuracy of the DAC. For example, the mismatch attributed to current source cells that constitute $w_6$ (subordinate DAC weight) are multiplied with the mismatch attributed to the current source cells that constitute $f_6$. (factorized scale), which lowers the accuracy of the overall DAC while reducing its size.

The area reduction benefit of the factorized DAC method can be extended for high resolution DACs comprising of plurality of factorized DACs. For example, a 6-bit DAC can be arranged by utilizing two factorized DACs (e.g., a 3-bit factorized Most-Significant-Portion of MPS DAC, and a 3-bit factorized Least-Significant-Portion or LSP DAC). Alternatively, a 6-bit DAC can be arranged by utilizing three factorized DACs (e.g., a 2-bit factorized top portion DAC, a 2-bit factorized middle portion DAC, and a 2-bit factorized bottom portion DAC).

As noted, earlier FIG. 7 is a functional block diagram illustrating a DAC comprising of three factorized DACs, but the same factorized method is applicable for example to 2 or 4 (instead of 3) factorized DACs.

In FIG. 7, the digital inputs $Di_7$ that is $i_7$-bit wide is applied to a logic block $L_7$ that arranges the digital input bits to three segments: First, a $t_7$-bit wide top-portion-bits or $Dt_7$ word. Second, a $m_7$-bit wide middle-portion-bits or $Dm_7$ word. And third, a $b_7$-bit wide bottom-portion-bits or $Db_7$ word.

In FIG. 7's illustration of factorized DAC method, the digital input words $Dt_7$, $Dm_7$, and $Db_7$ are fed onto three binary weighted subordinated factorized DACs: a top-DAC ($DACt_7$), a middle-DAC ($DACm_7$), and a bottom-DAC ($DACb_7$), respectively. The three respective top, middle, and bottom DACs receive a top-analog-reference signal ($tr_7$), a middle-analog-reference signal ($mr_7$), and a bottom-analog-reference signal ($br_7$), respectively. Accordingly, the three respective top, middle, and bottom subordinated factorized DACs generate a top-weight analog output signal ($At_7$), a middle-weight analog output signal ($Am_7$), and a bottom-weight analog output signal ($Ab_7$), respectively. The $At_7$, $Am_7$, and $Ab_7$ are then gained up by top-factor scale ($Ft_7$), a middle-factor scale ($Fm_7$), and a bottom-factor scale ($Fb_7$) whose respective output products $At_7 \times Ft_7$, $Am_7 \times Fm_7$, and $Ab_7 \times Fb_7$ are summed by an analog block $A_7$ to generate a final factorized DAC analog output signal, $Ao_7$. The three full-scale weights of $At_7$, $Am_7$, and $Ab_7$ can be programmed as a function of the ratio of the three reference analog signals $tr_7$, $mr_7$, and $br_7$. Programming the middle-factor scale $Fm_7=1$ as the base-factor, then $Ft_7=2^{t_7}/(tr_7/mr_7)$ relative to the base-factor, and $Fb_7=(½^{m_7}) \times (mr_7/br_7)$ relative to the base-factor.

Consider that for practical purposes (without any DAC calibration or trimming): The three digital bits $t_7$, $m_7$, and $b_7$ can be more than 1-bit and less than 8-bit wide. The three factor scales $Ft_7$, $Fm_7$, and $Fb_7$ can be programmed to gains than zero and less than 16 (without calibration or trimming): The ratio of analog reference signals $tr_7/mr_7$ and $mr_7/br_7$ can be programmed to ratios more than zero and less than 16 (without calibration or trimming).

For example, let's arrange the three subordinated factorized DAC's digital-bits $t_7=m_7=b_7=2$ bits each. Let's also program the three subordinated factorized DAC's reference analog signals substantially equally as $tr_7=mr_7=br_7=1w$. Accordingly, the three factor scales are programmed according to: $Ft_7=2^{t_7}/(tr_7/mr_7)=2^2/(1)=4$ and $Fb_7=(\frac{1}{2}^{m_7})\times(mr_7/br_7)=(\frac{1}{2}^2)\times(1)=\frac{1}{4}$. Again, notice that the three full-scale weights of $At_7$, $Am_7$, and $Ab_7$ are programmed as a function of the ratio of the three reference analog signals $tr_7$, $mr_7$, and $br_7$.

In an alternative example, arranging the three subordinated factorized DAC's digital-bits $t_7=m_7=b_7=2$ bits each, and programming the three subordinated factorized DAC's reference analog signals as $tr_7=4w$, $mr_7=2w$, and $br_7=1w$, then the three factors are programmed according to: $Ft_7=2^{t_7}/(tr_7/mr_7)=2^2/(4w/2w)=2$ and $Fb_7=(\frac{1}{2}^{m_7})\times(mr_7/br_7)=(\frac{1}{2}^2)\times(2w/1w)=2$.

It is of note that for a standard binary 6-bit DAC, a scale factor of $2^{6-1}=32$ LSB weights (32×) are needed to generate just the MSB signal as a multiple of the LSB weight. In comparison, for a 6-bit factorized DAC that is described in the above 2 examples, the largest scale factor is 4x to generate any bit, including the MSB. In the above 2 example, the largest scale factor is 4x in the three subordinate factorized DAC s ($At_7$, $Am_7$, and $Ab_7$ whose full-scale outputs are programmed with $tr_7/mr_7$ and $mr_7/br_7$ ratios) as well as in the factor blocks $Ft_7$, $Fm_7$, and $Fb_7$. Accordingly, smaller scale factors result in smaller DAC area and as well as other benefits such as improved dynamic response, which will be described further in the following DAC circuit embodiments that utilize the factorized DAC method.

Figure 8:
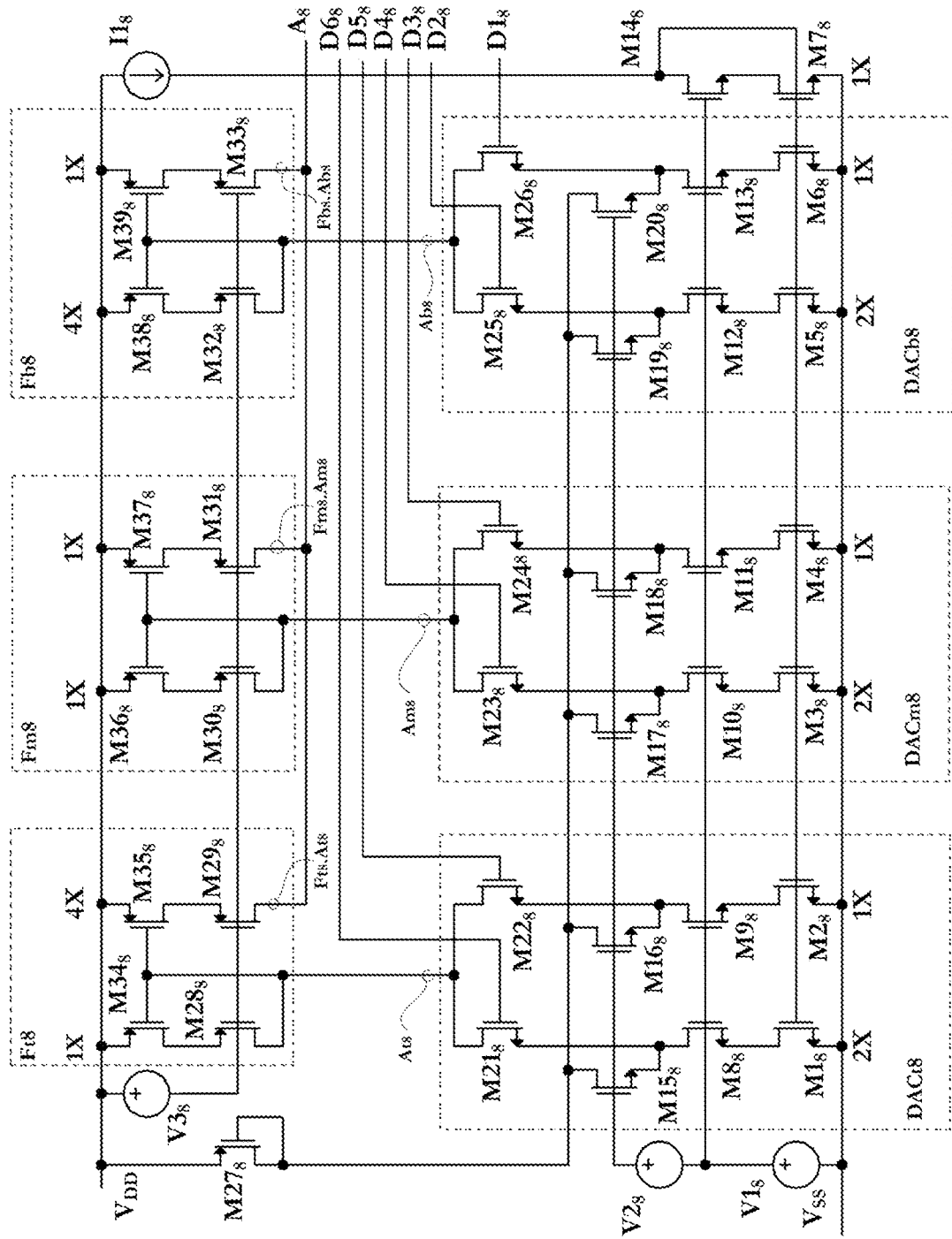
FIG. 8 is a simplified circuit schematic diagram illustrating an embodiment of an iDAC that utilizes the factorized iDAC method illustrated in FIG. 7.

Section 8—Description of FIG. 8

FIG. 8 is a simplified circuit schematic diagram illustrating an embodiment of an iDAC that utilizes the factorized iDAC method described and illustrated in section 7 FIG. 7.

In FIG. 8, the illustrated factorized iDAC is comprising of three subordinated factorized iDAC blocks $DACt_8$, $DACm_8$, and $DACb_8$ which are analogous to $DACt_7$, $DACm_7$, and $DACb_7$ of FIG. 7. Moreover, in FIG. 8, the three factor blocks $Ft_8$, $Fm_8$, and $Fb_8$ are analogous to $Ft_7$, $Fm_7$, and $Fb_7$ of FIG. 7. As noted earlier, the embodiment of the factorized DAC method is illustrated with combining three subordinated factorized iDACs (and their respective factor blocks) in FIG. 8. However, the factorized method is flexible in utilizing, for example, two or four subordinated factorized iDACs (and their respective factor blocks), depending on the end-application's feature-benefit-cost requirements.

In FIG. 8, the factorized iDAC's reference current source $I1_8$ sets the gate-to-source voltage of $M7_8$ which is scaled and mirrored onto $M1_8$-$M2_8$, $M3_8$-$M4_8$, and $M5_8$-$M6_8$ which are a binary weighted current source networks, belonging to the three subordinated factorized iDACs: $DACt_8$, $DACm_8$, and $DACb_8$, respectively. The digital word $Di_7$ in FIG. 7 is analogous FIG. 8's $Di_8$ digital word comprising of digital bits $D6_8$-$D5_8$-$D4_8$-$D3_8$-$D2_8$-$D1_8$. The digital words $Dt_7$, $Dm_7$, and $Db_7$ in FIG. 7 are analogous to digital words $D6_8$-$D5_8$, $D4_8$-$D3_8$, and $D2_8$-$D1_8$ of FIG. 8, respectively. Note that for clarity of illustration the factorized iDAC's resolution is arranged with 6-bit, but the resolution can be higher such as 16-bits. In FIG. 7, signals $At_7$, $Am_7$, and $Ab_7$ are analogous to current signals designated as $At_8$, $Am_8$, and $Ab_8$ in FIG. 8, which are the current output signals of subordinated factorized iDAC blocks $DACt_8$, $DACm_8$, and $DACb_8$, respectively. In FIG. 7, designated signals $Ft_7 \times At_7$, $Fm_7 \times Am_7$, and $Fb_7 \times Ab_7$ are analogous to current signals designated as $Ft_8 \times At_8$, $Fm_8 \times Am_8$, and $Fb_8 \times Ab_8$ in FIG. 8, which are the current output signals of factor blocks $Ft_8$, $Fm_8$, and $Fb_8$, respectively. In FIG. 8, current output signals of factor blocks $Ft_8$, $Fm_8$, and $Fb_8$ are coupled (summed) at node $A_8$. As such the factorized iDAC output current signal is $A_8=Ft_8 \times At_8\ Fm_8 \times Am_8+Fb_8 \times Ab_8$.

Given that the three subordinated factorized iDACs (i.e., $DACt_8$, $DACm_8$, and $DACb_8$) in FIG. 8 are identical, only the subordinated factorized $DACt_8$'s operation is briefly described. Let the $I1_8=w$ as the $DACt_8$'s reference analog current input signal, which is scaled and mirrored onto the subordinated factorized $DACt_8$'s current source network comprising of $I_{N1_8}=2w$ and $I_{N2_8}=1w$. Consider that $M1_8$ and $M2_8$ are cascaded by $M8_8$ and $M9_8$ (biased with $V1_8$), respectively, to raise the current sources output impedance. The $I_{N1_8}=I_{N8_8}=2w$ is coupled with a current switch comprising of $M15_8$ and $M21_8$. The $M15_8$ is biased at a fixed voltage $V2_8+V1_8$ that can be biased at approximately $(V_{DD}+V_{SS})/2$, which would enable $M15_8$, $M21_8$ to switch $I_{N8_8}=I_{N1_8}$ to two paths: When $D6_8$ is in the low ($V_{SS}$) states, $I_{N1_8}$ flows through $M15_8$ (that is turned on) and onto $M27_8$. The aim of diode connected $M27_8$ is to substantially equalize the drain terminal voltage of $M8_8$ at roughly $V_{DD}-V_{GSpmos}$, while $D6_8$ is toggled between high or low states, which improves the iDAC's dynamic response. Similarly, $I_{N2_8}=I_{N9_8}=1w$ is coupled with a current switch comprising of $M16_8$ and $M22_8$. Also, $M16_8$ is biased at a fixed voltage $V2_8+V1_8$. When $D5_8$ is in the high states, the $I_{N2_8}$ flows through $M22_8$ and again onto node $At_8$. When $D5_8$ is in the low states, the $I_{N2_8}$ flows through $M16_8$ and onto the diode connected $M27_8$, which again substantially equalizes the drain terminal voltage of $M8_8$ at roughly $V_{DD}-V_{GSpmos}$, when $D5_8$ is toggled between high or low states, which improves the iDAC's dynamic response. Notice that the full-scale current signal flowing through the node designated as $A_{t8}$ is $2 \times I1_8+1 \times I1_8=3 \times I1_8=3w$, which is the full-scale output current signal for subordinated factorized $DACt_8$.

Similarly, the current signals through nodes designated as $Am_8$ and $Ab_8$ (which are generated by the subordinated factorized $DACm_8$ and $DACb_8$, respectively) both have a full-scale current of $3w$. Consider that $tr_8$, $mr_8$, and $br_8$ are the equivalent full-scale reference signal for the subordinated factorized $DACt_8$, $DACm_8$ and $DACb_8$, respectively, which are analogous to the terminology $tr_7$, $mr_7$, $br_7$ described in section 7, FIG. 7. Since the three subordinated factorized iDAC's reference analog signals (full-scale values) are arranged substantially equally (i.e., equivalent $tr_8=mr_8=br_8=3w$), then the three other factor scales are programmed according to: $Fm_8=1$ as base value, $Ft_8=2^{t_8}/(tr_8/mr_8)=2^2/(1)=4$ and $Fb_8=(\frac{1}{2}^{m_8})\times(mr_8/br_8)=(\frac{1}{2}^2)\times(1)=\frac{1}{4}$, taking into consideration that $DACt_8$ is a 2-bit DAC ($t_8=2$) and $DACm_8$ is a 2-bit DAC ($m_8=2$).

Accordingly, the full-scale value of the factorized iDAC which is $A_8=Ft_8\times At_8+Fm_8\times Am_8+Fb_8\times Ab_8=4\times 3w+1\times 3w+\frac{1}{4}\times 3w=w\times15\frac{3}{4}$. Given that $I1_8=w$, the full-scale value of $A_8$ can be adjusted in accordance with $w\times15\frac{3}{4}$ (from nano amperes to milliamperes scales) depending on the applications requirements.

As noted earlier, the accuracy of the factorized DAC is dominated by matching of components in the signal path of the most significant bits (MSB). As such, design and FET layout care can help the matching between $M1_8$-$M2_8$ in the subordinated factorized $DACt_8$ block and matching between $M34_8$-$M35_8$ in the $Ft_8$ block which arrange the factorized iDAC's MSB and dominate the accuracy of the overall factorized DAC. Moreover, subordinated factorized $DACt_8$ can be arranged in a segmented fashion (disclosed next in section 9, FIG. 9) to improve accuracy and reduce the glitch.

Also, it would obvious to one skilled in the art to further reduce the size and cost of FIG. 8's circuit by eliminating the cascoded FETs $M28_8$ to $M33_8$ as well as $M8_8$ to $M14_8$ in applications where low power supplies with low $V_{DD}$ variations are available, and or low cost calibration (trimming) is available to adjust gain error and full-scale.

The benefits of factorized DAC, including that of factorized iDAC are summarized below:

First, factorized iDAC is smaller than standard iDACs, and here is how: A standard binary weighted iDAC's current source network (as part of the iDAC's input-to-output transfer function network) is comprising of scaled current sources as follows: the MSB current source sized at $2^5x=32x$ scaled through ($2^4x=16x$, $2^3x=8x$, $2^2x=4x$, $2^1x=2\times$) to the LSB current source cell sized at $2^0$ x=1x, where x is an equivalent current source cell that carries an LSB current weight. As such, for a standard 6-bit iDAC, about 63x current sources are required.

In comparison (setting aside the cascoded FETs and current switches), a factorized iDAC illustrated in FIG. 8 would require: 2x+1x, 2x+1x, 2x+1x current source cells for the three subordinated factorized iDACs ($DACt_8$, $DACm_8$, and $DACb_8$) plus 4x+1x, 1x+1x, 1x+4x (equivalent size x current source cell) for the three current mirrors in factor blocks ($Ft_8$, $Fm_8$, and $Fb_8$). As such, for a 6-bit iDAC utilizing the factorized DAC method, 21x equivalent current source cells are required, which is about 3 times smaller than a conventional iDAC.

For higher resolution DACs, the factorized DAC method is even more area efficient.

Second, dynamic response is faster than conventional iDACs because factorized DACs smaller sized input-to-output transfer function network utilizes smaller FETs with smaller capacitances, which can be charged and discharged faster.

Third, glitch is lower during code transitions compared to standard DACs, again because factorized DACs smaller input-to-output transfer function network utilizes smaller devices that carry smaller capacitances, which inject fewer analog glitches to the output of the DAC during digital input code transitions.

Fourth, dynamic power consumption is lower because a factorized DAC's smaller sized FETs (in the input-to-output transfer function network) would consume less dynamic current to drive smaller devices during digital input code transitions.

Fifth, utilizing the factorized DAC method in a current-mode DAC (iDAC) is inherently fast.

Sixth, factorized iDAC can operate with low power supply since its operating headroom can be limited by a FET's VGS+VDS.

Seventh, utilizing the factorized iDACs in subthreshold region can further reduce power consumption and lower power supply voltage.

Eight, factorized iDAC can be programmed for a non-linear (e.g., logarithmic or square) input-to-output transfer function.

Ninth, running the CMOSFETs in subthreshold enables the factorized iDAC to operate with ultra-low currents, low power supply, and ultra-low power consumption suitable for mobile applications, especially in AI and ML applications that require numerous ultra-low power and low power supply DACs for computation.

Tenth, neither any capacitors nor any resistors are needed, which facilitates fabricating the factorized iDAC in standard digital CMOS manufacturing factory that is low cost, mainstream and readily available for high-volume mass production applications, and proven for being rugged and having high quality.

Eleventh, factorized iDAC can be arranged free of clock, suitable for asynchronous (clock free) computation.

Twelfth, factorized iDAC can utilize same type of MOSFET current sources and MOSFET switches that are symmetric, matched, and scaled. This trait facilitates devices parameters to track each other over process, temperature, and operating condition variations. Accordingly, the iDAC's temperature coefficient, power supply coefficient, and AC power supply rejection performance can be enhanced.

Thirteenth, the embodiment disclosed here is not restricted by FETs having to operate either in saturation (high-currents) or subthreshold (low currents). For example, some analog signal processing units rely on operating transistors in the subthreshold regions which restricts the dynamic range of analog signal processing circuits to low current signals. Also, some other analog signal processing units rely on operating transistors with high currents in the saturation regions which restricts the dynamic range of analog signal processing circuits to higher current signals.

Figure 9:
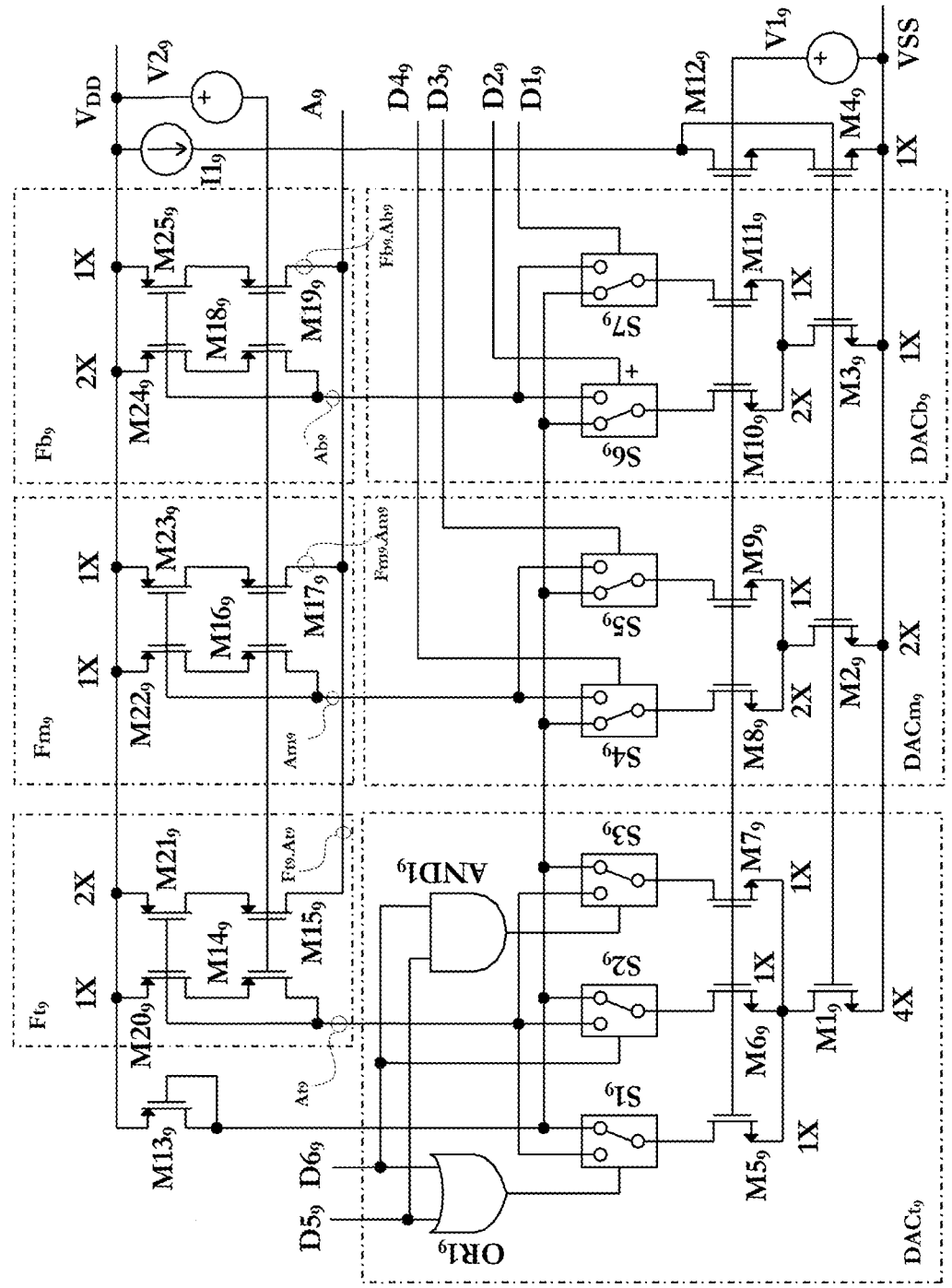
FIG. 9 is a simplified circuit schematic diagram illustrating another embodiment of an iDAC that combines the factorized and floating DAC methods illustrated FIG. 7 and FIG. 1, respectively.

Section 9—Description of FIG. 9

FIG. 9 is a simplified circuit schematic diagram illustrating another embodiment of an iDAC that combines the factorized and floating iDAC methods described in sections 7 and 1, and illustrated FIGS. 7 and 1, respectively.

The three subordinated iDACs in FIG. 9 utilize a combination of both the factorized DAC method and the floating iDAC methods. Also, the top subordinate $DACt_9$ utilizes floating iDAC method as well as segmentation to improve accuracy and reduce glitch associated with digital input code transitions.

In FIG. 9 illustration, the factorized floating iDAC is comprising of three factorized floating subordinated iDACs depicted in blocks $DACt_9$, $DACm_9$, and $DACb_9$ (which are analogous to $DACt_8$, $DACm_8$, and $DACb_8$ of FIG. 8). The factor blocks $Ft_9$, $Fm_9$, and $Fb_9$ are analogous to $Ft_8$, $Fm_8$, and $Fb_8$ of FIG. 8. Notice that the digital input word $Di_8$ comprising of the digital bits $D6_8$ to $D1_8$ in FIG. 8 are analogous to the factorized floating iDAC's digital input word $Di_9$ comprising of the digital bits $D6_9$ to $D1_9$ of FIG. 9, respectively. Again, bear in mind that for clarity of illustration the main factorized floating iDAC in FIG. 9 is arranged with 6-bit of resolution (comprising of the three 2-bit factorized floating subordinated iDACs: $DACt_9$, $DACm_9$, and $DACb_9$) but the factorized floating iDAC resolution can be higher, such as 16-bit. Also, it would be obvious to one skilled in the art that iDACs can be arranged with less than three factorized floating subordinated iDACs (e.g., two) or more than three (e.g., four or five).

The factorized floating iDAC's reference current source $I1_9$ sets the gate-to-source voltage of $M4_9$ which is scaled and mirrored onto $M1_9$, $M2_9$, and $M3_9$ which program the full-scale weights of the three factorized floating subordinated iDACs: $DACt_9$, $DACm_9$, and $DACb_9$, respectively. Also notice that signals $At_8$, $Am_8$, and $Ab_8$ in FIG. 8 are analogous to current signals designated as $At_9$, $Am_9$, and $Ab_9$ in FIG. 9 which are the current output signals of the three subordinated iDAC blocks $DACt_9$, $DACm_9$, and $DACb_9$, respectively. In FIG. 8, designated signals $Ft_8 \times At_8$, $Fm_8 \times Am_8$, and $Fb_8 \times Ab_8$ analogous to current signals designated as $Ft_9 \times At_9$, $Fm_9 \times Am_9$, and $Fb_9 \times Ab_9$ in FIG. 9, which are the current output signals of factor blocks $Ft_9$, $Fm_9$, and $Fb_9$, respectively. In FIG. 9, current output signals of factor blocks designated as $Ft_9$, $Fm_9$, and $Fb_9$ are coupled (summed) at node $A_9$. As such the factorized floating iDAC output current signal is $A_9 = Ft_9 \times At_9 + Fm_9 \times Am_9 + Fb_9 \times Ab_9$.

As noted earlier, the three factorized floating subordinated iDACs in FIG. 9 utilize a combination of both the factorized DAC method (described in section 7, FIG. 7), and the floating iDAC method (described in section 1, FIG. 1). In FIG. 9, a central reference current $I1_9 = w$ flows through $M4_9$ that is sized at 1x, which programs $I_{M49} = w$ that is mirrored and scaled onto: $M1_9$ sized at 4x with $I_{M1_9} = 4 \times w$, $M2_9$ sized at 2x with $I_{M1_9} = 2 \times w$, and $M3_9$ sized at 1x with $I_{M1_9} = 1 \times w$. Consider that $I_{M1_9}$, $I_{M2_9}$, and $I_{M3_9}$ are the reference analog signals $tr_9 = 4w$, $mr_9 = 2w$, and $br_9 = 1w$ (analogous to the terminology $tr_7$, $mr_7$, $br_7$ described in section 7, FIG. 7) that are applied to the factorized floating subordinated $DACt_9$, $DACm_9$ and $DACb_9$, respectively, which also set the said three factorized floating subordinated iDAC's full-scale current output signals through nodes designated as $At_9$, $Am_9$ and $Ab_9$, respectively. As such, the three factor scales are programmed according to: For $Fm_9 = 1$ as base factor scale, $Ft_9 = 2^{t_9}/(tr_9/mr_9) = 2^2/(2) = 2$ and $Fb_9 = (\frac{1}{2}^{m_9}) \times (mr_9/br_9) = (\frac{1}{2}^2) \times (2) = \frac{1}{2}$, also considering that $DACt_9$ is a 2-bit iDAC ($t_9 = 2$) and $DACm_9$ is a 2-bit iDAC ($m_9 = 2$).

Accordingly, the full-scale value of the factorized floating iDAC output is $A_9 = Ft_9 \times At_9 + Fm_9 \times Am_9 + Fb_9 \times Ab_9 = 2 \times 4w + 1 \times 2w + \frac{1}{2} \times 1w = w \times 10\frac{1}{2}$. Given that $I1_9 = w$, the full-scale value of $A_9$ output signal can be adjusted (from nano amperes to milliamperes scales) depending on the applications requirements.

Notice that $V1_9$ biases the floating current sources $M5_9$ to $M11_9$. For applications where high-accuracy and higher iDAC output currents may be required, instead of one voltage source such as $V1_9$, up to three voltage sources can be utilized: such as one for each group of floating current sources $M5_9$ to $M7_9$, one for $M4_9$ to $M5_9$, and one for $M10_9$ to $M12_9$. In doing so, the $V_{DS}$ or drain-to-source voltages of $M1_9$ to $M4_9$ would match which reduces scaled second order systematic error due $V_{ts}$ mismatch between $M1_9$ to $M4_9$ currents. The current switches $S1_9$ to $S7_9$ (when in their off states) are terminated onto a diode connected $M13_9$ which is a $VGS_{PMOS}$ below $V_{DD}$ that roughly matches (to first order) the $VGS_{PMOS}$ of diode connected $M20_9$, $M22_9$, and $M24_9$. As such, the transient and dynamic performance of the iDAC is improved since the drain terminal of FETs $M5_9$ to $M11_9$ are roughly balanced at $V_{DD} - VGS_{PMOS}$ as the iDAC's codes toggle between on and off states.

Additionally, $DACt_9$ is arranged with segmentation to improve accuracy since $DACt_9$ carries the analog weight of the first 2 most significant bits. Here, $D6_9$ and $D5_9$ are fed to a 2-to-3 bit encoder (comprising of $AND1_9$ and $OR1_9$) whose digital outputs control the $DACt_9$'s current switches. As such, the $DACt_9$'s substantially equal current source segments ($I_{M5_9}$, $I_{M6_9}$, and $I_{M7_9}$) are turned on-or-off one at a time (e.g., thermometer fashion), which improves accuracy and lowers the digital input code to analog output glitching. As noted earlier, the motivation for segmenting the MSB (as noted earlier) is that the accuracy of the factorized DAC is dominated by the MSB input-to-output transfer function network.

Excluding the cascoded current mirrors and current switches, the disclosed 6-bit iDAC in FIG. 9 occupies the equivalent area of about 24x current source cells, compared to that of a standard iDAC requiring about 63x current source cells, where x is an equivalent current source cell that carries an LSB current weight. In summary, some of the benefits of the factorized floating iDAC embodiment illustrated in FIG. 9 includes some of the benefits of the floating iDAC described in section 2, FIG. 2, in addition to some of the benefits of the factorized iDAC described in section 8, FIG. 8. Moreover, arranging the MSB factorized iDAC ($DACt_9$) in a segmented manner has the benefit of improved accuracy as well as lowering the iDAC's glitch.

Figure 10:
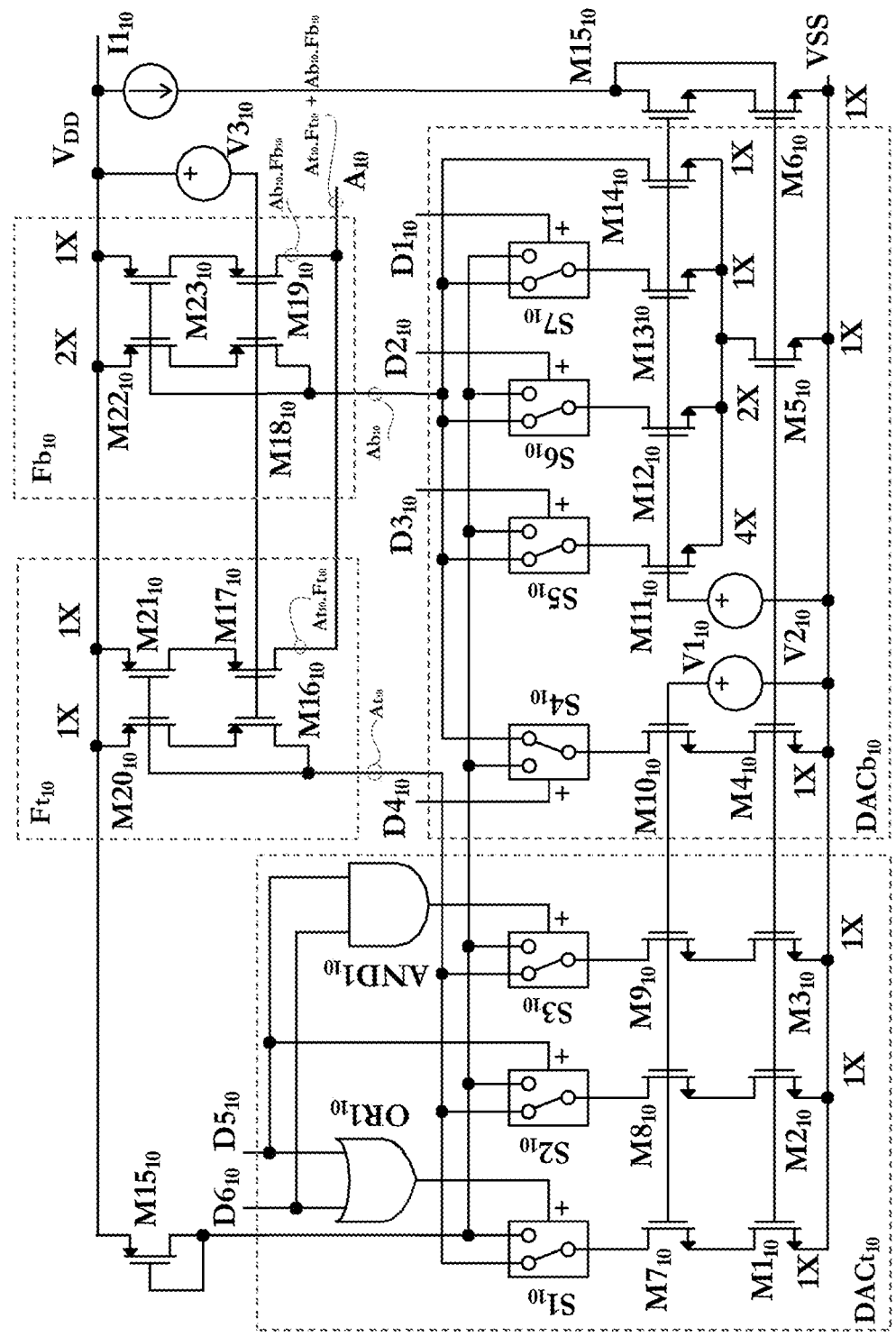
FIG. 10 is a simplified circuit schematic diagram illustrating another embodiment of another iDAC that utilizes the factorized and floating DAC methods illustrated FIG. 7, and FIG. 1, respectively.

Section 10—Description of FIG. 10

FIG. 10 is a simplified circuit schematic diagram illustrating another embodiment of another iDAC that utilizes the factorized and floating DAC methods described in sections 7 and 1, and illustrated FIGS. 7 and 1, respectively.

The two subordinated iDACs in FIG. 10 utilize a combination of both the factorized DAC method and the floating iDAC methods. The $DACt_{10}$, utilizes conventional 2-bit iDAC that is segmented for improve accuracy and lower glitch associated with the first 2 MSBs code transitions.

In FIG. 10, the illustrated factorized floating iDAC is comprising of two subordinated iDACs illustrated in blocks $DACt_{10}$ (subordinated segmented factorized iDAC) and $DACb_{10}$ (subordinated factorized floating iDAC) that operate in conjunction with the factor blocks $Ft_{10}$, and $Fb_{10}$. The iDAC's digital input word $D_{i10}$ comprising of the digital bits $D1_{10}$ to $D6_{10}$, respectively. Again, bear in mind that for clarity of illustration the overall factorized floating iDAC in FIG. 10 is arranged with 6-bit of resolution (comprising of $DACt_{10}$ that is a subordinated 2-bit segmented factorized iDACs, and the factorized floating 4-bit $DACb_{10}$) but overall resolution of the factorized floating iDAC can be higher, such as 16-bit.

In FIG. 10, signals $At_{10}$ and $Ab_{10}$ depict the current output signals of the two subordinated iDAC blocks $DACt_{10}$ and $DACb_{10}$, respectively. Current signals designated as $At_{10} \times Ft_{10}$ and $Ab_{10} \times Fb_{10}$ are the current output signals of factor blocks $Ft_{10}$ and $Fb_{10}$, respectively. In FIG. 10, current output signals of factor block $Ft_{10}$ and $Fb_{10}$ are coupled (summed) at node $A_{10}$. As such, in FIG. 10, the factorized floating iDAC output current signal is $A_{10} = Ft_{10} \times At_{10} + Fb_{10} \times Ab_{10}$.

The iDAC's reference current source in FIG. 10 is $I1_{10}$ which programs the gate-to-source voltage of $M6_{10}$ that is scaled and mirrored onto $M1_{10}$, $M2_{10}$, and $M3_{10}$, which together program the full-scale weights of $DACt_{10}$. Moreover, the gate-to-source voltage of $M6_{10}$ is mirrored onto $M4_{10}$, and $M5_{10}$, which together program the full-scale weight of $DACb_{10}$. Note that the drain current of $M5_{10}$ that is $I_{M5_{10}}$, supplies the floating current to the floating section of the $DACb_{10}$ comprising of $M11_{10}$, $M12_{10}$, $M13_{10}$, and $M14_{10}$, which are binary scaled at 4x, 2x, 1x, and 1x, respectively. Let's set $I1_{10} = w$, then $I_{M4_{10}} = I_{M5_{10}} = I_{M6_{10}} = I1_{10} = I_{M10_{10}} = w$, $I_{M11_{10}} = w/2$, $I_{M12_{10}}/4 = w/4$, $I_{M13_{10}} = w/8$, and $I_{M14_{10}} = w/8$. Also, $M1_{10}$, $M2_{10}$, and $M3_{10}$ sized at 1x with $I_{M1_{10}} = I_{M2_{10}} = I_{M3_{10}} = I_{M6_9} = 1 \times w$. Accordingly, the full scale value of $At_{10}$ which is the output current for $DACt_{10}$ is then $3w$ that also represents $tr_{10}$. The full scale value of $Ab_{10}$ which is the output current for $DACb_{10}$ is $2w$ that also represents $br_{10}$. Since there are only a top iDAC ($DACt_{10}$) and a bottom iDAC ($DACb_{10}$), the programming of factor values are more straight forward: The LSB weight of $DACt_{10}$ is w and the LSB weight of $DACb_{10}$ is w/8, which makes their ratio=8. Considering that $DACt_{10}$ is a 2-bit iDAC ($t_{10}$=2), then $2^{t_{10}}$=4, which computes to $4/8$=½ or $Ft_{10}$=1 and $Fb_{10}$=½ for current mirrors with the smallest FET ratio. Accordingly, the full-scale value of the factorized iDAC output $A_{10}$=$Ft_{10} \times At_{10}$+$Fb_{10} \times Ab_{10}$=1×3w+½× 2w=w×4. Given that $I1_{10}$=w, the full-scale value of $A_{10}$ output signal can be adjusted (from nano-amperes to milli-amperes scales) depending on the applications requirements.

Notice that $V1_{10}$ and $V2_{10}$ bias the floating current sources $M7_{10}$ to $M9_{10}$ of $DACt_{10}$, and $M10_{10}$ to $M14_{10}$ of $DACb_{10}$, respectively. By having separate $V1_{10}$ and $V2_{10}$, the $V_{DS}$ or drain-to-source voltages of $M7_{10}$ to $M14_{10}$ would match better which reduces (scaled) second order systematic error (due to drain-to-source or FET's $V_{DS}$ mismatch) between $M1_{10}$ to $M5_{10}$ currents. Also, as stated in the prior section, the iDAC's current switches (iSWs) $S1_{10}$ to $S7_{10}$, in their off states, are terminated onto a diode connected $M15_{10}$ which is a $VGS_{PMOS}$ (below $V_{DD}$) that roughly matches the $VGS_{PMOS}$ of diode connected $M20_{10}$ and $M22_{10}$. As such, the transient and dynamic performance of the factorized floating iDAC is improved since the drain terminal of FETs $M7_{10}$ to $M13_{10}$ are roughly balanced at $V_{DD}$–$VGS_{PMOS}$ as the iDAC's codes toggle between on and off states.

Additionally, $DACt_{10}$ is arranged with segmentation to improve accuracy. The two upper MSBs, $D6_{10}$ and $D5_{10}$ are fed to a 2-to-3 bit encoder (comprising of $AND1_{10}$ and $OR1_{10}$) whose digital output control the $DACt_{10}$'s switches. As such, the $DACt_{10}$'s substantially equal current source segments ($I_{M1_{10}}$, $I_{M2_{10}}$, and $I_{M3_{10}}$) turn on-or-off one at a time (e.g., in a thermometer fashion), which improves accuracy and lowers digital input code to analog output glitching. As stated earlier, the motivation for segmenting the MSB (as noted earlier) is that the accuracy of the factorized DAC is dominated by the accuracy of the MSB signal path.

Excluding the cascoded current mirrors and current switches, the disclosed 6-bit iDAC in FIG. 10 occupies the equivalent area of about 18x current source cells, compared to that of a conventional iDAC requiring about 63x current source cells, where x is an equivalent current source cell that carries an LSB current weight. In summary, some of the benefits of the factorized floating iDAC embodiment illustrated in FIG. 10 includes some of the benefits of the floating iDAC described in section 2, FIG. 2, in addition to some of the benefits of the factorized iDAC described in section 8, FIG. 8. Moreover, arranging the MSB factorized iDAC ($DACt_{10}$) in a segmented manner has the benefit of improved accuracy as well as lowering the iDAC's glitch.

Figure 11:
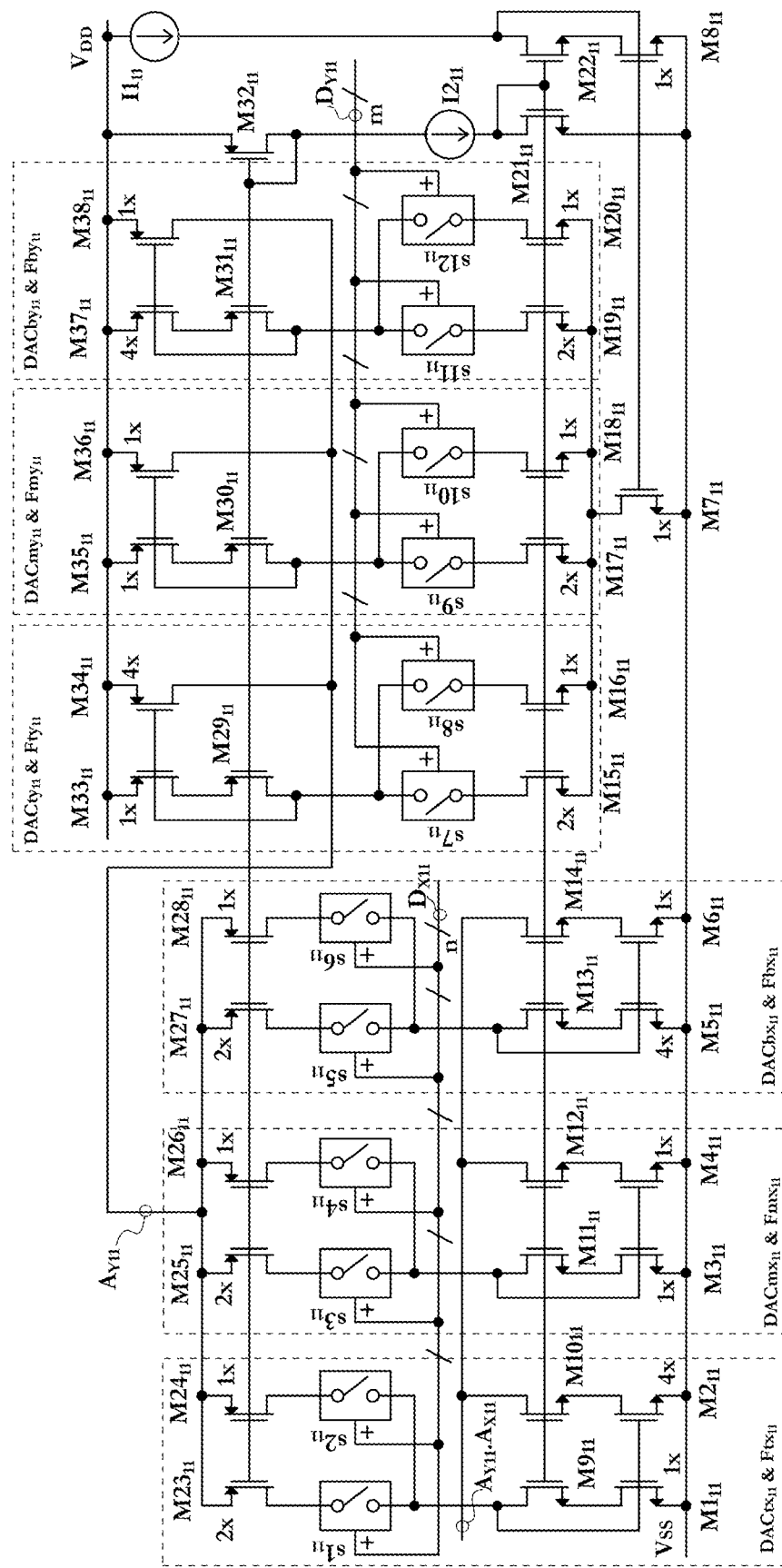
FIG. 11 is a simplified circuit schematic diagram illustrating an embodiment of a mixed-signal current-mode digital-input to analog-output multiplier ($XD_iI_o$) comprising of a first iDAC whose output is coupled to the reference input of a second iDACs, wherein the first and second iDACs utilize the factorized and floating DAC methods illustrated FIG. 7, and FIG. 1, respectively.

Section 11—Description of FIG. 11

FIG. 11 is a simplified circuit schematic diagram illustrating an embodiment of a mixed-signal current-mode digital-input to analog-output multiplier ($XD_iI_o$) comprising of a first iDAC whose output supplies the reference input to a second iDACs, wherein the first and second iDACs utilize the factorized and floating DAC methods illustrated FIG. 7, and FIG. 1, respectively.

As noted earlier, a simplified transfer function for an $$iDAC \text{ is: } I_o = I_R \sum_{i=1}^{k} D_i/2^i = (I_R/2^k) \sum_{i=1}^{k} D_i \times 2^{i-1} = \Delta_R \sum_{i=1}^{k} D_i \times 2^{i-1},$$

where for the iDAC, $I_o$ is the analog output current, $I_R$ is the reference input current that can set the full-scale value of $I_o$, $D_i$ is the digital input word (that is k-bits wide), and $\Delta_R$=($I_R/2^k$) represents an analog LSB current weight for $I_o$. For example, for a 6-bit iDAC, k=6, and full scale value of $I_o$ set to substantially equal $I_R$=64 nA, then LSB of the iDAC which is $\Delta_R$=($I_R/2^k$)=$\Delta_R$=(64 nA/$2^6$)=1 nA.

A simplified transfer function of a multiplier $XD_iI_o$ where a Y-iDAC's output supplies the reference input to a second X-iDAC is as follows:

$$I_{oy} = I_{Ry} \sum_{y=1}^{m} D_y/2^y = (I_{Ry}/2^m) \times \sum_{y=1}^{m} D_y \times 2^{y-1} = \Delta_{Ry} \times \sum_{y=1}^{m} D_y \times 2^{y-1}$$

where the analog output current is $I_{oy}$, the reference input current is $I_{RY}$ which can set the full-scale value of $I_{oy}$, the digital input word (that is m-bits) wide is $D_y$, and $\Delta_{Ry}$=($I_{Ry}/2^m$) represents an analog LSB current weight of $I_{oy}$.

Similarly, for the X-iDAC $$I_{ox} = I_{Rx} \sum_{x=1}^{n} D_x/2^x = (I_{Rx}/2^n) \times \sum_{x=1}^{n} D_x \times 2^{x-1} = \Delta_{Rx} \times \sum_{x=1}^{n} D_x \times 2^{x-1}$$

where the analog output current is $I_{ox}$, the reference input current is $I_{Rx}$ which can set the full-scale value of $I_{ox}$, the digital input word (that is n-bits) wide is $D_x$, and $L_{Rx}$=($I_{Rx}/2^n$) is an analog LSB current weight of $I_{ox}$.

By feeding the output current of Y-iDAC onto the reference input of the X-iDAC, where $$I_{Rx} = I_{oy} = I_{Ry} \sum_{y=1}^{m} D_y/2^y,$$

the following transfer function is realized:

$$I_{ox} = \left(I_{Ry} \sum_{y=1}^{m} D_y/2^y\right) \times \left(\sum_{x=1}^{n} D_x/2^x\right).$$

As such a digital-input to analog-current-output multiplier $XD_iI_o$ is realized where $$\left(\sum_{y=1}^{m} D_y/2^y\right) \times \left(\sum_{x=1}^{n} D_x/2^x\right) = I_{ox}/I_{Ry}.$$

On the right hand-side of FIG. 11, the Y digital-input $Dy_{11}$ (that is m-bits wide where m=6 for illustrative clarity) is applied to a Y-iDAC, whose analog current output is $Ay_{11}$=$I_{oy}$. The Y-iDAC utilizes a combination of floating and factorizing DAC methods, and it is comprised of top, middle, and bottom iDACs and Factor blocks: $DAC_{ty_{11}}$ & $F_{ty_{11}}$, $DAC_{my_{11}}$, $F_{my_{11}}$, and $DAC_{by_{11}}$ & $F_{by_{11}}$. In FIG. 11, for example, the upper half of $DAC_{my_{11}}$ & $F_{my_{11}}$ block is comprising of the Factor function $F_{my_{11}}$, and the lower half of $DAC_{ty_{11}}$ & $F_{ty_{11}}$ block is comprising of the subordinated iDAC function $DAC_{my_{11}}$, and so on. For Y-iDAC, a reference current $I1_{11}$ is mirrored by $M8_{11}$ onto $M7_{11}$ which supplies the reference current (via the floating DAC method) onto the three 2-bit subordinated factorized floating iDACs: $DAC_{ty_{11}}$ (comprising of $M15_{11}$-$M16_{11}$), $DAC_{my_{11}}$ (comprising of M17$_{11}$-M18$_{11}$), and DAC$_{by_{11}}$ (comprising of M19$_{11}$-M20$_{11}$). The digital word Dy$_{11}$ (that is m=6 bits wide) is applied to the respective Y-iDAC current switches S7$_{11}$ through S12$_{11}$. The Y-iDAC utilizes NMOSFETs for its three 2-bit subordinated factorized floating iDACs sub-blocks (DAC$_{ty_{11}}$, DAC$_{my_{11}}$, and DAC$_{by_{11}}$) whose output are fed onto diode-connected PMOSFETs M33$_{11}$, M35$_{11}$, and M37$_{11}$, respectively, which are the inputs of its three Factor sub-blocks (F$_{ty_{11}}$, F$_{my_{11}}$, and F$_{by_{11}}$), respectively. Similar to the FIG. 8 in section 8, for illustrative clarity m=6 in FIG. 11 (but m can be as high as 16-bits), and also similarly the factor values for F$_{ty_{11}}$, F$_{my_{11}}$, and F$_{by_{11}}$ (current mirrors) are 4x, 1x, and ¼x, respectively.

Also, note for example, when bit D1y$_{11}$ (the MSB of Y-iDAC, in this case) is off, then the off S7$_{11}$ couples the drain-terminal of M15$_{11}$ (i.e., I$_{M15_{11}}$) to a bias-voltage (V$_{GS_P}$ that is a PMOS gate-to-source voltage below V$_{DD}$, which is not shown for illustrative clarity). The bias-voltage V$_{GS_P}$ biases the current switches S7$_{11}$ through S12$_{11}$, in a similar arrangement (and in this respect, similar to the iDAC's switch arrangement illustrated in FIGS. 8, 9, and 10) when the current switches are in off states.

Consider that diode connected NMOS M$_{2111}$ are scaled and biased via I2$_{11}$ (to generate a Vg$_{M21_{11}}$) such that M1$_{11}$ to M7$_{11}$ have enough drain-to-source voltage head-room to remain in saturation, considering gate-to-source voltage drop of M9$_{11}$ through M20$_{11}$. Similarly, diode connected PMOS M32$_{11}$ are scaled and biased via I2$_{11}$ (to generate a Vg$_{M32_{11}}$) such that M33$_{11}$ to M38$_{11}$ have enough drain-to-source voltage head-room to remain is saturation, considering gate-to-source voltage drop of M23$_{11}$ through M31$_{11}$.

The output of the Y-iDAC that is Ay$_{11}$=I$_{oy}$ supplies the reference current (via the floating DAC method) onto X-iDAC which is described next.

On the left hand-side of FIG. 11, the X digital-input Dx$_{11}$ (that is n-bits wide where n=6 for illustrative clarity) is applied to a X-iDAC, whose analog current output is Ay$_{11}$×Ax$_{11}$=I$_{ox}$. The X-iDAC is the complementary version of Y-iDAC described earlier, and it utilizes a combination of floating and factorizing DAC methods, and it is comprised of top, middle, and bottom iDACs and Factor blocks: DAC$_{tx_{11}}$ & F$_{tx_{11}}$, DAC$_{mx_{11}}$ & F$_{mx_{11}}$, and DAC$_{bx_{11}}$ & F$_x$. In FIG. 11, for example, the upper half of DAC$_{mx_{11}}$ & F$_{mx_{11}}$ block is comprising of the Factor function F$_{mx_{11}}$, and the lower-half of DAC$_{tx_{11}}$ & F$_{tx_{11}}$ is comprising of the subordinated DAC$_{mx_{11}}$, and so on. The output of Y-iDAC or Ay$_{11}$=I$_{oy}$ supplies the reference current onto X-iDAC's three of 2-bit factorized floating subordinate iDACs: DAC$_{tx_{11}}$ (comprising of M23$_{11}$-M24$_{11}$), DAC$_{mx_{11}}$ (comprising of M25$_{11}$-M26$_{11}$), and DAC$_{bx_{11}}$ (comprising of M27$_{11}$-M28$_{11}$). The digital word Dx$_{11}$ (that is also m=n=6 bits wide) is applied to the respective X-iDAC current switches S1$_{11}$ through S6$_{11}$. The X-iDAC utilizes PMOSFETs for its three 2-bit DAC$_{tx_{11}}$, DAC$_{mx_{11}}$, and DAC$_{bx_{11}}$ whose output are fed onto diode-connected NMOSFETs M1$_{11}$, M3$_{11}$, and M5$_{11}$, respectively, which are the inputs of its three Factor blocks F$_{tx_{11}}$, F$_{mx_{11}}$, and F$_{bx_{11}}$, respectively. Similar to the FIG. 8 in section 8, for illustrative clarity n=6 in FIG. 11 (but n can be as high as 16-bits), and also similarly the factor scales or values for F$_{tx_{11}}$, F$_{mx_{11}}$, and F$_{bx_{11}}$ (current mirrors) are 4x, 1x, and ¼x, respectively.

Also, note for example, when bit D1x$_{11}$ (the MSB of X-iDAC, in this case) is off, then the off S1$_{11}$ couples the drain-terminal of M23$_{11}$ (i.e., I$_{M23_{11}}$) to a bias-voltage (V$_{GS_N}$) that is a NMOS gate-to-source voltage above V$_{SS}$. The bias-voltage (V$_{GS_N}$) is not shown for clarity of illustration, but V$_{GS_N}$ biases the current switches S1$_{11}$ through S6$_{11}$, in a similar arrangement (and in this respect, similar to the iDAC's switch arrangement illustrated in FIGS. 8, 9, and 10) when the current switches are in off states.

Accordingly, a digital-input to analog-current-output multiplier XD$_i$I$_o$ is realized where $$\left(\sum_{y=1}^{m} D_y/2^y\right) \times \left(\sum_{x=1}^{n} D_x/2^x\right) = I_{ox}/I_{Ry},$$

where m=n=6, and Ay$_{11}$×Ax$_{11}$=I$_{ox}$ which is the analog representation of multiplying two digital codes D$_y$=Dy$_{11}$ and D$_x$=Dx$_{11}$. Bear in mind that I$_{Ry}$ represents a reference weight for the multiplier XD$_i$I$_o$ which is a scaled multiple (g) of I1$_{11}$. For example, if I1$_{11}$=i for Y-iDAC, then the full scale output current for each of sub-iDAC blocks DAC$_{ty_{11}}$, DAC$_{my_{11}}$, and DAC$_{by_{11}}$ would be $$\frac{i}{9}(1x + 2x) = i/3$$

which is factored by 4x, 1x, and x/4 by its respective blocks F$_{ty_{11}}$, F$_{my_{11}}$, and F$_{by_{11}}$. Consider that x=1 is programmed as the base factor scale in current mirrors of the subordinate iDAC and Factor blocks. Accordingly, Y-iDAC's full scale output value of A$_{y11}$ is $$\frac{i}{3} \times \left(4x + 1x + \frac{x}{4}\right) = i \times 5.25/3.$$

Similarly, for the X-iDAC, the full scale output current for each of subordinated iDAC blocks DAC$_{tx_{11}}$, DAC$_{mx_{11}}$, and DAC$_{bx_{11}}$ would be $$\frac{A_{y11}}{9}(1x + 2x) = A_{y11}/3,$$

which is also factored by 4x, 1x, and x/4 by its respective factor blocks F$_{tx_{11}}$, F$_{mx_{11}}$, and F$_{bx_{11}}$. As noted earlier, the output of Y-iDAC, which is A$_{y11}$ that is fed onto X-iDAC for its reference current signal. Therefore, X-iDAC's full scale output value of $$A_{y11} \times A_{x11} =$$

$$\frac{A_{y11}}{3} \times \left(4x + 1x + \frac{x}{4}\right) = A_{y11} \times \frac{5.25}{3} = i \times \frac{5.25}{3} \times \frac{5.25}{3} = i \times \left(\frac{5.25}{3}\right)^2,$$

$$\text{where } g = \left(\frac{5.25}{3}\right)^2.$$

As such, $$I_{Ry} = i \times g = I1_{11} \times g = I1_{11} \times \left(\frac{5.25}{3}\right)^2$$

represents the reference weight for the multiplier XD$_i$I$_o$.

In summary some of the benefits of the XD$_i$I$_o$ utilizing the factorizing iDAC method are as follows:

First, the $XD_iI_o$ utilizing the factorizing iDAC (described in section 8 of FIG. 8) saves area and helps reduce FET sizes which saves die are, lowers cost, and also lowers the capacitance that can be charged and discharged faster in the iDAC's current reference network which in turn improve the transient response of the $XD_iI_o$.

Second, the $XD_iI_o$ operating in current-mode, which inherently runs fast.

Third, voltage swings in current-mode signal processing are small, which enables operating the $XD_iI_o$ with lower power supply voltage. Also, factorized iDAC utilized in $XD_iI_o$ can operate with low power supply since its operating headroom can be limited by a FET's VGS+VDS.

Fourth, operating at low supply voltage reduces power consumption of the $XD_iI_o$. Moreover, Running the CMOS-FETs in subthreshold enables the factorized iDAC used in the in $XD_iI_o$ to operate with ultra-low currents, low power supply, and ultra-low power consumption suitable for mobile applications, especially in AI and ML applications that require numerous $XD_iI_o$ that are ultra-low power and operate on low power supply for computation.

Fifth, by substantially equalizing the terminal voltages at the positive and negative current output of the factorizing iDAC would improve the transient response of the disclosed $XD_iI_o$ and reduces glitch.

Sixth, the $XD_iI_o$ needs neither any capacitors nor any resistors, which facilitates fabricating the $XD_iI_o$ in standard digital CMOS manufacturing factory that is low cost, mainstream and readily available for high-volume mass production applications, and proven for being rugged and having high quality.

Seventh, the precision of the iDAC and hence that of the $XD_iI_o$ multiplier can be improved by for example utilizing proper sized FETs in the iDAC's current reference network or by utilizing current source segmentation (along with digital binary-to-thermometer coding) in the iDAC's reference current transfer-function network.

Eighth, the $XD_iI_o$ multiplier can lower resolution factorized iDACs (e.g., 3-bits or 5-bits) that occupy smaller areas, but have higher accuracy (e.g., 8-bits of accuracy or 0.4%) which is beneficial for cost-performance. For example, higher than 3 of 5 bits of accuracy is attainable in standard CMOS fabrication. With proper W/L scaling of FETs used in the current source transfer-function of iDACs (8-bits of accuracy or), a ±0.4% matching that can be achievable. As such, this disclosure can utilize low resolution iDACs that occupy small areas and achieve higher accuracy multiplication at lower cost.

Ninth, glitch is lower during code transitions in $XD_iI_o$ multiplier because factorized iDACs utilized in $XD_iI_o$ are smaller given that the input-to-output transfer function network utilizes smaller devices that carry smaller capacitances, which inject fewer analog glitches to the output of the $XD_iI_o$ during digital input code transitions.

Tenth, dynamic power consumption is lower because the $XD_iI_o$ multiplier utilizes factorized DAC that have smaller sized FETs (in the input-to-output transfer function network) which would consume less dynamic current to drive smaller FET devices during digital input code transitions.

Eleventh, the $XD_iI_o$ that utilizes factorized iDAC can be arranged free of clock, suitable for asynchronous (clock free) computation.

Twelfth, The $XD_iI_o$ that utilizes same type of MOSFET current sources and MOSFET switches in the respective factorized iDACs, which are symmetric, matched, and scaled. This trait facilitates device parameters to track each other over process, temperature, and operating conditions variations. Accordingly, the $XD_iI_o$'s temperature coefficient, power supply coefficient, and AC power supply rejection performance can be enhanced.

Thirteenth, the embodiment disclosed here is not restricted by FETs having to operate either in saturation (high-currents) or subthreshold (low currents). For example, some analog signal processing units rely on operating transistors in the subthreshold regions which restricts the dynamic range of analog signal processing circuits to low current signals. Also, some other analog signal processing units rely on operating transistors with high currents in the saturation regions which restricts the dynamic range of analog signal processing circuits to higher current signals

Section 12A & 12B—Description of FIG. 12A & FIG. 12B

FIG. 12, including FIG. 12A and FIG. 12B, is a (Simulation Program with Integrated Circuits Emphasis) SPICE circuit simulation showing the input-output and linearity waveforms of the mixed-signal current-mode digital-input to analog-current-output multiplier ($XD_iI_o$) that is illustrated in FIG. 11.

For the simulations of FIG. 12A and FIG. 12B, the digital signals $D_y = Dy_{11} = Y$ and $D_x = Dx_{11} = X$ are spanned from full-scale to zero-scale (shown 1 as full-scale to 0 as zero-scale on the vertical axis) when both X, Y signals are ramped together in time from full-scale to zero-scale over 1 millisecond (shown on the horizontal axis). For the simulations of FIG. 12B, for clarity of illustration, $D_y$ and $D_y$ are fed onto ideal iDACs and plotted as '$D_y$ Analog Equivalent Signal' and '$D_x$ Analog Equivalent Signal' that are displayed next to $A_{y11} \times A_{x11} = Y \cdot X$ which is the resultant representation of analog output of the multiplier $XD_iI_o$. FIG. 12A illustrates 10 runs of montecarlo (MC) simulation plotting the difference between an ideal $A_{y11} \times A_{x11}$ and MC simulation of the transistor level circuit of FIG. 11 that generates $A_{y11} \times A_{x11}$. FIG. 12B indicates the linearity of the multiplier $XD_iI_o$.

The FETs in the iDAC and Factor blocks operate in the subthreshold region where most of the mismatch between FETs is due to their threshold voltage ($V_{TH0}$) mismatch. In simulating of FIG. 11's circuit using SPICE, wherein the simulations are depicted in FIG. 12A and FIG. 12B, the $V_{TH0}$ statistical distribution for FETs is programmed as STAT CMOS $V_{TH0}$ GAUSS 0.4%+3−3 cc=0.998, which indicated maximum $I_{DS}$ mismatch of ~±0.8% (for the 10 MC runs) between two arbitrary FETs (with the same W/L as that of non-digital FETs in the iDAC and Factor blocks). The 10 MC simulation runs in FIG. 12A, captured a maximum DNL of about ~±0.3% (and a gain-error of about ~±0.8% which is mostly due to the reference current mirror mismatch). Note that for a 6-bit DAC, the resolution is $\frac{1}{2^6} = 1.6\%$.

Figure 13:
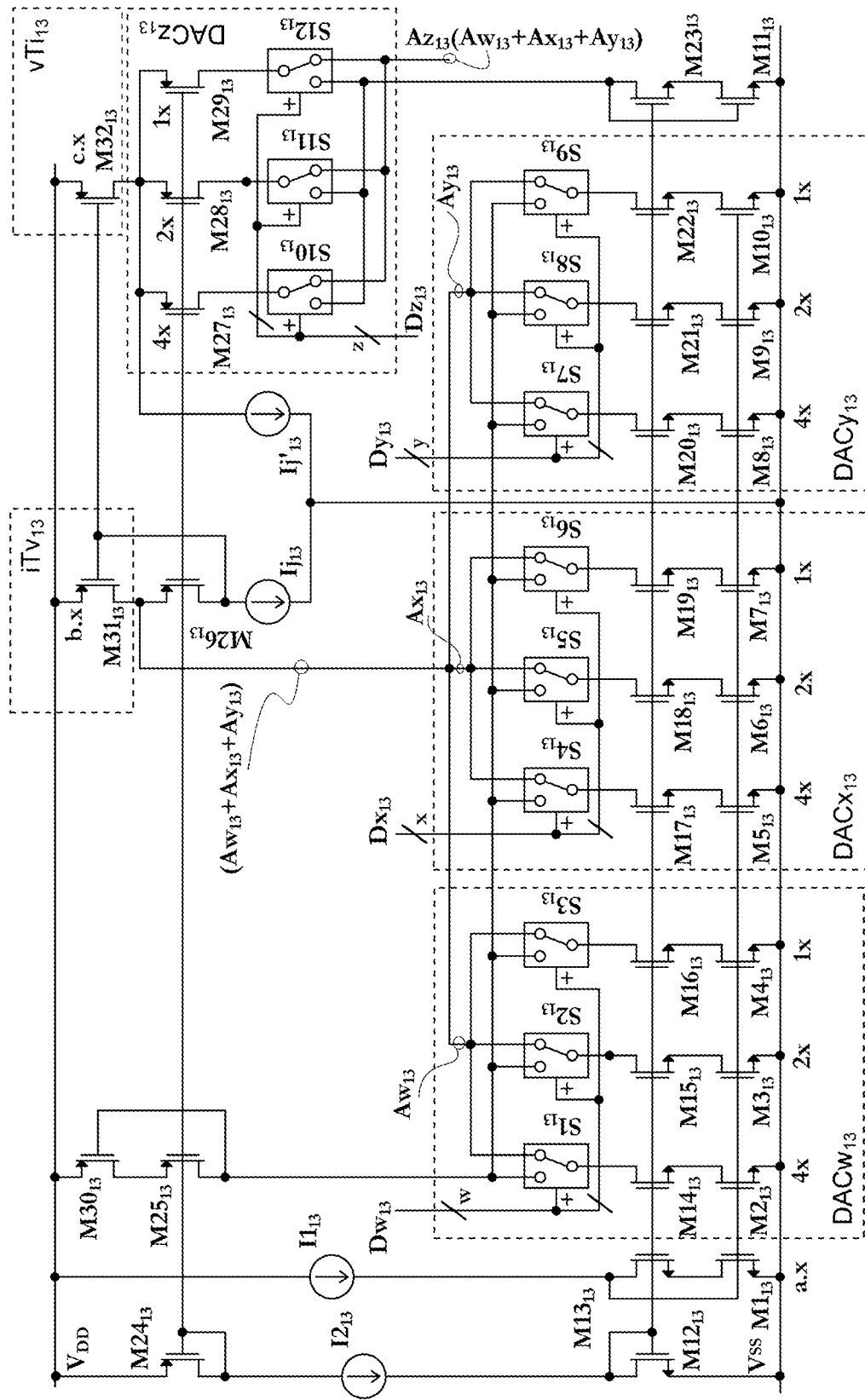
FIG. 13 is a simplified circuit schematic diagram illustrating an embodiment of a mixed-signal current-mode scalar multiply-accumulate (sMACiDAC) circuit. The disclosed sMACiDAC is a mixed-signal current-mode digital-input to analog-current-output ($D_iI_o$) scalar multiply-accumulate (sMAC) circuit utilizing current-mode digital-to-analog-converters (iDAC).

Section 13—Description of FIG. 13

FIG. 13 is a simplified circuit schematic diagram illustrating an embodiment of a mixed-signal current-mode scalar multiply-accumulate (sMACiDAC) circuit. The disclosed sMACiDAC is a mixed-signal current-mode digital-input to analog-current-output ($D_iI_o$) scalar multiply-accumulate (sMAC) circuit that utilizes current-mode digital-to-analog-converters (iDAC).

A simplified $D_iI_o$ sMACiDAC's transfer function is $$\sum_{m=1}^{n} s \times p_m,$$

where a scalar (s) is multiplied with the sum of plurality (m=n) of $p_m$ weights. The disclosed embodiment of $D_iI_o$ sMACiDAC utilizes the distributive property, wherein multiplying the sum of two or more (plurality of) addends by a (scalar) number will give the same result as multiplying each addend individually by the scalar) number and then adding the products together. Accordingly, the disclosed embodiment of $D_iI_o$ sMACiDAC utilizes plurality of iDACs whose outputs coupled together in current-mode, which generates a summation current $$\left(\sum_{m=1}^{n} p_m\right)$$

that is then fed onto a current reference terminal of a scalar iDAC, whose output generate $$s \times \sum_{m=1}^{n} p_m$$

which can also be represented as $$\sum_{m=1}^{n} s \times p_m.$$

To accomplish the above objective, the disclosed circuit of FIG. 13 utilizes a plurality of digital input words ($p_D$) that are supplied to a plurality (m=n) of iDACs that generate a plurality of respective analog output currents ($p_A$). The plurality of $p_A$ analog output currents are coupled together which generates a summation current signal that is fed onto an input of a current controlled voltage source (CCVS). A voltage output of the CCVS is then fed onto a voltage controlled current source (VCCS). Then a current output of the VCCS is fed onto a (current) reference terminal of a scalar iDAC whose digital input word is $S_D$. The scalar iDAC generates an analog (current) output signal which is the product of $s_A$ (which represent the analog value of $S_D$) multiplied by the sum of a plurality $p_{Ai}$ (for m=n plurality) or $$s_A \times \sum_{m=1}^{n} p_{Ai} = \sum_{m=1}^{n} s_A \times p_{Ai}.$$

To further describe the disclosed $D_iI_o$ sMACiDAC circuit embodiment of FIG. 13, let $$A_w = A_{Rw} \times \sum_{i=1}^{w} D_i/2^i, A_x = A_{Rx} \times \sum_{j=1}^{x} D_j/2^j, \text{ and } A_y = A_{Ry} \times \sum_{k=1}^{y} D_k/2^k.$$

For $$A_{Rw} = A_{Rx} = A_{Ry} = A_R, \text{ then}$$

$$A_w + A_x + A_y = A_R \times \left(\sum_{i=1}^{w} D_i/2^i + \sum_{j=1}^{x} D_j/2^j + \sum_{k=1}^{y} D_k/2^k\right).$$

The nomenclatures and terminologies used here are self-explanatory for one skilled in the art, but as an example for the w-channel iDAC, bear in mind that $A_w$ is the analog output, $A_{Rw}$ is the reference input, $D_i$ is the digital input word that is w-bits wide, and so on.

If $A_R$ is fed into reference input of scalar $DACz_{13}$, then $$A_z = A_R \times \sum_{l=1}^{z} D_l/2^l.$$

By feeding $A_w+A_x+A_y=A_{Rz}$ into the reference input of scalar $DACz_{13}$, then it generates $$A_o = A_{Rz} \times \sum_{l=1}^{z} D_l/2^l = (A_w + A_x + A_y) \times \sum_{i=1}^{z} D_i/2^i =$$

$$\left[A_R \times \left(\sum_{i=1}^{w} D_i/2^i + \sum_{j=1}^{x} D_j/2^j + \sum_{k=1}^{y} D_k/2^k\right)\right] \times \sum_{l=1}^{z} D_l/2^l.$$

Therefore, $$A_o/A_R = \left[\left(\sum_{i=1}^{w} D_i/2^i + \sum_{j=1}^{x} D_j/2^j + \sum_{k=1}^{y} D_k/2^k\right)\right] \times \sum_{l=1}^{z} D_l/2^l,$$

which can be represented in the analog domain as $A_o/A_R = (A_w+A_x+A_y) \times A_z$. This represents multiplying scalar z by the accumulation of w, x, and y.

In FIG. 13, the scalar iDACs and plurality of iDACs are shown with 3-bit of resolution i=j=k=l=3 and there are three (plurality) of iDACs, as an illustration and for clarity of description but not as a limitation of this disclosure. Resolution of iDACs can be up to 16-bits, and the plurality of iDACs can be a sea of iDACs and for example 1000 channels.

As noted earlier, an iDAC transfer function where $A_o=I_o$ and $A_R=I_R$ can be simplified to $$I_o = I_R \sum_{i=1}^{n} D_i/2^i = (I_R/2^n) \times \sum_{i=1}^{n} D_i \times 2^{i-1}.$$

For example, let's consider half-scale of a 3-bit wide digital word corresponding to the digital binary word $D_i$=100 or $D_1$=1, and $D_2$=$D_3$=0 and letting $I_R$ be 1 unit representing full-scale for $I_O$. In such an example, the DAC's input-to-output transfer function would be as follows: $I_O=I_R \times [D_1/2^1+D_2/2^2+D_3 \times 2^3]=(I_R) \times [\frac{1}{2}^1+0/2^2+0/2^3]=I_R/2=\frac{1}{2}$ reference unit, which is ½ of full scale.

Here a more detailed description of embodiment of the $D_iI_o$ sMACiDAC's circuit illustrated in FIG. 13 is provided. The reference current $I1_{13}=I_r$ is applied to a diode connected $M1_{13}$ whose $Vgs_{M1_{13}}$ biases the binary weighted current source network in each of three iDAC: $DACw_{13}$, $DACx_{13}$, and $DACy_{13}$. Notice that $M12_{13}$ and $I2_{13}$ program the $Vgs_{M12_{13}}$ that biases the cascoded FETs in binary current sources of $DACw_{13}$, $DACx_{13}$, and $DACy_{13}$ to attain higher output impedance of the respective iDAC's current network with higher accuracy, which can be omitted to save area if lower $V_{DD}$ with less variation is available in the end-application.

A DACw$_{13}$ receives a digital word Dw$_{13}$, and generates an analog output current Aw$_n$, wherein Vgs$_{M1_{13}}$ biases M2$_{13}$, M3$_{13}$, and M4$_{13}$ (according to their respective width-over-length or W/L scales a. x, 1x, 2x, 4x) which programs the DACw$_{13}$'s binary weighted currents as a ratio of the I1$_{13}$=I$_{r}$. The DACw$_{13}$'s current switches S1$_{13}$, S2$_{13}$, and S3$_{13}$ steer the respective M2$_{13}$, M3$_{13}$, and M4$_{13}$ currents to either a diode connected M30$_{13}$ (which is coupled with the DACw$_{13}$'s I$_o^-$ port) or the DACw$_{13}$'s I$_o^+$ port (at Aw$_{13}$ signal) in accordance with the polarity of digital word Dw$_{13}$ bits. As it would be clear to one skilled in the art, for example, when Dw$_{13}$'s MSB in on (high-state), then S1$_{13}$ steers M2$_{13}$'s current (through the cascoded FET M14$_{13}$) onto the DACw$_{13}$'s I$_o^+$ port (carrying the analog output current Aw$_{13}$). Conversely, when Dw$_{13}$'s MSB in off (low-state), then S1$_{13}$ steers M2$_{13}$'s current (through the cascoded FET M14$_{13}$) onto the DACw$_{13}$'s I$_o^-$ port and onto the diode connected M30$_{13}$ (through the cascoded FET M25$_{13}$).

A DACx$_{13}$ receives a digital word Dx$_{13}$, and generates an analog output current Ax$_{13}$, wherein Vgs$_{M1_{13}}$ biases M5$_{13}$, M6$_{13}$, and M7$_{13}$ (according to their respective width-over-length or W/L scales a. x, 1x, 2x, 4x) which programs the DACx$_{13}$'s binary weighted currents as a ratio of the I1$_{13}$=I$_{r}$. The DACx$_{13}$'s current switches S4$_{13}$, S5$_{13}$, and S6$_{13}$ steer the respective M5$_{13}$, M6$_{13}$, and M7$_{13}$ currents to either the diode connected M30$_{13}$ (which is coupled with the DACx$_{13}$'s I$_o^-$ port) or the DACx$_{13}$'s I$_o^+$ port (for Ax$_{13}$ signal) in accordance with the polarity of the Dx$_{13}$ bits.

A DACy$_{13}$ receives a digital word Dy$_{13}$, and generates an analog output current Ay$_{13}$, wherein Vgs$_{M1_{13}}$ biases M8$_{13}$, M9$_{13}$, and M10$_{13}$ (according to their respective width-over-length or W/L scales a. x, 1x, 2x, 4x) which programs the DACy$_n$'s binary weighted currents as a ratio of the I1$_{13}$=I$_{r}$. The DACy$_{13}$'s current switches S7$_{13}$, S8$_{13}$, and S9$_{13}$ steer the respective M8$_{13}$, M9$_{13}$, and M10$_{13}$ currents to either the diode connected M30$_{13}$ (which is coupled with the DACy$_{13}$'s I$_o^-$ port) or the DACy$_n$'s I$_o^+$ port (for Ay$_{13}$ signal) in accordance with the polarity of the Dy$_{13}$ bits.

As described earlier, the current outputs of DACw$_{13}$, DACx$_{13}$, and DACy$_{13}$ are then summed to generate the output current summation Aw$_{13}$+Ax$_{13}$+Ay$_{13}$, which is fed onto the input of a CCVS (or current-to-voltage converter iTv$_{13}$) comprising of M26$_{13}$ and M31$_{13}$. An output of the CCVS is Vgs$_{M31_{13}}$ which is supplied to the input of a VCCS (or voltage-to-current converter vTi$_{13}$) comprising of M32$_{13}$.

Consider that for a=1, the full scale output current for each of DACw$_{13}$, DACx$_{13}$, and DACy$_{13}$ is (4+2+1)×I$_{r}$=7I$_{r}$.

Accordingly, the full-scale output current summation Aw$_{13}$+Ax$_{13}$+Ay$_{13}$ would compute to 3×7I$_{r}$=21I$_{r}$. The W/L's of M31$_{13}$ and M32$_{13}$ (i.e., b.x and c.x) program the combined gain of iTv$_{13}$ and vTi$_{13}$ which scales the sum of Aw$_{13}$+Ax$_{13}$+Ay$_{13}$ before the said sum is supplied to the reference input of a DACz$_{13}$. For clarity of description b=c=1 which provides a combined current scaling (net-gain) of 1 (through iTv$_{13}$ to vTi$_{13}$) for the sum of Aw$_{13}$+Ax$_{13}$+Ay$_{13}$ currents that are supplied to the reference input of a DACz$_{13}$.

The floating DACz$_{13}$ receives a digital word Dz$_{13}$, and generates an analog output current at the DACz$_{13}$'s I$_o^+$ port that is the output current of D$_i$I$_o$ sMACiDAC as being represented in the analog domain and proportional to A$_{R''}$: A$_o$/A$_{R''}$=(A$_w$+A$_x$+A$_y$)×A$_z$. The DACz$_{13}$'s current switches S10$_{13}$, S11$_{13}$, and S12$_{13}$ steer the respective M27$_{13}$, M28$_{13}$, and M29$_{13}$ currents to either a diode connected M11$_{13}$ (which is coupled with the DACz$_{13}$'s I$_o^-$ port) or the DACz$_{13}$'s I$_o^+$ port in accordance with the polarity of the Dz$_{13}$ bits.

As indicated earlier, for a=b=c=1, then A$_{R''}$ is a scaled reference current where A$_{R''}$=21I$_{r}$. Notice that DACz$_{13}$ utilizes a floating iDAC method that is disclosed in FIG. 1 section 1. Also note that M24$_{13}$ and I2$_{13}$ program the Vgs$_{M24_{13}}$ that biases the cascoded FETs M25$_{13}$ to M29$_{13}$ which provides sufficient drain-to-source voltages (V$_{DS}$) head-room and substantially equalizes the V$_{DS}$ between M31$_{13}$ and M32$_{13}$ for better current matching and also to maintain their operation in the saturation regions. Also, to enhance the dynamic response of iTv$_{13}$ and vTi$_{13}$, a constant current Ij$_{13}$ is added to keep the diode connected M31$_{13}$ constantly alive during D$_i$I$_o$ sMACiDAC's zero and full scale transitions, and accordingly an substantially equal current Ij'$_{13}$ is subtracted from drain terminal of M32$_{13}$ to keep the mirror balanced.

Bear in mind that for better dynamic response and substantially equalization between the operating voltages at the I$_o^-$ and I$_o^+$ ports of the DACw$_{13}$, DACx$_{13}$, and DACy$_{13}$, their I$_o^-$ ports can be coupled with drain terminal of M30$_{13}$ (also coupled with source terminal of M25$_{13}$), while a current source (e.g., Ij''$_{13}$ not shown in FIG. 13) can be coupled with gate terminal of M30$_{13}$ (also coupled with drain terminal of M25$_{13}$).

In summary, the embodiment illustrated in FIG. 13 of a mixed-mode scalar multiply-accumulate (D$_i$I$_o$ sMACiDAC) circuit that processes signals in current-mode utilizing iDACs has the following benefits:

First, the disclosed D$_i$I$_o$ sMACiDAC utilizing plurality of iDACs (along with CCVS and VCCS) whose outputs are summed in current-mode and fed onto the reference input terminal of a scalar iDAC saves area and lowers cost, and improved performance with faster dynamic response. This is in part due to the efficacy in performing the distributive property in current-mode, wherein multiplying the sum of two or more addends by a number will give the same result as multiplying each addend individually by the number and then adding the products together. Summation in current-mode is accomplished by simply coupling plurality of addends (i.e., coupling the output of plurality of iDACs together), and feeding the said summation to another scalar iDAC's reference input. This will result in multiplying each addend individually by the scalar number and then adding the products together, which is fast since signals are processed in current-mode.

Second, utilizing the floating iDAC method disclosed in FIG. 1 section 1, saves area and reduces FETs sizes carrying lower capacitances in the iDAC's current reference network which in turn lowers the cost, reduces the size, and improves the transient response of the D$_i$I$_o$ sMACiDAC that utilizes such iDACs.

Third, as noted earlier, the disclosed D$_i$I$_o$ sMACiDAC utilizing iDACs that operate in current-mode is inherently fast.

Fourth, voltage swings in current-mode signal processing are small, which enables operating the disclosed D$_i$I$_o$ sMACiDAC with lower power supply voltage and retain the speed and dynamic rage benefits.

Fifth, operating at low supply voltage reduces power consumption of the disclosed D$_i$I$_o$ sMACiDAC. Additionally, the flexibility to run the CMOSFETs in subthreshold enables a iDAC that are utilized in D$_i$I$_o$ sMACiDAC to operate with ultra-low currents, even lower power supplies, and ultra-low power consumption suitable for mobile applications, especially in AI and ML applications that may require numerous ultra-low power and low power supply iDACs for computation.

Sixth, the disclosed $D_iI_o$ sMACiDAC utilizing iDAC for signal processing such as addition or subtraction operations, in current mode, take small area and can be performed fast.

Seventh, by substantially equalizing the terminal voltages at $I_o^+$ and $I_o^-$ ports of plurality of iDACs as well as the $I_o^+$ and $I_o^-$ ports of scalar iDACs utilized in the disclosed $D_iI_o$ sMACiDAC, improves the $D_iI_o$ sMACiDAC's transient response and glitch is reduced during on-to-off $D_iI_o$ sMACiDAC's digital input code transitions.

Eight, there are no passive devices in the disclosed $D_iI_o$ sMACiDAC of FIG. 13, and as such there is no need for resistors or capacitors, which reduces manufacturing size and cost.

Ninth, the precision of the disclosed $D_iI_o$ sMACiDAC can be improved by improving the accuracy of iDACs (for example) by segmenting the iDAC's reference current transfer-function (along with digital binary-to-thermometer logic decoding of iDAC's digital input code).

Tenth, the disclosed $D_iI_o$ sMACiDAC of FIG. 13 can utilize lower resolution iDACs (e.g., 3-bits or 5-bits) to perform the multiplication function, which occupy smaller areas, but can still deliver higher accuracy (e.g., 8-bits of accuracy or ±0.4%) which is beneficial. For example, higher than 3 of 5 bits of accuracy for iDACs is attainable in standard CMOS fabrication due to (8-bits of accuracy or ±0.4%) matching that is achievable between the iDAC's binary weighted current sources or segmented current sources. As such, the disclosed $D_iI_o$ sMACiDAC can utilize low resolution iDACs that occupy small areas but still achieve higher accuracy multiply-accumulate performance at lower cost.

Eleventh, glitch is lower during code transitions in $D_iI_o$ sMACiDAC because floating iDACs utilized in $D_iI_o$ sMACiDAC can be made smaller given that their input-to-output transfer function network utilizes smaller devices that carry smaller capacitances, which inject fewer analog glitches to the output of the $D_iI_o$ sMACiDAC during digital input code transitions.

Twelfth, dynamic power consumption is lower because the $D_iI_o$ sMACiDAC utilizes floating iDAC that have smaller sized FETs (in the input-to-output transfer function network) which would consume less dynamic current to drive smaller FET devices during digital input code transitions.

Thirteenths, the $D_iI_o$ sMACiDAC that utilizes floating iDAC can be arranged free of clock, suitable for asynchronous (clock free) computation.

Fourteenth, the $D_iI_o$ sMACiDAC that utilizes same type of MOSFET current sources and MOSFET switches in the respective floating iDACs, which are symmetric, matched, and scaled. Such arrangement facilitates device parameters to track each other over process-temperature-operation conditions variations. Accordingly, the $D_iI_o$ sMACiDAC's temperature coefficient, power supply coefficient, and AC power supply rejection performance can be enhanced.

Fifteenth, while digital computation is generally accurate but it may be excessively power hungry. Current-mode analog and mixed-signal computation that is disclosed here can be approximate but signal processing can be accomplished asynchronously and power consumption can be lower. Moreover, analog current errors here generally result in degradation but (not total failures) of analog computation, which provides the end-application with approximate results to work with instead of experiencing failed results.

Sixteenth, the embodiment disclosed here is not restricted by FETs having to operate either in saturation (high-currents) or subthreshold (low currents). For example, some analog signal processing units rely on operating transistors in the subthreshold regions which restricts the dynamic range of analog signal processing circuits to low current signals. Also, some other analog signal processing units rely on operating transistors with high currents in the saturation regions which restricts the dynamic range of analog signal processing circuits to higher current signals.

Seventeenth, utilizing plurality of iDACs, whose outputs are summed, would attenuate the statistical contribution of the cumulative iDAC's random errors (such as random noise, offset, mismatches, linearity, gain, drift, etc.) at the summing node where the iDAC's current outputs are coupled. The statistical contribution of such cumulative iDAC's random errors, at the summing node, is the square root of the sum of the squares of such random error terms.

Figure 14:
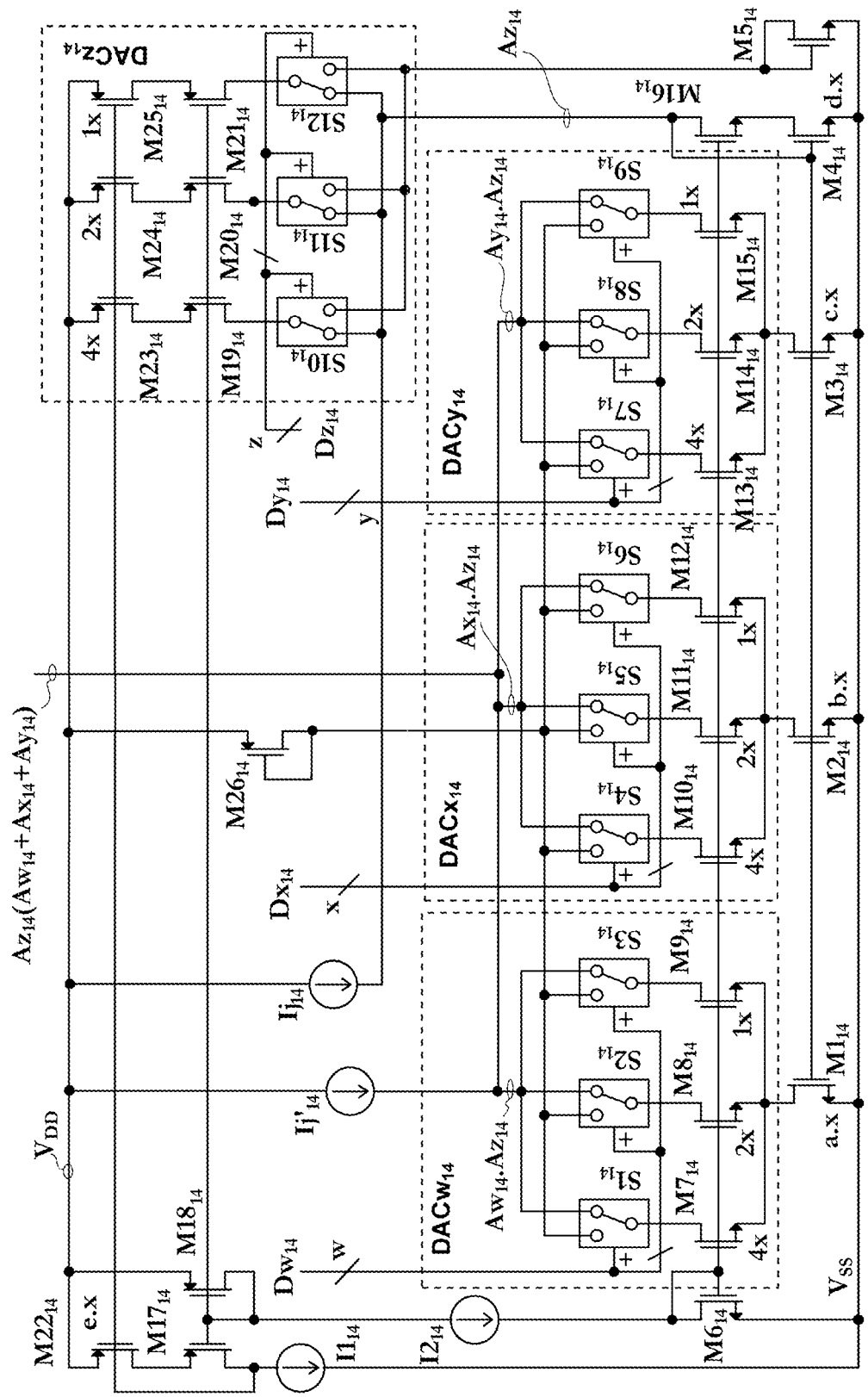
FIG. 14 is a simplified functional block diagram illustrating another embodiment of a mixed-signal current-mode scalar multiply-accumulate (sMACiDAC) circuit. The disclosed sMACiDAC is another mixed-signal current-mode digital-input to analog-current-output ($D_iI_o$) scalar multiply-accumulate (sMAC) circuit utilizing current-mode digital-to-analog-converters (iDAC).

Section 14—Description of FIG. 14

FIG. 14 is a simplified functional block diagram illustrating another embodiment of a mixed-signal current-mode scalar multiply-accumulate (sMACiDAC) circuit. The disclosed sMACiDAC is another mixed-signal current-mode digital-input to analog-current-output ($D_iI_o$) scalar multiply-accumulate (SMAC) circuit utilizing current-mode digital-to-analog-converters (iDAC).

The disclosed embodiment of $D_iI_o$ sMACiDAC in FIG. 14 also utilizes the a multiplication property, wherein multiplying the sum of two or more (plurality of) addends by a (scalar) number will give the same result as multiplying each addend individually by the number and then adding the products together. To accomplish this objective, the disclosed circuit of FIG. 14 utilizes a scalar iDACs that receives a digital input word ($s_D$) and generates an analog current ($s_A$). Concurrently, a plurality of iDACs receive a respective plurality of digital input words ($p_D$). The $s_A$ is replicated onto plurality of $s_A$s that are supplied to a plurality reference inputs of the plurality of iDACs. The outputs of the plurality of iDACs are couple together to generate a summation current signal, which is the product of $s_A$ (which represent the analog value of $s_D$) multiplied by the sum of a plurality $p_{Ai}$ (which represent a plurality of respective analog value of the respective plurality of $p_D$) or $$s_A \times \sum_{m=1}^{n} p_{Ai} = \sum_{m=1}^{n} s_A \times p_{Ai}.$$

To further describe the disclosed $D_iI_o$ sMACiDAC circuit embodiment of FIG. 14, let the FET's W/L factors a=b=c=d=e=1. For an $A_{Rz}$ feeding the reference input of scalar $DACz_{14}$, its output signal $$A_z = A_{Rz} \times \sum_{l=1}^{z} D_l/2^l.$$

Similarly $$A_w = A_{Rw} \times \sum_{i=1}^{w} D_i/2^i, A_x = A_{Rx} \times \sum_{j=1}^{x} D_j/2^j,$$

and $$A_y = A_{Ry} \times \sum_{k=1}^{y} D_k/2^k.$$

By replicating and feeding substantially equal values of $A_z$ onto the reference inputs of a plurality (e.g., 3 channels) of floating iDACs, namely $DACw_{14}$, $DACx_{14}$, and $DACy_{14}$, then: $A_{Rw}=A_{Rx}=A_{Ry}=A_z=A_{Rz}\times\Sigma_{l=1}^{z}D_l/2^l$. Therefore, $$\left(A_{Rz}\times\sum_{l=1}^{z}D_l/2^l\right)\times\sum_{i=1}^{w}D_i/2^i; \left(A_{Rz}\times\sum_{l=1}^{z}D_l/2^l\right)\times\sum_{j=1}^{x}D_j/2^j;$$

$$\left(A_{Rz}\times\sum_{l=1}^{z}D_l/2^l\right)\times\sum_{k=1}^{y}D_k/2^k.$$

Therefore, the disclosed $D_zI_o$ sMACiDAC output current signal which is the summation of w, x, and y—iDAC's outputs is thus:

$$A_w+A_x+A_y=A_{Rz}\times\sum_{l=1}^{z}D_l/2^l\times\left(\sum_{i=1}^{w}D_i/2^i+\sum_{j=1}^{x}D_j/2^j+\sum_{k=1}^{y}D_k/2^k\right).$$

Therefore, $$A_o/A_R=\left[\left(\sum_{i=1}^{w}D_i/2^i+\sum_{j=1}^{x}D_j/2^j+\sum_{k=1}^{y}D_k/2^k\right)\right]\times\sum_{l=1}^{z}D_l/2^l,$$

which can be mapped in the analog domain as $A_o/A_R=(A_w+A_x+A_y)\times A_z$ representing multiplying scalar z by the accumulation of w, x, and y.

Note that in FIG. 14, the scalar $DACz_{14}$ and plurality of iDACs (e.g., for 3-channels $DACw_{14}$, $DACx_{14}$, and $DACy_{14}$) are shown with 3-bit of resolution with i=j=k=l=3. In FIG. 14's illustration of $D_zI_o$ sMACiDAC embodiment with 3-bits of resolution and 3 channels is for illustrative clarity of description, but not as a limitation of this disclosure. Resolution of iDACs can be up to 16-bits, and the plurality of iDACs can be a sea of iDACs and for example 1000 channels.

Here, a more detailed description of embodiment of the $D_zI_o$ sMACiDAC's circuit illustrated in FIG. 14 is provided. The reference current $I1_{14}=I_r$ is applied to a diode connected $M17_{14}$ whose $Vgs_{M17_{14}}$ biases the binary weighted current source network of the scalar $DACz_{14}$. Let e=1 for this illustration. Consider that $M18_{14}$ and $I2_{14}$ program the $Vgs_{M18_{14}}$ that biases the cascoded FETs is intended to increase (accuracy and) the output impedance of $DACz_{14}$'s current source network.

A $DACz_{14}$ receives a digital word $Dz_{14}$, and generates an analog output current $Az_{14}$, wherein $Vgs_{M17_{14}}$ biases $M23_{14}$, $M24_{14}$, and $M25_{14}$ (according to their respective width-over-length or W/L scales e.x, 1x, 2x, 4x) which programs the $DACz_{14}$'s binary weighted currents as a ratio of the $I1_{14}=I_r$. The $DACz_{14}$'s current switches $S10_{14}$, $S11_{14}$, and $S12_{14}$ steer the respective $M23_{14}$, $M24_{14}$, and $M25_{14}$ currents to either a diode connected $M5_{14}$ (which is coupled with the $DACz_{14}$'s $I_o^-$ port) or the $DACz_{14}$'s $I_o^+$ port (for $Az_{14}$ signal) in accordance with the polarity of the $Dz_{14}$ bits. As it would be clear to one skilled in the art, for example, when $Dz_{14}$'s MSB in on (high-state), then $S10_{14}$ steers $M23_{14}$'s current (through the cascoded FET $M19_{14}$) onto the $DACz_{14}$'s $I_o^+$ port (carrying the an analog output current $Az_{14}$). Conversely, when $Dz_{14}$'s MSB in off (low-state), then $S10_{14}$ steers $M23_{14}$'s current (through the cascoded FET $M19_{14}$) onto the $DACz_{14}$'s $I_o^-$ port and onto the diode connected $M5_{14}$. Also, notice that for e=1, the $DACz_{14}$ full-scale output is $I1_4$ (4+2+1)=$7I_r$.

Figure 15:
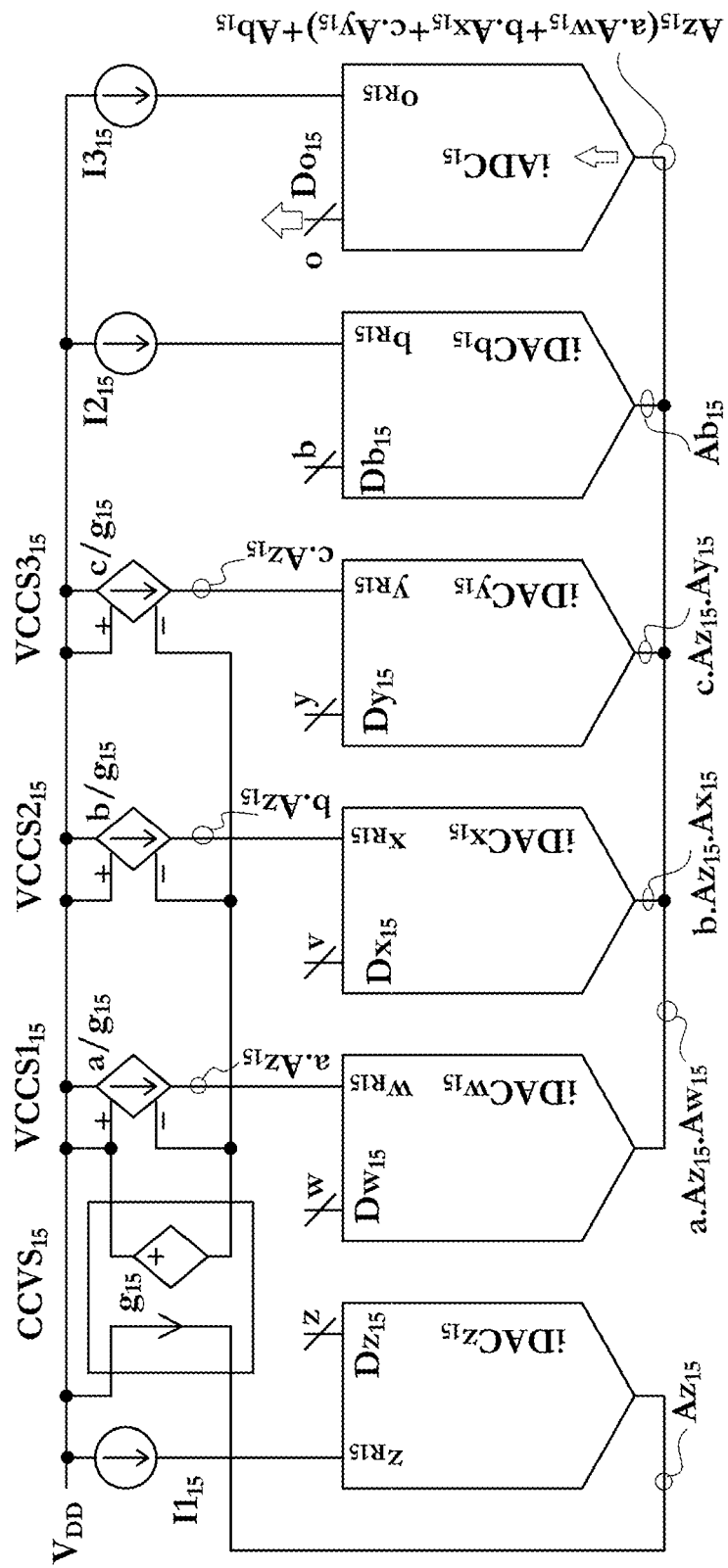
FIG. 15 is a simplified functional block diagram illustrating another embodiment of a mixed-signal current-mode scalar multiply-accumulate (sMACiDAC) circuit. The disclosed sMACiDAC is another mixed-signal current-mode digital-input to digital-output ($D_iD_o$) scalar multiply-accumulate (sMAC) plus bias circuit utilizing current-mode digital-to-analog-converters (iDAC) and current-mode analog-to-digital converters (iADC).

As noted earlier, $Az_{14}$ (which is the current outputs of the $DACz_{14}$) is replicated and fed onto the reference input terminals of $DACw_{14}$, $DACx_{14}$, and $DACy_{14}$. In the embodiment of FIGS. 15 and 14, proportional replication of $Az_{14}$ is effectuated via feeding $Az_{14}$ onto a current-controlled-voltage source (CCVS) with a gain of 1/g, whose output voltage can then feed plurality of (e.g., 3) voltage-controlled-current-sources (VCCSs) with their gains proportional to g. The plurality of outputs of the VCCSs can then feed the reference input terminals of a plurality of iDACs (e.g., $DACw_{14}$, $DACx_{14}$, and $DACy_{14}$).

More specifically, in FIG. 14, the CCVS and VCCSs are implemented by feeding $Az_{14}$ current onto a diode connected $M4_{14}$ whose current is scaled and mirrored through $M1_{14}$, $M2_{14}$, and $M3_{14}$. For descriptive clarity, let $M1_{14}$ to $M4_{14}$'s W/L factors a=b=c=d=1 (which programs the gains of CCVS and VCCS). As described in the floating iDAC of FIG. 2 section 2, $M1_{14}$, $M2_{14}$, and $M3_{14}$ supply the reference current signal for the three floating iDACs here: $DACw_{14}$, $DACx_{14}$, and $DACy_{14}$. Also, bias current $I2_{14}$ and a diode connected $M6_{14}$ program $Vgs_{M614}$ which biases the respective $DACw_{14}$, $DACx_{14}$, and $DACy_{14}$'s binary weighted current networks comprising of $M7_{14}M9_{14}$, $M10_{14}$-$M12_{14}$, and $M13_{14}$-$M15_{14}$, respectively.

A $DACw_{14}$ receives a digital word $Dw_{14}$ at its digital input port, receives a reference current signal that is a proportional replica of $Az_{14}$ through a current mirror ($M4_{14}$, $M1_{14}$) and generates an analog output current signal $Aw_{14}\times Az_{14}$. As noted earlier, floating $DACw_{14}$'s reference current is proportional to $Az_{14}$ that (through $M1_{14}$) is binarily distributed between $M7_{14}$, $M8_{14}$, and $M9_{14}$, according to their respective width-over-length or W/L scales 1x, 2x, 4x. The $DACw_{14}$'s current switches $S1_{14}$, $S2_{14}$, and $S3_{14}$ steer the respective $M7_{14}$, $M8_{14}$, and $M9_{14}$ currents to either a diode connected $M26_{14}$ (which is coupled with the $DACw_{14}$'s $I_o^-$ port) or the $DACw_{14}$'s $I_o^+$ port (carrying a $Aw_{14}\times Az_{14}$ current signal) in accordance with the polarity of the $Dw_{14}$ bits.

A $DACx_{13}$ receives a digital word $Dx_{14}$ at its digital input port, receives a reference current signal that is a proportional replica of $Az_{14}$ through a current mirror ($M4_{14}$, $M2_{14}$) and generates an analog output current signal $Ax_{14}\times Az_{14}$. As noted earlier, floating $DACx_{14}$'s reference current is proportional to $Az_{14}$ that (through $M2_{14}$) is binarily distributed between $M10_{14}$, $M11_{14}$, and $M12_{14}$, according to their respective width-over-length or W/L scales 1x, 2x, 4x. The $DACx_{14}$'s current switches $S4_{14}$, $S5_{14}$, and $S6_{14}$ steer the respective $M10_{14}$, $M11_{14}$, and $M12_{14}$ currents to either a diode connected $M26_{14}$ (which is coupled with the $DACx_{14}$'s $I_o^-$ port) or the $DACx_{14}$'s $I_o^+$ port (carrying a $Ax_{14}\times Az_{14}$ current signal) in accordance with the polarity of the $Dx_{14}$ bits.

A $DACy_{13}$ receives a digital word $Dy_{14}$ at its digital input port, receives a reference current signal that is a proportional replica of $Az_{14}$ through a current mirror ($M4_{14}$, $M3_{14}$) and generates an analog output current signal $Ay_{14}\times Az_{14}$. As noted earlier, floating $DACy_{14}$'s reference current is proportional to $Az_{14}$ that (through $M3_{14}$) is binarily distributed between $M13_{14}$, $M14_{14}$, and $M15_{14}$, according to their respective width-over-length or W/L scales 1x, 2x, 4x. The $DACy_{14}$'s current switches $S7_{14}$, $S8_{14}$, and $S9_{14}$ steer the respective $M13_{14}$, $M14_{14}$, and $M15_{14}$ currents to either a diode connected $M26_{14}$ (which is coupled with the $DACy_{14}$'s $I_o^-$ port) or the $DACy_{14}$'s $I_o^+$ port (carrying a $Ay_{14} \times Az_{14}$ current signal) in accordance with the polarity of the $Dy_{14}$ bits.

As indicated earlier, $DACz_{14}$'s full scale output current is $7I1_4 = 7I_r$, and as such the $DACw_{14}$, $DACx_{14}$, and $DACy_{14}$ full scale can be programmed to $7I_r$, with $a=b=c=d=e=1$. In this case, the summation of $DACw_{14}$, $DACx_{14}$, and $DACy_{14}$ full-scale output current or summation of $Aw_{14} \times Az_{14} + Ax_{14} \times Az_{14} + Ay_{14} \times Az_{14}$ would compute to $3 \times 7I_r = 21I_r$. The output of sMACiDAC can be represented in the analog domain and proportional to $21I_r = A_{R''}$: $A_o/A_{R''} = (A_w + A_x + A_y) \times A_z$.

As stated earlier, $M6_{14}$ and $I2_{14}$ program the $Vgs_{M6_{14}}$ that biases the floating current sources of $DACw_{14}$, $DACx_{14}$, and $DACy_{14}$ as well as provide sufficient drain-to-source voltages ($V_{DS}$) head-room and substantially equalizes the $V_{DS}$ between $M1_{14}$ and $M3_{14}$ for better current matching and also to maintain their operation in the saturation regions. Also, to enhance the dynamic response $D_iI_o$ sMACiDAC a constant current $Ij_{14}$ is added to keep the diode connected $M4_{14}$ alive during $DACw_{14}$'s zero and full scale transitions, and accordingly a proportional current $Ij'_{14}$ (e.g., $3 \times Ij_{14}$) is subtracted from the current output terminal of $D_iI_o$ sMACiDAC.

In summary, the embodiment of the $D_iI_o$ sMACiDAC circuit illustrated in FIG. 14 that processes signals in current-mode by utilizing iDACs has the following benefits:

First, the disclosed $D_iI_o$ sMACiDAC utilizing a current mode scalar iDACs whose output is copied and fed onto the reference input terminals of plurality of iDAC saves area and lowers cost, and improved performance with faster dynamic response, in part for its efficacy in performing summation in current-mode that can be accomplished by simply coupling plurality of current signals.

Second, utilizing the floating iDAC method disclosed in FIG. 1 section 1, saves area and reduces FETs sizes (which lower capacitance) in the iDAC's current reference network which in turn lowers the cost, reduces the size, and improves the transient response of the $D_iI_o$ sMACiDAC that utilizes such iDACs.

Third, as noted earlier, the disclosed $D_iI_o$ sMACiDAC utilizing iDACs that operate in current-mode is inherently fast.

Fourth, voltage swings in current-mode signal processing are small, which enables operating the disclosed $D_iI_o$ sMACiDAC of FIG. 14 with lower power supply voltage and retain the speed and dynamic rage benefits.

Fifth, operating at low supply voltage reduces power consumption of the disclosed $D_iI_o$ sMACiDAC. Additionally, the flexibility to run the CMOSFETs in subthreshold enables a iDAC that are utilized in $D_iI_o$ sMACiDAC to operate with ultra-low currents, even lower power supplies, and ultra-low power consumption suitable for mobile applications, especially in AI and ML applications that may require numerous ultra-low power and low power supply iDACs for computation.

Sixth, the disclosed $D_iI_o$ sMACiDAC utilizing iDAC for signal processing such as addition or subtraction functions (in current mode) take small area and can be performed fast.

Seventh, by substantially equalizing the terminal voltages at $I_o^+$ and $I_o^-$ ports of plurality of iDACs as well as the $I_o^+$ and $I_o^-$ ports of scalar iDACs utilized in the disclosed $D_iI_o$ sMACiDAC, improves the $D_iI_o$ sMACiDAC's transient response and glitch is reduced during on-and-off $D_iI_o$ sMACiDAC's digital input code transitions.

Eight, there are no passive devices in the disclosed $D_iI_o$ sMACiDAC of FIG. 14, and as such there is no need for resistors or capacitors, which reduces manufacturing size and cost.

Ninth, the precision of the disclosed $D_iI_o$ sMACiDAC can be improved by improving the accuracy of iDACs (for example) by segmenting the iDAC's reference current transfer-function (along with digital binary-to-thermometer logic decoding of iDAC's digital input code).

Tenth, the disclosed $D_iI_o$ sMACiDAC of FIG. 14 can utilize lower resolution iDACs (e.g., 3-bits or 5-bits) to perform the multiplication function, which occupy smaller areas, but can still deliver higher accuracy (e.g., 8-bits of accuracy or ±0.4%) which is beneficial. For example, higher than 3 of 5 bits of accuracy for iDACs is attainable in standard CMOS fabrication factories due to (8-bits of accuracy or ±0.4%) matching that is achievable between the iDAC's binary weighted current sources or segmented current sources. As such, the disclosed $D_iI_o$ sMACiDAC can utilize low resolution iDACs that occupy small areas but still achieve higher accuracy multiply-accumulate performance at lower cost.

Eleventh, glitch is lower during code transitions in $D_iI_o$ sMACiDAC because floating iDACs utilized in $D_iI_o$ sMACiDAC can be made smaller given that their input-to-output transfer function network utilizes smaller devices that carry smaller capacitances, which inject fewer analog glitches to the output of the $D_iI_o$ sMACiDAC during digital input code transitions.

Twelfth, dynamic power consumption is lower because the $D_iI_o$ sMACiDAC utilizes floating iDAC that have smaller sized FETs (in the input-to-output transfer function network) which would consume less dynamic current to drive smaller FET devices during digital input code transitions.

Thirteenths, the $D_iI_o$ sMACiDAC that utilizes floating iDAC can be arranged free of clock, suitable for asynchronous (clock free) computation.

Fourteenth, the $D_iI_o$ sMACiDAC that utilizes same type of MOSFET current sources and MOSFET switches in the respective floating iDACs, which are symmetric, matched, and scaled. Such arrangement facilitates device parameters to track each other over process, temperature, and operating conditions variations. Accordingly, the $D_iI_o$ sMACiDAC's temperature coefficient, power supply coefficient, and AC power supply rejection performance can be enhanced.

Fifteenth, while digital computation is generally accurate but it may be excessively power hungry. Current-mode analog and mixed-signal computation that is disclosed here can be approximate but signal processing can be accomplished asynchronously and power consumption can be lower. Moreover, analog current errors here generally may result in degradation but (not total failures) of analog computation, which provides the end-application with approximate results to work with instead of experiencing failed results.

Sixteenth, the embodiment disclosed here is not restricted by FETs having to operate either in saturation (high-currents) or subthreshold (low currents). For example, some analog signal processing units rely on operating transistors in the subthreshold regions which restricts the dynamic range of analog signal processing circuits to low current signals. Also, some other analog signal processing units rely on operating transistors with high currents in the saturation regions which restricts the dynamic range of analog signal processing circuits to higher current signals.

Seventeenth, utilizing plurality of iDACs, whose outputs are summed, would attenuate the statistical contribution of the cumulative iDAC's random errors (such as random noise, offset, mismatches, linearity, gain, drift, etc.) at the summing node where the iDAC's current outputs are coupled. The statistical contribution of such cumulative iDAC's random errors, at the summing node, is the square root of the sum of the squares of such random error terms.

Section 15—Description of FIG. 15

FIG. 15 is a simplified functional block diagram illustrating another embodiment of a mixed-signal current-mode scalar multiply-accumulate (sMACiDAC) circuit. The disclosed sMACiDAC is another mixed-signal current-mode digital-input to digital-output ($D_iD_o$) scalar multiply-accumulate (sMAC) plus bias circuit utilizing current-mode digital-to-analog-converters (iDAC) and current-mode analog-to-digital converters (iADC).

Utilizing current-mode data-converters, the $D_iD_o$ sMACiDAC embodiment disclosed in FIG. 15, first multiplies a scalar current signal by a respective plurality of current signals, whose products are summed together in current-mode and added to a bias current signal to generate a final summation signal. This final summation current signal is digitized via a current-mode analog-to-digital-converter (iADC). FIG. 15 disclosure performs the multiply-accumulate function by utilizing analog and mixed-signal signal processing in current-mode, by arranging data-converters to leverage the distributive property of multiplication, to save area and improve performance in multiply-accumulate functions needed in AI and ML applications. As such, the embodiment disclosed in FIG. 15, performs the function of $$\sum_{i=1}^{p}(s \times W_i + b),$$

where s is scalar current signal (e.g., s can be programmed by $iDACz_{15}$), $W_i$ is plurality of weight current signals with p as pluralities of channels (e.g., p=3 of $W_i$ current signals can be programmed by $iDACw_{15}$, $iDACx_{15}$, and $iDACy_{15}$, respectively), and b is bias current signal (e.g., b current signal can be programmed by $DACb_{is}$). As indicated in prior sections, the illustration of FIG. 15 depicts (plurality) p=3 channels for clarity of description, but n can be a sea of channels depending on application and as many as 1000.

In FIG. 15, a scalar $iDACz_{15}$ is supplied with a reference current signal $I1_{15}$ at its $zR_{15}$ port, receives a z-bits wide digital input word $Dz_{15}$, and accordingly $iDACz_{15}$ generates an analog output current signal $Az_{15}$.

The $Az_{15}$ current is inputted to a current-controlled-voltage-source $CCVS_{15}$'s current input port, whose gain is programmed to $g_{15}$. The $CCVS_{15}$'s voltage output port is coupled with a plurality of voltage-controlled-current sources $VCCSs_{15}$, which in the FIG. 15 illustration are 3-channels $VCCS1_{15}$, $VCCS2_{15}$, and $VCCS3_{15}$ but could be more depending on the application requirement. The gains of $VCCS1_{15}$, $VCCS2_{15}$, and $VCCS3_{15}$ can be programmed to $a/g_{15}$, $b/g_{15}$, and $c/g_{15}$, respectively. It is of note that the CCVS and plurality of VCCS can be implemented with current mirrors, such as the one illustrated in FIG. 14 (e.g., $M4_{14}$, $M1_{14}$, $M2_{14}$, and $M3_{14}$). A plurality of iDAC's reference ports are supplied with a respective plurality of proportional replicates of scalar iDAC's output current signal as follows:

An $iDACw_{15}$ is supplied with the $VCCS1_{15}$'s output current ($a \times Az_{15}$) at $iDACw_{15}$'s reference port $wR_{15}$ port. The $iDACw_{15}$ receives a w-bits wide digital input word $Dw_{15}$, and accordingly $iDACw_{15}$ generates an analog output current signal $a \times Az_{15} \times Aw_{15}$.

An $iDACx_{15}$ is supplied with the $VCCS2_{15}$'s output current ($b \times Az_{15}$) at $iDACx_{15}$'s reference port $xR_{15}$ port. An $iDACx_{15}$ receives a v-bits wide digital input word $Dx_{15}$, and accordingly $iDACx_{15}$ generates an analog output current signal $b \times Az_{15} \times Ax_{15}$.

An $iDACy_{15}$ is supplied with the $VCCS3_{15}$'s output current ($c \times Az_{15}$) at $iDACy_{15}$'s reference port $yR_{15}$ port. An $iDACy_{15}$ receives a y-bits wide digital input word $Dy_{15}$, and accordingly $iDACy_{15}$ generates an analog output current signal $c \times A_{z15} \times Ay_{15}$.

A bias $iDACb_{15}$ is supplied with a reference current signal $I2_{15}$ at its $bR_{15}$ port, receives a b-bits wide digital input word $Db_{15}$, and accordingly $iDACb_{15}$ generates an analog output current signal $Ab_{15}$.

The current outputs of $iDACw_{15}$, $iDACx_{15}$, $iDACy_{15}$, and $iDACb_{15}$ are coupled together to generate a summation current signal of $a \times Az_{15} \times Aw_{15} + b \times Az_{15} \times Ax_{15} + c \times Az_{15} \times Ay_{15} + Ab_{15} = Az_{15} \times (a \times A_{w15} + b \times Ax_{15} + c \times Ay_{15}) + Ab_{15}$. This summation current signal is concurrently fed onto a current input port of $iADC_{15}$ which is a current-mode analog-to-digital-converter (iADC), which generates a o-bits wide digital output word $Do_{15}$ which is the digital representation of the $D_iD_o$ iMACiDAC output signal $Az_{15} \times (a \times Aw_{15} + b \times Ax_{15} + c \times Ay_{15}) + Ab_{15}$.

In summary, the $D_iD_o$ sMACiDAC embodiment illustrated in FIG. 15 that processes signals in current-mode utilizing iDACs has the following benefits:

First, the disclosed $D_iI_o$ sMACiDAC utilizing plurality of current-mode iDACs whose certain outputs can be coupled together and biased (in current mode) saves area (lower cost) and improved performance (faster dynamic response), in part for its efficacy in performing summation in current-mode that can be accomplished by simply coupling plurality of current signals.

Second, standard iDACs or factorized or floating iDACs methods (described earlier in the disclosure) can be utilized, which saves area and reduces FETs sizes with lower capacitances in the iDAC's current reference network, which in turn lowers the cost, reduces the size, and improves the transient response of the $D_iD_o$ sMACiDAC that utilizes such iDACs.

Third, as noted earlier, operating in current mode has the following benefits for the disclosed $D_iD_o$ sMACiDAC: (a) current mode is inherently fast, (b) voltage swings in current-mode signal processing are small, which enables operating with lower power supply voltage and operating at low supply voltages facilitates reducing power consumption, (c) current-mode signal processing such as addition or subtraction functions take small area and can be performed fast.

Fourth, there are no passive devices in the disclosed $D_iD_o$ sMACiDAC of FIG. 15, and as such there is no need for resistors or capacitors, which reduces manufacturing size and cost.

Fifth, the precision of the disclosed $D_iD_o$ sMACiDAC can be improved by improving the accuracy of iDACs (for example) by segmenting the iDAC's reference current transfer-function (along with digital binary-to-thermometer logic decoding of iDAC's digital input code).

Sixth, the disclosed $D_iD_o$ sMACiDAC of FIG. 15 can utilize lower resolution iDACs (e.g., 3-bits or 5-bits) to perform the multiplication function, which occupy smaller areas, but can still deliver higher accuracy (e.g., 8-bits of accuracy or ±0.4%) which is beneficial. For example, higher than 3 of 5 bits of accuracy for iDACs is attainable in standard CMOS fabrication factories due to (8-bits of accuracy or ±0.4%)) matching that is achievable between the iDAC's binary weighted current sources or segmented current sources. As such, the disclosed $D_iD_o$ sMACiDAC can utilize low resolution iDACs that occupy small areas but still achieve higher accuracy multiply-accumulate performance at lower cost.

Seventh, dynamic power consumption is lower because the $D_iD_o$ sMACiDAC by utilizing floating, factorized, or combination of floating and factorized iDACs which have smaller sized FETs (in the input-to-output transfer function network) which would consume less dynamic current to drive smaller FET devices during digital input code transitions.

Eight, the $D_iD_o$ sMACiDAC that utilizes floating iDAC can be arranged free of clock, suitable for asynchronous (clock free) computation.

Ninth, the $D_iD_o$ sMACiDAC that utilizes same type of MOSFET current sources and MOSFET switches in the respective floating, factorized, or combination of floating and factorized iDACs, which are symmetric, matched, and scaled. Such arrangement facilitates device parameters to track each other over process, temperature, operating condition variations. Accordingly, the $D_iD_o$ sMACiDAC's temperature coefficient, power supply coefficient, and AC power supply rejection performance can be enhanced.

Tenth, while digital computation is generally accurate but it may be excessively power hungry. Current-mode analog and mixed-signal computation that is disclosed here can be approximate but signal processing can be accomplished asynchronously and power consumption can be lower. Moreover, analog current errors here generally may result in degradation but (not total failures) of analog computation, which provides the end-application with approximate results to work with instead of experiencing failed results.

Eleventh, utilizing plurality of iDACs, whose outputs are summed, would attenuate the statistical contribution of the cumulative iDAC's random errors (such as random noise, offset, mismatches, linearity, gain, drift, etc.) at the summing node where the iDAC's current outputs are coupled. The statistical contribution of such cumulative iDAC's random errors, at the summing node, is the square root of the sum of the squares of such random error terms.

Figure 16:
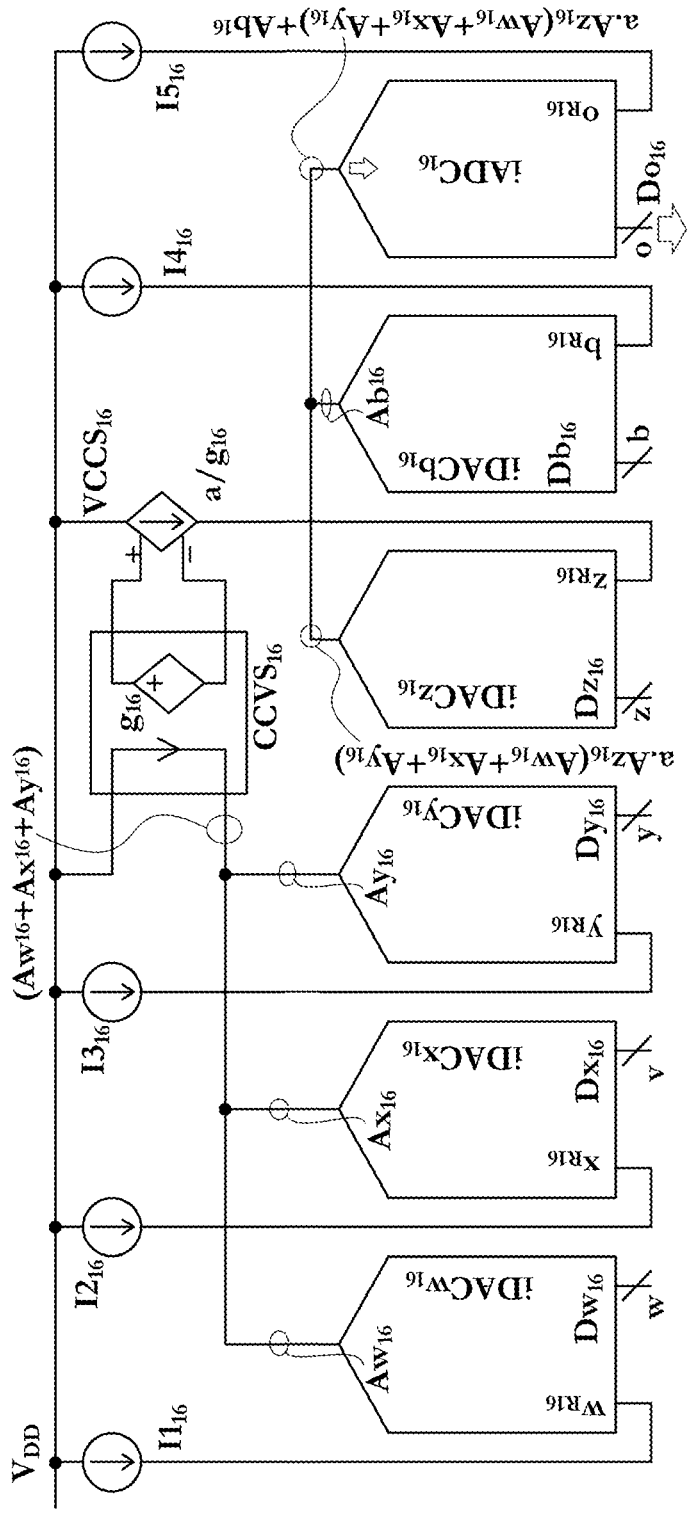
FIG. 16 is a simplified functional block diagram illustrating another embodiment of a mixed-signal current-mode scalar multiply-accumulate (sMACiDAC) circuit. The disclosed sMACiDAC is another mixed-signal current-mode digital-input to digital-output ($D_iD_o$) scalar multiply-accumulate (sMAC) plus bias circuit utilizing current-mode digital-to-analog-converters (iDAC) and current-mode analog-to-digital converters (iADC).

Section 16—Description of FIG. 16

FIG. 16 is a simplified functional block diagram illustrating another embodiment of a mixed-signal current-mode scalar multiply-accumulate (sMACiDAC) circuit. The disclosed sMACiDAC is another mixed-signal current-mode digital-input to digital-output ($D_iD_o$) scalar multiply-accumulate (sMAC) plus bias circuit utilizing current-mode digital-to-analog-converters (iDAC) and current-mode analog-to-digital converters (iADC).

Utilizing current-mode data-converters, the $D_iD_o$ sMACiDAC embodiment disclosed in FIG. 16, first a plurality of current signals are summed together, wherein the said summation current signal is multiplied by a scalar current signal, whose products are summed together in current-mode and added to a bias current signal to generate a final summation signal. This final summation current signal is digitized via a current-mode analog-to-digital-converter (iADC). FIG. 16 disclosure performs the multiply-accumulate function by utilizing analog and mixed-signal signal processing in current-mode, by arranging data-converters to leverage the distributive property of multiplication, to save area and improve performance in multiply-accumulate functions needed in AI and ML applications. As such, the embodiment disclosed in FIG. 16, performs the function of $$\sum_{i=1}^{p}(s \times W_i + b),$$

where s is scalar current signal (e.g., s can be programmed by iDACz$_{16}$), W$_i$ is plurality of weight current signals with p as pluralities of channels (e.g., p=3 of W$_i$ current signals can be programmed by iDACw$_{16}$, iDACx$_{16}$, and iDACy$_{16}$, respectively), and b is bias current signal (e.g., b current signal can be programmed by DACb$_{16}$). As indicated in prior sections, the illustration of FIG. 16 depicts (plurality) p=3 channels for clarity of description, but n can be a sea of channels depending on application and as many as 1000.

In FIG. 16, a plurality of iDAC's reference ports are supplied with a respective plurality of current reference signals, wherein the plurality of iDACs generate a plurality of output current signals, which are coupled together to generate a summation current signal as follows: An iDACw$_{16}$ is supplied with the I1$_{16}$ reference current at iDACw$_{16}$'s reference port wR$_{16}$ port. The iDACw$_{16}$ receives a w-bits wide digital input word Dw$_{16}$, and accordingly iDACw$_{16}$ generates an analog output current signal Aw$_{16}$. An iDACx$_{16}$ is supplied with the I2$_{16}$ reference current at iDACx$_{16}$'s reference port xR$_{16}$ port. The iDACx$_{16}$ receives a v-bits wide digital input word Dx$_m$, and accordingly iDACx$_{16}$ generates an analog output current signal Ax$_{16}$. An iDACy$_{16}$ is supplied with the I3$_{16}$ reference current at iDACy$_{16}$'s reference port yR$_{16}$ port. The iDACy$_{16}$ receives a y-bits wide digital input word Dy$_{16}$, and accordingly iDACy$_{16}$ generates an analog output current signal Ay$_{16}$. The output currents of the iDACw$_{16}$, iDACx$_{16}$, and iDACy$_{16}$ are coupled together to generate a summation current represented by Aw$_{16}$+Ay$_{16}$+Ax$_{16}$ which is fed onto an input port of current-controlled-voltage source CCVS$_{16}$ (which a gain of g$_{16}$) whose output is coupled with an input of a voltage-controlled-current-source VCCS$_{16}$ (which a gain of a/g$_{16}$). Considering the net-gain of g$_{16}$×1/g$_{16}$=a attributed to CCVS$_{16}$ and VCCS$_{16}$ combination, output current representing (Aw$_{16}$+Ay$_{16}$+Ax$_{16}$)×a is generated at the output port of VCCS$_{16}$.

The output current of VCCS$_{16}$ is concurrently fed onto zR$_{16}$ which is a reference input terminal of a scalar iDACz$_{16}$. The iDACz$_{16}$ receives a z-bits wide digital input word Dz$_{16}$, and accordingly iDACz$_{16}$ generates an analog output current signal that represents a×Az$_{16}$×(Aw$_{16}$+Ay$_{16}$+Ax$_{16}$).

Also concurrently, a bias iDACb$_{16}$ is supplied with a reference current signal I4$_{16}$ at its bR$_{16}$ port, receives a b-bits wide digital input word Db$_{16}$, and accordingly iDACb$_{16}$ generates an analog output current signal Ab$_{16}$.

The output of iDACz$_{16}$ and output of iDACb$_{16}$ are coupled together to generate a final summation current signal representing a×Az$_{16}$×(Aw$_{16}$+Ay$_{16}$+Ax$_{16}$)+Ab$_{16}$. This final summation current signal is concurrently fed onto a current input port of iADC$_{16}$ which is a current-mode analog-to-digital-converter (iADC), which generates a o-bits wide digital output word Do$_{16}$ which is the digital representation of the $D_iD_o$ iMACiDAC output signal $a \times Az_{16} \times (Aw_{16}+Ay_{16}+Ax_{16})+Ab_{16}$.

Bear in mind that FIG. 13 can be a circuit embodiment of the functional block diagram illustrating the embodiment of $D_iD_o$ sMACiDAC circuit of FIG. 16, excluding the iDACb$_{16}$ and iADC$_{16}$. Also, keep in mind that similar to the circuit embodiment illustrated in FIG. 13, the CCVS$_{16}$ and VCCS$_{16}$ combination in FIG. 16 can correspond to the iTv$_{13}$ and vTi$_{13}$ combination in FIG. 13 (comprising of M26$_{13}$, M27$_{13}$, M31$_{13}$, and M32$_{13}$ and Ij$_{13}$, Ij'$_{13}$).

In summary, the embodiment illustrated in FIG. 16 of a mixed-mode scalar multiply-accumulate ($D_iD_o$ sMACiDAC) circuit that processes signals in current-mode utilizing iDACs has the following benefits:

First, the disclosed $D_iI_o$ sMACiDAC utilizing plurality of current-mode iDACs whose certain outputs can be coupled together and biased in current mode, which saves area and lowers cost, and improved performance with faster dynamic response, in part for its efficacy in performing summation in current-mode that can be accomplished by simply coupling plurality of current signals.

Second, standard iDACs or factorized or floating iDACs methods (described earlier in the disclosure) can be utilized, which saves area and reduces FETs sizes carrying lower capacitances in the iDAC's current reference network, which in turn lowers cost, reduces the size, and improves the transient response of the $D_iD_o$ sMACiDAC that utilizes such iDACs.

Third, as noted earlier, operating in current mode has the following benefits for the disclosed $D_iD_o$ sMACiDAC: (a) current mode is inherently fast, (b) voltage swings in current-mode signal processing are small, which enables operating with lower power supply voltage and operating at low supply voltages facilitates reducing power consumption, (c) current-mode signal processing such as addition or subtraction functions take small area and can be performed fast.

Fourth, there are no passive devices in the disclosed $D_iD_o$ sMACiDAC of FIG. 16, and as such it does not require resistors or capacitors, which reduces manufacturing size and cost.

Fifth, the precision of the disclosed $D_iD_o$ sMACiDAC can be improved by improving the accuracy of iDACs (for example) by segmenting the iDAC's reference current transfer-function (along with digital binary-to-thermometer logic decoding of iDAC's digital input code).

Sixth, the disclosed $D_iD_o$ sMACiDAC of FIG. 16 can utilize lower resolution iDACs (e.g., 3-bits or 5-bits) to perform the multiplication function, which occupy smaller areas, but can still deliver higher accuracy (e.g., 8-bits of accuracy or ±0.4%) which is beneficial. For example, higher than 3 of 5 bits of accuracy for iDACs is attainable in standard CMOS fabrication factories due to (8-bits of accuracy or ±0.4%) matching that is achievable between the iDAC's binary weighted current sources or segmented current sources. As such, the disclosed $D_iD_o$ sMACiDAC can utilize low resolution iDACs that occupy small areas but still achieve higher accuracy multiply-accumulate performance at lower cost.

Seventh, dynamic power consumption is lower because the $D_iD_o$ sMACiDAC by utilizing floating, factorized, or combination of floating and factorized iDACs which have smaller sized FETs (in the input-to-output transfer function network) which would consume less dynamic current to drive smaller FET devices during digital input code transitions.

Eight, the $D_iD_o$ sMACiDAC that utilizes floating iDAC can be arranged free of clock, suitable for asynchronous (clock free) computation.

Ninth, the $D_iD_o$ sMACiDAC that utilizes same type of MOSFET current sources and MOSFET switches in the respective floating, factorized, or combination of floating and factorized iDACs, which are symmetric, matched, and scaled. Such arrangement facilitates device parameters to track each other over process, temperature, and operating condition variations. Accordingly, the $D_iD_o$ sMACiDAC's temperature coefficient, power supply coefficient, and AC power supply rejection performance can be enhanced.

Tenth, while digital computation is generally accurate but it may be excessively power hungry. Current-mode analog and mixed-signal computation that is disclosed here can be approximate but signal processing can be accomplished asynchronously and power consumption can be lower. Moreover, analog current errors here generally may result in degradation but (not total failures) of analog computation, which provides the end-application with approximate results to work with instead of experiencing failed results.

Thirteenth, utilizing plurality of iDACs, whose outputs are summed, would attenuate the statistical contribution of the cumulative iDAC's random errors (such as random noise, offset, mismatches, linearity, gain, drift, etc.) at the summing node where the iDAC's current outputs are coupled. The statistical contribution of such cumulative iDAC's random errors, at the summing node, is the square root of the sum of the squares of such random error terms.

Figure 17:
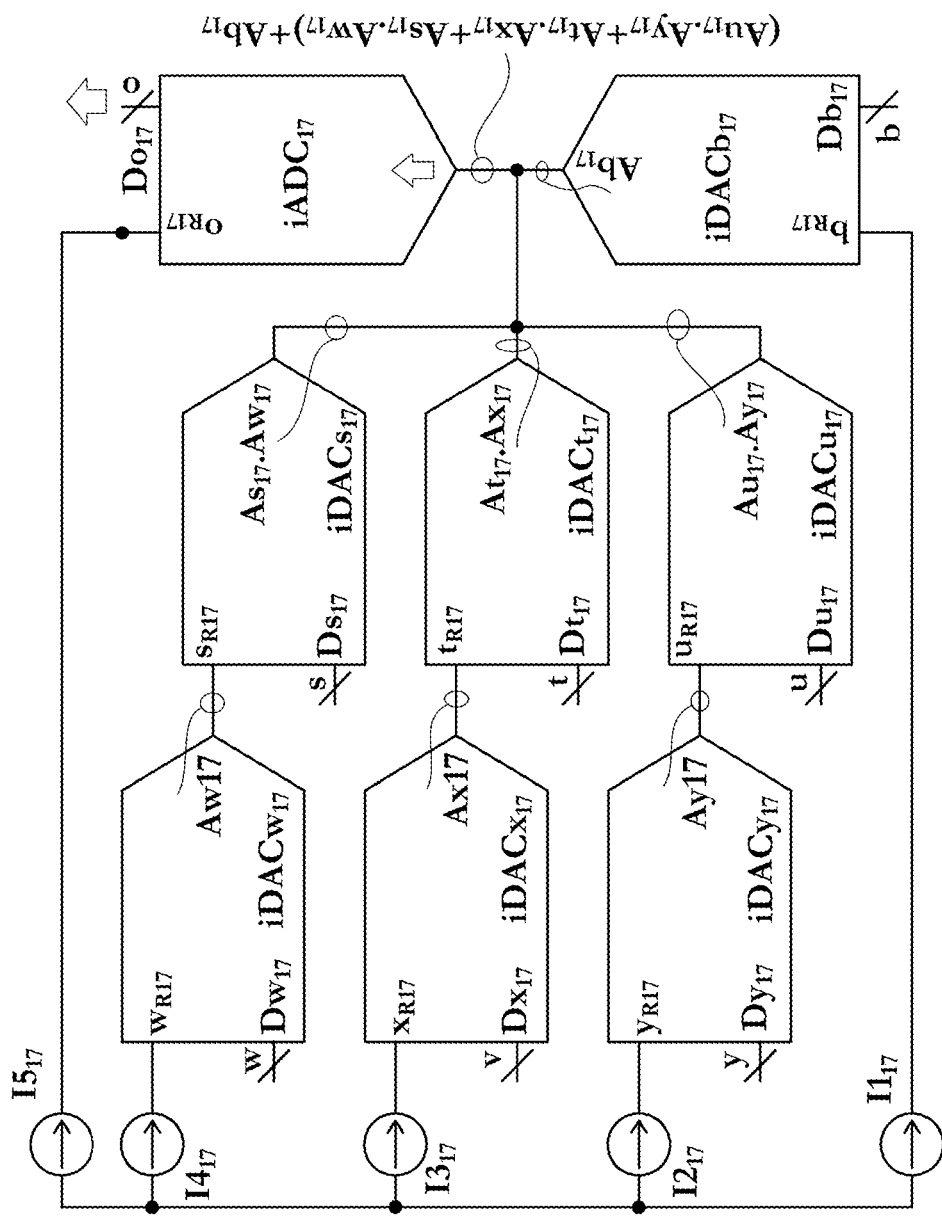
FIG. 17 is a simplified functional block diagram illustrating an embodiment of a mixed-signal current-mode multiply-accumulate (iMACiDAC) circuit. The disclosed iMACiDAC is a mixed-signal current-mode digital-input to digital-output ($D_iD_o$) multiply-accumulate (iMAC) circuit plus bias circuit utilizing current-mode digital-to-analog-converters (iDAC) and current-mode analog-to-digital converters (iADC).

Section 17—Description of FIG. 17

FIG. 17 is a simplified functional block diagram illustrating an embodiment of a mixed-signal current-mode multiply-accumulate (iMACiDAC) circuit. The disclosed iMACiDAC is a mixed-signal current-mode digital-input to digital-output ($D_iD_o$) multiply-accumulate (iMAC) circuit plus bias circuit utilizing current-mode digital-to-analog-converters (iDAC) and current-mode analog-to-digital converters (iADC).

The $D_iD_o$ iMACiDAC embodiment disclosed in FIG. 17 is arranged with a plurality of weight iDACs to generate a plurality of weight current signals that feed the reference input of a respective plurality of data iDACs. A respective plurality of the data iDACs outputs generate a respective plurality of products as analog current representations of a respective plurality of the weight iDACs input signals multiplied by a respective plurality of the data iDACs input signals. The respective plurality of the data iDACs outputs are coupled together to generate a summation current signal that is then added to a bias current signal to generate a final summation current signal, wherein the bias current signal is programmed by a bias iDAC. This final summation current signal is digitized via a current-mode analog-to-digital-converter (iADC) whose digital outputs represent a summation of bias iDAC input signal added with a summation of the products of the respective weight iDAC input signals multiplied by the respective data iDAC input signals.

FIG. 17 discloses an embodiment that performs a multiply-accumulate function by performing analog and mixed-signal processing utilizing current-mode data-converters, arranged in such a way to leverage the distributive property of multiplication, which save area and improve performance of multiply-accumulate functions needed in AI and ML applications. As such, the embodiment disclosed in FIG. 17, performs the function of $$\sum_{i=1}^{p}(D_i \times W_i + b),$$

where $D_i$ is plurality of 'data current signals' with p as plurality (e.g., p=3 of $D_i$ can be generated by $iDACs_{17}$, $iDACt_{17}$, and $iDACu_{17}$), $W_i$ is plurality of 'weight current signals' with p again as plurality (e.g., again with p=3 of $W_i$ current signals that can be generated by $iDACw_{16}$, $iDACx_{16}$, and $iDACy_{16}$, respectively), and b is 'bias current signal' (e.g., b current signal can be generated by $DACb_{17}$). As indicated in prior sections, the illustration of FIG. 17 depicts (plurality) p=3 for clarity of description, but n can be a sea of multiplying iDAC channels depending on application and as many as 1000.

In FIG. 17, a weight $iDACw_{17}$ is supplied with a reference current signal $I4_{17}$ at its $wR_{17}$ port. Also, $iDACw_{17}$ receives a w-bits wide digital input word $Dw_{17}$, and accordingly $iDACw_{17}$ generates an analog output current signal $Aw_{17}$. Concurrently, a data $iDACs_{17}$ is supplied with $Aw_{17}$ at its $sR_{17}$ reference input port, while $iDACs_{17}$ receives a s-bits wide digital input word $Ds_{17}$, and accordingly $iDACs_{17}$ generates an analog output current signal $As_{17} \times Aw_{17}$, which represents the product of w 'weight current signal' multiplied by s 'data current signal'.

A weight $iDACx_{17}$ is supplied with a reference current signal $I3_{17}$ at its $xR_{17}$ port. Also, $iDACx_{17}$ receives a v-bits wide digital input word $Dx_{17}$, and accordingly $iDACx_{17}$ generates an analog output current signal $Ax_{17}$. Concurrently, a data $iDACt_{17}$ is supplied with $Ax_{17}$ at its $tR_{17}$ reference input port, while $iDACt_{17}$ receives a t-bits wide digital input word $Dt_{17}$, and accordingly $iDACt_{17}$ generates an analog output current signal $At_{17} \times Ax_{17}$, which represents the product of x 'weight current signal' multiplied by t 'data current signal'.

A weight $iDACy_{17}$ is supplied with a reference current signal $I2_{17}$ at its $yR_{17}$ port. Also, $iDACy_{17}$ receives a y-bits wide digital input word $Dy_{17}$, and accordingly $iDACy_{17}$ generates an analog output current signal $Ay_{17}$. Concurrently, a data $iDACu_{17}$ is supplied with $Ay_{17}$ at its $uR_{17}$ reference input port, while $iDACu_{17}$ receives a u-bits wide digital input word $Du_{17}$, and accordingly $iDACu_{17}$ generates an analog output current signal $Au_{17} \times Ay_{17}$, which represents the product of y 'weight current signal' multiplied by u 'data current signal'.

A bias $iDACb_{17}$ is supplied with a reference current signal $I1_{17}$ at its $bR_{17}$ reference input port. Also, $iDACb_{17}$ receives a b-bits wide digital input word $Db_{17}$, and accordingly $iDACb_{17}$ generates an analog output current signal $Ab_{17}$.

The output of $iDACb_{17}$, $iDACs_{17}$, $iDACt_{17}$, and $iDACu_{17}$ are coupled together to generate a final summation current signal representing $(Au_{17} \times Ay_{17} + At_{17} \times Ax_{17} + As_{17} \times Aw_{17}) + Ab_{17}$.

This final summation current signal is concurrently fed onto a current input port of $iADC_{17}$ which is a current-mode analog-to-digital-converter (iADC), which generates a o-bits wide digital output word $Do_{17}$ which is the digital representation of the $D_iD_o$ iMACiDAC output signal $(Au_{17} \times Ay_{17} + At_{17} \times Ax_{17} + As_{17} \times Aw_{17}) + Ab_{17}$.

In summary, the embodiment of $D_iD_o$ sMACiDAC circuit illustrated in FIG. 17 processes signals in current-mode utilizing iDACs has the following benefits:

First, the disclosed $D_iI_o$ sMACiDAC utilizing plurality of current-mode iDACs whose certain outputs can be coupled together and biased in current mode, which saves area and lowers cost, and improved performance with faster dynamic response, in part for its efficacy in performing summation in current-mode that can be accomplished by simply coupling plurality of current signals.

Second, standard iDACs or factorized or floating iDACs methods (described earlier in the disclosure) can be utilized, which saves area and reduces FETs sizes carrying lower capacitances in the iDAC's current reference network, which in turn lowers cost, reduces the size, and improves the transient response of the $D_iD_o$ sMACiDAC that utilizes such iDACs.

Third, as noted earlier, operating in current mode has the following benefits for the disclosed $D_iD_o$ sMACiDAC: (a) current mode is inherently fast, (b) voltage swings in current-mode signal processing are small, which enables operating with lower power supply voltage and operating at low supply voltages facilitates reducing power consumption, (c) current-mode signal processing such as addition or subtraction functions take small area and can be performed fast.

Fourth, there are no passive devices in the disclosed $D_iD_o$ sMACiDAC of FIG. 17, and as such there is no need for resistors or capacitors, which reduces manufacturing size and cost.

Fifth, the precision of the disclosed $D_iD_o$ sMACiDAC can be improved by improving the accuracy of iDACs (for example) by segmenting the iDAC's reference current transfer-function (along with digital binary-to-thermometer logic decoding of iDAC's digital input code).

Sixth, the disclosed $D_iD_o$ sMACiDAC of FIG. 17 can utilize lower resolution iDACs (e.g., 3-bits or 5-bits) to perform the multiplication function, which occupy smaller areas, but can still deliver higher accuracy (e.g., 8-bits of accuracy or ±0.4%) which is beneficial. For example, higher than 3 of 5 bits of accuracy for iDACs is attainable in standard CMOS fabrication factories due to (8-bits of accuracy or ±0.4%) matching that is achievable between the iDAC's binary weighted current sources or segmented current sources. As such, the disclosed $D_iD_o$ sMACiDAC can utilize low resolution iDACs that occupy small areas but still achieve higher accuracy multiply-accumulate performance at lower cost.

Seventh, dynamic power consumption is lower because the $D_iD_o$ sMACiDAC by utilizing floating, factorized, or combination of floating and factorized iDACs could have smaller sized FETs (in the input-to-output transfer function network) which would consume less dynamic current to drive smaller FET devices during digital input code transitions.

Eight, the $D_iD_o$ sMACiDAC that utilizes floating iDAC can be arranged free of clock, suitable for asynchronous (clock free) computation.

Ninth, the $D_iD_o$ sMACiDAC that utilizes same type of MOSFET current sources and MOSFET switches in the respective floating, factorized, or combination of floating and factorized iDACs, which are symmetric, matched, and scaled. Such arrangement facilitates device parameters to track each other over process-temperature-operation conditions variations. Accordingly, the $D_iD_o$ sMACiDAC's temperature coefficient, power supply coefficient, and AC power supply rejection performance can be enhanced.

Tenth, while digital computation is generally accurate but it may be excessively power hungry. Current-mode analog and mixed-signal computation that is disclosed here can be approximate but signal processing can be accomplished asynchronously and power consumption can be lower. Moreover, analog current errors here generally may result in degradation but (not total failures) of analog computation, which provides the end-application with approximate results to work with instead of experiencing failed results.

Eleventh, utilizing plurality of iDACs, whose outputs are summed, would attenuate the statistical contribution of the cumulative iDAC's random errors (such as random noise, offset, mismatches, linearity, gain, drift, etc.) at the summing node where the iDAC's current outputs are coupled. The statistical contribution of such cumulative iDAC's random errors, at the summing node, is the square root of the sum of the squares of such random error terms.

Figure 18:
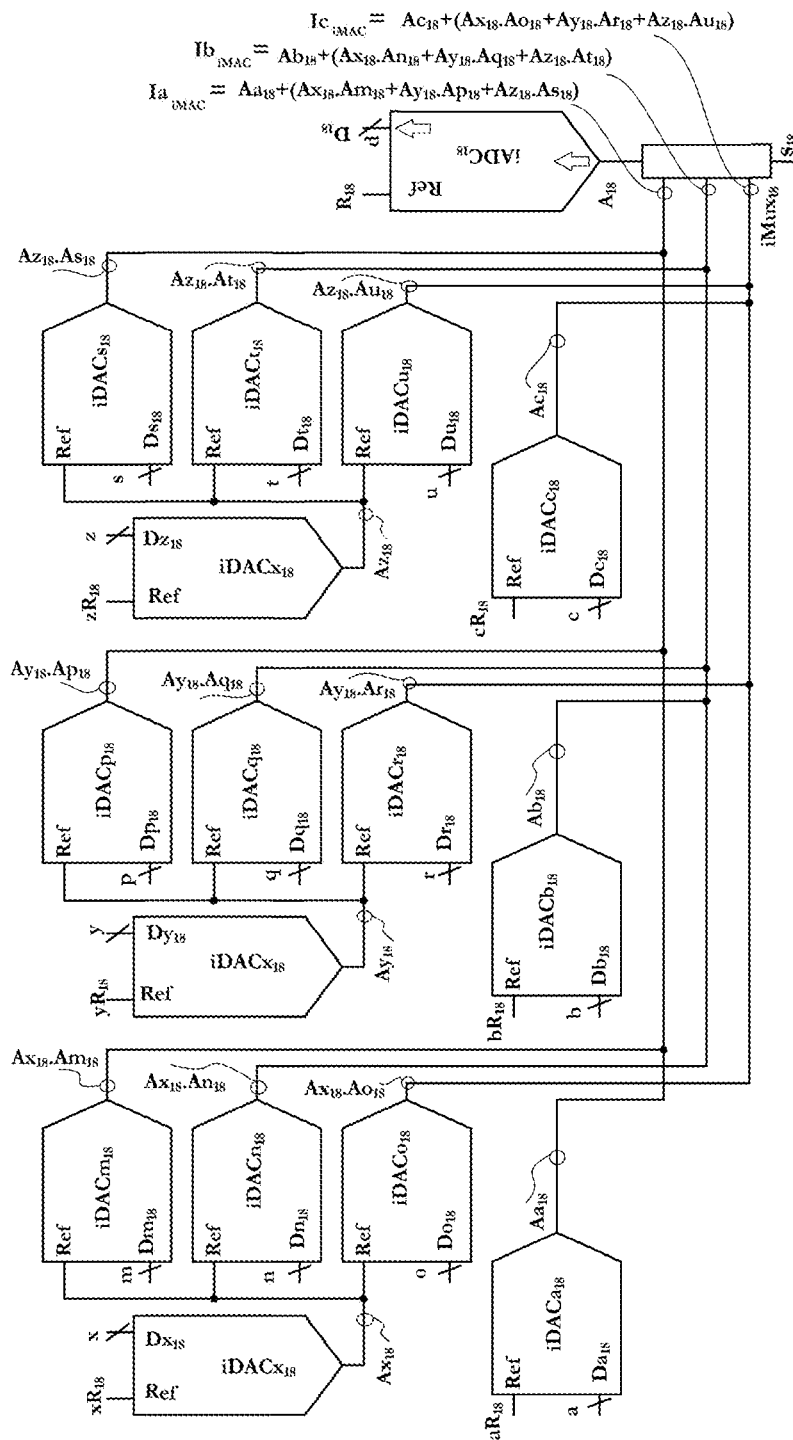
FIG. 18 is a simplified functional block diagram illustrating an embodiment of a mixed-signal current-mode Artificial Neural Network (iANN) circuit. The disclosed iANN is a mixed-signal current-mode digital-input to digital-output ($D_iD_o$) iANN circuit utilizing current-mode multiply-accumulate (iMAC) circuits that utilize current-mode digital-to-analog-converter (iDAC) and current-mode analog-to-digital converter (iADC) circuits.

Section 18—Description of FIG. 18

FIG. 18 is a simplified functional block diagram illustrating an embodiment of a mixed-signal current-mode Artificial Neural Network (iANN) circuit. The disclosed iANN is a mixed-signal current-mode digital-input to digital-output $(D_iD_o)$ iANN circuit utilizing current-mode multiply-accumulate (iMAC) circuits that utilize current-mode digital-to-analog-converter (iDAC) and current-mode analog-to-digital converter (iADC) circuits.

Consider that in the FIG. 18 illustrates 3 channels of iDACs (e.g., $iDACm_{18}$-$iDACn_{18}$-$iDACo_{18}$, or $iDACp_{18}$-$iDACq_{18}$-$iDACr_{18}$, or $iDACs_{18}$-$iDACt_{18}$-$iDACu_{18}$, or $iDACx_{18}$-$iDACy_{18}$-$iDACz_{18}$, or $iDACa_{18}$-$iDACb_{18}$-$iDACc_{18}$, and so on) for clarity of description and illustration purposes only, but 3 channels are not a limitation of this disclosure. For example, a sea of iDACs (e.g., less than 1000 channels) can be utilized here depending on end-applications.

In FIG. 18, an $iDACx_{18}$ receives a reference current signal $xR_{18}$, a x-bits wide digital input word $Dx_{18}$, and generates an analog output current signal $Ax_{18}$. Keep in mind that the $Ax_{18}$ can be replicated, as illustrated in FIG. 15, and supplied to plurality of reference inputs of a respective plurality of iDACs comprising of $iDACm_{18}$, $iDACn_{18}$, and $iDACo_{18}$. Accordingly, an $iDACm_{18}$ receives a m-bits wide digital input word $Dm_{18}$, and generates an analog output current signal $Ax_{18} \times Am_{18}$. An $iDACn_{18}$ receives a n bits wide digital input word $Dn_{18}$, and generates an analog output current signal $Ax_{18} \times An_{18}$. An $iDACo_{18}$ receives a o-bits wide digital input word $Do_{18}$, and generates an analog output current signal $Ax_{18} \times Ao_{18}$.

An $iDACy_{18}$ receives a reference current signal $yR_{18}$, a y-bits wide digital input word $Dy_{18}$, and generates an analog output current signal $Ay_{18}$. Also, bear in mind that the $Ay_{18}$ can be replicated, similarly as illustrated in FIG. 15, and supplied to plurality of reference inputs of a respective plurality of iDACs comprising of $iDACp_{18}$, $iDACq_{18}$, and $iDACr_{18}$. Accordingly, an $iDACp_{18}$ receives a p-bits wide digital input word $Dp_{18}$, and generates an analog output current signal $Ay_{18} \times Ap_{18}$. An $iDACq_{18}$ receives a q bits wide digital input word $Dq_{18}$, and generates an analog output current signal $Ay_{18} \times Aq_{18}$. An $iDACr_{18}$ receives a r-bits wide digital input word $Dr_{18}$, and generates an analog output current signal $Ay_{18} \times Ar_{18}$.

An $iDACz_{18}$ receives a reference current signal $zR_{18}$, a z-bits wide digital input word $Dz_{18}$, and generates an analog output current signal $Az_{18}$. Also, notice that the $Az_{18}$ can be replicated, similarly as illustrated in FIG. 15, and supplied to plurality of reference inputs of a respective plurality of iDACs comprising of $iDACs_{18}$, $iDACt_{18}$, and $iDACu_{18}$. Accordingly, an $iDACs_{18}$ receives a s-bits wide digital input word $Ds_{18}$, and generates an analog output current signal $Az_{18} \times As_{18}$. An $iDACt_{18}$ receives a t-bits wide digital input word $Dt_{18}$, and generates an analog output current signal $Az_{18} \times At_{18}$. An $iDACu_{18}$ receives a u-bits wide digital input word $Du_{18}$, and generates an analog output current signal $Az_{18} \times Au_{18}$.

A bias $iDACa_{18}$ receives a reference current signal $aR_{18}$, a a-bits wide digital input word $Da_{18}$, and generates an analog output current signal $Aa_{18}$. A bias $iDACb_{18}$ receives a reference current signal $bR_{18}$, a b-bits wide digital input word $Db_{18}$, and generates an analog output current signal $Ab_{18}$. A bias $iDACc_{18}$ receives a reference current signal $cR_{18}$, a c-bits wide digital input word $Dc_{18}$, and generates an analog output current signal $Ac_{18}$.

The outputs of $iDACm_{18}$, $iDACp_{18}$, and $iDACs_{18}$ are coupled together and coupled with output of bias $iDACa_{18}$ which generates the summation analog current signal that is a multiply-accumulate analog current signal $Ia_{iMAC} = [Aa_{18} + (Ax_{18} \times Am_{18} + Ay_{18} \times Ap_{18} + Az_{18} \times As_{18})]$ which can be independently digitized through an iADC or can be fed onto an input of a current mux (iMux) as depicted by $iMUX_{18}$.

Also, the outputs of $iDACn_{18}$, $iDACq_{18}$, and $iDACt_{18}$ are coupled together and coupled with output of bias $iDACb_{18}$ which generates the summation analog current signal that is another multiply-accumulate analog current signal $M_{iMAC} = [Ab_{18} + (Ax_{18} \times An_{18} + Ay_{18} \times Aq_{18} + Az_{18} \times At_{18})]$ which can be independently digitized through another input of a current mux (iMux) as depicted by $iMUX_{18}$.

Moreover, the outputs of $iDACn_{18}$, $iDACq_{18}$, and $iDACt_{18}$ are coupled together and coupled with output of bias $iDACb_{18}$ which generates the summation analog current signal that is another multiply-accumulate analog current signal $Ic_{iMAC} = [Ab_{18} (Ax_{18} \times An_{18} + Ay_{18} \times Aq_{18} + Az_{18} \times At_{18})]$ which can be independently digitized through an iADC or can be fed onto another input of a current mux (iMux) as depicted by $iMUX_{18}$.

A current mux (such as FIG. 18 illustration of an $iMUX_{18}$ which is a 3-to-1 channel analog current mux) with plurality of inputs and one output can consecutively select with ($S_{18}$) and steer the multiply-accumulate analog current signals $Ia_{iMAC}$, $Ib_{iMAC}$, and $Ic_{iMAC}$ into $iADC_{18}$ to digitize the said multiply-accumulate analog current signals at its output $D_{18}$.

Notice that there is flexibility in programming the FIG. 18's iDACs reference signals (e.g., $xR_{18}$, $yR_{18}$, $zR_{18}$, $aR_{18}$, $bR_{18}$, $cR_{18}$, $R_{18}$) such as programming $xR_{18} = yR_{18} = zR_{18}$. Also, depending on the end-application requirements, to save area and current consumption, one bias iDAC can be arranged with its output replicated and supplied to plurality of multiply-accumulate analog current nodes, instead of utilizing plurality of bias iDACs (e.g., $iDACa_{18}$, $iDACb_{18}$, and $iDACc_{i8}$). Moreover, the reference signal of the $iADC_{18}$ can be programmed to accommodate the zero to full scale current signals of the plurality of multiply-accumulate analog currents (e.g., $Ia_{iMAC}$, $Ib_{iMAC}$, and $Ic_{iMAC}$).

In summary, the current-mode Artificial Neural Network (iANN) circuit in illustrated FIG. 18 is a mixed-signal digital-input to digital-output $(D_iD_o)$ iANN that is arranged with plurality of current-mode multiply-accumulate (iMAC) circuits, wherein the iMAC circuits utilize current-mode digital-to-analog-converter (iDAC) and current-mode analog-to-digital converter (iADC) circuits. As such, the disclosed iANN has the following benefits:

First, in part, because summation is a key part of iANN that are arranged with iMAC circuits that utilize iDAC circuits, a simple coupling of iDAC current outputs generates a summation signal in a small area, asynchronously, and at high speeds (since current mode signal processing is inherently fast.

Second, standard iDACs or factorized or floating iDACs methods (described earlier in the disclosure) can be utilized here, which saves area and reduces FETs sizes carrying lower capacitances in the iDAC's current reference network, which in turn lowers cost, reduces the size, and improves the transient response of the iANN.

Third, as noted earlier, operating the iANN in current-mode reduces voltage swings, which enables operating with lower power supply voltage and operating at low supply voltages facilitates reducing power consumption. Additionally, the flexibility to run the CMOSFETs in subthreshold enables the iDACs (and hence the iANN) to operate with ultra-low currents, even lower power supplies, and ultra-low power consumption suitable for mobile applications.

Fourth, there are no passive devices in the disclosed iANN, and as such there is no need for resistors or capacitors, which reduces manufacturing size and cost.

Fifth, the precision of the disclosed iANN can be improved by improving the accuracy of iDACs (for example) by segmenting the iDAC's reference current transfer-function (along with digital binary-to-thermometer logic decoding of iDAC's digital input code).

Sixth, the iANN can utilize lower resolution iDACs (e.g., 3-bits or 5-bits) to perform the multiplication function, which occupy smaller areas, but can still deliver higher accuracy (e.g., 8-bits of accuracy or ±0.4%) which is beneficial. For example, higher than 3 of 5 bits of accuracy for iDACs is attainable in standard CMOS fabrication factories due to (8-bits of accuracy or ±0.4%) matching that is achievable between the iDAC's binary weighted current sources or segmented current sources. As such, the disclosed iANN can utilize low resolution iDACs that occupy small areas but still achieve higher accuracy multiply-accumulate performance at lower cost.

Seventh, dynamic power consumption is lower because iANN can utilize floating, factorized, or combination of floating and factorized iDACs which have smaller sized FETs (in the input-to-output transfer function network) which would consume less dynamic current to drive smaller FET devices during digital input code transitions.

Eight, the iANN that utilizes floating iDAC can be arranged free of clock, suitable for asynchronous (clock free) computation.

Ninth, the iANN that utilizes same type of MOSFET current sources and MOSFET switches in the respective floating, factorized, or combination of floating and factorized iDACs, which are symmetric, matched, and scaled. Such arrangement facilitates device parameters to track each other over process-temperature-operation conditions variations. Accordingly, the iANN temperature coefficient, power supply coefficient, and AC power supply rejection performance can be enhanced.

Tenth, while digital computation is generally accurate but it may be excessively power hungry. Methods of current-mode analog and mixed-signal computation that is disclosed here can be approximate but signal processing can be accomplished asynchronously and power consumption can be lower. Moreover, analog current errors here generally may result in degradation but (not total failures) of analog computation, which provides the end-application with approximate results to work with instead of experiencing failed results.

Eleventh, utilizing plurality of iDACs, whose outputs are summed, would attenuate the statistical contribution of the cumulative iDAC's random errors (such as random noise, offset, mismatches, linearity, gain, drift, etc.) at the summing node where the iDAC's current outputs are coupled. The statistical contribution of such cumulative iDAC's random errors, at the summing node, is the square root of the sum of the squares of such random error terms.

Figure 19:
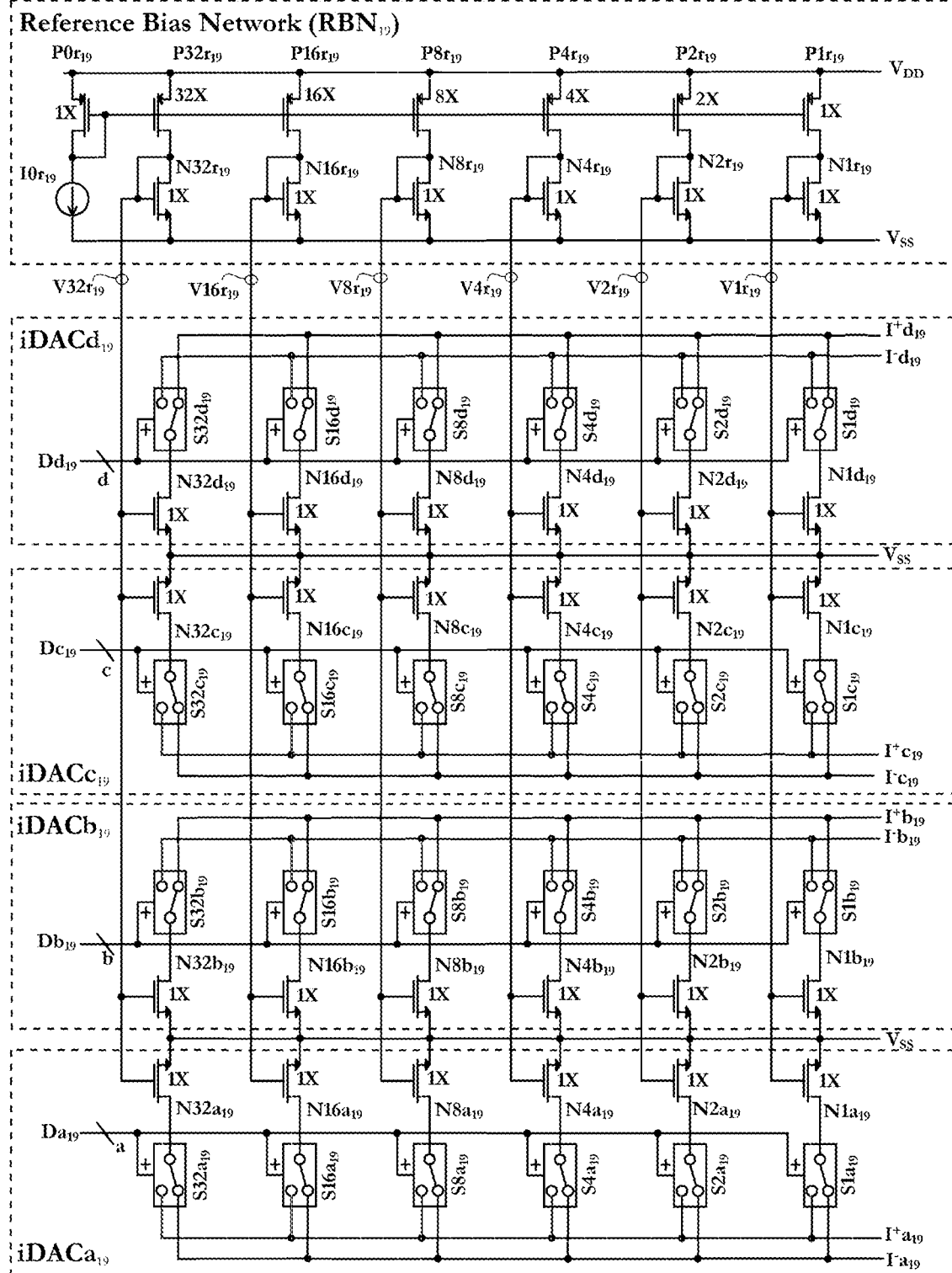
FIG. 19 is a simplified circuit schematic diagram illustrating an embodiment of a multi-channel mixed-signal current-mode digital-to-analog converter (iDAC) utilizing the multiple-channel data-converter method, wherein a central reference bias network (RBN) shares its reference bias voltage bus with plurality of current reference networks of respective plurality of data-converters.

Section 19—Description of FIG. 19

FIG. 19 is a simplified circuit schematic diagram illustrating an embodiment of a multi-channel mixed-signal current-mode digital-to-analog converter (iDAC) utilizing the multiple-channel data-converter method.

One of the objectives of this disclosure is to make multiple-channel (sea of) iDACs with medium-to-high (6-bits to 12-bits) resolution that is small size and low cost. Low cost and small size of sea of iDACs have broad applications, including in machine learning (ML) and artificial intelligence (AI) applications wherein 1000s of iDACs may be utilized as part of for example the multiply-accumulate (MAC) function.

Another objective of this disclosure is to make multiple-channel (sea of) current mode analog to digital converters (iADCs). Similarly, low cost and small size of sea of iADCs have broad base of applications including in ML & AI applications where a plurality of sums of the outputs of a plurality of current-mode MACs (iMACs) may need to be converted to digital signals. The first segments of this section describe iDACs.

For clarity of description, FIG. 19 illustrates only 4-channels of 6-bit iDACs, and this illustration is not a limitation of the disclosure here. Depending on application requirements, the disclosed multiple-channel data-converter method could have 1000s of channels where each iDAC can, for example, have 16-bits of resolution.

Note that for example, in a conventional 6-bit binary iDACs with an LSB current weight of i, binary current source network comprising of current sources $(2^{6-1})i$, $(2^{5-1})i$, $(2^{4-1})i$, $(2^{3-1})i$ $(2^{2-1})i$, and $(2^{1-1})i$ are generated by arranging plurality of paralleled current reference cells. Generally, each current cell is a non-minimum W/L=X carrying an LSB current weight (e.g., i). In a conventional iDAC, identical cells having a 1X (W/L size carrying an LSB current weight of i) are, for example, replicated in parallel 32X, 16X, 8X, 4X, 2X, and 1X times to generate the respective binary reference currents of 32i, 16i, 8i, 4i, 2i, and 1i. Utilizing identical current cells (which dominate the accuracy of an iDACs and that are arranged in parallel to generate the respective binary reference currents) improves the matching between respective binary weighted reference currents, and optimizes the iDAC's accuracy.

As an example, in a conventional 6-bit iDAC the binary weighted currents would require 127 LSB current cells. A conventional 8-bit iDAC's binary weighted currents would require 255 LSB current cells. Thus, a 16-channel conventional 6-bit iDAC array would require about 127×16=2032 LSB current cells and an 8-bit iDAC array would require about 255×16=4080 LSB current cells. In order to attain medium to high accuracy targets for the iDACs, the LSB current cells need to be patterned with non-minimum (larger) size W and L, and as such the numerous LSB current cells which are combined in parallel, dominate the area of the iDACs. As such, conventional iDACs with medium to large resolution are generally prohibitively large and impractical for AI and ML applications that require (numerous channels) sea of iDACs.

Operating in current mode, an iDAC is generally fast. However, because of the numerous paralleled LSB current cells required in conventional medium to high resolution iDACs, the combined parasitic and stray capacitance associated with the array of paralleled LSB current cells would slow down the circuit. For example, in an 8-bit iDAC, the 8th bit or the MSB is comprised of 128× parallel LSB current cells and $7^{th}$ bit is comprised of 64× parallel LSB current cells and so on. Besides occupying large die area, the large size of paralleled current cells can slow down the dynamic response of the conventional iDACs, cause glitch into the iDAC's analog output as well as the power supplier, and increase dynamic current consumption. Consequently, the overall dynamic performance of the iDACs and AI and ML end-system could be degraded.

The disclosed invention, utilizing a multiple-channel data-converter method, substantially reduces the number of the current cells (and thereby minimizes the area of the disclosed iDACs) which makes feasible utilizing sea of the disclosed iDACs with a low cost. Moreover, plurality of the disclosed iDACs with substantially fewer current cells, lowers the combined associated parasitic and stray capacitance associated with current reference cells, which improves the disclosed iDAC's dynamic response, lowers glitch, lowers digital injections into power supplies, and reduces the disclosed iDAC's dynamic power consumption.

A multiple-channel data-converter method disclosed here arranges a plurality of n-bit iDACs, wherein each of the iDACs is comprised of a voltage controlled current sources (VCCS) to generate each iDAC's binary weighted currents. With i representing an LSB current weight, the multiple-channel data-converter method utilizes a reference bias network ($RBN_{19}$) that generates a sequence of individual binary weighted reference bias currents from $(2^{n-1})i$ to $(2^{1-1})i$ that are inputted to a sequence of current controlled voltage sources (CCVS). In turn, the sequences of CCVSs generate a sequence of reference bias voltage buses that correspond to the sequence of binary weighted reference bias currents $(2^{n-1})i$ to $(2^{1-1})i$. The respective output ports of CCVSs, which are a sequence of reference bias voltage busses are coupled to the input of the sequence of the respective plurality of iDACs' VCCSs, that correspond to the respective binary weighted reference bias currents from $(2^{n-1})i$ to $(2^{1-1})i$.

By utilizing the multiple-channel data-converter method, the reference current network of an iADC or that of a plurality of iADCs can also be supplied with sequence of reference bias voltage buses that can bias the sequence of binary weighted reference bias currents $(2^{n-1})i$ to $(2^{1-1})i$ of the iADC or the plurality of iADCs. As such, the multiple-channel data-converter method enables decoupling the weight of a current source from the scaling of the size current source node capacitances of the iADC's current reference networks. This trait, beside saving on die area, can substantially reduce node capacitance along the iADC's signal paths which can speed up the iADC (e.g., the larger the W/L size of a FET current source the larger its capacitance and the slower the node).

Consider that the multiple-channel data-converter method can also be arranged such that a RBN would generate a sequence of individual reference bias currents that are non-linear (e.g., square or logarithmic) where the sequence of individual reference bias currents can then bias the current reference networks (transfer function) for multiple-channels of non-linear iDACs, wherein as a result each of the non-liner iDAC's current reference network would follow a non-linear (e.g., square or logarithmic) digital input to analog current output transfer function.

For example, if a RBN is programmed to approximate a logarithmic transfer function, then a pair of iDACs (e.g., $iDAC_{log\ X}$ and $iDAC_{log\ Y}$) whose reference current networks are biased from the logarithmic RBN can each generate logarithmic outputs in response to their digital inputs (e.g., $D_X$, and $D_Y$). Coupling the outputs of the pair of logarithmic $iDAC_X$ and $iDAC_Y$ would generate a current output that is an analog representation of the product of $D_{log\ X}$ and $D_{log\ Y}$ in the logarithmic domain (i.e., analog current representation of $log[D_X \times D_Y]$. This can be a cost-performance effective arrangement to perform, for example, 1000s of multiplications on one IC by utilizing plurality of pairs of logarithmic iDACs (whose digital input to analog output transfer functions are programmed logarithmically), wherein each logarithmic iDAC can have small reference current network that is biased from the same logarithmic RBN.

Figure 42:
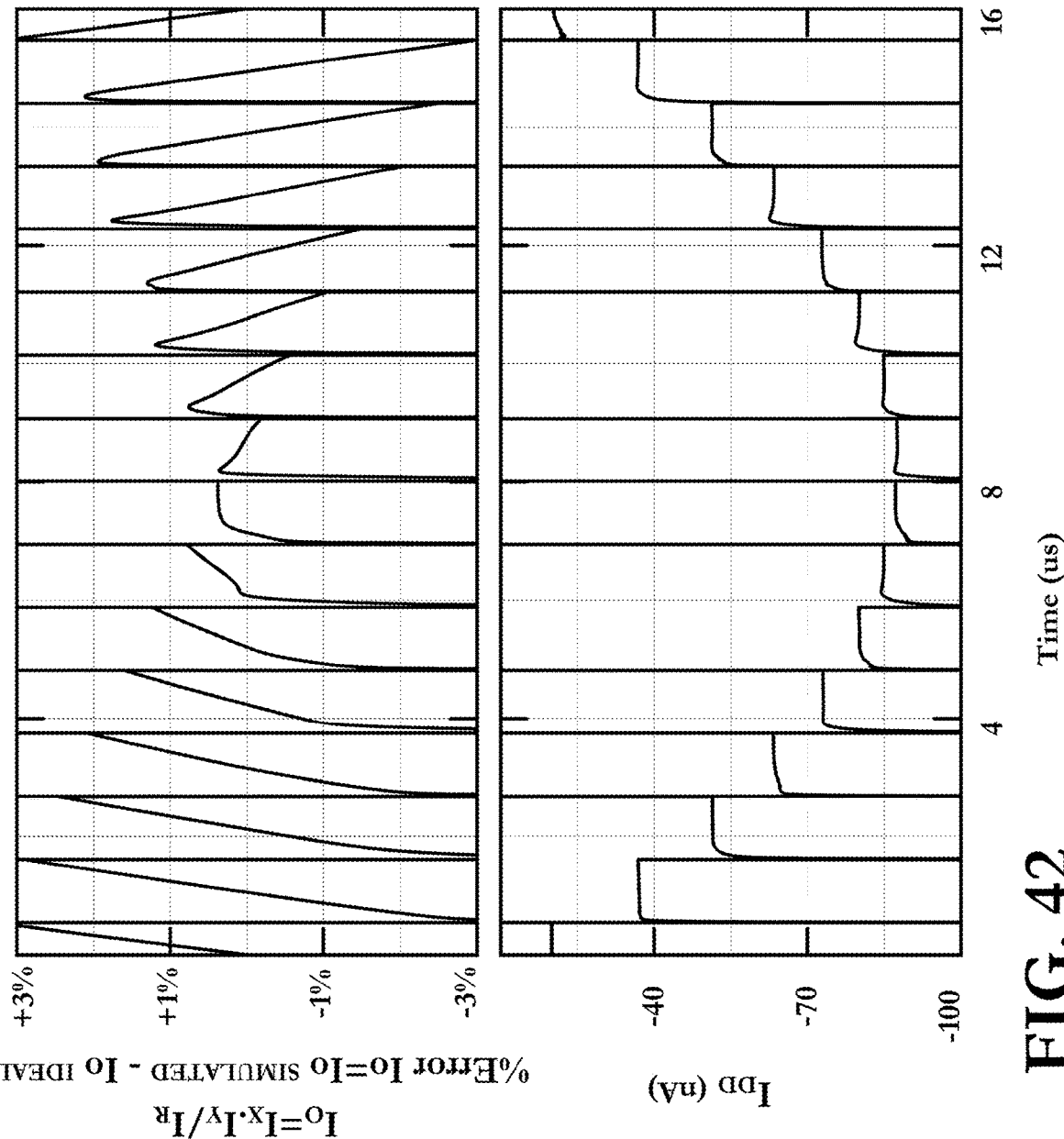
FIG. 42 is a SPICE circuit simulations that illustrates the linearity error in % between an ideal output current (Io$_{ideal}$) of a XD$_i$I$_o$ multiplier versus the simulated output current (Io$_{simulation}$) of a XD$_i$I$_o$ multiplier that is arranged similar to that of FIG. 34 but having a 4-bit resolution.

An alternative example could be to program a RBN that follows an approximate square function. As such a pair of square iDACs (e.g., $iDAC_{(x+y)^2}$ and $iDAC_{(x-y)^2}$) whose reference current networks are biased from the square RBN. Accordingly, each pair of $iDAC_{(x+y)^2}$ and $iDAC_{(x-y)^2}$ can generate square outputs in response to the summation and subtraction of their respective digital inputs (e.g., $D_X+D_Y$, and $D_Y-D_Y$). Bear in mind that multiplication can be performed by a quarter square operation, wherein $(X+Y)^2-(X-Y)^2=4 \times X \times Y$. Therefore, by subtracting the outputs of the pair of $iDAC_{(x+y)^2}$ and $iDAC_{(x-y)^2}$, we can generate a current output that is an analog representation of the product of $D_X$ and $D_Y$ times a scale factor (e.g., scale factor=4). The subtraction operation in current mode can be accomplished cost-performance effectively by feeding the $iDAC_{(x+y)^2}$ and $iDAC_{(x-y)^2}$ current outputs to the input port and output port of a current mirror, respectively. This also can be a cost-performance effective arrangement to perform, for example, 1000s of multiplications in one IC by utilizing plurality of pairs of square iDACs (wherein each of the iDAC's digital input to analog output transfer functions are programmed squarely), wherein each square iDAC has a small reference current network that is biased from the same square RBN. FIG. 42 illustrates atypical simulations of a square iDAC's input-output waveform and linearity, which will be described later.

As noted earlier, for clarity of description, FIG. 19 illustrates an embodiment of the multiple-channel data-converter method with a 4-channels of iDACs wherein each iDAC has 6-bits of resolution. Here, the four channels of iDACs are $iDACa_{19}$, $iDACb_{19}$, $iDACc_{19}$, and $iDACd_{19}$, whose current source networks are biased via reference bias network ($RBN_{19}$) circuit.

In FIG. 19, a $RBN_{19}$ generates a sequence of individual binary weighted reference bias currents as follows: $P32r_{19}$ operating at $I_D$ of $(2^{6-1}) \times i=32i$; $P16r_{19}$ operating at $I_D$ of $(2^{5-1}) \times i=16i$; $P8r_{19}$ operating at $I_D$ of $(2^{4-1}) \times i=8i$; $P4r_{19}$ operating at $I_D$ of $(2^{3-1}) \times i=4i$; $P2r_{19}$ operating at $I_D$ of $(2^{2-1}) \times i=2i$; and $P1r_{19}$ operating at $I_D$ of $(2^{1-1}) \times i=1i$. In the embodiment of FIG. 19, $RBN_{19}$ is comprised of a sequence of CCVS which are implemented as a sequence of diode connected NMOSFETs ($N32r_{19}$, $N16r_{19}$, $N8r_{19}$, $N4r_{19}$, $N2r_{19}$, and $N1r_{19}$) whose gate and drain ports are coupled together, wherein each NMOSFET is scaled with a W/L=1X. Accordingly, the sequence of binary weighted reference bias currents $I32r_{19}$ to $I1r_{19}$ are inputted to the diode connected NMOSFETs (CCVS) which generate a sequence of (gate-to-source) reference bias voltages from reference bias voltage bus $V32r_{19}$ to reference bias voltage bus $V1r_{19}$ as follows: $I_D$ of $P32r_{19}=32i$ is inputted to the (drain-gate ports of the) diode connected $N32r_{19}$ to generate a reference bias bus voltage of $V32r_{19}$; $I_D$ of $P16r_{19}=16i$ is inputted to the diode connected $N16r_{19}$ to generate a reference bias bus voltage of $V16r_{19}$; $I_D$ of $P8r_{19}=8i$ is inputted to the diode connected $N8r_{19}$ to generate a reference bias bus voltage of $V8r_{19}$; $I_D$ of $P4r_{19}=4i$ is inputted to the diode connected $N4r_{19}$ to generate a reference bias bus voltage of $V4r_{19}$; $I_D$ of $P2r_{19}=2i$ is inputted to the diode connected $N2r_{19}$ to generate a reference bias bus voltage of $V2r_{19}$; and $I_D$ of $P1r_{19}=1i$ is inputted to the diode connected $N1r_{19}$ to generate a reference bias bus voltage of $V1r_{19}$.

The $iDACa_{19}$ receives a digital input word $Da_{19}$ that is a=6 bits wide and generates a positive and a negative output currents $I_{a_{19}}^+$ and $I_{a_{19}}^-$, respectively. Here, $N32a_{19}$ which is scaled with W/L=1X (and functioning as $iDACa_{19}$'s $6^{th}$ bit's VCCC) receives the reference bias bus voltage $V32r_{19}$ at its gate port. As such, $I_D$ of $N32a_{19}$ mirrors that of the $N32r_{19}$, and generates $I_D=32i$ for $iDACa_{19}$ which is steered onto either $I_{a_{19}}^+$ or $I_{a_{19}}^-$ in accordance with (the MSB or) the $6^{th}$ bit's polarity of the $Da_{19}$ word. The $N16a_{19}$ which is also scaled with W/L=1X (and functioning as $iDACa_{19}$'s $5^{th}$ bit's VCCC) receives the reference bias bus voltage $V16r_{19}$ at its gate port. As such, $I_D$ of $N16a_{19}$ mirrors that of the $N16r_{19}$, and generates $I_D=16i$ for $iDACa_{19}$ which is steered onto either $I_{a_{19}}^+$ or $I_{a_{19}}^-$, in accordance with the $5^{th}$ bit's polarity of the $Da_{19}$ word. The $N8a_{19}$ is also scaled with W/L=1X (and functioning as $iDACa_{19}$'s $4^{th}$ bit's VCCC) receives the reference bias bus voltage $V8r_{19}$ at its gate port. As such, $I_D$ of $N8a_{19}$ mirrors that of the $N8r_{19}$, and generates $I_D=8i$ for $iDACa_{19}$ which is steered onto either $I_{a_{19}}^+$ or $I_{a_{19}}^-$, in accordance with the $4^{th}$ bit's polarity of the $Da_{19}$ word. The $N4a_{19}$ which is also scaled with W/L=1X (and functioning as $iDACa_{19}$'s $3^{rd}$ bit's VCCC) receives the reference bias bus voltage $V4r_{19}$ at its gate port. As such, $I_D$ of $N4a_{19}$ mirrors that of the $N4r_{19}$, and generates $I_D=4i$ for $iDACa_{19}$ which is steered onto either $I_{a_{19}}^+$ or $I_{a_{19}}^-$ in accordance with the $3^{rd}$ bit's polarity of the $Da_{19}$ word. The $N2a_{19}$ which is also scaled with W/L=1X (and functioning as $iDACa_{19}$'s $2^{nd}$ bit's VCCC) receives the reference bias bus voltage $V2r_{19}$ at its gate port. As such, $I_D$ of $N2a_{19}$ mirrors that of the $N2r_{19}$, and generates $I_D=2i$ for $iDACa_{19}$ which is steered onto either $I4_9$ or/Z, in accordance with the $2^{nd}$ bit's polarity of the $Da_{19}$ word. The $N1a_{19}$ which is also scaled with W/L=1X (and functioning as $iDACa_{19}$'s bit's VCCC) receives the reference bias bus voltage $V1r_{19}$ at its gate port. As such, $I_D$ of $N1a_{19}$ mirrors that of the $N1r_{19}$, and generates $I_D=1i$ for $iDACa_{19}$ which is steered onto either $I_{a_{19}}^+$ or $I_{a_{19}}^-$ in accordance with the $1^{st}$ bit's polarity of the $Da_{19}$ word.

The $iDACb_{19}$ receives a digital input word $Db_{19}$ that is b=6 bits wide and generates a positive and a negative output currents $I_{b_{19}}^+$ and $I_{b_{19}}^-$, respectively. Here, $N32b_{19}$ which is scaled with W/L=1X (and functioning as $iDACb_{19}$'s $6^{th}$ bit's VCCC) receives the reference bias bus voltage $V32r_{19}$ at its gate port. As such, $I_D$ of $N32b_{19}$ mirrors that of the $N3271_9$, and generates $I_D=32i$ for $iDACb_{19}$ which is steered onto either $I_{b_{19}}^+$ or $I_{b_{19}}^-$ in accordance with (the MSB or) the $6^{th}$ bit's polarity of the $Db_{19}$ word. The $N16b_{19}$ which is also scaled with W/L=1X (and functioning as $iDACb_{19}$'s $5^{th}$ bit's VCCC) receives the reference bias bus voltage $V16r_{19}$ at its gate port. As such, $I_D$ of $N16b_{19}$ mirrors that of the $N16r_{19}$, and generates $I_D=16i$ for $iDACb_{19}$ which is steered onto either $I_{b_{19}}^+$ or $I_{b_{19}}^-$ in accordance with the $5^{th}$ bit's polarity of the $Db_{19}$ word. The $N8b_{19}$ which is also scaled with W/L=1X (and functioning as $iDACb_{19}$'s $4^{th}$ bit's VCCC) receives the reference bias bus voltage $V8r_{19}$ at its gate port. As such, $I_D$ of $N8b_{19}$ mirrors that of the $N8r_{19}$, and generates $I_D=8i$ for $iDACb_{19}$ which is steered onto either $I_{b_{19}}^+$ or $I_{b_{19}}^-$ in accordance with the $4^{th}$ bit's polarity of the $Db_{19}$ word. The $N4b_{19}$ which is also scaled with W/L=1X (and functioning as $iDACb_{19}$'s $3^{rd}$ bit's VCCC) receives the reference bias bus voltage $V4r_{19}$ at its gate port. As such, $I_D$ of $N4b_{19}$ mirrors that of the $N4r_{19}$, and generates $I_D=4i$ for $iDACb_{19}$ which is steered onto either $I_{b_{19}}^+$ or $I_{b_{19}}^-$ in accordance with the $3^{rd}$ bit's polarity of the $Db_{19}$ word. The $N2b_{19}$ which is also scaled with W/L=1X (and functioning as $iDACb_{19}$'s $2^{nd}$ bit's VCCC) receives the reference bias bus voltage $V2r_{19}$ at its gate port. As such, $I_D$ of $N2b_{19}$ mirrors that of the $N2r_{19}$, and generates $I_D=2i$ for $iDACb_{19}$ which is steered onto either $I_{b_{19}}^+$ or $I_{b_{19}}^-$ in accordance with the $2^{nd}$ bit's polarity of the $Db_{19}$ word. The $N1b_{19}$ which is also scaled with W/L=1X (and functioning as $iDACb_{19}$'s $1^{st}$ bit's VCCC) receives the reference bias bus voltage $V1r_{19}$ at its gate port. As such, $I_D$ of $N1b_{19}$ mirrors that of the $N1r_{19}$, and generates $I_D=1i$ for $iDACb_{19}$ which is steered onto either $I_{b_{19}}^+$ or $I_{b_{19}}^-$ in accordance with the $1^{st}$ bit's polarity of the $Db_{19}$ word.

The $iDACc_{19}$ receives a digital input word $Dc_{19}$ that is c=6 bits wide and generates a positive and a negative output currents $I_{c_{19}}^+$ and $I_{c_{19}}^-$, respectively. Here, $N32c_{19}$ which is scaled with W/L=1X (and functioning as $iDACc_{19}$'s $6^{th}$ bit's VCCC) receives the reference bias bus voltage $V32r_{19}$ at its gate port. As such, $I_D$ of $N32c_{19}$ mirrors that of the $N32r_{19}$, and generates $I_D=32i$ for $iDACc_{19}$ which is steered onto either $I_{c_{19}}^+$ or $I_{c_{19}}^-$, in accordance with (the MSB or) the $6^{th}$ bit's polarity of the $Dc_{19}$ word. The $N16c_{19}$ which is also scaled with W/L=1X (and functioning as $iDACc_{19}$'s $5^{th}$ bit's VCCC) receives the reference bias bus voltage $V16r_{19}$ at its gate port. As such, $I_D$ of $N16c_{19}$ mirrors that of the $N16r_{19}$, and generates $I_D=16i$ for $iDACc_{19}$ which is steered onto either $I_{c_{19}}^+$ or $I_{c_{19}}^-$, in accordance with the $5^{th}$ bit's polarity of the $Dc_{19}$ word. The $N8c_{19}$ which is also scaled with W/L=1X (and functioning as $iDACc_{19}$'s $4^{th}$ bit's VCCC) receives the reference bias bus voltage $V8r_{19}$ at its gate port. As such, $I_D$ of $N8c_{19}$ mirrors that of the $N8r_{19}$, and generates $I_D=8i$ for $iDACc_{19}$ which is steered onto either $I_{c_{19}}^+$ or $I_{c_{19}}^-$ in accordance with the $4^{th}$ bit's polarity of the $Dc_{19}$ word. The $N4c_{19}$ which is also scaled with W/L=1X (and functioning as $iDACc_{19}$'s $3^{rd}$ bit's VCCC) receives the reference bias bus voltage $V4r_{19}$ at its gate port. As such, $I_D$ of $N4c_{19}$ mirrors that of the $N4r_{19}$, and generates $I_D=4i$ for $iDACc_{19}$ which is steered onto either $I_{c_{19}}^+$ or $I_{c_{19}}^-$ in accordance with the $3^{rd}$ bit's polarity of the $Dc_{19}$ word. The $N2c_{19}$ which is also scaled with W/L=1X (and functioning as $iDACc_{19}$'s $2^{nd}$ bit's VCCC) receives the reference bias bus voltage $V2r_{19}$ at its gate port. As such, $I_D$ of $N2c_{19}$ mirrors that of the $N2r_{19}$, and generates $I_D=2i$ for $iDACc_{19}$ which is steered onto either $I_{c_{19}}^+$ or $I_{c_{19}}^-$ in accordance with the $2^{nd}$ bit's polarity of the $Dc_{19}$ word. The $N1c_{19}$ which is also scaled with W/L=1X (and functioning as $iDACc_{19}$'s 1st bit's VCCC) receives the reference bias bus voltage $V1r_{19}$ at its gate port. As such, $I_D$ of $N1c_{19}$ mirrors that of the $N1r_{19}$, and generates $I_D=1i$ for $iDACc_{19}$ which is steered onto either $I_{c_{19}}^+$ or $I_{c_{19}}^-$ in accordance with the $1^{st}$ bit's polarity of the $Dc_{19}$ word.

Finally, $iDACd_{19}$ receives a digital input word $Dd_{19}$ that is d=6 bits wide and generates a positive and a negative output currents $I_{d_{19}}^+$ and $I_{d_{19}}^-$, respectively. Here, $N32d_{19}$ which is scaled with W/L=1X (and functioning as $iDACd_{19}$'s $6^{th}$ bit's VCCC) receives the reference bias bus voltage $V32r_{19}$ at its gate port. As such, $I_D$ of $N32d_{19}$ mirrors that of the $N32r_{19}$, and generates $I_D=32i$ for $iDACd_{19}$ which is steered onto either $I_{d_{19}}^+$ or $I_{d_{19}}^-$ in accordance with (the MSB or) the $6^{th}$ bit's polarity of the $Dd_{19}$ word. The $N16d_{19}$ which is also scaled with W/L=1X (and functioning as $iDACd_{19}$'s $5^{th}$ bit's VCCC) receives the reference bias bus voltage $V16r_{19}$ at its gate port. As such, $I_D$ of $N16d_{19}$ mirrors that of the $N16r_{19}$, and generates $I_D=16i$ for $iDACd_{19}$ which is steered onto either $I_{d_{19}}^+$ or $I_{d_{19}}^-$ in accordance with the $5^{th}$ bit's polarity of the $Dd_{19}$ word. The $N8d_{19}$ which is also scaled with W/L=1X (and functioning as iDACd$_n$'s 4$^{th}$ bit's VCCC) receives the reference bias bus voltage V8$r_{19}$ at its gate port. As such, I$_D$ of N8$d_{19}$ mirrors that of the N8$r_{19}$, and generates I$_D$=8i for iDACd$_{19}$ which is steered onto either I$_{d_{19}}^+$ or I$_{d_{19}}^-$ in accordance with the 4$^{th}$ bit's polarity of the Dd$_{19}$ word. The N4$d_{19}$ which is also scaled with W/L=1X (and functioning as iDACd$_{19}$'s 3$^{rd}$ bit's VCCC) receives the reference bias bus voltage V4$r_{19}$ at its gate port. As such, I$_D$ of N4$d_{19}$ mirrors that of the N4$r_{19}$, and generates I$_D$=4i for iDACd$_{19}$ which is steered onto either I$_{d_{19}}^+$ or I$_{d_{19}}^-$ in accordance with the 3$^{rd}$ bit's polarity of the Dd$_{19}$ word. The N2$d_{19}$ which is also scaled with W/L=1X (and functioning as iDACd$_{19}$'s 2$^{nd}$ bit's VCCC) receives the reference bias bus voltage V2$r_{19}$ at its gate port. As such, I$_D$ of N2$d_{19}$ mirrors that of the N27$_{19}$, and generates I$_D$=2i for iDACd$_{19}$ which is steered onto either I$_{d_{19}}^+$ or I$_{d_{19}}^-$ in accordance with the 2$^{nd}$ bit's polarity of the Dd$_{19}$ word. The N1$d_{19}$ which is also scaled with W/L=1X (and functioning as iDACd$_{19}$'s bit's VCCC) receives the reference bias bus voltage V1$r_{19}$ at its gate port. As such, I$_D$ of N1$d_{19}$ mirrors that of the N1$r_{19}$, and generates I$_D$=1i for iDACd$_{19}$ which is steered onto either I$_{d_{19}}^+$ or I$_{d_{19}}^-$ in accordance with the 1$^{st}$ bit's polarity of the Dd$_{19}$ word.

In the embodiment of FIG. 19, the multiple-channel data-converter method generates the binary weighted reference currents for plurality of iDACs (iDACa$_{19}$, iDACb$_{19}$, iDACc$_{19}$, and iDACd$_{19}$) via their respective sequence of current source MOSFETs N32$_{19}$, N16$_{19}$, N8$_{19}$, N4$_{19}$, N2$_{19}$, and N1$_{19}$. These MOSFET are only scaled with W/L=1X, which results in significant area savings. For a plurality of 6-bit iDACs (setting aside RBN$_{19}$'s area), every incremental iDAC utilizing the multiple-channel data-converter method requires 6 of 1x size current sources, which is less than 10 times the area as compared to 64 of 1x size current sources required for a conventional 6-bit iDAC which requires a binary scaling of the MOSFET based current source network. Moreover, for a plurality of 8-bit iDACs (setting aside RBN$_{19}$'s area), every incremental 8-bit iDAC utilizing the multiple-channel data-converter method requires 8 of 1X size current sources, which is less than 25 times the area as compared to 256 of 1X size current sources required for a conventional 8-bit iDAC which requires binary scaled MOSFETs for its current source network.

Moreover, dynamic response of the iDACs is improved here because the disclosed multiple-channel data-converter method substantially reduces the number of MOSFETs that form the iDAC's binary weighted current source network. Fewer MOSFETs result in substantially less capacitance along the iDAC's signal paths, which in turn improves the dynamic response of the iDACs, including reducing glitch and lowering dynamic power consumption.

As indicated earlier, the MOSFETs that form a conventional iDAC's binary weighted current sources need to be sized with meaningfully larger W and L than minimum geometry for better matching and thereby attaining higher accuracy iDACs. Given their larger W/L sizes, a conventional iDAC's binary weighted current source network, dominate the area of such iDAC. Utilizing the multiple-channel data-converter method, accuracy is roughly comparable with that of a conventional iDAC by keeping the larger (non-minimum MOSFETs) W/L size of the iDAC's current source. However, multiple-channel data-converter method reduces the number of non-minimum MOSFET utilizes in the iDAC's current sources, providing meaningful die size reduction and cost savings.

Bear in mind that the multiple-channel data-converter method can be utilized for a portion of an iDAC's current source network (e.g., MSB bank) and conventional binary weighted iDAC can be utilized for the remainder portion (e.g., LSB bank) of iDAC's current source network. Also consider that the iDAC's current sources can utilize cascoded MOSFETs to attain higher output impedance, and the cascoded MOSFETs can be biased with an independent bias bus, that feeds plurality of iDACs, similar in arrangement to those generated by RBN$_{19}$ circuit. Also, notice that for example in applications requiring 8 or 16 or 32 channels iDACs, the area savings by utilize g the multiple-channel data-converter method significantly outweighs the additional area due to RBN$_{19}$.

In summary, the current-mode multiple-channel data-converter method that is illustrated in the embodiment of FIG. 19 discloses integrating multiple mid-to-high resolution current-mode data-converters including iDACs with the following benefits:

First, substantial area savings is achieved by utilizing the disclosed multiple-channel data-converter method, especially in applications requiring sea of iDACa in a chip. The area savings is achieved in part because the requirement for individually weighted current sources (e.g., binary weighted or non-linearly weighted) is decoupled from requiring individually scaled current sources.

Second, the disclosed multiple-channel data-converter method substantially reduces the number of MOSFETs that form the iDAC's binary weighted current source network. Fewer MOSFETs result in substantially less capacitance along the iDAC's signal paths, which in turn improves the dynamic response of the iDACs, including reducing glitch and lowering dynamic power consumption.

Third, despite area savings attainable by the disclosed multiple-channel data-converter method, the accuracy of individual iDACs is not substantially deterred. All else substantially equal, the matching of MOSFETs that form a data-converter's reference current network dominate the accuracy of a current-mode data-converter. The scaled MOSFETs in both the (central) reference bias network (RBN) match the 1X scaled MOSFETs in each of the iDAC because they are all arranged with the same (non-minimum W/L size) cell layout and same orientation.

Fourth, as noted earlier, operating the disclosed multiple-channel data-converter method in current-mode is inherently fast. Moreover, operating in current mode reduces voltage swings along the pertinent signal paths, which enables operating the iDACs with lower power supply voltages. Operating the data-converters at low power supply voltages facilitates reducing power consumption.

Fifth, the flexibility to run the MOSFETs in subthreshold enables the iDACs to operate with ultra-low currents, even lower power supplies, and ultra-low power consumption suitable for mobile applications.

Sixth, there are no passive devices in the disclosed iDACs, and as such there is no need for resistors or capacitors, which reduces manufacturing size and cost.

Seventh, the disclosed multiple-channel data-converter method can be arranged free of clock, suitable for asynchronous (clock free) computation.

Eighth, the disclosed multiple-channel data-converter method utilize same type of MOSFET current sources and MOSFET switches which are symmetric and matched. Such arrangement facilitates device parameters to track each other over process-temperature-operation conditions variations. Accordingly, each of the data-coefficient, power supply coefficient, and AC power supply rejection performance can be enhanced and matched between the plurality of data-converters.

Ninth and as stated earlier, the disclosed multiple-channel data-converter method substantially reduces the number of MOSFETs that for example form the iDAC's binary weighted current source network, and as such the fewer MOSFETs can be placed closer to each other on a chip. Similarly, oriented and physically closer MOSFETs, that form the current reference of a data-converter, generally match better which in turn improves the accuracy of each of the data-converter and the matching between them in plurality of iDACs in one chip.

Tenth, besides iDACs, the multiple-channel data-converter method can be applied to iADCs as well. Generally and all else substantially equal, the larger the W/L size of a FET current source, the larger its capacitance and the slower the node, which capacitively loads an iADC's current reference networks and can substantially reduce the speed of the iADC. As noted earlier, the multiple-channel data-converter method enables decoupling the weight of a current source from the scaling of the sizes of FETs utilizing in forming the data-converter's reference current sources. By keeping each of the W/L sizes of the current source FETs the same at 1X and small for example (despite each of their binary weighted currents), the node capacitances of the iADC's reference current networks can be kept small which helps speeds up the dynamic response of the iADC. More importantly, in applications where plurality (sea of) iADCs are required, by keeping the size of the current reference network of each of the iADC small in the plurality of the iADCs, substantial die area savings can also be realized.

Eleventh, in an embodiment of the multiple-channel data-converter method wherein the central RBN is trimmed or calibrated for accuracy, the accuracy of each of the plurality of data-converters whose reference current network is biased from the same central RBN can be improved.

Figure 40:
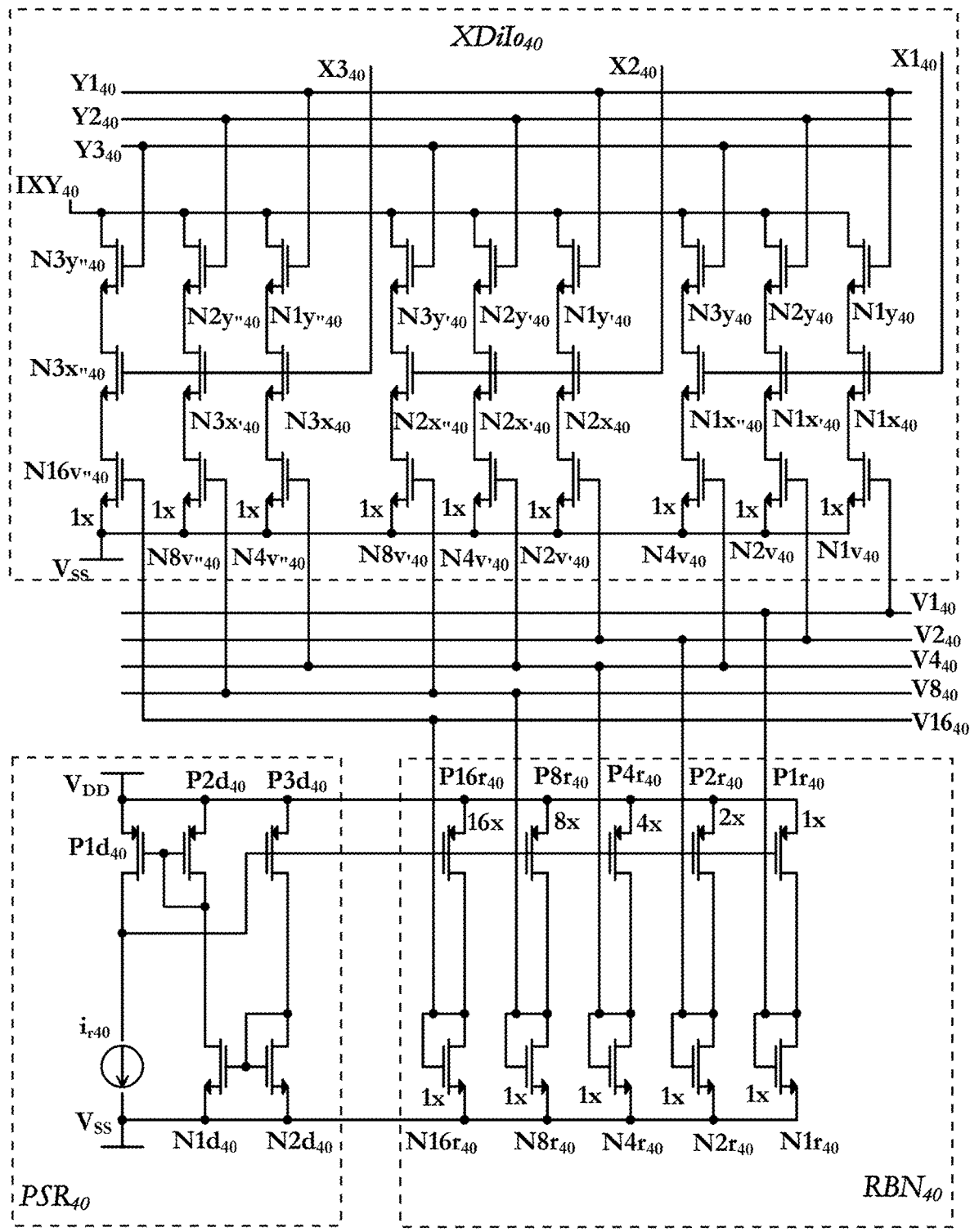
FIG. 40 is a simplified circuit schematic illustrating another embodiment of the digital-input to analog current output multiplier (XD$_i$I$_o$) that utilizes the meshed digital-to-analog multiplication (mD$_i$S$_o$) method described in the prior section 32, and wherein the XD$_i$I$_o$ multiplier utilizes the multiple-channel data-converter method disclosed in section 19 when plurality of XD$_i$I$_o$ multipliers are needed by an end-application.
Figure 41:
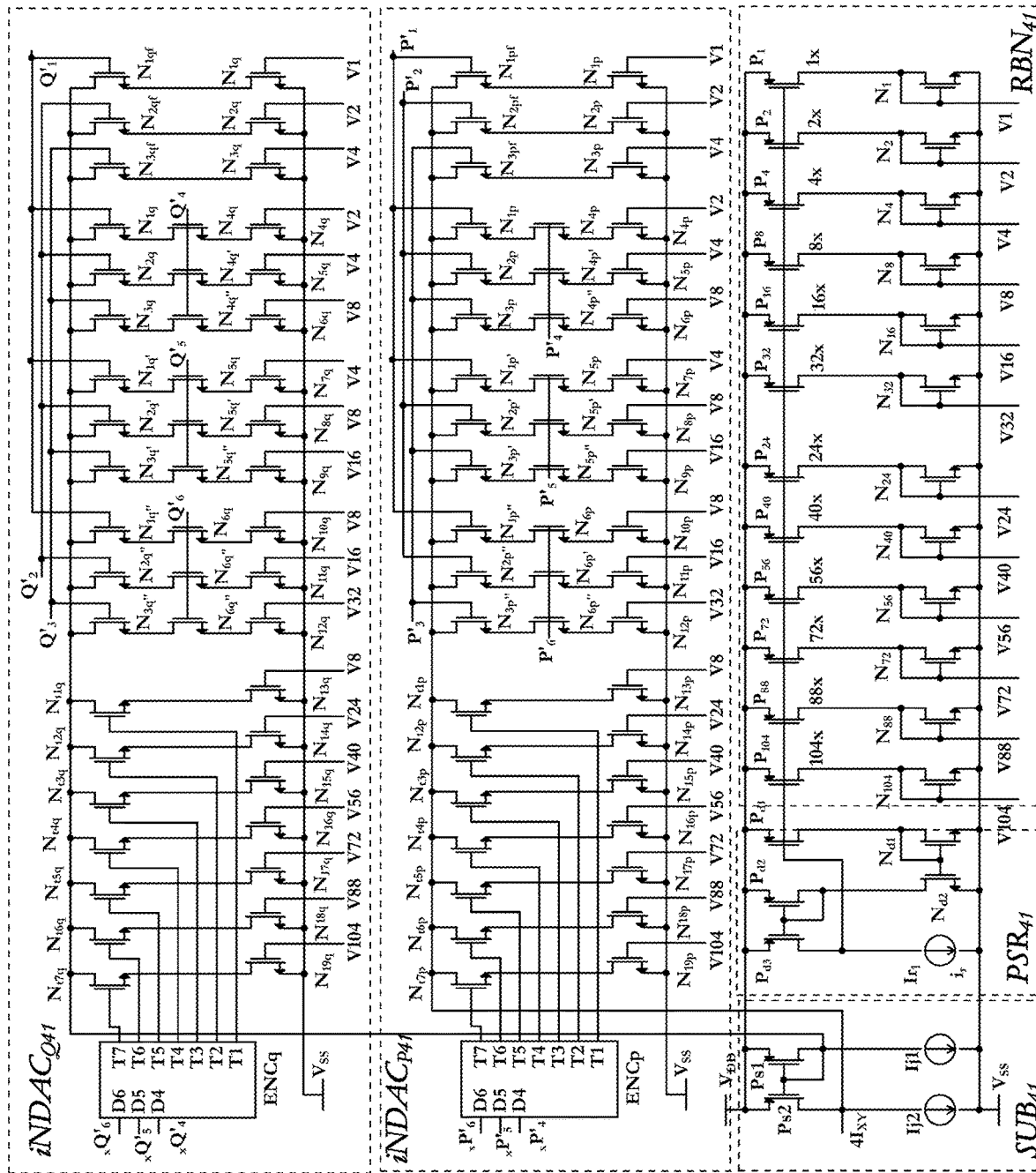
FIG. 41 is a simplified circuit schematic illustrating another embodiment of the digital-input to analog current output multiplier (XD$_i$I$_o$), which can be extended to plurality of XD$_i$I$_o$ multipliers by sharing a central reference bias network (RBN) that bias the current reference network of each of the XD$_i$I$_o$ multipliers.

Twelfth, in an embodiment of the multiple-channel data-converter method wherein the central RBN is desensitized from power supply variations (e.g., by utilizing the second power supply desensitization method or the second PSR method disclosed in FIG. 40 and FIG. 41), the power supply insensitivity of each of the plurality of data-converters whose reference current network is biased from the same central RBN can be improved.

Thirteenth, the benefits of the multiple-channel data-converter method can be attained in other higher-order systems including but not limited to multipliers, multiply-accumulate (MAC), and artificial-neural-network (ANN) that utilize the multiple-channel data-converter method.

Figure 20:
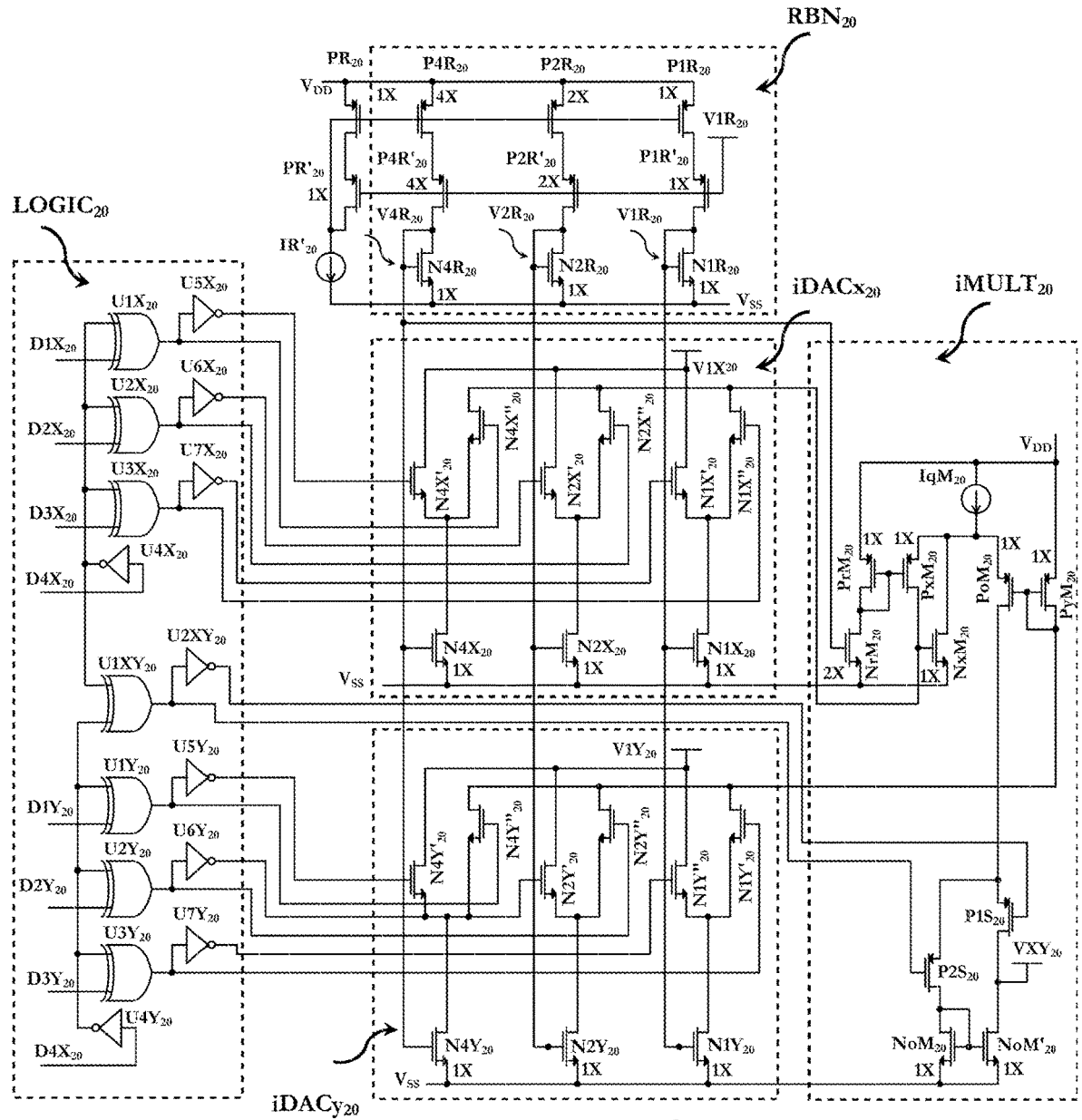
FIG. 20 is a simplified circuit schematic illustrating an embodiment for a plurality-channels of mixed-mode multiplier ($XD_iI_o$) with digital-input to analog-current-output that is multi-quadrant, wherein the $XD_iI_o$ utilizes the multiple-channel data-converter method disclosed in section 19.

Section 20—Description of FIG. 20

FIG. 20 is a simplified circuit schematic illustrating an embodiment for a plurality-channels of mixed-mode digital-input to analog-current-output multiplier ($XD_iI_o$) that is multi-quadrant, wherein the $XD_iI_o$ utilizes the multiple-channel data-converter method. The $XD_iI_o$ of FIG. 20 ($XD_iI_{o_{20}}$) utilizes an embodiment of the multiple-channel data-converter method disclosed in section 19 of this disclosure, which can save silicon area and improve iDAC's dynamic performance. The $XD_iI_{o20}$ also utilizes a multiplier power supply desensitization method (or XPSR method) that substantially desensitize $XD_iI_o$'s output current from power supply variations, while eliminating cascodes from current sources (which saves area).

For descriptive clarity and illustrative simplicity, the embodiment of the $XD_iI_{o20}$ that is depicted in FIG. 20 is a single channel multiplier with 4-bits (x-word digital input) by 4-bits (y-word digital input) of resolution wherein the x and y digital words are sign-magnitude formatted, but the digital input resolutions can be higher (e.g., 6-bits to 12-bits) and the digital inputs can be arranged with other formats (e.g., binary, 2's complement, binary-offset, etc.) and plurality of channels can be in the 1000s.

As presented earlier, $XD_iI_{o_{20}}$ embodiment utilizes the multiple-channel data-converter method wherein a reference bias network ($RBN_{20}$) generates a sequence of reference bias currents that are mirrored onto a plurality of iDAC's current reference networks, which is described in section 19. The same $RBN_{20}$ can be utilized to mirror a reference current ($Ir_{20}$) whose value is programmed at the full-scale of $Ix_{20}$ and $Iy_{20}$.

The $XD_iI_{o20}$ is comprising of a first current-output DAC (iDAC) or $iDACx_{20}$ that generates an output $Ix_{20}$, a second current-output iDAC or $iDACy_{20}$ that generates an out $Iy_{20}$, wherein $Ix_{20}$, $Iy_{20}$, and a reference current ($Ir_{20}$) are inputted to a current multiplier or $iMULT_{20}$. The resultant analog output product of $iMULT_{20}$ is $Io_{20}$ which is a single-quadrant current output. The $Io_{20}$ is then inputted to a switching current mirror inverter (comprising of $P1s_{20}$, $P2s_{20}$, $NoM_{20}$, and $NoM'_{20}$) section of the $iMULT_{20}$ which converts the single-quadrant $Io_{20}$ to a multi-quadrant output $\pm Io_{20}$, wherein the plus minus sign of $Io_{20}$ is controlled by the sign bits of the x and y digital input words (e.g., sign-magnitude format).

As noted earlier, the $XD_iI_o$'s dynamic performance is improved and silicon area is reduced by utilizing the multiple-channel data-converter method that is described in section 19 of this disclosure. A single bias reference network ($RBN_{20}$) is shared by biasing a plurality $XD_iI_o$ channels, wherein each $XD_iI_o$ is comprising of iMULT (e.g., an $iMULT_{20}$) and pair of iDACs (e.g., $iDACx_{20}$ and $iDACy_{20}$). Here, substantially equal 1x sized current sources in the iDAC's reference current network is biased separately by $RBN_{20}$ wherein each iDAC's 1X sized current source carries its respective binary weighted current, which improves dynamic performance of the iDACs and save silicon area, especially in machine learning applications were 1000s (plurality) of iDACs can be needed to perform the multiply-accumulate (MAC) functions.

Note also that the sign-magnitude logic ($LOGIC_{20}$) block can be shared between plurality $XD_iI_o$ channels by inserting a plurality of latches (to store the x and y digital input words) between the $LOGIC_{20}$ block outputs and the plurality of current switches of the respective plurality of $iDACx_{20}$ and $iDACy_{20}$ pairs, which also saves silicon area.

Moreover, additional area is save by utilizing only one $RBN_{20}$ that is shared with a plurality of $XD_iI_{o20}$, wherein the multiplier power supply desensitization method (or XPSR method) is utilized to substantially desensitize each of the $XD_iI_{o20}$'s output currents to $V_{DD}$ variations, while the chip area attributed to each of the $XD_iI_{o20}$ is reduced by eliminating the cascoded FETs from the current reference network of each of the $iDACx_{20}$ and $iDACy_{20}$ pairs. The XPSR method is described next.

The multiplier power supply desensitization method substantially desensitizes a multiplier from power supply variations by arranging a first ratio relationship between the first input ($I_Y$) and the reference input ($I_R$) to a multiplier wherein the $I_Y$ and the $I_R$ both have a substantially equivalent first dependence error ($e_{dd}$) to power supply variations ($\Delta V_{DD}$) and wherein the $e_{dd}$ cancel each other out due to the first ratio ($I_Y/I_R$) relationship in a multiplier. Moreover, multiplier power supply desensitization method substantially desensitizes the multiplier from $\Delta V_{DD}$ by arranging a second ratio ($I_O/I_X$) relationship between the output ($I_O$) and the second input ($I_X$) of the multiplier wherein the $I_O$ and the $I_X$ of the multiplier both have a substantially equivalent second dependence error ($e'_{dd}$) to $\Delta V_{DD}$ and wherein the $e'_{dd}$ cancel each other out due to the $I_O/I_X$ relationship. Also, the $I_Y/I_R$ is substantially equalized to $I_O/I_X$ in the multiplier, and the $e_{dd}$ and the $e'_{dd}$ may be substantially equal or different from one another. This means that for example $e_{dd}$ can be zero meaning $I_Y$ and $I_R$ have no dependence to power supply variations, and where $e'_{dd}$ can be finite meaning $I_O$ and $I_X$ have dependence to power supply variations, and vice versa. Moreover, for example, $e_{dd}$ and $e'_{dd}$ can be zero meaning that $I_Y$, $I_R$, $I_O$, and $I_X$ do not have dependence to power supply variations.

Another way of describing the multiplier power supply desensitization (XPSR) method is as follows: An analog multiplier input-output transfer function is $I_O=I_X \times I_Y/I_R$ or $I_O/I_X=I_Y/I_R$, where X is x-input current, $I_Y$ is y-input current, $I_R$ is a reference input current representing the full scale of $I_X$ and $I_Y$, and $I_O$ is the multiplier's output current. The multiplier power supply desensitization method arranges a multiplier where $t_o$ and $I_x$ can have similar dependence (error) on power supply ($V_{DD}$), and $I_Y$ and $I_R$ can have with other similar dependence (error) on $V_{DD}$. In other words, $I_O=i_o(1 \pm e_{dd})$, $I_X=i_x(1 \pm e_{dd})$, $I_Y=i_y(1 \pm e'_{dd})$, and $I_R=i_r(1 \pm e'_{dd})$, wherein $\pm e_{dd}$ is the scale error attributed to $V_{DD}$ variations for $i_o$ and $i_x$, and $\pm e'_{dd}$ is the scale error attributed to $V_{DD}$ variations for $i_y$ and $i_r$. As such, a scale error term $(1 \pm e_{dd})$ attributed to $V_{DD}$ variations is canceled out in the ratio of $I_O/I_X$. Similarly, a scale error terms $(1 \pm e'_{dd})$ attributed to $V_{DD}$ variations are canceled out in the ratio of $I_Y/I_R$. Also, note that $\pm e_{dd}$ can be the same as or different from $\pm e'_{dd}$.

First, the XPSR method to help substantially desensitize a $XD_iI_o$ from the dependence error of $I_Y/I_R$ on power supply variations is described. Let's arrange the $iDACy_{20}$'s current switches (comprising of $N4y'_{20}$ through $N1y'_{20}$ and $N4y''_{20}$ through $N1y''_{20}$) with low on resistance. Also, let's arrange $V1y_{20}=V_{DD}-Vgs_{PMOS}$ (e.g., placing a diode connected FET between $V_{DD}$ and $V1y_{20}$, which can help lower iDAC's glitch and improves settling time). One of the current outputs ($Iy_{20}$) of $iDACy_{20}$ that is coupled with the y-input port of $iMULT_{20}$ has a bias voltage of $V_{DD}$ minus a PMOS's gate-to-source voltage ($V_{gs}$ of $PyM_{20}$). Thus, the drain-to-source voltage ($V_{DS}$) of FETs in the current reference network of $iDACy_{20}$ (comprising of $N4y_{20}$ through $N1y_{20}$) is $V_{DD}-V_{gs}$. Be mindful that early voltage ($V_A$) in FETs can cause $I_{DS}$ dependence (error) on power supply variations, wherein such $I_{DS}$ dependence (error) can be reduced by cascading FETs at the expense of increasing silicon area. Accordingly, the $iMULT_{20}$'s current input $Iy_{20}$ is arranged in this disclosure to have a dependence error as a function of $V_{DD}$ variations. Similarly, the reference current input ($Ir_{20}$) of $iMULT_{20}$ that is supplied by an NMOS (i.e., $NrM_{20}$) has a $V_{DS}$ that is also $V_{DD}$ minus $V_{gs}$ of $PrM_{20}$. As such, the current input that is $Ir_{20}$ of $iMULT_{20}$ is arranged to have a substantially similar dependence error as a function of $V_{DD}$ variations to that of $Iy_{20}$. Hence, the $I_Y$ and $I_R$ have the same depended error on $V_{DD}$ variations that is substantially rejected, without the need for cascode FETs (which saves silicon area) in light of $iMULT_{20}$ ratio relationship between them that is $I_Y/I_R$.

Next, the XPSR method to help substantially desensitize a $XD_iI_o$ from the dependence error of $I_O/I_X$ on power supply variations is described. Similar to the y-channel, let's arrange the $iDACx_{20}$'s current switches (comprising of $N4x'_{20}$ through $N1x'_{20}$ and $N4x''_{20}$ through $N1x''_{20}$) with low on resistance. Similarly, let's arrange $V1x_{20}=V_{SS}+Vgs_{NMOS}$ (which can help lower iDAC's glitch and improves settling time). One of the current outputs ($Ix_{20}$) of $iDACx_{20}$ that is coupled with the x-input port of $iMULT_{20}$ has a bias voltage of $V_{SS}$ plus a NMOS's gate-to-source voltage ($V_{gs}$ of $NxM_{20}$). Thus, the drain-to-source voltage ($V_{DS}$) of FETs in the current reference network of $iDACx_{20}$ (comprising of $N4x_{20}$ through $N1x_{20}$) is $V_{SS}+V_{gs}$. As such, the $iMULT_{20}$'s current input that is $Ix_{20}$ is arranged in this disclosure to have a dependence error as a function of $V_{SS}$ variations. By biasing $Vxy_{20}=V_{SS}+Vgs_{NMOS}$, then depending on sign (or MSB) of the x or y digital input word, the bias voltage of the current input ($Io_{20}$) of $iMULT_{20}$ would be subject to either $V_{gs}$ of $NoM_{20}$ or that of $NoM'_{20}$, which are both NMOS. Thus, the $iMULT_{20}$'s current output that is $Io_{20}$ is arranged in this disclosure to have the same dependence error as a function of $V_{SS}$ variations to that of $Ix_{20}$. Hence, the $I_0$ and $I_x$ have the same depended error (on $V_{SS}$ variations) that is substantially rejected in light of $iMULT_{20}$ ratio relationship between them that is $I_O/I_X$.

Bear in mind that for machine learning applications where plurality (or sea) of $XD_iI_O$ channels are required, the reference bias network (RBN) and LOGIC sections can be shared amongst plurality (or sea) of $XD_iI_O$ channels. The iDAC's current reference network can provide binary weighted currents without requiring the current sources to be sized in binary weighted arrangement which saves significant area in each iDAC utilized in $XD_iI_O$. Further area savings are realized by eliminating the cascoded FETs from the current (mirror) reference network of each iDAC utilized in $XD_iI_O$, while utilizing the PSR method substantially desensitizes the $XD_iI_O$ from power supply variations.

Figure 29:
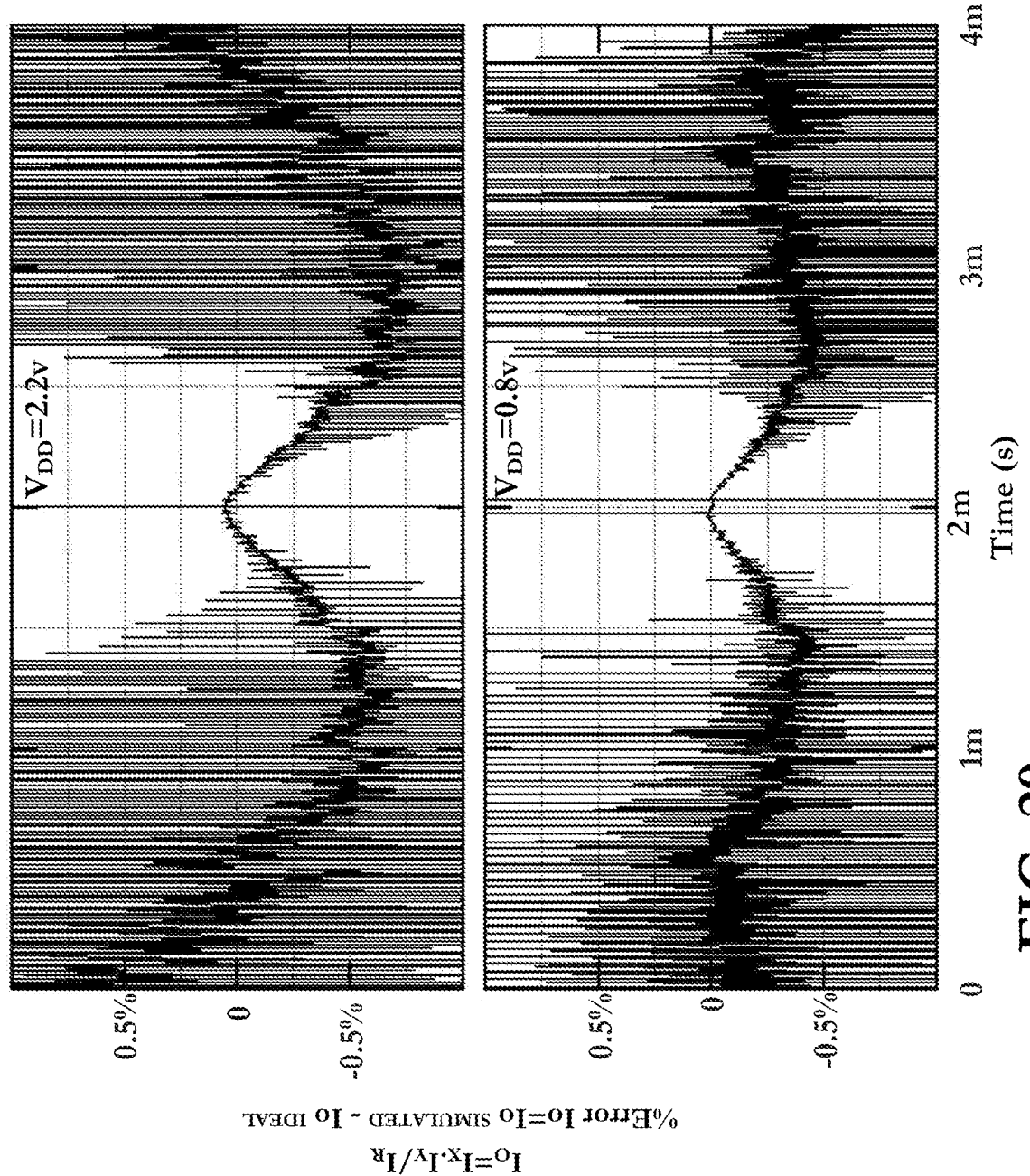
FIG. 29 is a circuit simulations illustrating the error waveform (output current SPICE simulation minus output current ideal) attributed to an output current (I$_o$) of a XD$_i$I$_o$ multiplier arranged similar to that of FIG. 20 but having an 8-bit digital inputs instead of 4-bits.

Each $XD_iI_O$ is substantially desensitized from power supply variations by utilizing the multiplier power supply desensitization method which is indicated by SPICE circuit simulations of FIG. 29. The FIG. 29 simulations results are that of a $XD_iI_O$ similar to FIG. 20 circuit with a resolution of 8-bits digital words instead of that of FIG. 20 with a resolution of 4-bits digital words. A $XD_iI_O$ of FIG. 29 is inputted with an 8-bit (x-word digital input) by an 8-bit (y-word digital input) wherein the x and y words are ramped from zero-scale to full scale where power supply $V_{DD}$ is varied from 2.2V to 0.8V. FIG. 29 illustrates a waveform plot that is the error curve (output current simulation minus output current ideal) attributed to $I_o$ of the $XD_iI_O$ indicating less than ±0.5% error in DNL (differential non-linearity), INL (integral non-linearity), and GE (gain-error).

In summary, some of the benefits of the embodiment disclosed in FIG. 20 are as follows:

First, the disclosed embodiment benefits from operating in current mode that has been discussed in this disclosure Second, the disclosed embodiment benefits from savings in silicon die area, lower glitch, and faster speed when plurality of $XD_iI_O$ are required (e.g., in machine learning applications where 1000s of $XD_iI_O$ may be needed) by utilizing the multiple iDAC method that is disclosed in section 19.

Third, the disclosed embodiment benefits from further saving in silicon die area as well as desensitization to power supply variations for each $XD_iI_O$ by utilizing the multiplier power supply desensitization method, which also facilitates the elimination of the cascoded FETs in iDACs current reference network.

Figure 21:
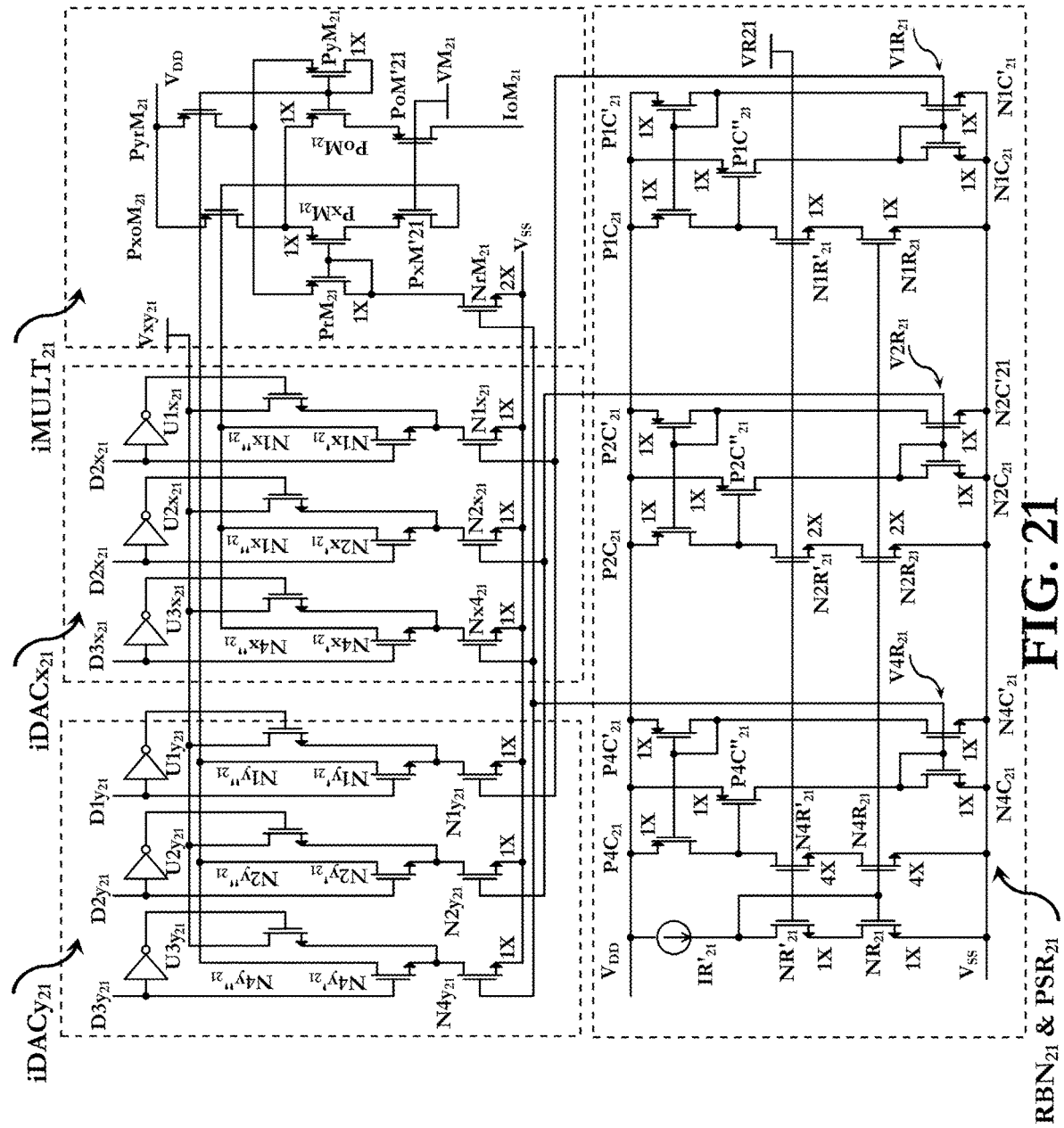
FIG. 21 is a simplified circuit schematic illustrating an embodiment for a plurality-channels multiplier ($XD_iI_o$) with digital-input to analog-current-output that is single-quadrant, wherein the $XD_iI_o$ utilizes the multiple-channel data-converter method disclosed in section 19, and wherein the $XD_iI_o$ utilizes a power supply desensitization (PSR) method.

Section 21—Description of FIG. 21

FIG. 21 is a simplified circuit schematic illustrating an embodiment for a plurality-channels of mixed-mode digital-input to analog-current-output multiplier ($XD_iI_O$) that is single-quadrant, wherein the $XD_iI_O$ utilizes the multiple-channel data-converter method. The $XD_iI_O$ of FIG. 21 ($XD_iI_{O_{21}}$) utilizes another embodiment of the multiple-channel data-converter method disclosed in section 19 of this disclosure to save silicon area and improve iDAC's dynamic performance. The $XD_iI_{O_{21}}$ also utilizes another embodiment of the multiplier power supply desensitization method that substantially desensitize $XD_iI_O$'s output current from power supply variations, while eliminating cascodes from current sources (which saves area).

For descriptive clarity and illustrative simplicity, the embodiment of the $XD_iI_{O_{21}}$ that is depicted in FIG. 21 is a single channel multiplier with 3-bits (x-word digital input) by 3-bits (y-word digital input) of resolution wherein the x and y words are in binary format, but the digital input resolutions can be higher (e.g., 6-bits to 12-bits) and plurality of channels can be in the 1000s. Let's assume the iDACy$_{21}$'s current switches (comprising of N4y'$_{21}$ through N1y'$_{21}$ and N4y''$_{21}$ through N1y''$_{21}$) and the iDACx$_{21}$'s current switches (comprising of N4x'$_{21}$ through N1x'$_{21}$ and N4x''$_{21}$ through N1x''$_{21}$) have low on resistances. Also, let's arrange V1xy$_{21}$=V$_{DD}$-Vgs$_{PMOS}$ (e.g., placing a diode connected FET between V$_{DD}$ and Vxy$_{21}$, which can help lower iDAC's glitch and improves settling time). Moreover, let's assume that $V_{GS_p} \gg V_{DS}$ of PxoM$_{21}$ and PyrM$_{21}$, wherein $V_{GSp}$ is gate-to-source voltage of a PMOS operating at full-scale current in iMULT$_{21}$.

As asserted earlier, $XD_iI_{O_{21}}$ embodiment utilizes the multiple-channel method data-converter wherein a reference bias network (RBN$_{21}$) circuit generates a sequence of reference bias currents that are mirrored onto a respective plurality of iDAC's current reference networks, which is described in section 19. The same RBN$_{21}$ circuit can be utilized to mirror a fixed reference current (Ir$_{21}$) programmed at the full-scale of Ix$_{21}$ and Iy$_{21}$.

The $XD_iI_{O_{21}}$ is comprising of iDACx$_{21}$ that generates an Ix$_{21}$, and iDACy$_{21}$ that generates an Iy$_{21}$, wherein Ix$_{21}$, Iy$_{21}$, and a reference current (Ir$_{21}$) are inputted to a current multiplier or iMULT$_{21}$. The resultant analog output product of iMULT$_{21}$ is IoM$_{21}$=Io$_{21}$ which is a single-quadrant current output.

Note that Ix$_{21}$ as output of iDACx$_{21}$ is coupled with x-input of iMULT$_{21}$ that is biased at about V$_{DD}$-V$_{GSp}$ where V$_{GSp}$ is that of PxoM$_{21}$. Similarly, Iy$_{21}$ as output of iDACy$_{21}$ is coupled with y-input of iMULT$_{21}$ that is also biased at about V$_{DD}$-V$_{GSp}$ where V$_{GSp}$ is that of PyM$_{21}$. Also, Ir$_{21}$ provided by NrM$_{21}$ is coupled with reference current input of iMULT$_{21}$ that is also biased at about V$_{DD}$-V$_{GSp}$ where V$_{GSp}$ is that of PrM$_{21}$.

As stated earlier, the $XD_iI_O$'s dynamic performance is improved and silicon area is reduced by utilizing the multiple-channel data-converter method that is described in section 19 of this disclosure. A single bias reference network (RBN$_{21}$) is shared by biasing a plurality $XD_iI_O$ channels, wherein each $XD_iI_O$ is comprising of iMULT (e.g., an iMULT$_{21}$) and pair of iDACs (e.g., iDACx$_{21}$ and iDACy$_{21}$). Here, substantially equal 1x sized current sources in the iDAC's reference current network is biased separately by RBN$_{21}$ wherein each iDAC's 1x sized current source carries its respective binary weighted current.

Due to FET's early voltage (V$_A$), the I$_{DS}$ of a current source made of one FET increases with increasing its V$_{DS}$. As such I$_{DS}$ of a current source FET is sensitive to V$_{DD}$ variation, unless the current source is cascoded (to increase the FET's output impedance) which takes double the area for a given current source. The multiple-channel data-converter method of section 19 is combined with the XPSR method that was described in section 20, in order to (1) avoid the cascoded FETs, (2) substantially desensitize the multiplier from power supply variations, (3) reduce the size of iDAC's binary weighted current reference network. Such combination of methods is utilized in the embodiment of a RBN$_{21}$ & PSR$_{21}$ circuit, wherein the RBN$_{21}$ & PSR$_{21}$ circuit is shared with a plurality of $XD_iI_{O_{21}}$ channels.

Notice that the PSR circuit is comprised of identical sections that are repeated for each sequence of reference bias currents of RBN, and that each multiplier $XD_iI_{O21}$ channel is comprised of iDACx$_{21}$, iDACy$_{21}$, and an iMULT$_{21}$.

For example, the PSR$_{21}$ section of the MSB current of RBN$_{21}$ is comprising of P4c$_{21}$, P4c'$_{21}$, P4c''$_{21}$, N4c$_{21}$, and N4c'$_{21}$. The MSB current of the RBN$_{21}$ circuit, which is set by the I$_{DS}$ of N4r$_{21}$, is mirrored through P4c$_{21}$ and the diode connected P4c'$_{21}$ where P4c''$_{21}$ regulates the current in N4c'$_{21}$ and its diode connected N4c$_{21}$ mirror while keeping the V$_{GS}$ of P4c$_{21}$ and P4c'$_{21}$ substantially equalized. The V$_{as}$ of N4c'$_{21}$ is V$_{DD}$-V$_{GSp}$ with V$_{GSp}$ being that of P4c'$_{21}$. The PSR$_{21}$ section's regulation of the MSB current of RBN$_{21}$ kicks in when, for example, V$_{DD}$ falls then I$_{DS}$ of P4c''$_{21}$ increases which raises the operating current in N4c$_{21}$, N4c'$_{21}$, P4c'$_{21}$, and P4c$_{21}$ until the I$_{DS}$ of P4c$_{21}$ is substantially equalized with I$_{DS}$ of N4r'$_{21}$, which is independent of V$_{DD}$ variations (since I$_{DS}$ of N4r'$_{21}$ mirrors a multiple of the fixed reference current Ir'$_{21}$).

In other words, when V$_{DD}$ varies, the I$_{DS}$ of N4c'$_{21}$ and P4c'$_{21}$ is regulated and independent of V$_{DD}$ variations, despite N4c'$_{21}$'s V$_{DS}$=V$_{DD}$-V$_{GSp}$. The V4r$_{21}$ that is the V$_{GS}$ of N4c$_{21}$ and N4c'$_{21}$ programs the bus voltage that is coupled with the gate terminals of N4y$_{21}$ and N4x$_{21}$ which are the MSB current sources of the current reference network of iDACx$_{21}$ and iDACy$_{21}$. Considering that the bias voltage at the drain terminals of N4y$_{21}$ and N4x$_{21}$ are coupled with the inputs of iMULT$_{21}$ which are about V$_{DD}$-V$_{GSp}$, the I$_{DS}$ of the N4y$_{21}$ and N4x$_{21}$ is also independent of V$_{DD}$ variations because they mirror N4c$_{21}$ and N4c'$_{21}$.

Be mindful that the drain terminals of N4x$_{21}$ and N4y$_{21}$ (when selected in iDACs) are coupled with the x and y analog input current ports of iMULT$_{21}$, respectively, whose bias voltages are arranged as V$_{GSp}$ of PxoM$_{21}$ and PyM$_{21}$. In summary, the MSB current sources of iDAC's current reference networks are arranged to be independent of V$_{DD}$ variations, without cascoded FETs in iDAC's current reference network, and with the iDAC's binary weighted current reference network that is not sized in a binary weighted manner, combination of which saves substantial silicon area (especially in machine learning applications where 1000s of iDACs may be required).

Note that the same description as above is applicable to N2r$_{21}$, N2r'$_{21}$ and N1r$_{21}$, N1r'$_{21}$ that in conjunction with the regulating mechanism of their respective PSR$_{21}$ sections, generate the V2r$_{21}$ and V1r$_{21}$ bus voltages.

Thus, V2r$_{21}$ that is the V$_{GS}$ of N2c$_{21}$ and N2c'$_{21}$ is the bus voltage that is coupled with the gate terminals of N2y$_{21}$ and N2x$_{21}$ which can be referred to as the second bit current sources of current reference network of iDACx$_{21}$ and iDACy$_{21}$. The I$_{DS}$ of N2y$_{21}$ and N2x$_{21}$ is also independent of V$_{DD}$ variations, without cascoded FETs, as explained above.

Similarly, V1r$_{21}$ that is the V$_{GS}$ of N1c$_{21}$ and N1c'$_{21}$ is the bus voltage that is coupled with the gate terminals of N1y$_{21}$ and N1x$_{21}$ which are the LSB current sources of current reference network of iDACx$_{21}$ and iDACy$_{21}$. Accordingly, I$_{DS}$ of N1y$_{21}$ and N1x$_{21}$ is independent of V$_{DD}$ variations, without cascoded FETs. As indicated earlier, V4r$_{21}$, V2r$_{21}$, and V1r$_{21}$ are bus voltages in the reference bias network (RBN) that set the sequence of reference bias currents for plurality of iDACs (e.g., there can be 1000s if iDACs sharing the sequence bus voltages generated by the same RBN).

In summary, the sequence of reference bias currents generated in the RBN circuit are substantially desensitized from $V_{DD}$ variations by the PSR circuit before they are mirrored onto the iDAC's current reference networks. As such, iDAC's output currents are arranged to be independent of $V_{DD}$ variations, without cascoded FETs in iDAC's current reference network which save silicon area.

As presented in section 20, the $iMULT_{21}$'s input output transfer function follows the $Iy_{21}/Ir_{21}=Io_{21}/Ix_{21}$ relationship. The $Iy_{21}/Ir_{21}$ is substantially desensitized to $V_{DD}$ variations, since $iDACy_{21}$ current output that is $Iy_{21}$ and $Ir_{21}$ are substantially desensitized to $V_{DD}$ variations without cascoded FETs, as explained earlier.

The $iDACx_{21}$ current output is also substantially desensitized to $V_{DD}$ variations without cascoded FETs. The $PoM_{21}$ is cascoded with $PoM'_{21}$ to increase the output impedance of output port of $iMULT_{21}$ and substantially desensitized $Io_{21}$ to $V_{DD}$ variations. Also, $PxM_{21}$ is cascoded with $PxM'_{21}$ to help match the $V_{DS}$ of $PxM_{21}$ and $PoM_{21}$, which helps with $Io_{21}/Ix_{21}$ insensitivity to $V_{DD}$ variations.

Figure 28:
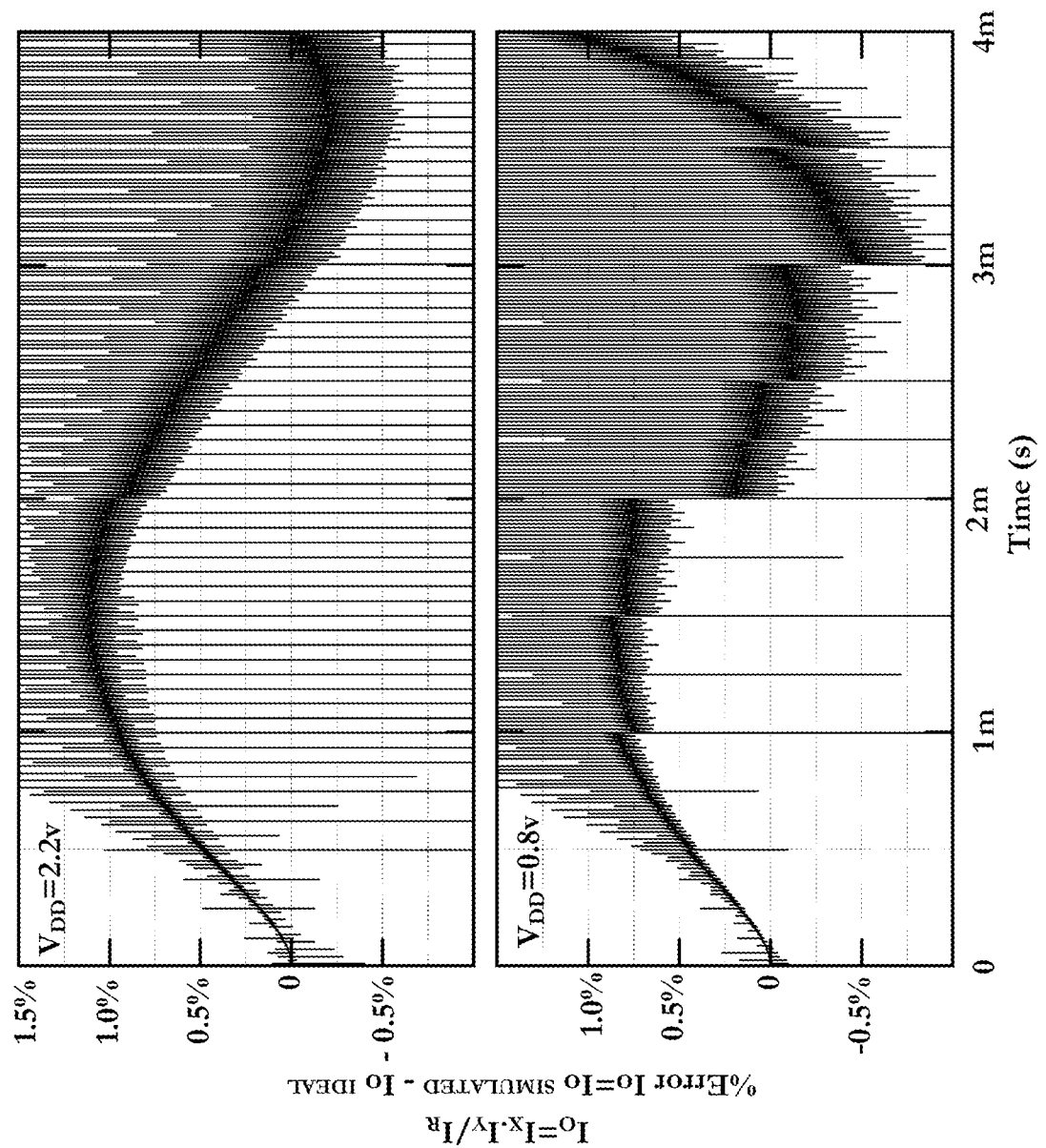
FIG. 28 is a circuit simulations illustrating the error waveform (output current SPICE simulation minus output current ideal) attributed to an output current (I$_o$) of a XD$_i$I$_o$ multiplier arranged similar to that of FIG. 21 but having an 8-bit digital inputs instead of 3-bits.

Each $XD_iI_O$ is substantially desensitized from power supply variations by utilizing another embodiment of the multiplier power supply desensitization method that is indicated by SPICE circuit simulations of FIG. 28. It is the simulations results of a $XD_iI_O$ similar to that of FIG. 21, but with a resolution of 8-bits digital words instead of that of FIG. 21 with a resolution of 3-bits digital words. A $XD_iI_O$ of FIG. 29 is inputted with an 8-bit (x-word digital input) by an 8-bit (y-word digital input) wherein the x and y words are ramped from zero-scale to full scale where power supply $V_{DD}$ is varied from 2.2V to 0.8V. FIG. 28 illustrates a waveform plot that is the error curve (output current simulation minus output current ideal) attributed to $I_O$ of the $XD_iI_O$ indicating less than ±0.75% error in DNL (differential non-linearity), INL (integral non-linearity), and GE (gain-error).

In summary some of the benefits of the embodiment disclosed in FIG. 21 are as follows:

First, the disclosed embodiment benefits from operating in current mode that has been discussed in this disclosure Second, the disclosed embodiment benefits from savings in silicon die area, lower glitch, and faster speed when plurality of $XD_iI_O$ are required (e.g., in machine learning applications where 1000s of $XD_iI_O$ may be needed) by utilizing the multiple iDAC method that is disclosed in section 19.

Third, the disclosed embodiment benefits from further saving in silicon die area as well as desensitization to power supply variations for each $XD_iI_O$ by utilizing another embodiment of the multiplier power supply desensitization method, which also facilitates the elimination of the cascoded FETs in iDACs current reference network.

Figure 22A:
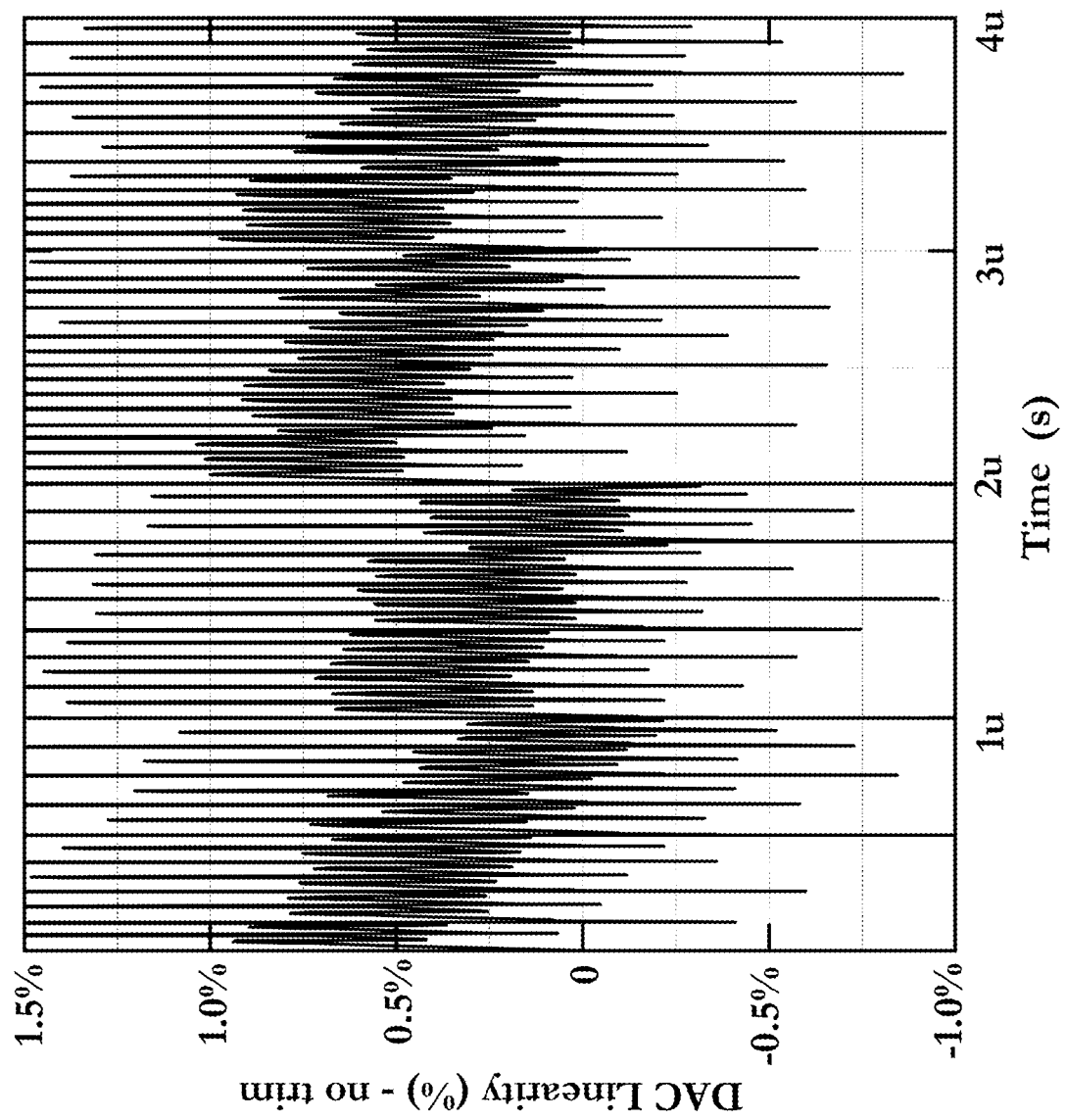
FIG. 22A is a circuit simulation illustrating the error waveform (output current SPICE simulation minus output current ideal) attributed to an output current ($I_o$) of a current-output DAC (iDAC). Here, the multiple-channel data-converter method of section 19 is utilized where the reference bias network (RBN) is not trimmed, and the iDAC is arranged similar to that of FIG. 19 but having an 8-bit resolution.

Section 22A—Description of FIG. 22A

FIG. 22A is a SPICE circuit simulations that illustrates the linearity error in % between an ideal output current ($Io_{ideal}$) iDAC versus the simulated output current ($Io_{simulation}$) of one of the iDAC channels as arranged similar to that of FIG. 19 but with an 8-bit resolution. The reference bias network is not trimmed here.

Keeping in mind that 8-bit of resolution computes to about ±0.4% of accuracy, FIG. 22 indicates DNL (differential non-linearity) and INL (integral non-linearity) of less than about ±0.5%. Note that the iDAC's digital input word span between zero and full scale.

Figure 22B:
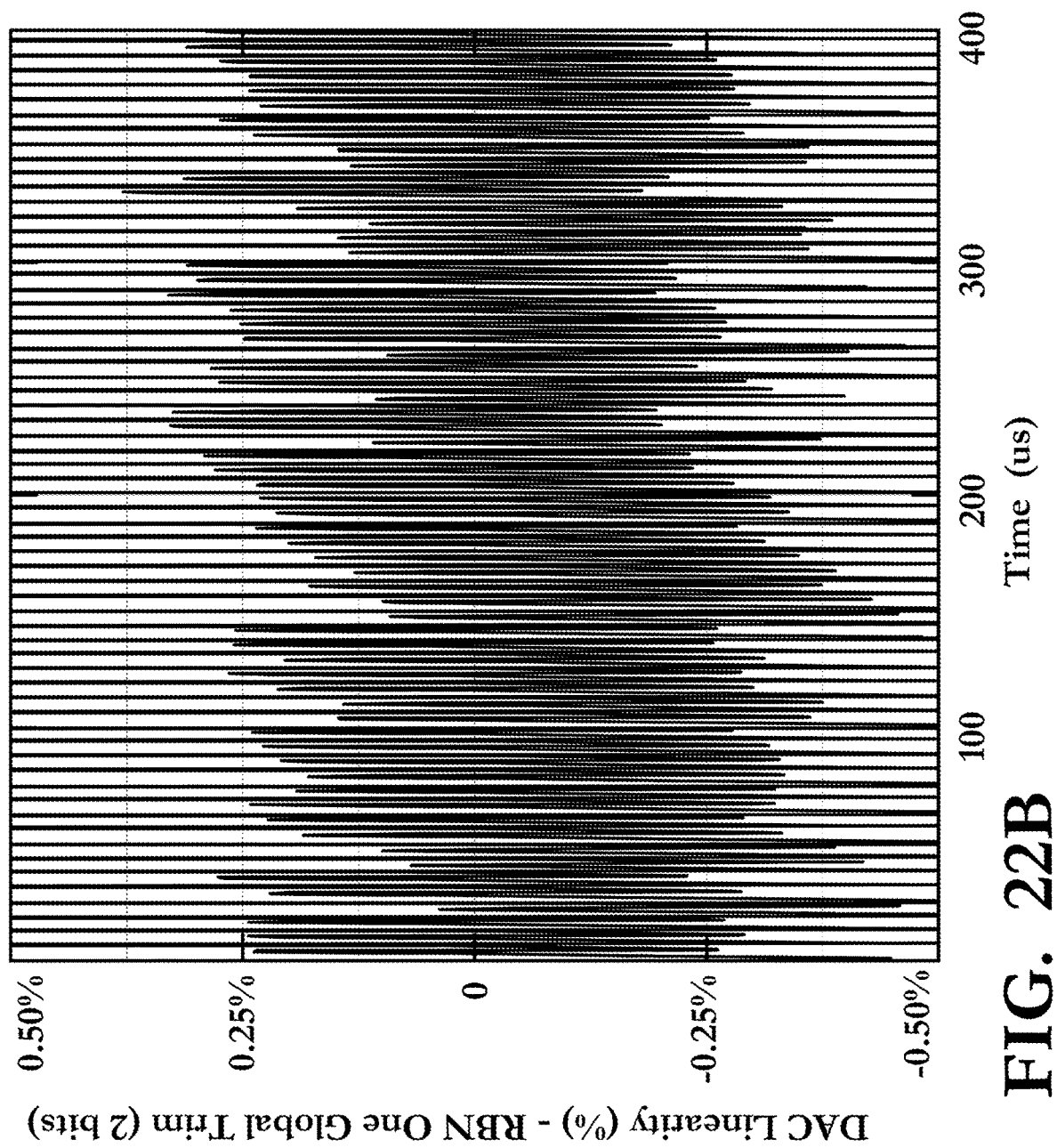
FIG. 22B is a circuit simulation illustrating the error waveform (output current SPICE simulation minus output current ideal) attributed to an output current ($I_o$) of a current-output DAC (iDAC). Here, the multiple-channel data-converter method of section 19 is utilized where two Most-Significant-Bits (MSBs) of the reference bias network (RBN) are trimmed, and the iDAC is arranged similar to that of FIG. 19 but having an 8-bit resolution.

Section 22B—Description of FIG. 22B

FIG. 22B is a SPICE circuit simulations that illustrates the linearity error in % between an ideal output current ($Io_{ideal}$) iDAC versus the simulated output current ($Io_{simulation}$) of one of the iDAC channels as arranged similar to that of FIG. 19 but with an 8-bit resolution. The two MSBs of the reference bias network (RBN) are trimmed here, which would improve the linearity of plurality of iDACs (that are biased from the same RBN).

Keeping in mind that 8-bit of resolution computes to about ±0.4% of accuracy, FIG. 22 indicates DNL (differential non-linearity) and INL (integral non-linearity) of less than about ±0.25% which is roughly a factor of 4 improvement. Note that the iDAC's digital input word span between zero and full scale.

Figure 23:
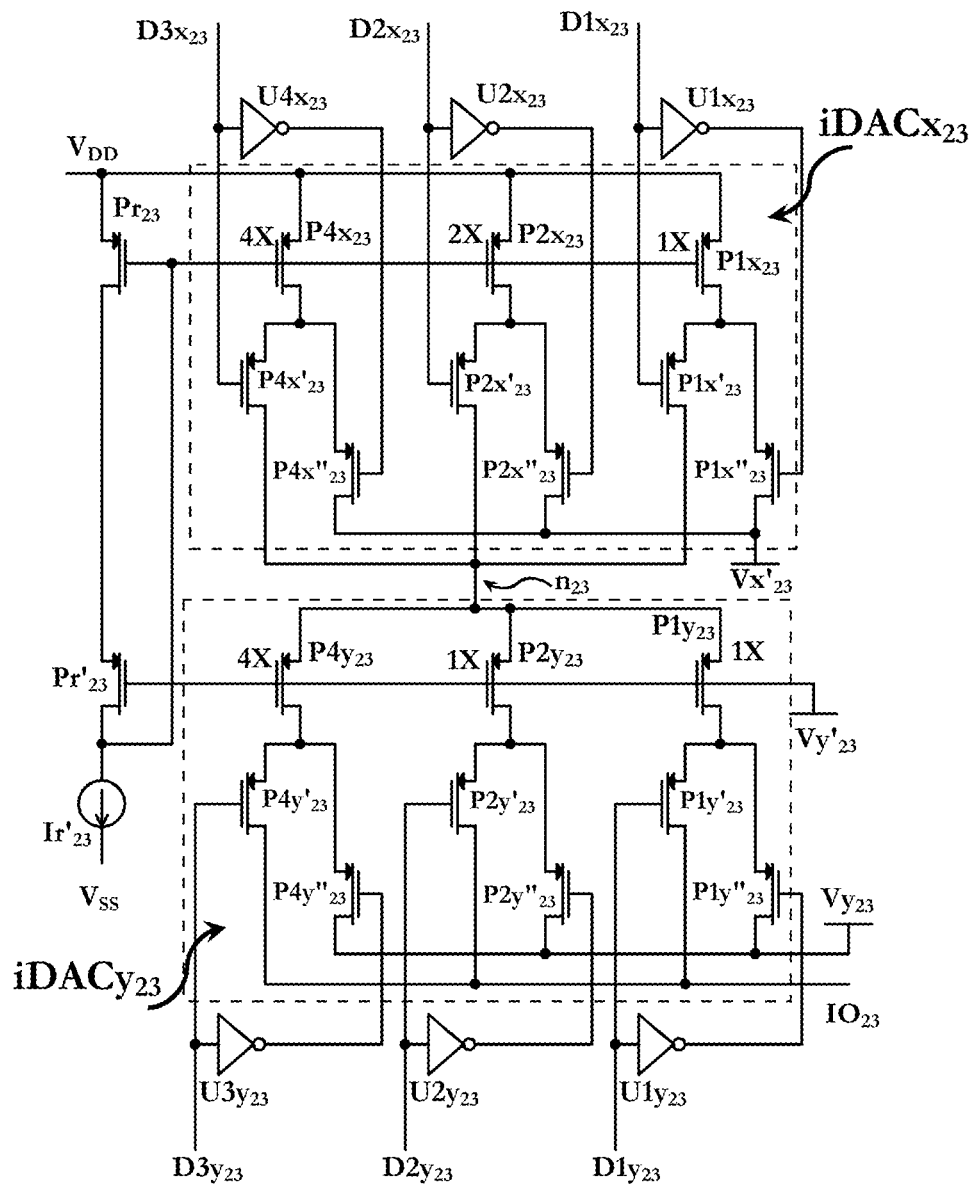
FIG. 23 is a simplified circuit schematic illustrating an embodiment of a multiplier ($XD_iI_o$) with digital-inputs to analog-current-output that operate in current mode comprising of a first current-output DAC (iDAC) or $iDACx_{23}$ whose analog-current-output supplies the reference input to a second current-output iDAC or $iDACy_{23}$.

Section 23—Description of FIG. 23

FIG. 23 is a simplified circuit schematic illustrating an embodiment of a digital-input to analog-current-output multiplier ($XD_iI_O$) that operate in current mode comprising of an $iDACx_{23}$ whose analog-current-output supplies the reference input to an $iDACy_{23}$.

For descriptive clarity and illustrative simplicity, the $XD_iI_{O_{23}}$'s resolution is arranged as a 3-bit (x-channel for $iDACx_{23}$) by 3-bit (y-channel for $iDACy_{23}$), but the resolution can be higher (e.g., 16-bits).

A current reference ($Ir'_{23}$) is inputted and mirrored onto $iDACx_{23}$'s binary weighed current reference network comprising of $P4x_{23}$ (scaled at 4×), $P2x_{23}$ (scaled at 2×), and $P1x_{23}$ (scaled at 1×). The $iDACx_{23}$'s digital inputs ($Dx_{23}$ digital word) are $D3x_{23}$ (as MSB) through $D1x_{23}$ (as LSB), which control $iDACx_{23}$'s analog current switches $P4x'_{23}$ through $P1x'_{23}$ and $P4x''_{23}$ through $P1x''_{23}$.

The selected sums of $iDACx_{23}$'s analog current switch outputs are steered through node $n_{23}$ onto the reference input of $iDACy_{23}$.

The $iDACy_{23}$'s binary weighed current reference network comprising of $P4y_{23}$ (scaled at 4×), $P2y_{23}$ (scaled at 2×), and $P1y_{23}$ (scaled at 1×) have their source terminals coupled together and floating on node $n_{23}$. Moreover, note that the gate terminal of $P4y_{23}$, $P2y_{23}$, and $P1y_{23}$ are coupled together with $Pr'_{23}$'s cascode bias voltage $Vy'_{23}$, which provides enough headroom for the $iDACx_{23}$'s binary weighed current reference network and improves its output impedance. Similarly, the $iDACy_{23}$'s digital inputs ($Dy_{23}$ digital word) are $D3y_{23}$ (as MSB) through $D1y_{23}$ (as LSB) control $iDACy_{23}$'s analog current switches $P4y'_{23}$ through $P1y'_{23}$ and $P4y''_{23}$ through $P1y''_{23}$. The selected sums of $iDACy_{23}$'s analog current switch outputs are steered through the $XD_iI_{O_{23}}$ s current-output node $Io_{23}$ that generates the analog current product $Ax_{23}×Ay_{23}/Ar_{23}$, wherein $Ax_{23}$ is the analog current representation of the digital word $Dx_{23}$, $Ay_{23}$ is the analog current representation of the digital word $Dy_{23}$, and $Ar_{23}$ is a multiple of $Ir'_{23}$.

The disclosed $XD_iI_{O_{23}}$ benefits from current mode operations, which has been discussed in this disclosure. Another benefit of $XD_iI_{O_{23}}$ disclosure results from feeding the current output of a first iDAC directly into the reference port of a second iDAC, whose reference input port is floating. The floating iDAC method (that is utilized here) was describe in section 1 of this disclosure. Here, the source terminals of current reference FET network of the second iDAC are coupled together to arrange the floating reference port of the second iDAC. As such, a current mirror (to channel the first iDAC output current onto the second iDAC reference input port) is avoided, which saves area and improves accuracy since it avoids the mismatch associated with the said current mirror.

Figure 24:
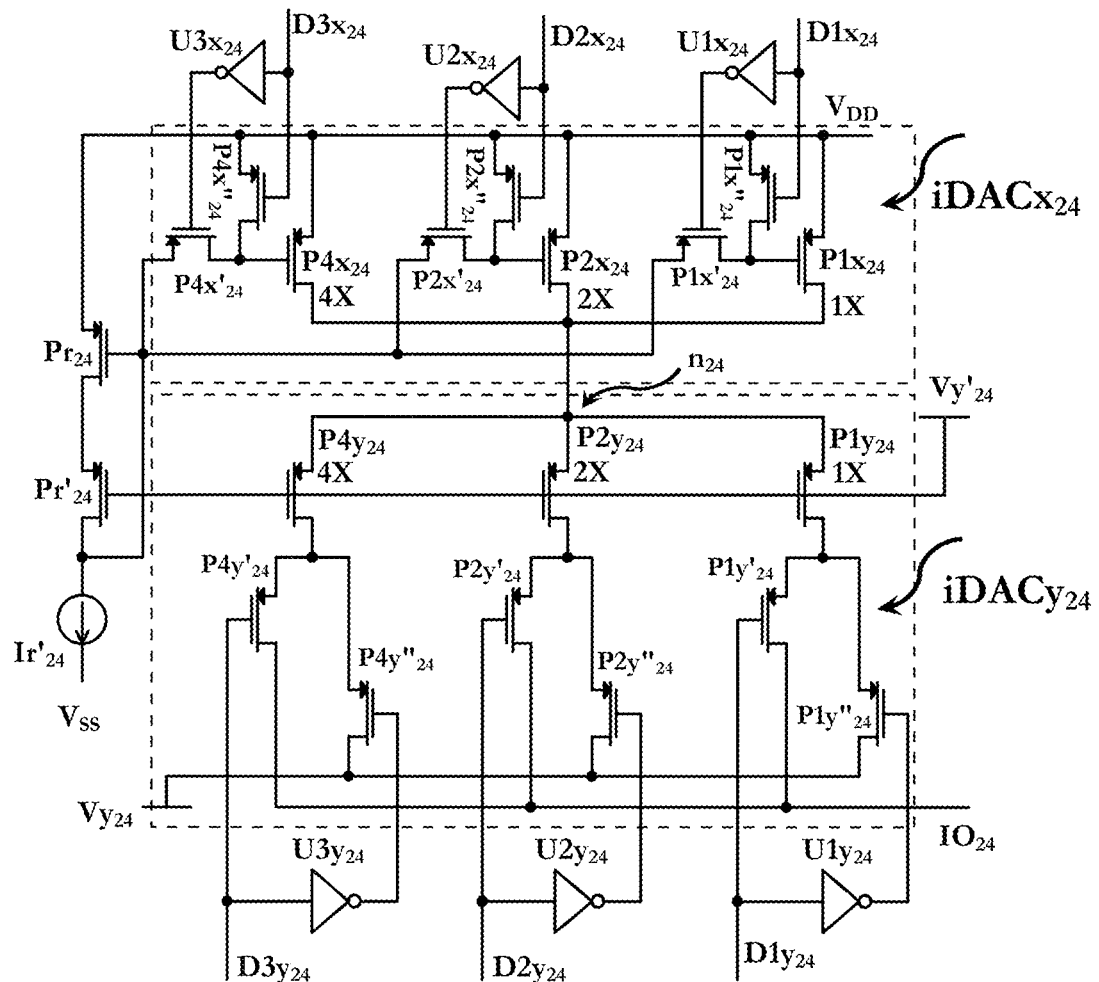
FIG. 24 is a simplified circuit schematic illustrating another embodiment of a multiplier ($XD_iI_o$) with digital-inputs to analog-current-output that operate in current mode comprising of a first current-output DAC (iDAC) or $iDACx_{24}$ whose analog-current-output supplies the reference input to a second current-output iDAC or $iDACy_{24}$.

Section 24—Description of FIG. 24

FIG. 24 is a simplified circuit schematic illustrating another embodiment of mixed-mode digital-input to analog-current-output multiplier ($XD_iI_O$) that operate in current mode comprising of an $iDACx_{24}$ whose analog-current-output supplies the reference input to an $iDACy_{24}$.

For descriptive clarity and illustrative simplicity, the $XD_iI_{O_{24}}$'s resolution is arranged as a 3-bit (x-channel for $iDACx_{24}$) by 3-bit (y-channel for $iDACy_{24}$) but the resolution can be higher (e.g., 16-bits).

A current reference ($Ir'_{24}$) is inputted and mirrored onto $iDACx_{24}$'s binary weighed current reference network comprising of $P4x_{24}$ (scaled at 4×), $P2x_{24}$ (scaled at 2×), and $P1x_{24}$ (scaled at 1×). The $iDACx_{24}$'s digital inputs ($Dx_{24}$ digital word) are $D3x_{24}$ (as MSB) through $D1x_{24}$ (as LSB), which control $iDACx_{24}$'s analog current switches $P4x'_{24}$ through $P1x'_{24}$ and $P4x''_{24}$ through $P1x''_{24}$.

Note that the embodiment of FIG. 24 does not arrange $iDACx_{24}$'s analog current switches is series with the binary weighed current reference network path. Instead, $iDACx_{24}$'s analog current switches are enabled (turned on) by switch coupling with the gate terminal of $Pr_{24}$ or disabled (turned off) by switch coupling with $V_{DD}$. For example, when $D3x_{24}$ digital value is high (on), then the analog current switch $P4x'_{24}$ is on and the analog current switch $P4x''_{24}$ is off, which causes $P4x_{24}$'s binary weighted MSB current (scaled and mirrored by $P4x_{24}$-$Pr_{24}$ current mirror) to flow onto the $iDACx_{24}$ current output port that is node $n_{24}$. Conversely, for example, when $D3x_{24}$ digital value is low (off), then the analog current switch $P4x'_{24}$ is off and the analog current switch $P4x''_{24}$ is on, which shuts off $P4x_{24}$ and blocks its' binary weighted MSB current from flowing onto the $iDACx_{24}$ current output port that is node $n_{24}$. The same principle of operations applies to the other-bits of $iDACx_{24}$.

The selected sums of $iDACx_{24}$'s analog current switch outputs are steered through the floating node $n_{24}$ and onto the reference input of $iDACy_{24}$.

The $iDACy_{24}$'s binary weighed current reference network comprising of $P4y_{24}$ (scaled at 4×), $P2y_{24}$ (scaled at 2×), and $P1y_{24}$ (scaled at 1 x) have their source terminals coupled together and floating on node $n_{24}$. Moreover, be mindful that the gate terminal of $P4y_{24}$, $P2y_{24}$, and $P1y_{24}$ are coupled together with $Pr'_{24}$'s cascode bias voltage $Vy'_{24}$, which provides enough headroom for the $iDACx_{24}$'s binary weighed current reference network and improves its output impedance. Similarly, the $iDACy_{24}$'s digital inputs ($Dy_{24}$ digital word) are $D3y_{24}$ (as MSB) through $D1y_{24}$ (as LSB) control $iDACy_{24}$'s analog current switches $P4y'_{24}$ through $P1y'_{24}$ and $P4y''_{24}$ through $P1y''_{24}$. The selected sums of $iDACy_{24}$'s analog current switch outputs are steered through the $XD_iI_{O_{24}}$'s current-output node $Io_{24}$ that generates the analog current product $Ax_{24} \times Ay_{24}/Ar_{24}$, wherein $Ax_{24}$ is the analog current representation of the digital word $Dx_{24}$, $Ay_{24}$ is the analog current representation of the digital word $Dy_{24}$, and $Ar_{24}$ is a multiple of $Ir'_{24}$.

The disclosed $XD_iI_{O_{24}}$ benefits from current mode operations, which has been discussed in this disclosure. Another benefit of $XD_iI_{O_{24}}$ disclosure results from feeding the current output of a first iDAC directly into the reference port of a second iDAC, whose reference input port is floating. The floating iDAC method, which is utilized here, was describe in section 1 of this disclosure. Here, the source terminals of current reference FET network of the second iDAC are coupled together to arrange the floating reference port of the second iDAC. As such, a current mirror (to channel the first iDAC output current onto the second iDAC reference input port) is avoided, which saves area and improves accuracy since it avoids the mismatch associated with the said current mirror.

Figure 25:
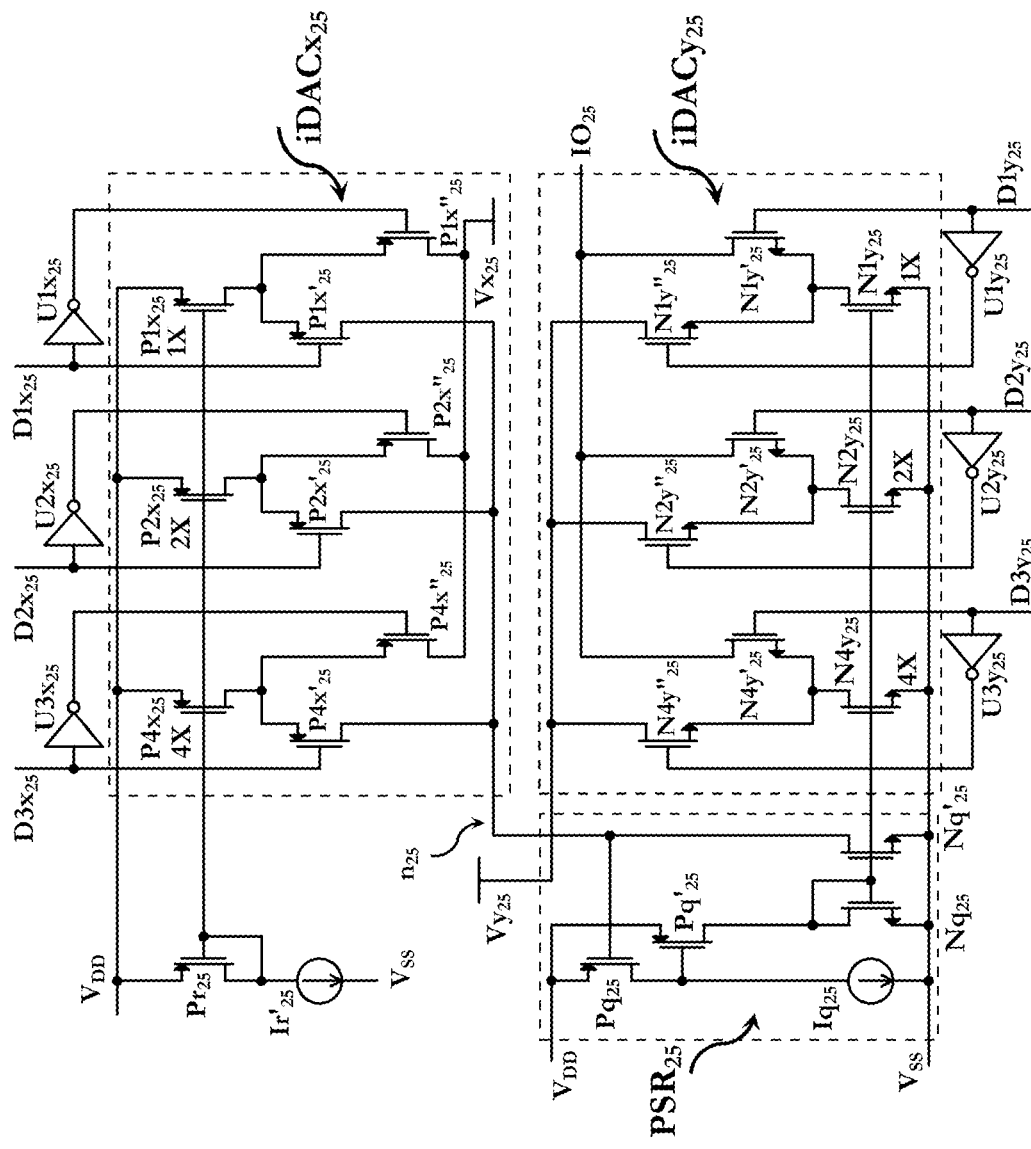
FIG. 25 is a simplified circuit schematic illustrating an embodiment of a multiplier ($XD_iI_o$) with digital-input to analog-current-output that operate in current mode equipped with an embodiment of the power supply desensitization (PSR) circuit.

Section 25—Description of FIG. 25

FIG. 25 is a simplified circuit schematic illustrating another embodiment of a digital-input to analog-current-output multiplier ($XD_iI_O$) that operate in current mode. The $XD_iI_{O_{25}}$ is comprising of a first current-output $iDACx_{25}$ whose analog-current-output supplies the reference input to an $iDACy_{25}$, while a power supply desensitization circuit ($PSR_{25}$) substantially desensitize the $XD_iI_{O25}$'s output current to $V_{DD}$ variations wherein silicon area is saved by eliminating the need for cascoded FETs in the iDACs.

For descriptive clarity and illustrative simplicity, the $XD_iI_{O25}$'s resolution is arranged as a 3-bit (x-channel for $iDACx_{25}$) by 3-bit (y-channel for $iDACy_{25}$) but the resolution can be higher (e.g., 16-bits).

A current reference ($b-'_{25}$) is inputted and mirrored onto $iDACx_{25}$'s binary weighed current reference network comprising of $P4x_{25}$ (scaled at 4×), $P2x_{25}$ (scaled at 2×), and $P1x_{25}$ (scaled at 1×). The $iDACx_{25}$'s digital inputs ($Dx_{25}$ digital word) are $D3x_{25}$ (as MSB) through $D1x_{25}$ (as LSB), which control $iDACx_{25}$'s analog current switches $P4x'_{25}$ through $P1x'_{25}$ and $P4x''_{25}$ through $P1x''_{25}$.

Be mindful that generally cascoded FETs are utilized in an iDAC's current reference network to increase its output impedance and substantially desensitize an iDAC's output current from power supply variations.

Here, the selected sums of $iDACx_{25}$'s analog current switch outputs are steered through node $n_{25}$ onto a power supply desensitization circuit ($PSR_{25}$). One of the objectives of $PSR_{25}$ is to substantially desensitize the output current of $XD_iI_{O_{25}}$ from power supply variations, wherein the cascode FETs are eliminated from the binary weighted current reference network of $iDACx_{25}$ and $iDACy_{25}$. Without the cascode FETs, the binary weighted current reference network net-net area is reduced substantially compared to the added area of $PSR_{25}$ (and hence the overall area of $XD_iI_{O_{25}}$ is reduced).

In the disclosed embodiment of FIG. 25, the $PSR_{25}$ receives the $iDACx_{25}$ output current at node $n_{25}$ whose DC voltage is biased at $V_{DD}$-$VGS_{Pq_{25}}$. As such the binary weighted current reference network output of $iDACx_{25}$ (at node $n_{25}$) tracks the $Ir'_{25}$ (that is a fixed reference current and independent of $V_{DD}$ by design), wherein $iDACx_{25}$ output port is also biased at $V_{DD}$-$VGS_{Pr_{25}}$, which substantially desensitizes $iDACx_{25}$'s output current from $V_{DD}$ variations. Without the $PSR_{25}$ and without the cascoded FETs, the $iDACy_{25}$'s output current would vary with $V_{DD}$ since the drain-to-source voltage ($V_{DS}$) of $iDACy_{25}$'s binary weighted current reference network ($N4y_{25}$, $N2y_{25}$, and $N1y_{25}$) is subject to $V_{DD}$ variations and the DC bias voltage of $IO_{25}$ port (e.g., $V_{IO_{25}}=V_{DD}-V_{GS}$). Notice that the $V_{DS}$ of $Pq'_{25}$ is $V_{DD}$-$VGS_{Nq_{25}}$ and $V_{DS}$ of $Nq'_{25}$ is $V_{DD}$-$VGS_{Pq_{25}}$. To substantially desensitize the output current of $iDACy_{25}$ (without its' cascoded FETs), $Pq'_{25}$ regulates the current through $Nq_{25}$ and $Nq'_{25}$ until $I_{DS}$ of $Nq'_{25}$ and the output current of $iDACx_{25}$ (flowing through node $n_{25}$) are substantially equalized. The $I_{DS}$ of $Nq'_{25}$ is mirrored onto the current reference network of $iDACy_{25}$ (stripped from cascoded FETs to save area), and accordingly the current output of $iDACy_{25}$ which is the analog current output of $D_iI_{O_{25}}$ is substantially desensitized from $V_{DD}$ variations.

The $iDACy_{25}$'s binary weighed current reference network comprising of $N4y_{25}$ (scaled at 4×), $N2y_{25}$ (scaled at 2×), and $N1y_{25}$ (scaled at 1 x) are scaled and mirrored to $I_{DS}$ of $Nq'_{25}$, and $Nq_{25}$. Here also, the $iDACy_{25}$'s digital inputs ($Dy_{25}$ digital word) are $D3y_{25}$ (as MSB) through $D1y_{25}$ (as LSB) control $iDACy_{25}$'s analog current switches $N4y'_{25}$ through $N1y'_{25}$ and $N4y''_{25}$ through $N1y''_{25}$. The selected sums of $iDACy_{25}$'s analog current switch outputs are steered through the $XD_iI_{O_{25}}$'s current-output node $IO_{25}$. The $iDACy_{25}$'s output generates the equivalent analog output current product $Ax_{25} \times Ay_{25}/Ar_{25}$, wherein $Ax_{25}$ is the analog current representation of the digital word $Dx_{25}$, $Ay_{25}$ is the analog current representation of the digital word $Dy_{25}$, and $Ar_{25}$ is a scaled $Ir'_{25}$. Again, consider that node $IO_{25}$ can be biased at a $V_{GS}$ below $V_{DD}$.

The disclosed $XD_iI_{O_{25}}$ benefits from current mode operations, which has been discussed in this disclosure. Another benefit of $XD_iI_{O_{25}}$ is having a smaller area by utilizing a method of rejecting power supply variations by regulating the first iDAC's output current before it is fed onto the reference input the second iDAC, wherein the iDAC's current reference networks are stripped from cascoded FETs. This power supply desensitization method utilized in $XD_iI_{O_{25}}$ (via the embodiment of a power supply desensitization circuit $PSR_{25}$) substantially desensitizes $XD_iI_{O_{25}}$'s output from $V_{DD}$ variations, wherein the cascoded FETs (in the iDAC's current reference networks) are eliminated, which saves silicon area and lowers cost.

Figure 26:
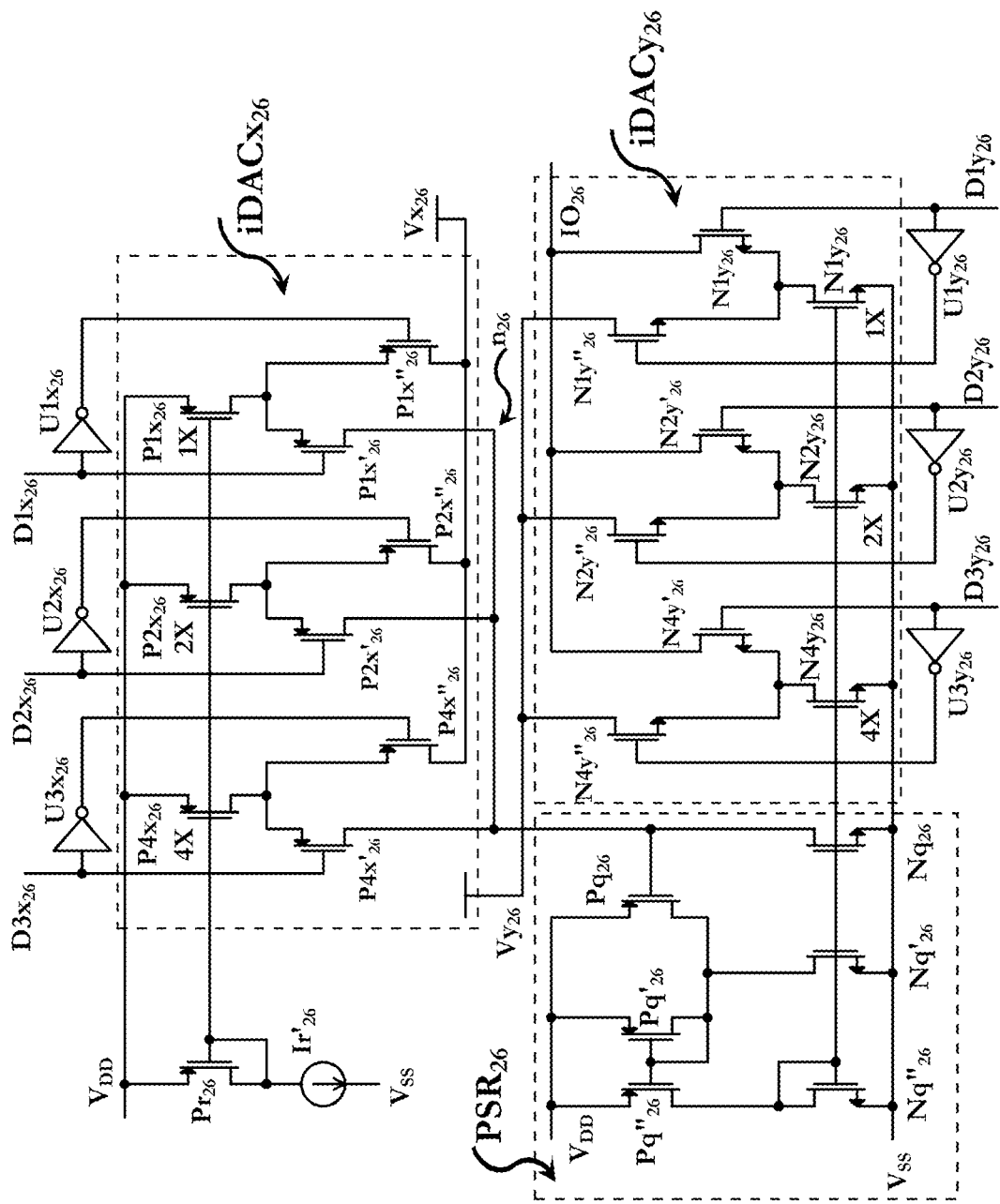
FIG. 26 is a simplified circuit schematic illustrating another embodiment of a multiplier ($XD_iI_o$) with digital-input to analog-current-output that operate in current mode equipped with another embodiment of the power supply desensitization (PSR) circuit.

Section 26—Description of FIG. 26

FIG. 26 is a simplified circuit schematic illustrating another embodiment of a digital-input to analog-current-output multiplier ($XD_iI_O$) that operate in current mode. The $XD_iI_{O_{26}}$ is comprising of an $iDACx_{26}$ whose analog-current-output supplies the reference input to a power supply desensitization circuit ($PSR_{26}$) that biases the current reference network of the $iDACy_{26}$. Here, $PSR_{26}$ substantially desensitize the $XD_iI_{O_{26}}$'s output current to $V_{DD}$ variations, while the iDAC's current reference network areas are reduced by eliminating the cascoded FETs.

For descriptive clarity and illustrative simplicity, the $XD_iI_{O_{26}}$'s resolution is arranged as a 3-bit (x-channel for $iDACx_{26}$) by 3-bit (y-channel for $iDACy_{26}$) but the resolution can be higher (e.g., 16-bits).

A current reference ($b\text{-}'_{26}$) is inputted and mirrored onto $iDACx_{26}$'s binary weighed current reference network comprising of $P4x_{26}$ (scaled at 4×), $P2x_{26}$ (scaled at 2×), and $P1x_{26}$ (scaled at 1×). The $iDACx_{26}$'s digital inputs ($Dx_{26}$ digital word) are $D3x_{26}$ (as MSB) through $D1x_{26}$ (as LSB), which control $iDACx_{26}$'s analog current switches $P4x'_{26}$ through $P1x'_{26}$ and $P4x''_{26}$ through $P1x''_{26}$.

The selected sums of $iDACx_{26}$'s analog current switch outputs are steered through node $n_{26}$ onto a power supply desensitization circuit ($PSR_{26}$). Similar to the disclosure in section 25, one of the objectives of $PSR_{26}$ is to substantially desensitize the output current of $DD_iI_{O_{26}}$ from power supply variations, while the cascode FETs are eliminated from the binary weighted current reference network of $iDACx_{26}$ and $iDACy_{26}$. By eliminating the cascode FETs from the binary weighted current reference network, net-net the area of $iDACx_{26}$ and $iDACy_{26}$ is substantially reduced compared to the added area of $PSR_{26}$ (and hence the overall area of $XD_iI_{O_{26}}$ is reduced).

Consider that cascoded FETs may be needed in an iDAC's current reference network to increase its output impedance and substantially desensitize an iDAC's output current from power supply variations. Here, the $PSR_{26}$ receives the $iDACx_{26}$ output current at node $n_{26}$ whose DC voltage is biased at $V_{DD}-V_{GS_P}$ wherein $V_{GS_P}$ is that of $Pq_{26}$. The $Ir'_{26}$ (that is independent of $V_{DD}$ by design) is biased at $V_{DD}-VGS_{Pr_{26}}$ where $Ir'_{26}$'s current biases the binary weighted current reference network of $iDACx_{26}$. As such, the reference current input port and the current output (at node $n_{26}$) of $iDACx_{26}$ are biased at $V_{DD}-V_{GS_P}$ and track each other, which therefore helps $iDACx_{26}$ output current to be substantially desensitized from $V_{DD}$ variations.

Moreover, keep in mind that without the $PSR_{26}$ and without the cascoded FETs, the $iDACy_{26}$'s output current would also vary with $V_{DD}$ since the drain-to-source voltage ($V_{DS}$) of $iDACy_{26}$'s binary weighted current reference network ($N4y_{26}$, $N2y_{26}$, and $N1y_{26}$) is subject to $V_{DD}$ variations and the DC bias voltage of $IO_{26}$ port (e.g., $V_{1O26}=V_{DD}-V_{GS}$). Note that the $V_{DS}$ of $Pq''_{26}$ is $V_{DD}-VGS_{Nq_{26}}$ and $V_{DS}$ of $Nq_{26}$ is $V_{DD}-VGS_{Pq_{26}}$. As such, to substantially desensitize the output current of $iDACy_{26}$ (without cascoded FETs), the inverting current amplifier comprising of $Pq_{26}$, $Pq'_{26}$, and $Pq''_{26}$ regulates the currents through $Nq''_{26}$ and $Nq_{26}$ until $I_{DS}$ of $Nq_{26}$ and the output current of $iDACx_{26}$ (flowing through node $n_{26}$) are substantially equalized. The $I_{DS}$ of $Nq''_{26}$ and $Nq_{26}$ are mirrored onto the current reference network of $iDACy_{26}$ (stripped from cascoded FETs to save area), and accordingly the current output of $iDACy_{26}$ that is the analog current output of $XD_iI_{O_{26}}$ is substantially desensitized from $V_{DD}$ variations.

The $iDACy_{26}$'s binary weighed current reference network comprising of $N4y_{26}$ (scaled at 4×), $N2y_{26}$ (scaled at 2×), and $N1y_{26}$ (scaled at 1 x) are scaled and mirrored to $I_{DS}$ of $Nq''_{26}$, $Nq_{26}$. Here also, the $iDACy_{26}$'s digital inputs ($Dy_{26}$ digital word) are $D3y_{26}$ (as MSB) through $D1y_{26}$ (as LSB) control $iDACy_{26}$'s analog current switches $N4y'_{26}$ through $N1y'_{26}$ and $N4y''_{26}$ through $N1y''_{26}$. The selected sums of $iDACy_{26}$'s analog current switch outputs are steered through the $XD_iI_{O_{26}}$'s current-output node $IO_{26}$ that generates the equivalent analog output current product $Ax_{26} \times Ay_{26}/Ar_{26}$, wherein $Ax_{26}$ is the analog current representation of the digital word $Dx_{26}$, $Ay_{26}$ is the analog current representation of the digital word $Dy_{26}$, and $Ar_{26}$ is a scaled $Ir'_{26}$. Again, notice that node $IO_{26}$ can be biased at a $V_{GS}$ below $V_{DD}$.

The disclosed $XD_iI_{O_{26}}$ benefits from current mode operations, which has been discussed in this disclosure. Another benefit of $XD_iI_{O_{26}}$ is having a smaller area by utilizing the method of rejecting power supply variations by regulating $iDACx_{26}$ output current before it is fed onto the reference input of $iDACy_{26}$, wherein both iDAC's binary weighted current reference networks are stripped from cascoded FETs. The disclosed embodiment of power supply desensitization method in $PSR_{26}$ is utilized in $XD_iI_{O_{26}}$ which substantially desensitizes $iDACx_{26}$ output current from $V_{DD}$ while $PSR_{26}$ regulates $iDACy_{26}$'s reference input current. Thus, the output current of the overall multiplier is substantially desensitized from power supply variations and the cascoded FETs (in both of the iDAC's current reference networks) are eliminated which saves area and lowers cost.

Figure 27:
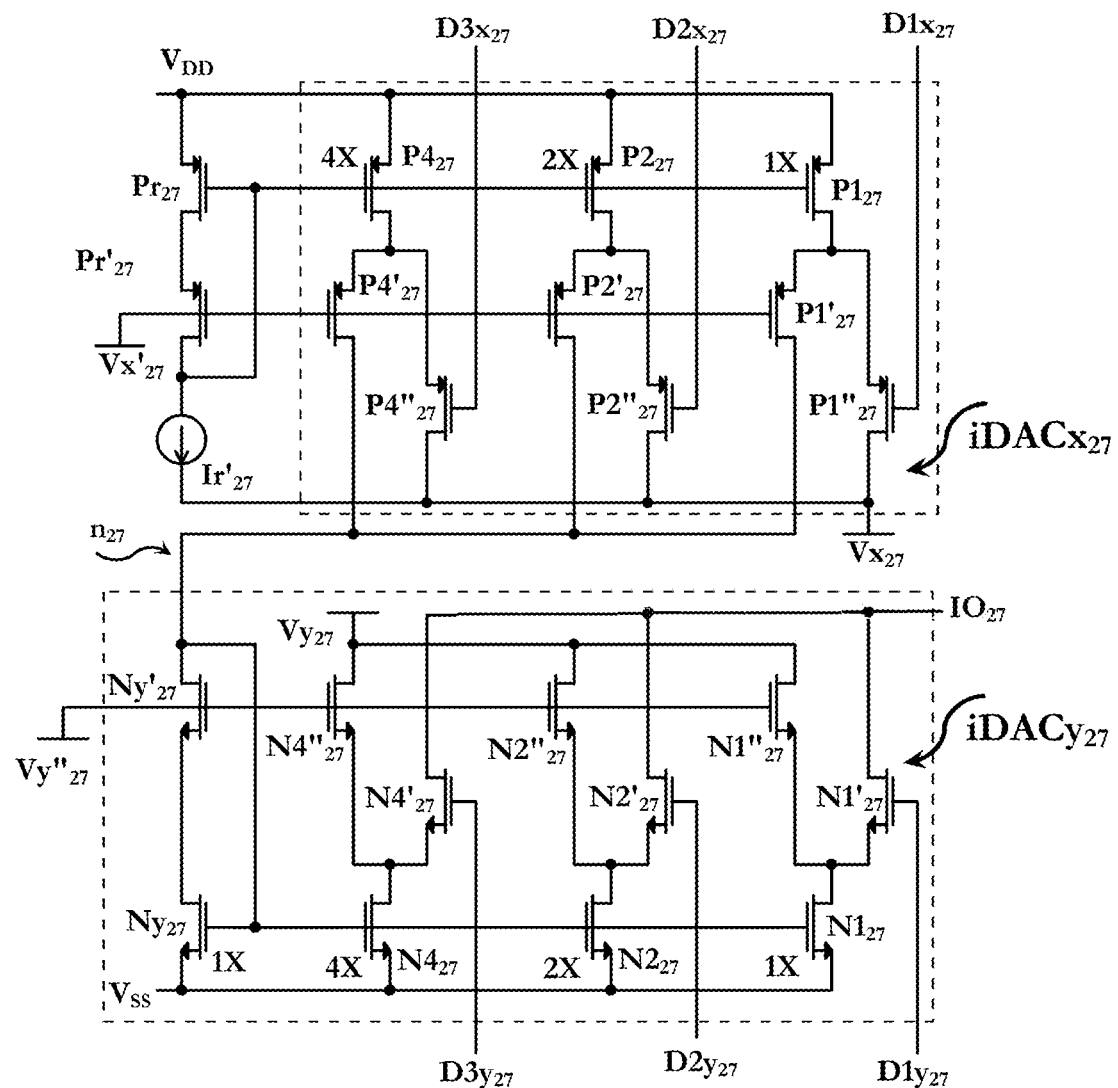
FIG. 27 is a simplified circuit schematic illustrating another embodiment of a multiplier ($XD_iI_o$) with digital-input to analog-current-output that operate in current mode comprising of a first current-output DAC (iDAC) or iDACx$_{27}$ whose analog-current-output supplies the reference input to a second current-output iDAC or iDACy$_{27}$.

Section 27—Description of FIG. 27

FIG. 27 is a simplified circuit schematic illustrating another embodiment of mixed-mode digital-input to analogcurrent-output multiplier ($XD_iI_O$) that operate in current mode comprising of a first current-output iDAC or $iDACx_{27}$ whose analog-current-output supplies the reference input to a second current-output iDAC or $iDACy_{27}$.

For descriptive clarity and illustrative simplicity, the $XD_iI_{O_{27}}$'s resolution is arranged as a 3-bit (x-channel for $iDACx_{27}$) by 3-bit (y-channel for $iDACy_{27}$), but the resolution can be higher (e.g., 16-bits).

A current reference ($Ir'_{27}$) is inputted and mirrored onto $iDACx_{27}$'s binary weighed current reference network comprising of $P4_{27}$ (scaled at 4×), $P2_{27}$ (scaled at 2×), and $P1_{27}$ (scaled at 1×). The $iDACx_{27}$'s digital inputs ($Dx_{27}$ digital word) are $D3X_{27}$ (as MSB) through $D1X_{27}$ (as LSB), which control $iDACx_{27}$'s analog current switches $P4'_{27}$ through $P1'_{27}$ and $P4''_{27}$ through $P1''_{27}$. For example, when $D3x_{27}$ is in a low state, current switch $P4''_{27}$ turns on and all of $P4_{27}$'s current flows through $P4''_{27}$ into $Vx_{27}$ (which can be coupled with $V_{SS}$). Conversely, when $D3x_{27}$ is in a high state, current switch $P4''_{27}$ turns off and all of $P4_{27}$'s current flows through $P4'_{27}$ into node $n_{27}$ (which is the current output port of $iDACx_{27}$). Note also that gate terminals of FETs comprising of $P4'_{27}$ through $P1'_{27}$ are coupled to a fixed bias voltage ($Vx'_{27}$), and as such, these FETs can serve as analog current switch as well as cascoded FETs that increase the output impedance of $iDACx_{27}$'s current reference network. The output current of $iDACx_{27}$ is fed onto $Ny_{27}$ to function in a current mirror supplying the current reference input of $iDACy_{27}$.

The $iDACy_{27}$'s binary weighed current reference network comprising of $N4_{27}$ (scaled at 4×), $N2_{27}$ (scaled at 2×), and $N1_{27}$ (scaled at 1×) are scaled and mirrored to $I_{DS}$ of $Ny_{27}$. Here also, the $iDACy_{27}$'s digital inputs ($Dy_{27}$ digital word) are $D3y_{27}$ (as MSB) through $D1y_{27}$ (as LSB) that control $iDACy_{27}$'s analog current switches $N4'_{27}$ through $N1'_{27}$ and $N4''_{27}$ through $N1''_{27}$. Similar to the arrangement in $iDACx_{27}$, here for example, when $D3y_{27}$ is in a high state, current switch $N4'_{27}$ turns on and all of $N4_{27}$'s current flows through $N4'_{27}$ into $IO_{27}$ port. Conversely, when $D3y_{27}$ is in a low state, current switch $N4'_{27}$ turns off and all of $N4_{27}$'s current flows through $N4''_{27}$ and onto $Vy_{27}$ (which can be coupled with $V_{DD}$). Note also that gate terminals of FETs comprising of $N4''_{27}$ through $N1''_{27}$ are coupled to a fixed bias voltage ($Vy''_{27}$), and as such, these FETs serve as analog current switch as well as cascode that increase the output impedance of $iDACy_{27}$'s current reference network. The selected sums of $iDACy_{27}$'s analog current switch outputs are steered through the $XD_iI_{O_{27}}$'s current-output node $IO_{27}$ that generates the equivalent analog output current product $Ax_{27} \times Ay_{27}/Ar_{26}$, wherein $Ax_{27}$ is the analog current representation of the digital word $Dx_{27}$, $Ay_{27}$ is the analog current representation of the digital word $Dy_{27}$, and $Ar_{27}$ is a scaled $Ir'_{27}$.

The disclosed $XD_iI_{O_{27}}$ benefits from current mode operations, which has been discussed in this disclosure. Another benefit of $XD_iI_{O_{27}}$ is having a smaller area by utilizing the same FETs as current switches of each iDAC and as cascoded FETs (to increase the iDAC's current reference network's output impedance).

Section 28—Description of FIG. 28

FIG. 28 is a circuit simulations showing the error waveform (output current SPICE simulation minus output current ideal) attributed to the output current ($I_o$) of a $XD_iI_O$ that is arranged similar to that of FIG. 21 but having an 8-bit digital inputs instead of 3-bits.

As noted, the $XD_iI_O$ circuit (whose simulation is provided in FIG. 28) is inputted with an 8-bit (x-word digital input) by an 8-bit (y-word digital input) wherein the x and y words are ramped from zero-scale to full scale while power supply $V_{DD}$ is varied from 2.2V (the upper waveform of FIG. 28) to 0.8V (the lower waveform of FIG. 28).

FIG. 28 illustrates a waveform plot that is the error curve (i.e. $XD_iI_O$'s output current $I_O$ simulation minus $XD_iI_O$'s output current $I_O$ ideal) indicating under ±0.75% error in DNL (differential non-linearity), INL (integral non-linearity), and GE (gain-error). FIG. 28 indicates that the $XD_iI_O$ with 8-bit digital inputs is substantially desensitized from power supply variations by utilizing the multiplier power supply desensitization method.

Section 29—Description of FIG. 29

FIG. 29 is a circuit simulations showing the error waveform (output current SPICE simulation minus output current ideal) attributed to the output current ($I_o$) of a $XD_iI_O$ that is arranged similar to that of FIG. 20 but having an 8-bit digital inputs instead of 4-bits.

As noted, the $XD_iI_O$ circuit whose simulation is provided in FIG. 29 is inputted with an 8-bit (x-word digital input) by an 8-bit (y-word digital input) wherein the x and y words are ramped from zero-scale to full scale where power supply $V_{DD}$ is varied from 2.2V (the upper waveform of FIG. 29) to 0.8V (the lower waveform of FIG. 29).

FIG. 29 illustrates a waveform plot that is the error curve (i.e. $XD_iI_O$'s output current $I_O$ simulation minus $XD_iI_O$'s output current $I_O$ ideal) indicating under ±0.5% error in DNL (differential non-linearity), INL (integral non-linearity), and GE (gain-error). FIG. 29 indicates that the $XD_iI_O$ with 8-bit digital inputs is substantially desensitized from power supply variations by utilizing the multiplier power supply desensitization method.

Figure 30:
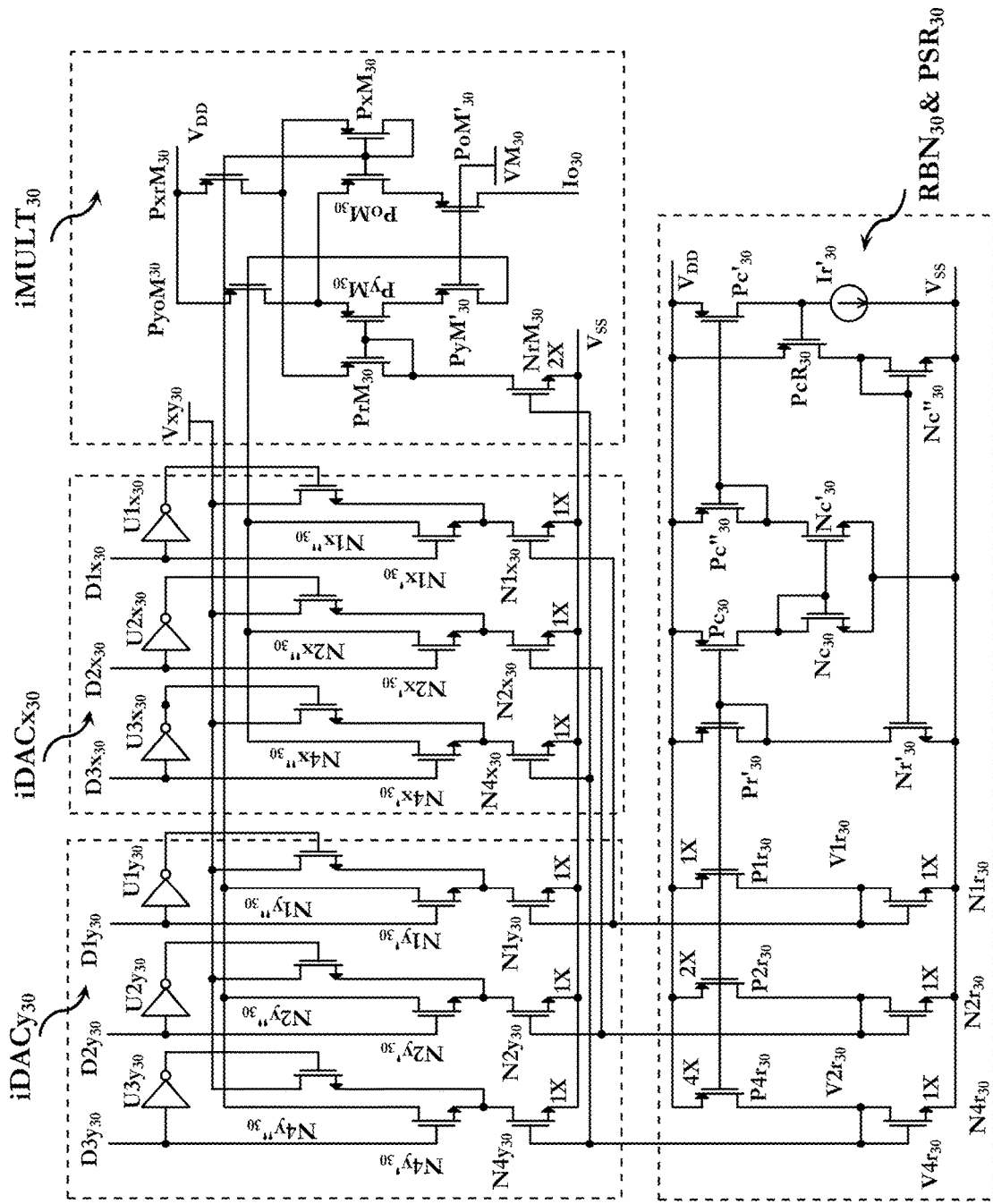
FIG. 30 is a simplified circuit schematic illustrating another embodiment for a plurality-channels multiplier (XD$_i$I$_o$) with digital-input to analog-current-output that is single-quadrant, wherein the XD$_i$I$_o$ multiplier utilizes the multiple-channel data-converter method disclosed in section 19 and the XD$_i$I$_o$ multiplier utilizes a power supply desensitization (PSR) circuit.

Section 30—Description of FIG. 30

FIG. 30 is a simplified circuit schematic illustrating another embodiment for a plurality-channels of mixed-mode digital-input to analog-current-output multiplier ($XD_iI_O$) that is single-quadrant, wherein the $XD_iI_O$ utilizes the multiple-channel data-converter method. The $XD_iI_O$ of FIG. 30 ($XD_iI_{O_{30}}$) utilizes another embodiment of the multiple-channel data-converter method disclosed in section 19 of this disclosure to save silicon area and improve iDAC's dynamic performance. The $XD_iI_{O_{30}}$ also utilizes another embodiment of the multiplier power supply desensitization method (or XPSR method) disclosed in section 20 that substantially desensitize $XD_iI_O$'s output current from power supply variations, while eliminating cascodes from current sources (which saves area).

The overall description of $XD_iI_O$ provided in section 21 (illustrated in FIG. 21) is applicable to the $XD_iI_{O\ 30}$ here. The iDACs and iMULT between FIG. 21 and FIG. 30 are identical. Thus, the description provided in section 21 (illustrated in FIG. 21) about the iDACs is applicable to pairs of $iDACx_{30}$ and $iDACy_{30}$. Also, the description provided in section 21 (illustrated in FIG. 21) about the iMULT is applicable to $iMULT_{30}$.

The embodiment of $RBN_{30}$ & $PSR_{30}$ utilizes another combination of the multiple-channel data-converter method disclosed in section 19 and the XPSR method disclosed in section 20. In the embodiment of $RBN_{30}$ & $PSR_{30}$ illustrated in FIG. 30, substantial area savings are realized by eliminating the cascode from current sources in $iDACx_{30}$, iDACy$_{30}$, iMULT$_{30}$, and the RBN$_{30}$ circuits, while the output current of XD$_i$I$_{O\ 30}$ is substantially desensitized from V$_{DD}$ variations. This is done by regulating the reference bias currents of RBN$_{30}$ so that the outputs of iDACx$_{30}$ and iDACy$_{30}$ (which supplies a pair of the input currents to iMULT$_{30}$) as well as the reference current input to the iMULT$_{30}$ are substantially desensitized to power supply variations, and wherein the voltage at the inputs of iMULT$_{30}$ substantially track power supply voltage variations. The power supply desensitization mechanism is explained as follows:

Bear in mind that FET early voltage (V$_A$) causes the FET's I$_{DS}$ to vary with varying the FET's V$_{DS}$. The V$_{as}$ of the N4y$_{30}$ is about a V$_{GS}$ of PyoM$_{30}$ below V$_{DD}$, assuming low on resistance (low voltage drop) across iDACx$_{30}$ current reference network current switches (N4y'$_{30}$ and N4y"$_{30}$) which causes the I$_{DS}$ of the N4y$_{30}$ to vary. The gate port of N4y$_{30}$ is coupled with a diode connected N4r$_{30}$ (whose V$_{DS}$ and V$_{GS}$ are substantially equal). The I$_{DS}$ of the N4r$_{30}$ would vary with changes in V$_{DD}$ since the V$_{DS}$ of P4r$_{30}$ is about V$_{DD}$ minus V$_{GS}$ of N4r$_{30}$. The disclosed power supply desensitization circuit (PSR$_{30}$) emulates a similar signal path from the gate port of P4r$_{30}$ to gate port of PyoM$_{30}$ (which is the output of iDACx$_{30}$ and the input of iMULT$_{30}$). This is done for the current input of iMULT$_{30}$ to be insensitive to power supply variations, while all iMULT$_{30}$, iDACx$_{30}$, iDACy$_{30}$, and RBN$_{30}$ current sources are without cascodes, which saves substantial silicon area.

This is how the PSR$_{30}$ circuit emulates a similar signal path from the gate port of P4r$_{30}$ to gate port of PyoM$_{30}$: The fixed current reference Ir'$_{30}$ is mirrored between Pc'$_{30}$ and Pc"$_{30}$ whose V$_{DS}$ is V$_{GS}$ of a PMOS and tracks each other with changes in V$_{DD}$. The I$_{DS}$ of diode connected Pc"$_{30}$ changes with V$_{DD}$ variations in light of V$_{DS}$ of the Nc'$_{30}$ being V$_{DD}$ minus V$_{GS}$ of Pc"$_{30}$. The Nc'$_{30}$ and diode connected Nc$_{30}$ are mirrors, wherein V$_{DS}$ of Pc$_{30}$ is V$_{DD}$ minus the V$_{GS}$ of Nc$_{30}$ which causes the I$_{DS}$ of Nc$_{30}$ to change with V$_{DD}$. Now, PcR$_{30}$ substantially equalizes Ir'$_{30}$ with the I$_{DS}$ of Pc'$_{30}$ by regulating the current in Nc"$_{30}$ that is mirrored onto Nr'$_{30}$ which regulates the gate voltage (and thus the I$_{DS}$) of Pr'$_{30}$ and Pc$_{30}$ as well as the gate voltage (and thus the I$_{DS}$) of P4r$_{30}$, P2r$_{30}$, and P1r$_{30}$. Also, consider that I$_{DS}$ of P4r$_{30}$, P2r$_{30}$, and P1r$_{30}$ (establishes the bus voltages V4r$_{30}$, V2r$_{30}$, and V1r$_{30}$) generate the sequence of reference bias currents from the reference bias network (RBN$_{30}$).

In summary some of the benefits of the embodiment disclosed in FIG. 30 are as follows:

First, the disclosed embodiment benefits from operating in current mode that has been discussed in this disclosure Second, the disclosed embodiment benefits from savings in silicon die area, lower glitch, and faster speed when plurality of XD$_i$I$_O$ are required (e.g., in machine learning applications where 1000s of XD$_i$I$_O$ may be needed) by utilizing the multiple iDAC method that is disclosed in section 19.

Third, the disclosed embodiment benefits from further saving in silicon die area as well as desensitization to power supply variations for each XD$_i$I$_O$ by combining the multiple iDAC method with another embodiment of the multiplier power supply desensitization method, which also facilitates the elimination of the cascoded FETs in iDACs current reference network as well as the PSR circuit.

Figure 31:
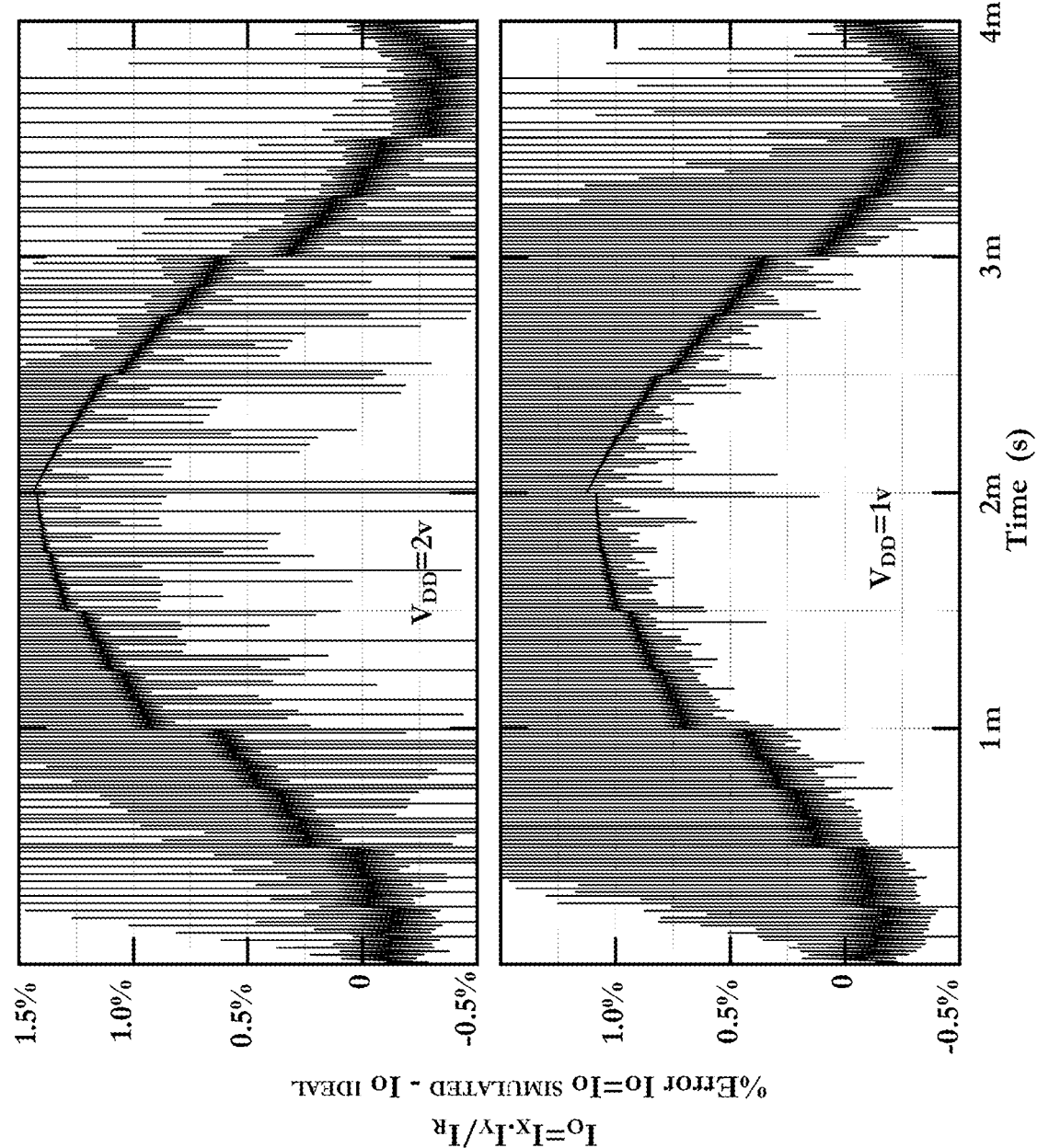
FIG. 31 is a circuit simulations showing the error waveform (output current SPICE simulation minus output current ideal) attributed to the output current (I$_o$) of a XD$_i$I$_o$ multiplier that is arranged similar to that of FIG. 30 but having an 8-bit digital inputs instead of 3-bits.

Section 31—Description of FIG. 31

FIG. 31 is a circuit simulations showing the error waveform (output current SPICE simulation minus output current ideal) attributed to the output current (I$_o$) of a XD$_i$I$_O$ that is arranged similar to that of FIG. 30 but having an 8-bit digital inputs instead of 3-bits.

As noted, the XD$_i$I$_O$ circuit whose simulation is provided in FIG. 31 is inputted with an 8-bit (x-word digital input) by an 8-bit (y-word digital input) wherein the x and y words are ramped the opposite of one another between zero-scale to full scale where power supply V$_{DD}$ is varied from 2V (the upper waveform of FIG. 31) to 1V (the lower waveform of FIG. 31).

FIG. 31 illustrates a waveform plot that is the error curve (i.e. XD$_i$I$_O$'s output current I$_O$ simulation minus XD$_i$I$_O$'s output current I$_O$ ideal) indicating under ±1% error in DNL (differential non-linearity), INL (integral non-linearity), and GE (gain-error) for V$_{DD}$=2v and V$_{DD}$=119, respectively. FIG. 31 indicates that the XD$_i$I$_O$ with 8-bit digital inputs is substantially desensitized from power supply variations by utilizing the multiplier power supply desensitization method combined with the multiple iDAC method.

Figure 32:
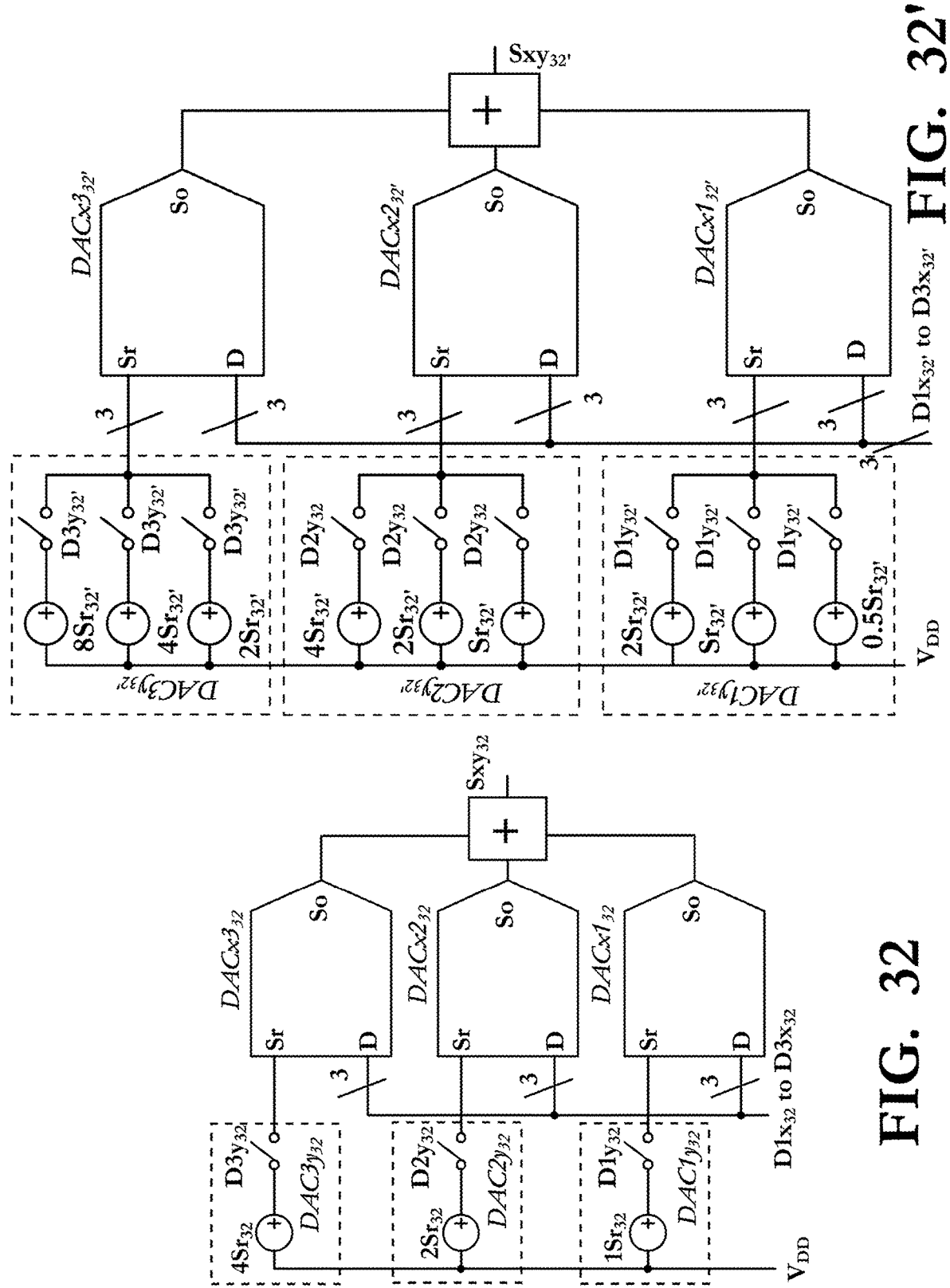
FIG. 32 is a simplified block diagram illustrating a meshed digital-to-analog multiplication (mD$_i$S$_o$) method.

Section 32—Description of FIG. 32

FIG. 32 is a simplified block diagram illustrating a meshed digital-to-analog multiplication (mD$_i$S$_o$) method. For clarity and not as a limitation, the mD$_i$S$_o$ method is described as receiving two digital words, each having 3-bits of resolution but the digital input word resolution can be higher (e.g., 16-bits). The digital input-bits are meshed with analog circuitry, wherein the digital bits controls are meshed with the reference network to perform bit-weight attribution and summation in the analog domain.

The mD$_i$S$_o$ method of FIG. 32 is inputted with two digital input words that are x-bits wide (e.g., Dx$_{32}$ word with x=3) and y-bits wide (e.g., Dy$_{32}$ word with y=3). The mD$_i$S$_o$ method is also inputted with a reference signal (Sr) that is scaled onto a bank of scaled reference networks (e.g., 1×Sr$_{32}$, 2×Sr$_{32}$, and 4×Sr$_{32}$). Plurality of y-channel sub-DACs (e.g., DAC1y$_{32}$, DAC2y$_{32}$, and DAC3y$_{32}$) each receiving the one respective bit of a y-digital input word (e.g., D1y$_{32}$, D2y$_{32}$, and D3y$_{32}$) control the steering (or transmission) of the scaled reference network to a plurality of x-channel sub-DAC's reference inputs (e.g., respective reference S$_R$ inputs of DACx1$_{32}$, DACx2$_{32}$, and DACx3$_{32}$), wherein each x-channel sub-DAC receives the same x-digital input word (e.g., D Ix$_{32}$, D2x$_{32}$, and D3x$_{32}$). The outputs of x-channel sub-DACs are combined to generate the final analog multicand representation (Sxy$_{32}$) of the digital X·Y multiplications. Here, the analog output or S$_O$ of DACx1$_{32}$, DACx2$_{32}$, and DACx3$_{32}$ are combined together to generate Sxy$_{32}$. Note that for a binary (linear) multiplier, the scaled reference network is also binarily weighted, but the reference network can be scaled in other fashions (e.g., equal weighted thermometer or non-linear or individually weighted, depending on the transfer function requirement of the end-application).

In summary, the binary weighted version of the meshed digital-to-analog multiplication method utilizes a multi-branch binary-weighted current reference network, wherein each of the first binary weighted reference current branches (y-branch) supply the current reference inputs of the sets of second binary weighted reference current branches (set of x-branches). Accordingly, the digital X word or Dx$_{32}$ and the digital Y word or Dy$_{32}$ control the respective sets of analog switches that steer (or transmit) the combined respective x-branch analog signals to an output port (e.g., Sxy$_{32}$). Keep in mind that, the X and Y word bits and their respective X and Y DAC channels here are interchangeable give the commutative property of multiplication. Benefits of utilizing the meshed digital-to-analog multiplication method is discussed in the embodiments of the said method, next.

Section 32'—Description of FIG. 32'

FIG. 32' is another simplified block diagram illustrating the meshed digital-to-analog multiplication ($mD_iS_O$) method. For clarity and not as a limitation, the $mD_iS_O$ method here is also described as receiving two digital words, each having 3-bits of resolution but the digital input word resolution can be higher as in for example 16-bits. The digital input-bits are also meshed with analog circuitry, wherein they control a reference network that is arranged to perform bit-weight attribution and summation in the analog domain.

The $mD_iS_O$ method of FIG. 32' is inputted with two digital input words that are x-bits wide (e.g., $Dx_{32'}$ word with x=3) and y-bits wide (e.g., $Dy_{32'}$ word with y=3). Here, the $mD_iS_O$ method is also inputted with a reference signal (Sr) that is scaled onto three banks of scaled reference networks (e.g., the y1-bank comprising of $0.5 \times Sr_{32'}$, $Sr_{32'}$, and $2Sr_{32'}$; the y2-bank comprising of $Sr_{32'}$, $2Sr_{32'}$, and $4Sr_{32'}$; and the y3-bank comprising of $2Sr_{32'}$, $4Sr_{32'}$, and $8Sr_{32'}$).

Plurality of y-channel sub-DACs (e.g., $DAC1y_{32'}$, $DAC2y_{32'}$, and $DAC3y_{32'}$) each receiving the one respective bit of a y-digital input word (e.g., $D1y_{32'}$, $D2y_{32'}$, and $D^3y_{32'}$).

A clarification point regarding the FIG. 32' illustration: In sub-$DAC3y_{32'}$, the digital bit $D3y_{32'}$ controls the 3 y-switches of sub-$DAC3y_{32'}$ whose inputs receive a sequence of scaled reference signals $8Sr_{32'}$, $4Sr_{32'}$, and $4Sr_{32'}$, wherein the 3 outputs of the sub-$DAC3y_{32'}$ are coupled to the 3 inputs of 3 x-switches of sub-$DACx3_{32'}$ wherein the x-switches of sub-$DACx3_{32'}$ are controlled by the digital x-word (e.g., $D1x_{32'}$ to $D3x_{32'}$ bits). Also, in sub-$DAC2y_{32'}$, the digital bit $D2y_{32'}$ controls the 3 y-switches of sub-$DAC2y_{32'}$ whose inputs receive a sequence of scaled reference signals $4Sr_{32'}$, $2Sr_{32'}$, and $1Sr_{32'}$, wherein the 3 outputs of the sub-$DAC2y_{32'}$ are coupled to the 3 inputs of 3 x-switches of sub-$DACx2_{32'}$ wherein the x-switches of sub-$DACx2_{32'}$ are controlled by the digital x-word (e.g., $D1x_{32'}$ to $D3x_{32'}$ bits). Lastly, in sub-$DAC1y_{32'}$, the digital bit $D1y_{32'}$ controls the 3 y-switches of sub-$DAC1y_{32'}$ whose inputs receive a sequence of scaled reference signals $2Sr_{32'}$, $1Sr_{32'}$, and $0.5Sr_{32'}$, wherein the 3 outputs of the sub-$DAC1y_{32'}$ are coupled to the 3 inputs of 3 x-switches of sub-$DACx1_{32'}$ wherein the x-switches of sub-$DACx1_{32'}$ are controlled by the digital x-word (e.g., $D1x_{32'}$ to $D3x_{32'}$ bits).

The $D1y_{32'}$ bit steers the three reference sources $0.5 \times Sr_{32'}$, $Sr_{32'}$, and $2Sr_{32'}$ onto the three switches of $DACx1_{32'}$ which are controlled by $D1x_{32'}$, $D2x_{32'}$, and $D3x_{32'}$, respectively. The $D2y_{32'}$ bit steers the three reference sources $Sr_{32'}$, $2Sr_{32'}$, and $4Sr_{32'}$ onto the three switches of $DACx2_{32'}$ which are controlled by $D1x_{32'}$, $D2x_{32'}$, and $D3x_{32'}$, respectively. And, the $D3y_{32'}$ bit steers the three reference sources $2Sr_{32'}$, $4Sr_{32'}$, and $8Sr_{32'}$ onto the three switches of $DACx3_{32'}$ which are controlled by $D1x_{32'}$, $D2x_{32'}$, and $D3x_{32'}$, respectively.

The outputs of x-channel sub-DACs (e.g., $DACx1_{32'}$, $DACx2_{32'}$, and $DACx3_{32'}$) are combined to generate the final analog multiplicand representation ($Sxy_{32'}$) of the digital X·Y multiplications. Here, the analog output or $S_O$ of $DACx1_{32'}$, $DACx2_{32'}$, and $DACx3_{32'}$ are added together to generate $Sxy_{32'}$. Note that for a binary (linear) multiplier, the (three) banks of scaled reference network is also binarily weighted, but the reference network can be scaled in other fashions (e.g., thermometer or non-linear).

In summary, the binary weighted version of the meshed digital-to-analog multiplication method utilizes banks of multi-branch binary-weighted current reference network, wherein each of the Y-banks of the binary weighted reference current branches (y-branch) supply the current reference inputs of the sets of X-banks of the binary weighted reference current branches (set of x-branches). Accordingly, the digital X word or $Dx_{32'}$ and the digital Y word or $Dy_{32'}$ control the respective sets of analog switches that steer (or transmit) the combined respective x-branch analog signals to an output port (e.g., $Sxy_{32'}$). Keep in mind that, the X and Y word bits and their respective X and Y DAC channels here are interchangeable given the commutative property of multiplication. Benefits of utilizing the meshed digital-to-analog multiplication method is discussed in the embodiments of the said method, next.

Figure 33:
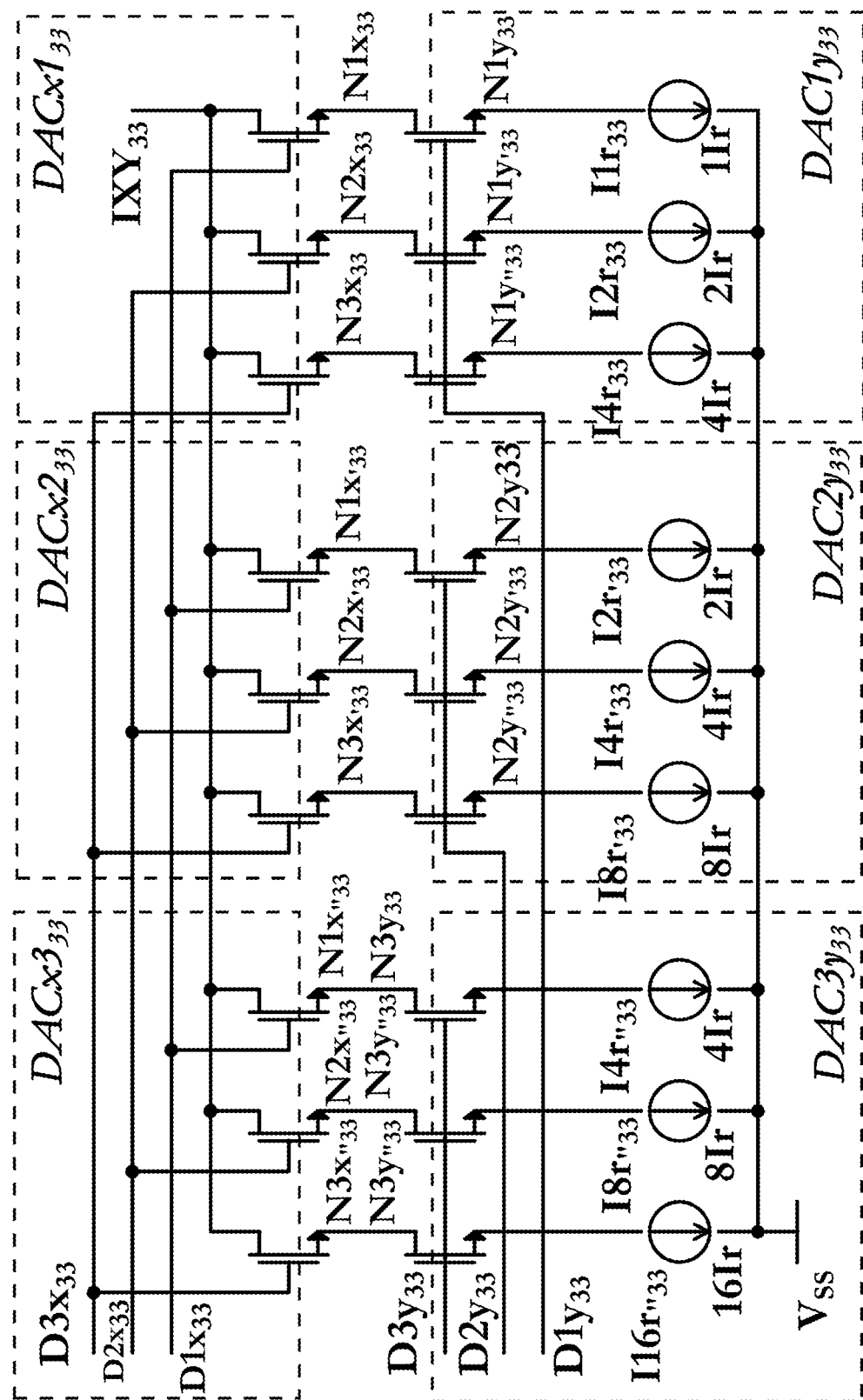
FIG. 33 is a simplified circuit schematic illustrating an embodiment of a digital-input to analog current output multiplier (XD$_i$I$_o$) that utilizes the meshed digital-to-analog multiplication (mD$_i$S$_o$) method described in the prior section 32'.

Section 33—Description of FIG. 33

FIG. 33 is a simplified circuit schematic illustrating a digital-input to analog current output multiplier ($XD_iI_O$) as a preferred embodiment of the meshed digital-to-analog multiplication ($mD_iS_O$) method described in the prior section 32' and illustrated in FIG. 32'. Similarly, for clarity and not as a limitation, the $XD_iI_O$ multiplier is described as receiving two digital words, each having 3-bits of resolution wherein the digital input word resolution can be as high as 16-bits.

The $XD_iI_O$ multiplier of FIG. 33 is inputted with two digital input words $Dx_{33}$ word (comprising of 3-bits $D1x_{33}$, $D2x_{33}$, and $D3x_{33}$) and $Dy_{33}$ word (comprising of 3-bits $D1y_{33}$, $D2y_{33}$, and $D3y_{33}$).

The $XD_iI_O$ multiplier here is also inputted with a reference current signal (Ir) that is scaled onto a scaled reference network, comprising of 3 banks namely: First scaled reference current bank $I1r_{33}=1 \times I_r$, $I2r_{33}=2 \times I_r$, and $I4r_{33}=4 \times I_r$. Second scaled reference current bank $I2r'_{33}=2 \times I_r$, $I4r'_{33}=4 \times I_r$, and $I8r'_{33}=8 \times I_r$. Third scaled reference current bank $I4r''_{33}=4 \times I_r$, $I8r''_{33}=8 \times I_r$, and $I16r''_{33}=16 \times I_r$.

A first y-channel sub-iDAC receives the first scaled reference bank (i.e., $I1r_{33}$, $I2r_{33}$, and $I4r_{33}$) at its current switch inputs that are the source-nodes of $N1y_{33}$, $N1y'_{33}$, and $N1y''_{33}$ whose gate-nodes are controlled by $D1y_{33}$ bit. Accordingly, $I1r_{33}$, $I2r_{33}$, and $I4r_{33}$ currents are respectively steered through, $N1y_{33}$, $N1y'_{33}$, and $N1y''_{33}$ which are gated by the $D1y_{33}$ bit, to provide the first x-channel sub-iDAC's reference input currents (in accordance with $Dy_{33}$ word). Consequently, the said first x-channel sub-iDAC reference currents are steered through current switches $N1x_{33}$, $N2x_{33}$, and $N3x_{33}$ that are controlled by the first x-channel DAC's digital inputs $D1x_{33}$, $D2x_{33}$, and $D3x_{33}$. The drain-node currents of $N1x_{33}$, $N2x_{33}$, and $N3x_{33}$ are summed together and coupled to $Ixy_{33}$, which is the analog current output port of $XD_iI_O$ multiplier.

Similarly, a second y-channel sub-iDAC receives the second scaled reference bank (i.e., $I2r'_{33}$, $I4r'_{33}$, and $I8r'_{33}$) at its current switch inputs that are the source-nodes of $N2y_{33}$, $N2y'_{33}$, and $N2y''_{33}$ whose gate-nodes are controlled by $D2y_{33}$ bit. Accordingly, $I2r'_{33}$, $I4r'_{33}$, and $I8r'_{33}$ currents are respectively steered through $N2y_{33}$, $N2y'_{33}$, and $N2y''_{33}$ which are gated by the $D2y_{33}$ bit, to provide the second x-channel sub-iDAC's reference input currents (in accordance with $Dy_{33}$ word). Consequently, the said second x-channel sub-iDAC reference currents are steered through current switches $N1x'_{33}$, $N2x'_{33}$, and $N3x'_{33}$ that are controlled by the second x-channel sub-DAC's same digital inputs $D1x_{33}$, $D2x_{33}$, and $D3x_{33}$. The drain-node currents of $N1x'_{33}$, $N2x'_{33}$, and $N3x'_{33}$ are summed together and also coupled to $Ixy_{33}$.

Also, a third y-channel sub-iDAC receives the second scaled reference bank (i.e., $I4r''_{33}$, $I8r''_{33}$, and $I16r''_{33}$) at its current switch inputs that are the source-nodes of $N3y_{33}$, $N3y'_{33}$, and $N3y''_{33}$ whose gate-nodes are controlled by $D3y_{33}$ bit. Accordingly, $I4r''_{33}$, $I8r''_{33}$, and $I16r''_{33}$ currents are respectively steered through, $N3y_{33}$, $N3y'_{33}$, and $N3y''_{33}$ which are gated by the $D3y_{33}$ bit, to provide the third x-channel sub-iDAC's reference input currents (in accordance with $Dy_{33}$ word). Consequently, the said third x-channel sub-iDAC reference currents are steered through current switches $N1x''_{33}$, $N2x''_{33}$, and $N3x''_{33}$ that are controlled by the third x-channel sub-DAC's same digital inputs $D1x_{33}$, $D2x_{33}$, and $D3x_{33}$. The drain-node currents of $Nix'_{33}$, $N2x'_{33}$, and $N3x'_{33}$ are summed together and also coupled to $Ixy_{33}$.

As noted above, the outputs of the first and second and third x-channel iDACs are summed at $Ixy_{33}$ to generate the analog multiplicand representation of X·Y digital multiplications. Note that for a binary (linear) multiplier, the scaled reference network (bank) is also binarily weighted, but the reference network can be scaled in other fashions (e.g., thermometer or non-linear).

In summary some of the benefits of the embodiment disclosed in FIG. 33 are as follows:

First, the disclosed embodiment benefits from operating in current mode that has been discussed in this disclosure Second, the dynamic response of $XD_iI_O$ multiplier is fast also in part because the scaled reference network banks are constant current sources whose current are steered by single MOFET switches which are inherently fast.

Third, current mirror loop associated with conventional multiplying iDACs (where a first iDAC's output signal supplies the reference signal to a second iDAC, generally through a current mirror) is avoided which helps the speed.

Fourth, the minimum power supply can be very low since it is only limited by the drain-to-source voltage of current sources of the scaled reference network.

Figure 34:
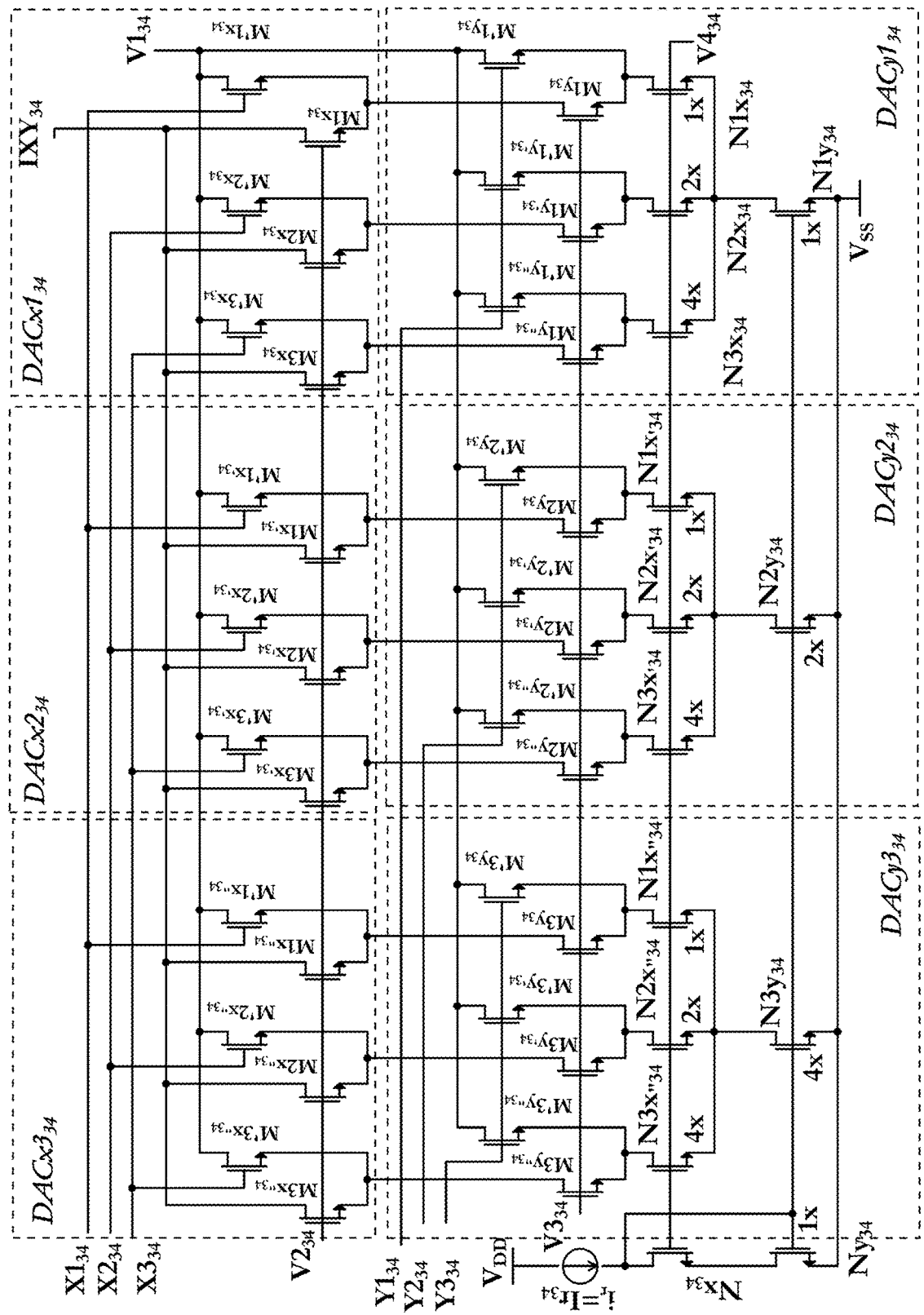
FIG. 34 is a simplified circuit schematic illustrating another embodiment of a digital-input to analog current output multiplier (XD$_i$I$_o$) that utilizes the meshed digital-to-analog multiplication (mD$_i$S$_o$) method described in section 32 and section 32'.

Section 34—Description of FIG. 34

FIG. 34 is a simplified circuit schematic illustrating another preferred embodiment of a digital-input to analog current output multiplier ($XD_iI_O$) that utilizes the meshed digital-to-analog multiplication ($mD_iS_O$) method described in section 32 and section 32', and illustrated in FIG. 32 and FIG. 32', respectively. Similarly, for clarity and not as a limitation, the $XD_iI_O$ multiplier is described as receiving two digital words, each having 3-bits of resolution wherein the digital input word resolution can be as high as 16-bits.

The $XD_iI_O$ multiplier of FIG. 34 is inputted with two digital input words $Dx_{34}$ word (comprising of 3-bits $x1_{34}$, $x2_{34}$, and $x3_{34}$) and $Dy_{34}$ word (comprising of 3-bits $y1_{34}$, $y2_{34}$, and $y3_{34}$).

The $XD_iI_O$ multiplier here is also inputted with a reference current signal ($i_r=1r_{34}$) that is mirrored and scaled (via $Ny_{34}$) onto a scaled reference network, comprising of 3 current sources: First scaled reference currents wherein the current through $N1y_{34}=1\times i_r$ that is split according to a programmed weight scale between $N1x_{34}$ (e.g., scaled at 1×), $N2x_{34}$ (e.g., scaled at 2×), and $N3x_{34}$ (e.g., scaled at 4×). Second scaled reference currents wherein the current through $N2y_{34}=2\times i_r$ that is split according to a programmed weight scale between $Nix'_{34}$ (e.g., scaled at 1×), $N2x'_{34}$ (e.g., scaled at 2×), and $N3x'_{34}$ (e.g., scaled at 4×). Third scaled reference currents wherein the current through $N3y_{34}=4\times i_r$ that is split according to a programmed weight scale between $N1x''_{34}$ (e.g., scaled at 1×), $N2x''_{34}$ (e.g., scaled at 2×), and $N3x''_{34}$ (e.g., scaled at 4×).

A first y-channel sub-iDAC receives the first scaled reference currents (i.e., $I_D$ of $N1x_{34}$, $N2x_{34}$, and $N3x_{34}$) at its FET switch inputs (i.e., at source-nodes of coupled pairs $M1y_{34}$–$M'1y_{34}$, $M1y_{34}$–$M'1y'_{34}$, and $M1y_{34}$–$M'1y''_{34}$) whose gate-nodes are controlled by the $y1_{34}$ bit. Accordingly, the first y-channel sub-iDAC scaled reference currents, gated by the $y1_{34}$ bit, are outputted through the FETs switches (i.e., as $I_D$ of $M1y_{34}$, $M1y'_{34}$, and $M1y''_{34}$), which provide the first x-channel sub-iDAC reference currents. Consequently, the said first x-channel sub-iDAC reference currents are steered through its FET current switches (i.e., at source-nodes of coupled pairs $M1x_{34}$-$M'1x_{34}$, $M2x_{34}$-$M'2x_{34}$, and $M3x_{34}$-$M'3x_{34}$) that are controlled by the first x-channel sub-DAC's digital inputs $x1_{34}$, $x2_{34}$, and $x3_{34}$. The drain-node currents of $M1x_{34}$, $M2x_{34}$, and $M3x_{34}$ are summed together and coupled to $Ixy_{34}$, which is the analog current output port of $XD_iI_O$ multiplier. Also, notice that drain-nodes of $M'1y_{34}$, $M'1y'_{34}$, and $M'1y''_{34}$ are coupled together and terminated at a voltage source ($V1_{34}$). Similarly, drain-nodes of $M'1x_{34}$, $M'2x_{34}$, and $M'3x_{34}$ are coupled together and terminated at a voltage source ($V1_{34}$).

Similarly, a second y-channel sub-iDAC receives the second scaled reference currents (i.e., $I_D$ of $N1x'_{34}$, $N2x'_{34}$, and $N3x'_{34}$) at its FET switch inputs (i.e., at source-nodes of coupled pairs $M2y_{34}$-$M'2y_{34}$, $M2y_{34}$-$M'2y_{34}$, and $M2y_{34}$-$M'2y_{34}$) whose gate-nodes are controlled by the $y2_{34}$ bit. Accordingly, the second y-channel sub-iDAC scaled reference currents, gated by the $y2_{34}$ bit, are outputted through the FETs switches (i.e., as $I_D$ of $M2y_{34}$, $M2y'_{34}$, and $M2y''_{34}$), which provide the second x-channel sub-iDAC reference currents. Consequently, the said second x-channel sub-iDAC reference currents are steered through its FET current switches (i.e., at source-nodes of coupled pairs $M1x'_{34}$-$M'1x'_{34}$, $M2x'_{34}$-$M'2x'_{34}$, and $M3x'_{34}$-$M'3x'_{34}$) that are controlled by the second x-channel sub-DAC's digital inputs $x1_{34}$, $x2_{34}$, and $x3_{34}$. The drain-node currents of $M1x'_{34}$, $M2x'_{34}$, and $M3x'_{34}$ are summed together and coupled to $Ixy_{34}$ as well. Also, notice that drain-nodes of $M'2y_{34}$, $M'2y'_{34}$, and $M'2y''_{34}$ are coupled together and also terminated at $V1_{34}$. Similarly, drain-nodes of $M'1x'_{34}$, $M'2x'_{34}$, and $M'3x'_{34}$ are coupled together and also terminated at $V1_{34}$.

Also, a third y-channel sub-iDAC receives the third scaled reference currents (i.e., $I_D$ of $N1x''_{34}$, $N2x''_{34}$, and $N3x''_{34}$) at its FET switch inputs (i.e., at source-nodes of coupled pairs $M3y_{34}$-$M'3y_{34}$, $M3y_{34}$-$M'3y_{34}$, and $M3y_{34}$-$M'3y_{34}$) whose gate-nodes are controlled by the $y3_{34}$ bit. Accordingly, the third y-channel sub-iDAC scaled reference currents, gated by the $y3_{34}$ bit, are outputted through the FETs switches (i.e., as $I_D$ of $M3y_{34}$, $M3y'_{34}$, and $M3y''_{34}$), which provide the third x-channel sub-iDAC reference currents. Consequently, the said third x-channel sub-iDAC reference currents are steered through its FET current switches (i.e., at source-nodes of coupled pairs $M1x''_{34}$-$M'1x''_{34}$, $M2x''_{34}$-$M'2x''_{34}$, and $M3x''_{34}$-$M'3x''_{34}$) that are controlled by the third x-channel sub-DAC's digital inputs $x1_{34}$, $x2_{34}$, and $x3_{34}$. The drain-node currents of $M1x''_{34}$, $M2x''_{34}$, and $M3x''_{34}$ are summed together and coupled to $Ixy_{34}$ as well. Also, notice that drain-nodes of $M'3y_{34}$, $M'3y'_{34}$, and $M'3y''_{34}$ are coupled together and also terminated at $V1_{34}$. Similarly, drain-nodes of $M'1x''_{34}$, $M'2x''_{34}$, and $M'3x''_{34}$ are coupled together and also terminated at $V1_{34}$.

As such the outputs of the three x-channel sub-iDACs is summed at Ixy$_{34}$ to generate the analog multiplicand representation of X·Y digital multiplications. Note that for a binary (linear) multiplier, the scaled reference network (bank) is also binarily weighted, but the reference network can be scaled in other fashions (e.g., thermometer or non-linear).

Note that coupling the iDAC switches gates to voltage sources V2$_{34}$ and V3$_{34}$ reduces logic gates that would otherwise be needed to drive the iDAC switches and it also reduces iDAC glitch (and thereby lowers the XD$_i$I$_O$ multiplier glitch).

In summary some of the benefits of the embodiment disclosed in FIG. 34 are as follows:

First, the disclosed embodiment benefits from operating in current mode that has been discussed in this disclosure Second, the dynamic response of XD$_i$I$_O$ multiplier is fast also in part because the scaled reference network banks are constant current sources whose current are steered by single MOFET switches which are inherently fast.

Third, current mirror loop associated with conventional multiplying iDACs (where a first iDAC's output signal supplies the reference signal to a second iDAC, generally through a current mirror) is avoided which helps the speed.

Fourth, utilizing the floating iDAC method surrounding N3$y_{34}$, N2$y_{34}$, and N1$y_{34}$ reduces die area.

Fifth, biasing one side of the iDAC switches by voltage sources (V2$_{34}$ and V3$_{34}$) saves area and lowers the XD$_i$I$_O$ multiplier glitch.

Figure 35:
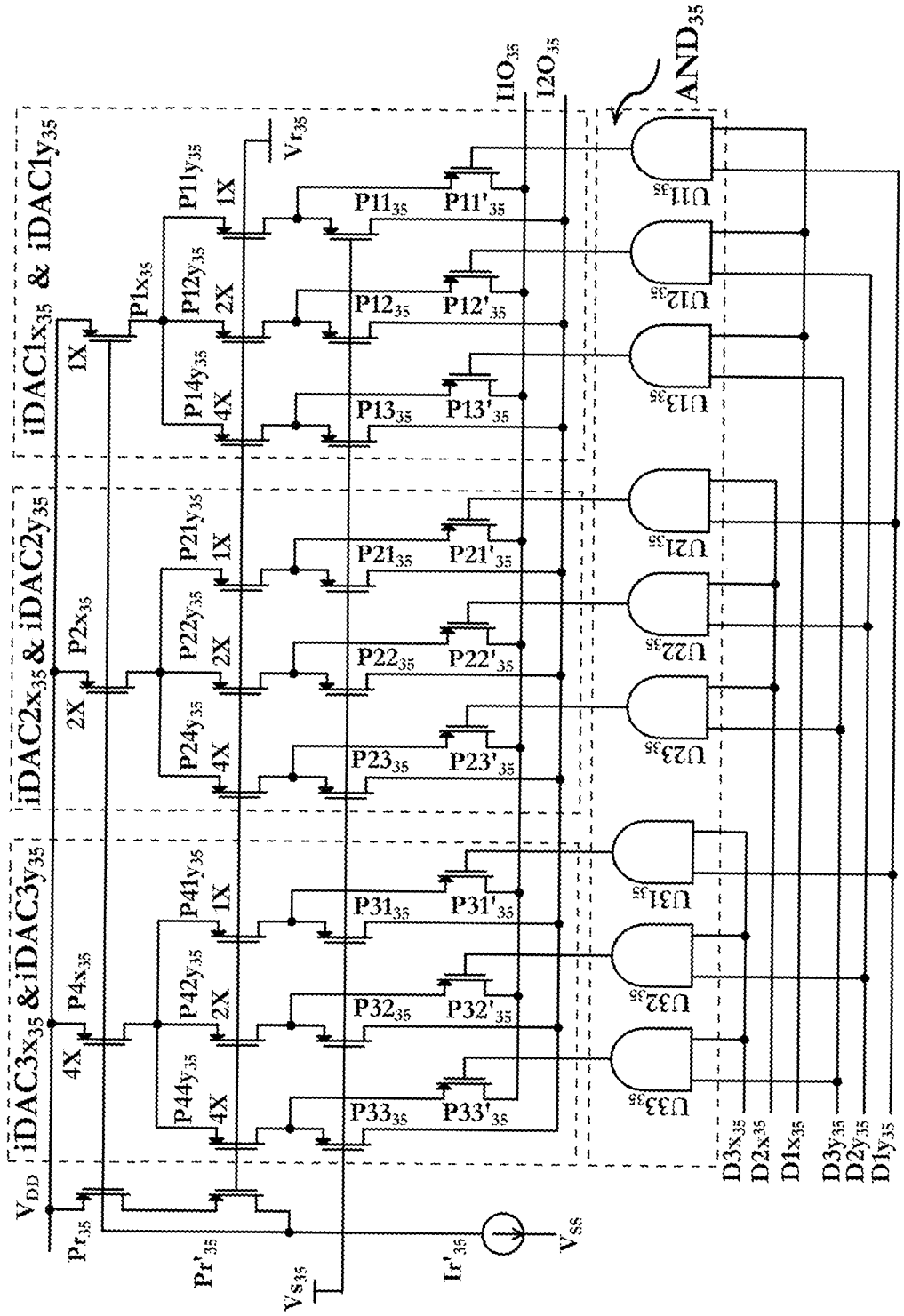
FIG. 35 is a simplified circuit schematic illustrating another embodiment of a digital-input to analog current output multiplier (XD$_i$I$_o$) that utilizes the meshed digital-to-analog multiplication (mD$_i$S$_o$) method described in section 32.

Section 35—Description of FIG. 35

FIG. 35 is a simplified circuit schematic illustrating another preferred embodiment of a digital-input to analog current output multiplier (XD$_i$I$_O$) that utilizes the meshed digital-to-analog multiplication (mD$_i$S$_O$) method described in section 32. In the embodiment of FIG. 35, two digital words are inputted into a set of AND gates whose outputs (via current switches) control the steering of currents of a current reference network, wherein the current reference network is arranged to performs bit-weight attribution and summation in the analog domain (and in current mode).

FIG. 35 utilizes a x×y matrix of AND gates that are inputted with two digital input words that are x-bits wide (Dx$_{35}$ word) and y-bits wide (Dy$_{35}$ word). The outputs of AND gates generate one digital output word that is x×y-bits wide (Dxy$_{35}$ word), wherein each bit of x×y-bits wide word has a respective weight. In FIG. 35's multi-branch binary-weighted current reference network, each of the first binary weighted reference current branches (x-branch) supply the current reference inputs of the sets of second binary weighted reference current branches (set of y-branches). Accordingly, the Dxy$_{35}$ bits control the respective sets of analog current switches that steer the respective y-branch currents to either a positive (I1$o_{35}$) or a negative (I2$o_{35}$) output current ports. Here, I1$o_{35}$ and I2$o_{35}$ represent the analog current outputs of a digital input to analog current output multiplier (XD$_i$I$_{O_{35}}$).

Consider that for descriptive clarity the embodiment of XD$_i$I$_{O_{35}}$ is illustrated with only 3-bit (x-bits) by 3-bit (y-bits) digital input words, but the resolution can be higher (e.g., 3-bits to 12-bits). Moreover, the x and y-bits and their respective iDAC channels here are interchangeable give the commutative property of multiplications.

A current reference (Ir'$_{35}$) is inputted and mirrored onto iDACx$_{35}$'s binary weighed current reference network, which constitutes the first binary weighted reference current branches (x-branch). The iDACx$_{35}$ current reference network is comprising of P4$x_{35}$ (scaled at 4×), P2$x_{35}$ (scaled at 2×), and P1$x_{35}$ (scaled at 1×).

In the FIG. 35 embodiment of a digital-input to analog current output multiplier (XD$_i$I$_O$) that utilizes the meshed digital-to-analog multiplication (mD$_i$S$_O$) method, the functions of Y-branch iDACs and Y-branch iDACs are meshed. Effectively, the multiplication function is performed by digitally decoding the digital X-word and digital Y-word and feeding the digitally decoded results onto respective pairs of iDAC1$x_{35}$ & iDAC1$y_{35}$, iDAC2$x_{35}$ & iDAC2$y_{35}$, and iDAC3$x_{35}$ & iDAC3$y_{35}$ which are arranged in a meshed structure.

Here also, the floating iDAC method (described earlier in section 1) is utilized, whereby each of the iDAC1$x_{35}$, iDAC2$x_{35}$, and iDAC3$x_{35}$ binary weighted reference current branches (via each of the respective PMOSFETs: P1$x_{35}$, P1$x_{35}$, and P1$x_{35}$) feed a respective current reference inputs of 3 floating y-branch iDACs, which are the next set of three binary weighted reference current branches (set of 3 y-branches: iDAC1$y_{35}$, iDAC2$y_{35}$, and iDAC3$y_{35}$).

First, the drain terminal of P1$x_{35}$ (scaled at 1×) is coupled with the reference current input port of a first floating iDAC1$y_{35}$ comprising of P14$y_{35}$ (scaled at 4×), P12$y_{35}$ (scaled at 2×), and P11$y_{35}$ (scaled at 1×).

Second, the drain terminal of P2$x_{35}$ (scaled at 2×) is coupled with the reference current input port of a second floating iDAC2$y_{35}$ comprising of P24$y_{35}$ (scaled at 4×), P22$y_{35}$ (scaled at 2×), and P21$y_{35}$ (scaled 1×).

Third, the drain terminal of P4$x_{35}$ (scaled at 4×) is coupled with the reference current input port of a third floating iDAC3$y_{35}$ comprising of P44$y_{35}$ (scaled at 4×), P42$y_{35}$ (scaled at 2×), and P41$y_{35}$ (scaled at 1×).

The x-channel digital inputs (Dx$_{35}$ word) are D3$x_{35}$ (MSB) through D1$x_{35}$ (LSB). The y-channel digital inputs (Dy$_{35}$ word) are D3$y_{35}$ (MSB) through D1$y_{35}$ (LSB).

The digital decoding can be accomplished by an AND matrix (AND$_{35}$) that is inputted with digital input words Dx$_{35}$ and Dy$_{35}$, whose output is a 3×3 bits wide word (Dxy$_{35}$ word). As noted earlier, each bit of the Dxy$_{35}$ word has a respective weight and as such the Dxy$_{35}$ digital word controls the respective current switches of iDAC1$y_{35}$ (comprising of P11'$_{35}$, P12'$_{35}$, and P13'$_{35}$), iDAC2$y_{35}$ (comprising of P21'$_{35}$, P22'$_{35}$, and P23'$_{35}$), and iDAC3$y_{35}$ (comprising of P31'$_{35}$, P32'$_{35}$, and P34'$_{35}$). For example, when D3$x_{35}$ is high, then the output of the AND gates U34$y_{35}$ through U31$_{35}$ respond to D3$y_{35}$ through D1$y_{35}$ considering their respective weights. Accordingly, P4$x_{35}$ current (having its respective weight) flows onto P44$y_{35}$ through P41$y_{35}$, in response to D3$y_{35}$ through D1$y_{35}$ states, wherein P44$y_{35}$ through P41$y_{35}$ have their respective weights.

In the illustrated embodiment, to reduce glitch and lower dynamic current consumption and to save logic area, the inverters and the bus lines (that would otherwise be needed for the opposite polarity of the Dxy$_{35}$ word) are eliminated. To attain such benefits, the biasing voltage Vs$_{35}$ is coupled with the gate terminals of current switches of iDAC1$y_{35}$ (comprising of P11$_{35}$, P12$_{35}$, and P13$_{35}$), iDAC2$y_{35}$ (comprising of P21$_{35}$, P22$_{35}$, and P23$_{35}$), and iDAC3$y_{35}$ (comprising of P31$_{35}$, P32$_{35}$, and P34$_{35}$). The current switches P11'$_{35}$ through P34'$_{35}$ (whose outputs are coupled with the I1$o_{35}$ port) and P11$_{35}$ through P34$_{35}$ (whose outputs are coupled with the I2$o_{35}$ port) steer their respective currents onto the I1$o_{35}$ and I2$o_{35}$ ports in accordance with their digital selection, controlled by Dxy$_{35}$.

Notice that the 4X binary weighted (scaled) reference current through P4$x_{35}$ is passed on through (to the iDAC3$y_{35}$) depending on the sign of D3$x_{35}$, which is the MSB of the X-word. The 2× binary weighted (scaled) reference current through P2$x_{35}$ is passed on through (to the iDAC2$y_{35}$) depending on the sign of D2$x_{35}$, which is the middle-bit of the X-word. The 1X binary weighted (scaled) reference current through P1$x_{35}$ is passed on through (to the iDAC1$y_{35}$) depending on the sign of D1$x_{35}$, which is the LSB of the X-word.

The selected sums of (analog) current switch outputs of iDAC1$y_{35}$ through iDAC3$y_{35}$ are steered through the XD$_iI_{O_{35}}$'s current-output port(s) I1$o_{35}$ (and I2$o_{35}$) that generate the analog current product A$x_{35}$×A$y_{35}$/A$r_{35}$, wherein A$x_{35}$ is the analog current representation of the digital word D$x_{35}$, A$y_{35}$ is the analog current representation of the digital word D$y_{35}$, and A$r_{35}$ is scaled relative to reference current signal Ir'$_{35}$.

Bear in mind that the gate terminals of P11$y_{35}$ through P44$y_{35}$ are coupled with a bias voltage source V$r_{35}$, which leaves enough V$_{DS}$ headroom for P1$x_{35}$ through P4$x_{35}$. Moreover, P11$y_{35}$ through P44$y_{35}$ also function as cascoded FETs which can help increase the output impedance of the (XD$_iI_{O_{35}}$ and) iDAC's current reference networks. Also consider that instead of a binary weighted current reference network for the iDACs, other thermometer, linear, or non-linear reference network can be programmed here for different objective transfer functions.

The disclosed XD$_iI_{O_{35}}$ benefits from current mode operations, which has been discussed in this disclosure. Multiplying a 3×3 bit digital words generates a 6-bit word that can then be inputted to a 6-bit iDAC to generate a current output product. Digital multipliers are expensive and power hungry when they operate at full speed due to dynamic power consumption of logic gates whose numbers increase exponentially in with the length of a digital multiplier's input word. The embodiment of XD$_iI_{O_{35}}$ that utilizes the disclosed mD$_iI_O$ method requires a larger size current reference network compared to that of a conventional a 6-bit iDAC but it requires a substantially smaller digital logic, which net-net has the benefit of yielding a smaller die size.

Figure 36:
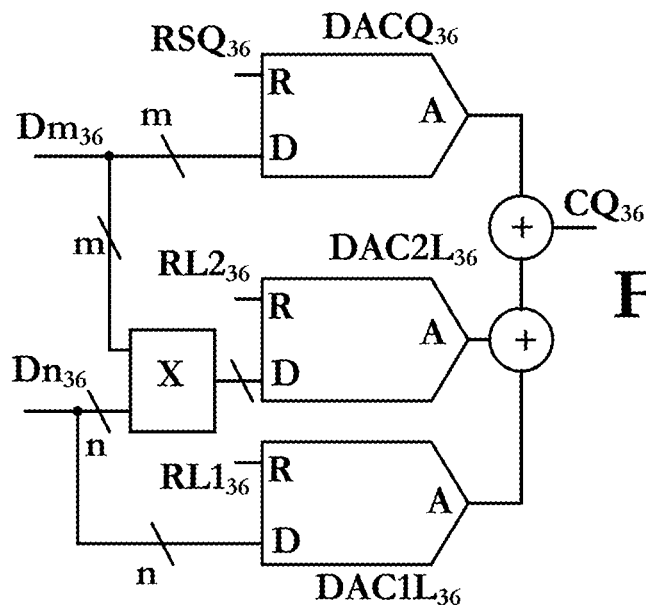
FIG. 36 is a simplified block diagram illustrating a first non-linear digital-to-analog converter (NDAC) method.
Figure 36:
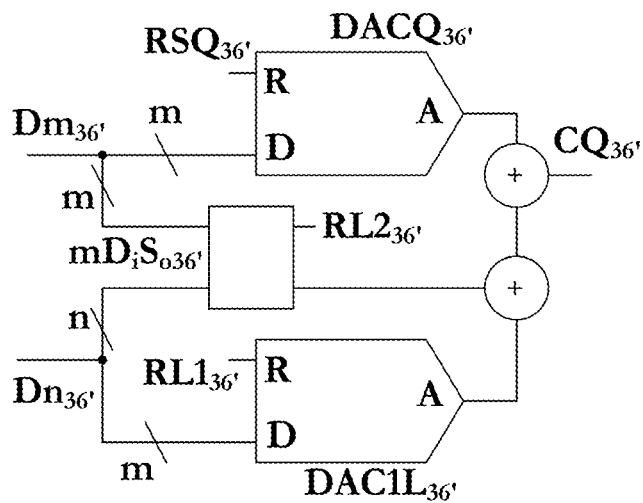

Section 36—Description of FIG. 36

FIG. 36 is a simplified block diagram illustrating a first non-linear digital-to-analog converter (NDAC) method. For clarity and not as a limitation, the NDAC method is described as one with a square transfer function. Utilizing the first NDAC method, Most-Significant-Portion (MSP) signals and Least-Significant-Portion (LSP) signals are generated utilizing both non-linear DACs and linear DACs. The transfer function of a non-linear MSP DAC can be arranged to follow a square transfer function or other profiles including but not limited to logarithmic, wherein the linear LSP DACs can be arranged as a linear straight-line approximation to fill the gaps in-between the non-linear MSP DAC's output segment.

The first NDAC method of FIG. 36 is inputted with a digital input word (D$_{36}$) comprising of a Most-Significant-Bit (MSB) bank word or Dm$_{36}$ that is m-bits wide, and a Least-Significant-Bit (LSB) bank word or Dn$_{36}$ that is n-bits wide, and wherein D$_{36}$ is m+n bits wide.

The first NDAC method of FIG. 36 is provided with a non-linear MSP DAC (DACQ$_{36}$) that is inputted with the Dm$_{36}$ word. Moreover, DACQ$_{36}$ is inputted with a reference signal RSQ$_{36}$. The reference network of DACQ$_{36}$ is programmed to follow a non-linear transfer function such as a square in this illustration.

Furthermore, the first NDAC method of FIG. 36 is provided with a linear LSP DAC (DAC1L$_{36}$) that is inputted with the Dn$_{36}$ word. The DAC1L$_{36}$ is inputted with a reference signal RL1$_{36}$, wherein the magnitude of RL1$_{36}$ is proportional to that of RSQ$_{36}$. The reference network of DAC1L$_{36}$ is programmed to follow a linear transfer function such as binary.

Moreover, the first NDAC method of FIG. 36 is provided with another linear LSP DAC (DAC2L$_{36}$) that is inputted with the multiplicand product of Dm$_{36}$×Dn$_{36}$ words. The DAC2L$_{36}$ is inputted with a reference signal RL2$_{36}$, wherein the magnitude of RL2$_{36}$ is also proportional to that of RSQ$_{36}$. The reference network of DAC2L$_{36}$ is also programmed to follow a linear transfer function such as binary.

The linear outputs of DAC1L$_{36}$ and DAC2L$_{36}$ are combined together to generate an output that serves as a straight line approximation to fill the gaps in-between MSP segments of the output of the non-linear DACQ$_{36}$. Utilizing the first NDAC method, a non-linear output signal (CO$_{36}$) can be generated which is an analog non-linear representation of D$_{36}$, as a function of an analog reference signal (e.g., scaled RSQ$_{36}$ signal).

In summary, the first non-linear digital-to-analog converter (NDAC) method of FIG. 36 is provided with at least one non-linear MSP DAC whose output is combined with at least on linear LSP DAC, wherein the output of linear LSP DAC(s) fill the gap in-between the non-linear MSP DAC output segments. Benefits of utilizing the NDAC method is later discussed in the embodiments of the said method.

Section 36'—Description of FIG. 36'

FIG. 36' is a simplified block diagram illustrating a second non-linear digital-to-analog converter (NDAC) method, which utilizes the meshed digital-to-analog multiplication (mD$_i$S$_O$) method that is discussed in section 32 and illustrated in FIG. 32. Utilization of the mD$_i$S$_O$ method is one of the differences between the second non-linear NDAC method and the first NDAC method disclosed in section 36 and the third NDAC method disclosed in section 37. For clarity and not as a limitation, the second NDAC method is also described as one with a square transfer function. Utilizing the second NDAC method, Most-Significant-Portion (MSP) signals and Least-Significant-Portion (LSP) signals can be generated utilizing non-linear DACs, a meshed digital-input analog-output multiplier, and a linear offset DACs. The transfer function of a non-linear MSP DAC can be arranged to follow a square transfer function or other profiles including but not limited to logarithmic, wherein the linear offset DAC in concert with the meshed digital-input analog-output multiplier can be arranged as a linear straight-line approximation to fill the gaps in-between the non-linear MSP DAC's output segment.

The second NDAC method of FIG. 36' is inputted with a digital input word (D$_{36'}$) comprising of a Most-Significant-Bit (MSB) bank word or Dm$_{36'}$ that is m-bits wide, and a Least-Significant-Bit (LSB) bank word or Dn$_{36'}$ that is n-bits wide, and wherein D$_{36'}$ is m+n bits wide.

The second NDAC method of FIG. 36' is provided with a non-linear MSP DAC (DACQ$_{36'}$) that is inputted with the Dm$_{36'}$ word. Moreover, DACQ$_{36'}$ is inputted with a reference signal RSQ$_{36'}$. The reference network of DACQ$_{36'}$ is programmed to follow a non-linear transfer function such as a square in this illustration.

Furthermore, the second NDAC method of FIG. 36' is provided with a linear offset LSP DAC (DAC1L$_{36'}$) that is inputted with the Dn$_{36'}$ word. The DAC1L$_{36'}$ is inputted with a reference offset signal $RL1_{36'}$, wherein the magnitude of $RL1_{36'}$ signal is proportional to that of $RSQ_{36'}$ signal. The reference network of $DAC1L_{36'}$ is programmed to follow a linear transfer function such as binary.

Moreover, the NDAC method of FIG. 36' is provided with a meshed digital-to-analog multiplier ($XDiSo_{36'}$), which utilizes the meshed digital-to-analog multiplication method ($mD_sS_O$) disclosed in section 32. The $XDiSo_{36'}$ is inputted with a reference signal ($RL2_{36'}$), wherein the magnitude of $RL2_{36'}$ signal is also proportional to that of $RSQ_{36'}$ signal. The reference network of $DAC2L_{36'}$ is also programmed to follow a linear transfer function such as binary.

The linear outputs of $DAC1L_{36'}$ and $XDiSo_{36'}$ are combined together to generate an output that serves as a straight line approximation to fill the gaps in-between MSP segments of the output of the non-linear $DACQ_{36'}$. Utilizing the second NDAC method, a non-linear output signal ($CO_{36'}$) can be generated which is an analog non-linear representation of $D_{36'}$, as a function of an analog reference signal (e.g., scaled $RSQ_{36'}$ signal).

In summary, the non-linear digital-to-analog converter (NDAC) method of FIG. 36' is provided with at least one non-linear MSP DAC whose output is combined with a meshed digital-to-analog multiplier and at least on linear (offset) LSP DAC, wherein the combined outputs of the meshed digital-to-analog multiplier, and the linear LSP DAC(s), fill the gap in-between the non-linear MSP DAC output segments. Benefits of utilizing the NDAC method is later discussed in the embodiments of the said method.

Figure 37:
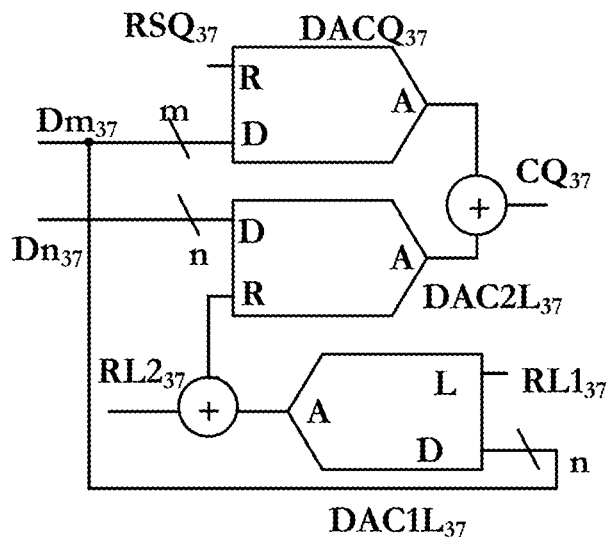
FIG. 37 is a simplified block diagram illustrating a third non-linear digital-to-analog converter (NDAC) method.

Section 37—Description of FIG. 37

FIG. 37 is a simplified block diagram illustrating a third non-linear digital-to-analog converter (NDAC) method. For clarity and not as a limitation, the third NDAC method here is also described as one with a square transfer function. Utilizing the third NDAC method, Most-Significant-Portion (MSP) signals generated by a non-linear MSP DAC are combined with and Least-Significant-Portion (LSP) signals generated by a pair of linear LSP DACs which are arranged in a multiplying fashion. The non-linear MSP DACs can also be arranged to follow a square (or other) profile(s) including but not limited to logarithmic, wherein the linear LSP DACs can also be arranged as a linear straight-line approximation to fill the gaps in-between the outputs of the non-linear MSP DAC segment.

The third NDAC method of FIG. 37 is inputted with a digital input word ($D_{37}$) comprising of a Most-Significant-Bit (MSB) bank word or $Dm_{37}$ that is m-bits wide, and a Least-Significant-Bit (LSB) bank word or $Dn_{37}$ that is n-bits wide, and wherein $D_{37}$ word is m+n bits wide.

The third NDAC method of FIG. 37 is provided with a non-linear MSP DAC ($DACQ_{37}$) that is inputted with the $Dm_{37}$ word. Moreover, $DACQ_{37}$ is inputted with a reference signal $RSQ_{37}$. The reference network of $DACQ_{37}$ is programmed to follow a non-linear transfer function such as a square in this illustration.

Furthermore, the third NDAC method of FIG. 37 is provided with a linear LSP DAC ($DAC1L_{37}$) that is inputted with the MSB bank word $Dm_{37}$. The $DAC1L_{37}$ is also inputted with a reference signal $RL1_{37}$, wherein the magnitude of $RL1_{37}$ is also proportional to that of $RSQ_{37}$. The reference network of $DAC1L_{37}$ is also programmed to follow a linear transfer function such as binary.

Moreover, the third NDAC method of FIG. 37 is provided with another linear LSB DAC ($DAC2L_{37}$) that is inputted with the LSB bank word or $Dn_{36}$. The output of $DAC1L_{37}$ is combined with a reference signal ($RL2_{37}$) and the said combined resultant signal is supplied to the reference input port of $DAC2L_{37}$. Note that the magnitude of $RL1_{37}$ signal and $RL1_{37}$ signal are also proportional to $RSQ_{37}$ signal.

The output the linear $DAC2L_{37}$ serves as a straight-line approximation to fill the gaps in-between Most-Significant-Portion (MSP) output segments of the non-linear $DACQ_{36}$. Utilizing the third NDAC method, a non-linear output signal ($CO_{37}$) can be generated which is an analog non-linear representation of $D_{37}$, as a function of an analog reference signal (e.g., scaled $RSQ_{37}$ signal).

In summary, the third non-linear digital-to-analog converter (NDAC) method of FIG. 37 is provided with at least one non-linear MPS DAC whose output is combined with a pair of linear LSP multiplying DACs, wherein the output of a first multiplying DAC is coupled with the refernceibput of a second multiplying DAC, and wherein the output of the second multiplying DAC fill the gap in-between the non-linear MSP DAC segments. Benefits of utilizing the third NDAC method is later discussed in the embodiments of the said method.

Figure 38:
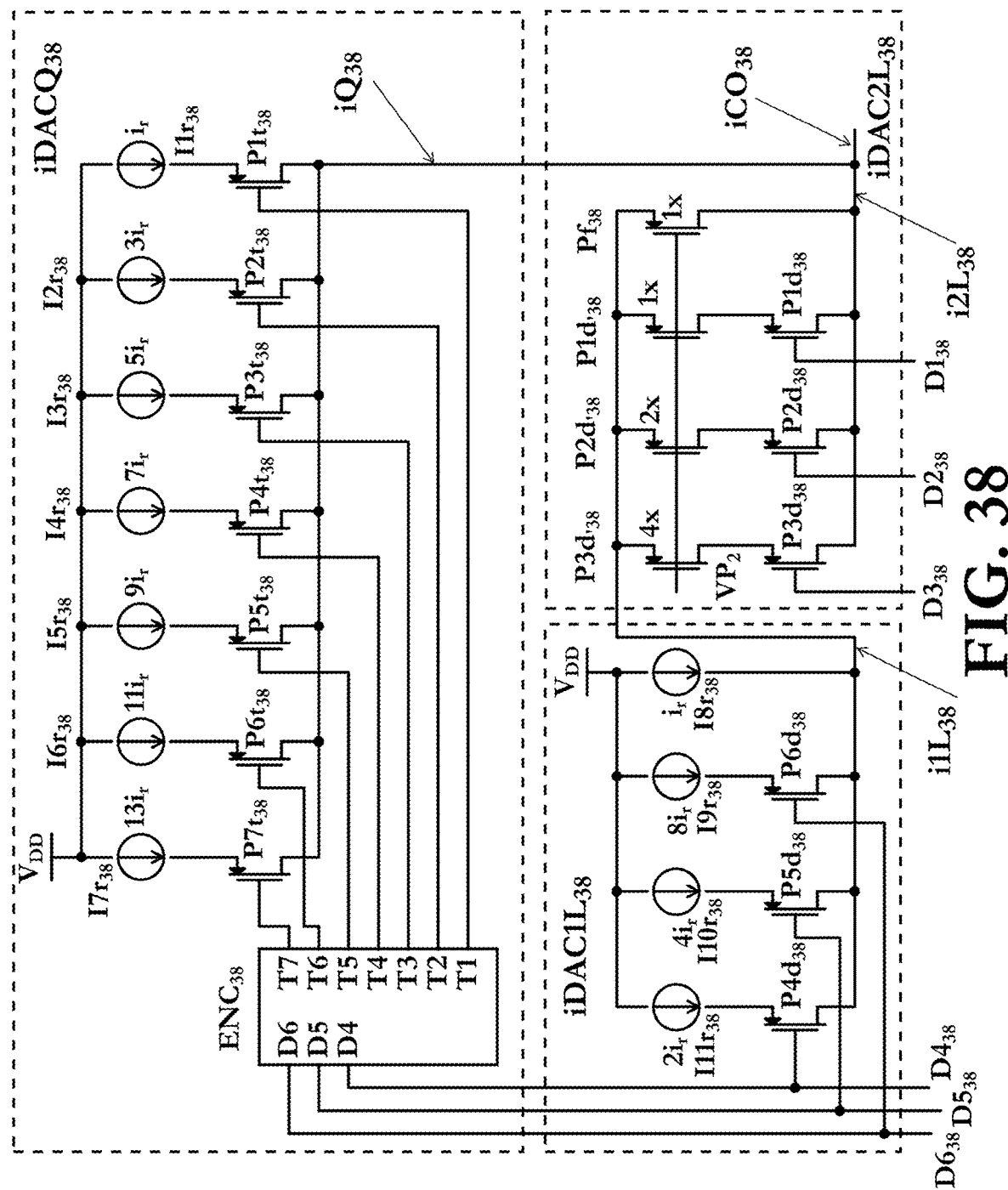
FIG. 38 is a simplified circuit schematic illustrating an embodiment of a non-linear digital-input to analog current output digital-to-analog converter (iNDAC$_{38}$), which utilizes the NDAC method described in section 37, wherein the non-linear output profile of iNDAC$_{38}$ is programmed to approximate a square transfer function.

Section 38—Description of FIG. 38

FIG. 38 is a simplified circuit schematic illustrating an embodiment of a non-linear digital-input to analog current output digital-to-analog converter ($iNDAC_{38}$), which utilizes the NDAC method described in section 37 and illustrated in FIG. 37, wherein the non-linear output profile of $iNDAC_{38}$ is programmed to approximate a square transfer function.

For clarity of description and illustration, FIG. 38 illustrates only 6-bit iDACs, but this illustration is not a limitation of the disclosure here. Here, the digital input word ($Di_{38}$) is comprising of $D6_{38}$, $D5_{38}$, $D4_{38}$, $D3_{38}$, $D2_{38}$, and $D1_{38}$ bits. Depending on an application requirement, the disclosed iDAC can, for example, have 16-bits of resolution.

The non-linear Most-Significant-Portion (MSP) DAC ($iDACQ_{38}$) is a non-linear thermometer iDAC. The $iDACQ_{38}$ non-linear thermometer reference current network is comprised of $I1r_{38}=i_r$, $I1r_{38}=3i_r$, $I1r_{38}=5i_r$, $I1r_{38}=7i_r$, $I1r_{38}=9i_r$, $I1r_{38}=11i_r$, and $I1r_{38}=13i_r$, wherein $i_r$ is a (unit) scaled reference signal. By inputting the MSB bank word ($D6_{38}$, $D5_{38}$, and $D4_{38}$) to a 3-bit input to 7-bit output digital encoder ($ENC_{38}$), a 7-bit digital word is generated. The 7-bit output word of $ENC_{38}$ control the current switches $P1t_{38}$, $P2t_{38}$, $P3t_{38}$, $P4t_{38}$, $P5t_{38}$, $P6t_{38}$, and $P7t_{38}$, whose inputs are couple to their respective non-linear current source segments of the non-linear thermometer reference current network. The current switches control the steering of the non-linear current source segments. The outputs of the current switches are coupled together at node $iQ_{38}$ wherein a non-linear MSP current signal is generated that approximates a square profile.

The first linear Least-Significant-Portion (LSP) iDAC ($iDAC1L_{38}$) is a linear binary weighted iDAC. The $iDAC1L_{38}$ binary weighted reference current network is comprised of $I9r_{38}=8i_r$, $I10r_{38}=4i_r$, and $I11r_{38}=2i_r$. The MSB bank word ($D6_{38}$, $D5_{38}$, and $D4_{38}$) controls the current switches $P6d_{38}$, $P5d_{38}$, and $P4d_{38}$ whose inputs are couple to their respective binary-weighted current sources (e.g., $I9r_{38}=8i_r$, $I10r_{38}=4i_r$, and $I11r_{38}=2\ i_r$). The $P6d_{38}$, $P5d_{38}$, and $P4d_{38}$ current switches control the steering of the respective binary-weighted current sources. The outputs of $P6d_{38}$, $P5d_{38}$, and $P4d_{38}$ current switches are coupled together at node $i1L_{38}$ wherein a first linear LSP current signal is generated.

An offset reference signal $18r_{38}=i_r$ is also coupled to the $i1L_{38}$ node, which is then coupled to the reference current input port of the second linear LSP iDAC (iDAC2L$_{38}$).

The second linear LSP iDAC or iDAC2L$_{38}$ is also a linear binary weighted iDAC. The iDAC2L$_{38}$ binary scaled reference current network is comprised of PMOSFETs: Pf$_{38}$@ 1X, P1$d'_{38}$@1X, P2$d'_{38}$@2X, and P3$d'_{38}$@4X. The LSB bank word (D1$_{38}$, D2$_{38}$, and D3$_{38}$) controls the current switches P1$d_{38}$, P2$d_{38}$, and P3$d_{38}$ whose inputs are couple to their respective binary-scaled current dividers (e.g., P1$d'_{38}$@1X, P2$d'_{38}$@ 2X, and P3$d'_{38}$@4X). The P1$d_{38}$, P2$d_{38}$, and P3$d_{38}$ current switches control the steering of the respective binary-scaled current divider of the (reference input current of iDAC2L$_{38}$) supplied through the $i1L_{38}$ node. The outputs of P1$d_{38}$, P2$d_{38}$, and P3$d_{38}$ current switches are coupled together at node $i2L_{38}$ wherein a second linear LSP current signal is generated.

The $i2L_{38}$ node and node $iQ_{38}$ node are coupled together and coupled to the output node of the iNDAC$_{38}$ which is $iCO_{38}$.

Note that the current signals at the $i2L_{38}$ port fills-in the gap between the current signals at the $A_{QM}$ port. As such, the signal at node $iCO_{38}$ follows an approximate profile that is squarely weighted, as a function of the $i_r$, and is responsive to the $Di_{38}$ word.

In summary some of the benefits of the embodiment disclosed in FIG. 38 are as follows:

First, the disclosed embodiment benefits from operating in current mode that has been discussed in this disclosure Second, the dynamic response of the non-linear iDAC is fast also in part because the scaled reference network banks utilized in the non-linear MSP, first linear LSP, and second linear LSP iDACs are constant current sources whose current are steered by single MOFET switches which are inherently fast.

Third, current mirror loop associated with conventional multiplying iDACs (where a first linear LSP iDAC's output signal supplies the reference signal to a second linear LSP iDAC, generally through a current mirror) is avoided which helps the speed.

Fourth, utilizing the floating iDAC method surrounding the first linear LSP iDAC and second linear LSP iDAC reduces die area and cost.

Fifth, the iNDAC$_{38}$ enables making a fast and low-cost digital input to current analog output multiplier using the quarter square method. Here, by subtracting the current outputs of two iNDAC$_{38}$ a multiplicand 4X·Y can be generated, wherein the first iNDAC$_{38}$ receives the sum of two digital words and generates $(X+Y)^2$ and the second iNDAC$_{38}$ receives the difference of the same two digital words and generates $(X-Y)^2$.

Figure 39:
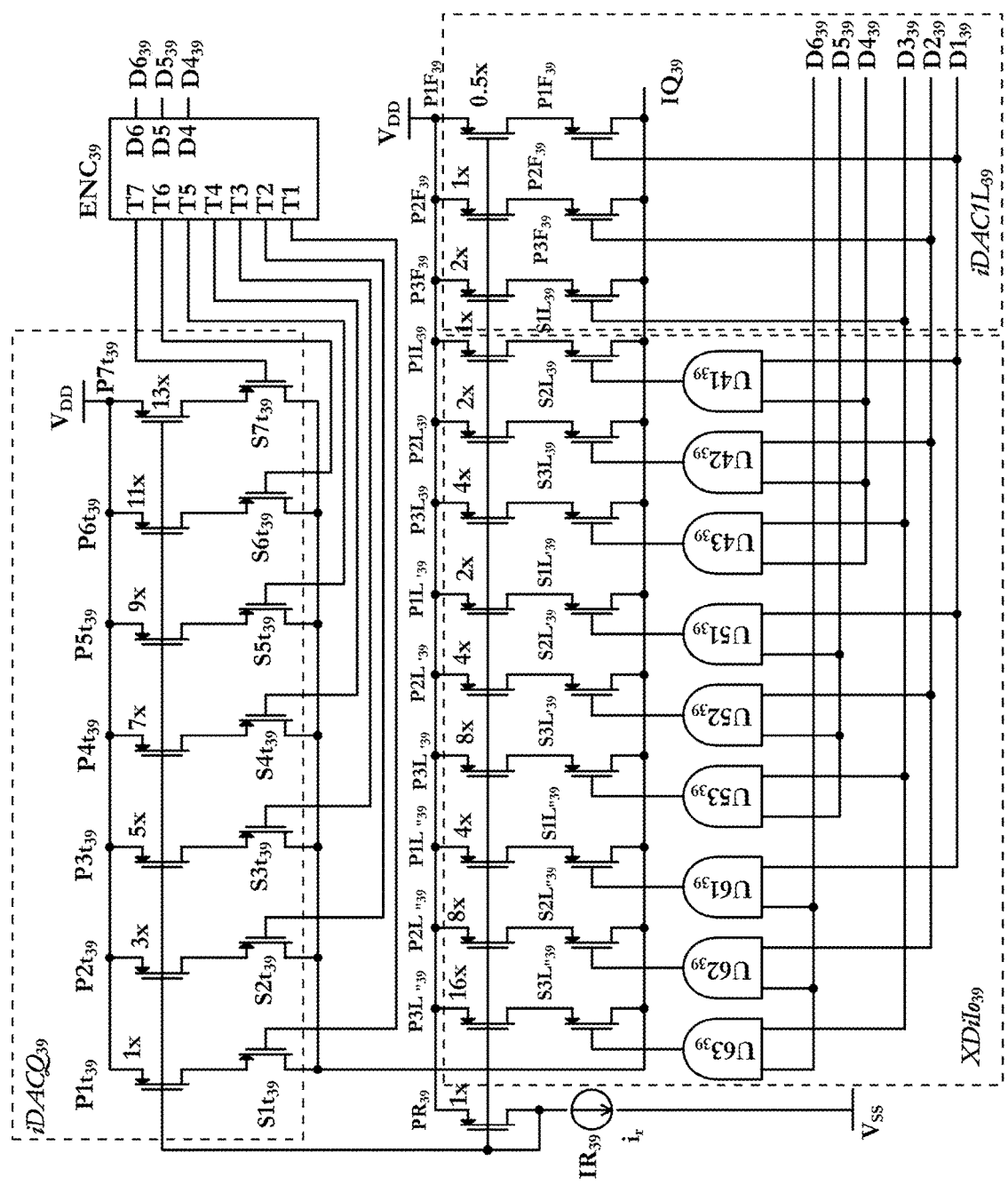
FIG. 39 is a simplified circuit schematic illustrating another embodiment of a non-linear digital-input to analog current output digital-to-analog converter (iNDAC$_{39}$), which utilizes the NDAC method described in section 36' wherein the non-linear output profile of iNDAC$_{39}$ is programmed to approximate a square transfer function.

Section 39—Description of FIG. 39

FIG. 39 is a simplified circuit schematic illustrating another embodiment of a non-linear digital-input to analog current output digital-to-analog converter (iNDAC$_{39}$), which utilizes the NDAC method described in section 36' and illustrated in FIG. 36', wherein the non-linear output profile of iNDAC$_{39}$ is programmed to approximate a square transfer function. To generate a liner LSP current signal, the embodiment of FIG. 39 also utilizes another embodiment of a digital-input to current analog-output multiplier (XDilo$_{39}$) that utilizes the meshed digital-to-analog multiplication (mD$_i$S$_O$) method that is discussed in sections 32 and 32', and illustrated in FIGS. 32 and 32'. Bear in mind that XDiSo$_{39}$ multiplier is similar to the XD$_i$I$_O$ disclosed in section and illustrated in FIG. 35.

For clarity of description and illustration, FIG. 39 illustrates only 6-bit iNDACs, but this illustration is not a limitation of the disclosure here. Here, the digital input word (Di$_{39}$) is comprising of D6$_{39}$, D5$_{39}$, D4$_{39}$, D3$_{39}$, D2$_{39}$, and D1$_{39}$ bits. Depending on an application requirement, the disclosed iDAC can, for example, have 16-bits of resolution.

The non-linear Most-Significant-Portion (MSP) DAC (iDACQ$_{39}$) is arranged as a non-linear thermometer iDAC. The iDACQ$_{39}$ non-linear thermometer reference current network is comprised of PMOSFETs whose drain currents are scaled as follows: P1$t_{39}$@$i_r$, P1$t_{39}$@3ir, P1$t_{39}$@5ir, P1$t_{39}$@7ir, P1$t_{39}$@9ir, P1$t_{39}$@11$i_r$, and P1$t_{39}$@13$i_r$, wherein $i_r$ is a (unit) scaled reference signal programmed by Ir$_{39}$=1$i_r$. By inputting the MSB bank word (D6$_{39}$, D5$_{39}$, and D4$_{39}$) to a 3-bit input to 7-bit output digital encoder (ENC$_{39}$), a 7-bit digital word is generated. The 7-bit output word of ENC$_{39}$ control the PMOSFET current switches comprising of s1$t_{39}$, s2$t_{39}$, s3$t_{39}$, s4$t_{39}$, s5$t_{39}$, s6$t_{39}$, and s7$t_{39}$, whose inputs are couple to their respective non-linear current source segments of the respective non-linear thermometer reference current network. As such, the current switches control the steering of the non-linear current source segments onto the outputs of the said current switches which are coupled together at the output node $iQ_{39}$.

The first linear offset Least-Significant-Portion (LSP) iDAC (iDAC1L$_{39}$) is a linear binary weighted iDAC. The iDAC1L$_{39}$ binary weighted reference current network is comprised of PMOSFETs whose drain currents are scaled at: P1$f_{39}$@½$i_r$, P2$f_{39}$@ $i_r$, and P3$f_{39}$@ 2$i_r$. The LSB bank word (D1$_{39}$, D2$_{39}$, and D3$_{39}$) controls the PMOSFET current switches P1$f_{39}$, P2$f_{39}$, and P3$f_{39}$ whose inputs are couple to their respective binary-weighted PMOSFET current sources (e.g., P1$f_{39}$@ 0.5X, P2$f_{39}$@ 1X, and P3$f_{39}$@ 2X). The P1$f_{39}$, P2$f_{39}$, and P3$f_{39}$ current switches control the steering of the respective binary-weighted current sources. The outputs of P1$f_{39}$, P2$f_{39}$, and P3$f_{39}$ current switches are coupled together at node $iQ_{39}$.

To generate the linear LSP output signal, the iNDAC$_{39}$ also utilizes the XDiSo$_{39}$ meshed multiplier, which utilizes the mD$_i$S$_O$ method.

Similar to the XD$_i$I$_O$ disclosed in section 35 and illustrated in FIG. 35, here in how XDilo$_{39}$ of FIG. 39 is arranged:

The D4$_{39}$ bit is AND gated (e.g., via U41$_{39}$, U42$_{39}$, and U43$_{39}$) with the LSB bank word (D3$_{39}$, D2$_{39}$, D1$_{39}$) to generate the control signals for a first sub-iDAC switches (s1L$_{39}$, s2L$_{39}$, and s3L$_{39}$). The first sub-iDAC switches steer the first bank of binary weighted current reference signals (generated by the PMOSFET binary scaled current reference sources: P1L$_{39}$@ 1X, P2L$_{39}$@ 2X, and P3L$_{39}$@ 4X), wherein the full scale of the first sub-iDAC is 7$i_r$. The output of the first sub-iDAC switches are also coupled together at node $iQ_{39}$.

The D5$_{39}$ bit is also AND gated (e.g., via U51$_{39}$, U52$_{39}$, and U53$_{39}$) with the LSB bank word (D3$_{39}$, D2$_{39}$, D1$_{39}$) to generate the control signals for a second sub-iDAC switches (s1L'$_{39}$, s2L'$_{39}$, and s3L'$_{39}$). The second sub-iDAC switches steer the second bank of binary weighted current reference signals (generated by the PMOSFET binary scaled current reference sources: P1L'$_{39}$@ 2X, P2L'$_{39}$@ 4X, and P3L'$_{39}$@ 8X), wherein the full scale of the second sub-iDAC is 14$i_r$. The output of the second sub-iDAC switches are also coupled together at node $iQ_{39}$.

The $D6_{39}$ bit is also AND gated (e.g., via $U61_{39}$, $U62_{39}$, and $U63_{39}$) with the LSB bank word ($D3_{39}$, $D2_{39}$, $D1_{39}$) to generate the control signals for a third sub-iDAC switches ($s1L''_{39}$, $s2L''_{39}$, and $s3L''_{39}$). The third sub-iDAC switches that steer the third bank of binary weighted current reference signals (generated by the PMOSFET binary scaled current reference sources: $P1L''_{39}$@ 4X, $P2L''_{39}$@ 8X, and $P3L''_{39}$@ 16X), wherein the full scale of the second sub-iDAC is $28i_r$. The output of the third sub-iDAC switches are also coupled together at node $iQ_{39}$.

Notice that the current output signal of the $XDilo_{39}$ combined with the output signal of at the linear offset $iDAC1L_{39}$ fills-in the gap between segments of the current signal of the $iDACQ_{39}$. As such, the signal at node $iQ_{39}$ follows an approximate squarely weighted profile, that is a function of the $i_r$, and is responsive to the $Di_{39}$ word.

In summary some of the benefits of the $iNDAC_{39}$ embodiment disclosed in FIG. 39 are as follows:

First, the disclosed embodiment benefits from operating in current mode that has been discussed in this disclosure Second, the dynamic response of the non-linear iDAC is fast also in part because the scaled reference network banks utilized in the non-linear MSP and the linear LSP segments are constant current sources whose current are steered by single MOFET switches which are inherently fast.

Third, current mirror loop associated with conventional multiplying iDACs (where for example a first linear LSP iDAC's output feeds the reference input port of a second linear LSP iDAC, generally through a current mirror) is avoided which helps the speed.

Fourth, utilizing a meshed digital input to analog output multiplier $XDilo_{39}$ is fast and can operate with low $V_{DD}$.

Fifth, the $iNDAC_{39}$ enables making a fast and low-cost digital input to current analog output multiplier using the quarter square method. Here, by subtracting the current outputs of two $iNDAC_{39}$ a multiplicand 4A·B can be generated, wherein the first $iNDAC_{39}$ receives the sum of two digital words and generates $(A+B)^2$ and the second $iNDAC_{39}$ receives the difference of the same two digital words and generates $(A-B)^2$.

Sixth, the disclosed $iNDAC_{39}$ power consumption is event driven in that if there is not event (e.g., data polarity of zero), the iDACs and $XDilo_{39}$ shut of their respective current sources and hence power down.

Section 40—Description of FIG. 40

FIG. 40 is a simplified circuit schematic illustrating another embodiment of the digital-input to analog current output multiplier ($XD_iI_O$). The $XD_iI_{O_{40}}$ multiplier utilizes the meshed digital-to-analog multiplication ($mD_iS_O$) method (described in the prior section 32' and illustrated in FIG. 32'), the multiple-channel data-converter method (disclosed in section 19 and illustrated in FIG. 19), and a second power supply desensitization method (PSR) disclosed here.

The $XD_iI_O$ of FIG. 40 ($XD_iI_{O_{40}}$) utilizes a reference bias network circuit ($RBN_{40}$) which is an embodiment of the multiple-channel data-converter method (disclosed in section 19 and illustrated in FIG. 19), which can save silicon area and improve the dynamic performance sub-iDACs, and thereby improve performance and reduce die size of the $XD_iI_{O_{40}}$. For clarity only one channel of $XD_iI_O$ is described here, but a sea of $XD_iI_O$s can be biased from the same reference bias network to bias the sea of $XD_iI_O$ multipliers.

The $XD_iI_{O_{40}}$ multiplier also utilizes the second multiplier power supply desensitization method in the $PRS_{40}$ circuit that can substantially desensitize $XD_iI_{O_{40}}$ multiplier's output current from power supply variations, while eliminating cascodes from current sources utilized in the current reference networks in the $XD_iI_{O_{40}}$ multiplier (which saves more area).

Also, for clarity and not as a limitation, the $XD_iI_{O_{40}}$ multiplier is described as receiving two digital words, each having 3-bits of resolution, but the digital input word resolution can be as high as 16-bits.

The three sections of $XD_iI_O$ multiplier circuit, comprising of $RBN_{40}$, $PSR_{40}$, and $XD_iI_{O_{40}}$ multiplier, is briefly described here:

In FIG. 40, a $RBN_{40}$ generates a sequence of individual binary weighted reference bias currents as follows: $P16r_{40}$ operating at $I16r_{40}$ of $(2^{5-1}) \times i = 16i_{r40}$; $P8r_{40}$ operating at $I8r_{40}$ of $(2^{4-1}) \times i = 8i_{r40}$; $P4r_{40}$ operating at $I4r_{40}$ of $(2^{3-1}) \times i = 4i_{r40}$; $P2r_{40}$ operating at $I2r_{40}$ of $(2^{2-1}) \times i = 2i_{r40}$; and $P1r_{40}$ operating at $I1r_{40}$ of $(2^{1-1}) \times i = 1i_{r40}$. In the embodiment of FIG. 40, $RBN_{40}$ is comprised of a sequence of CCVS which are implemented as a sequence of diode connected NMOS-FETs ($N16r_{40}$, $N8r_{40}$, $N4r_{40}$, $N2r_{40}$, and $N1r_{40}$) whose gate and drain ports are coupled together, wherein each NMOSFET is scaled with a W/L=1X. Accordingly, the sequence of binary weighted reference bias currents $I16r_{40}$ to $I1r_{40}$ are inputted to the diode connected NMOSFETs (CCVS) which generate a sequence of (gate-to-source) reference bias voltages from reference bias voltage bus $V16_{40}$ to reference bias voltage bus $V1_{40}$ as follows: $I_D$ of $P16r_{40}=16i_{r40}$ is inputted to the diode connected $N16r_{40}$ to generate a reference bias bus voltage of $V16_{40}$; $I_D$ of $P8r_{40}=8i_{r40}$ is inputted to the diode connected $N8r_{40}$ to generate a reference bias bus voltage of $V8_{40}$; $I_D$ of $P4r_{40}=4i_{r40}$ is inputted to the diode connected $N4r_{40}$ to generate a reference bias bus voltage of $V4_{40}$; $I_D$ of $P2r_{40}=2i_{r40}$ is inputted to the diode connected $N2r_{40}$ to generate a reference bias bus voltage of $V2_{40}$; and $I_D$ of $P1r_{40}=1i_{r40}$ is inputted to the diode connected $N1r_{40}$ to generate a reference bias bus voltage of $V1_{40}$.

The NMOSFET current sources of the $XD_iI_{O_{40}}$ multiplier are biased by coupling their gate-port to the respective (reference bias network) $RBN_{40}$'s voltage bus comprising of $V16_{40}$ to $V1_{40}$ as follows:

For the first sub-iDAC of the meshed $XD_iI_{O_{40}}$ multiplier, the gate ports of NMOSFET current sources $N1v_{40}$, $N2v_{40}$, and $N4v_{40}$ are coupled with reference bias voltage buses of $RBN_{40}$ comprising of $V1_{40}$, $V2_{40}$, and $V4_{40}$, respectively. Accordingly, the drain currents (scaled reference current sources) of $N1v_{40}$, $N2v_{40}$, and $N4v_{40}$ operate at $1i_{r40}$, $2i_{r40}$, and $4i_{r40}$, respectively.

For the second sub-iDAC of the meshed $XD_iI_{O_{40}}$ multiplier, the gate ports of NMOSFET current sources $N2v'_{40}$, $N4v'_{40}$, and $N8v'_{40}$ are coupled with reference bias voltage buses of $RBN_{40}$ comprising of $V2_{40}$, $V4_{40}$, and $V8_{40}$, respectively. Accordingly, the drain currents (scaled reference current sources) of $N2v'_{40}$, $N4v'_{40}$, and $N8v'_{40}$ operate at $2i_{r40}$, $4i_{r40}$, and $8i_{r40}$, respectively.

For the third sub-iDAC of the meshed $XD_iI_{O_{40}}$ multiplier, the gate ports of NMOSFET current sources $N4v''_{40}$, $N8v''_{40}$, and $N16v''_{40}$ are coupled with reference bias voltage buses of $RBN_{40}$ comprising of $V4_{40}$, $V8_{40}$, and $V16_{40}$, respectively. Accordingly, the drain currents (scaled reference current sources) of $N4v''_{40}$, $N8v''_{40}$, and $N16v''_{40}$ operate at $4i_{r40}$, $8i_{r40}$, and $16i_{r40}$ respectively.

As indicated earlier, the $PSR_{40}$ circuit utilizes a second PSR method. In the embodiment of $PSR_{40}$ illustrated in FIG. 40, results in substantial area savings by eliminating the cascode from current sources in the sub-iDAC$x_{40}$s of the $XD_iI_{O_{40}}$ multiplier as well as from that of the $RBN_{40}$ circuits, while the output current of $XD_iI_{O_{40}}$ multiplier is substantially desensitized from $V_{DD}$ variations. This is done by regulating the reference bias currents of $RBN_{40}$ so that the outputs of the sub-iDACx$_{40}$s of the $XD_iI_{O_{40}}$ multiplier are substantially desensitized to power supply variations.

The second power supply desensitization (PSR) method utilized in the $PSR_{40}$ circuit is briefly explained as follows:

A central reference bias current network (RBN), free of cascodes, generates a reference bias voltage bus, wherein the reference bias voltage bus is shared with a plurality of reference bias current networks of a plurality of cascode-free data-converters. To substantially desensitize the plurality of output currents of the plurality of cascode-free data-converters, a power supply desensitization circuit tracks the power supply variations and varies each reference bias currents of the central RBN. Utilization of the second PSR method $PSR_{40}$ is described next. in Bear in mind that FET early voltage ($V_A$) causes the FET's $I_{DS}$ to vary with varying the FET's $V_{DS}$. Also, keep in mind that the output port of the $XD_iI_{O_{40}}$ multiplier could be coupled to an input of a current-mode analog-to-digital converter (iADC), wherein the input port of the iADC could be biased at a $V_{GS}$ of a MOSFET below or above the $V_{DD}$ or $V_{SS}$, respectively (e.g., $V_{DD}$-$Vgs_{PMOS}$). As such, assuming little voltage drop across current switches of the sub-iDACs of the $XD_iI_{O_{40}}$ multiplier, the drain-terminals of the (digitally selected) scaled reference current sources of the $XD_iI_{O_{40}}$ multiplier would be biased at $V_{DD}$-$Vgs_{PMOS}$ as well. Additionally, keep in mind that the drain-to-source voltage ($V_{DS}$) of current sources of the $RBN_{40}$ (e.g., $P16r_{40}$, $P8r_{40}$, $P4r_{40}$, $P2r_{40}$, and $P1r_{40}$) is $V_{DS} = V_{DD}$-$Vgs_{NMOS}$. In order to substantially desensitize the output current of the $XD_iI_{O_{40}}$ multiplier from $V_{DD}$ variations, the $PSR_{40}$ is arranged to operates as follows: $P3d_{40}$ regulates the $I_D$ of the diode-connected $N2d_{40}$ (i.e., $Vgs_{NMOS}$) whose current is mirrored onto $N1d_{40}$. The $I_D$ of $N1d_{40}$ is coupled into the diode connected $P2d_{40}$ (i.e., $Vgs_{PMOS}$) whose $I_D$ is mirrored onto $P1d_{40}$. The $I_D$ of $P1d_{40}$ is substantially equal to that of the scaled reference current or $ir_{40}$. Accordingly, as the $V_{DD}$ is varied, the gate port of $P3d_{40}$ regulates the magnitude of the current sources of the $RBN_{40}$ so that the current sources of the $RBN_{40}$ track the scaled reference current or $ir_{40}$, which is substantially stable by design. In summary, the disclosed arrangement could substantially desensitize the $XD_iO_{O_{40}}$ multiplier from $V_{DD}$ variations while all current sources of the sub-iDACx$_{40}$s of the $XD_iO_{O_{40}}$ multiplier and that of the $RBN_{40}$ current sources are without cascodes, which saves substantial silicon area.

Next, the $XD_iI_{O_{40}}$ multiplier is briefly described, keeping in mind that the embodiment of $XD_iI_{O_{40}}$ multiplier is similar to the embodiment of the $XD_iI_O$ multiplier of FIG. 33 which utilized the meshed digital-to-analog multiplication ($mD_iS_O$) method (described in the prior section 32' and illustrated in FIG. 32'). The $XD_iO_{O_{40}}$ multiplier is inputted with two digital input words $Dx_{40}$ word (comprising of 3-bits $x1_{40}$, $x2_{40}$, and $x3_{40}$) and $Dy_{40}$ word (comprising of 3-bits $y1_{40}$, $y2_{40}$, and $y3_{40}$).

As described earlier, the $XD_iI_{O_{40}}$ multiplier is also inputted with a plurality of scaled reference current signals proportional to $ir_{40}$, utilize NMOSFETs that are each scaled with W/L of 1X) comprising of 3 banks namely: The first scaled reference current bank $I1r_{40} = 1 \times ir_{40}$, $I2r_{40} = 1 \times ir_{40}$, and $I4r_{40} = 4 \times ir_{40}$, corresponding to $I_D$ of $N1v_{40}$, $N2v_{40}$, and $N4v_{40}$, respectively. The second scaled reference current bank $I2r_{40} = 2 \times ir_{40}$, $I4r_{40} = 4 \times ir_{40}$, and $I8r_{40} = 8 \times ir_{40}$, corresponding to $I_D$ of $N2v'_{40}$, $N4v'_{40}$, and $N8v'_{40}$, respectively. The third scaled reference current bank $I4r_{40} = 4 \times ir_{40}$, $I8r_{40} = 8 \times ir_{40}$, and $I16r_{40} = 16 \times ir_{40}$, corresponding to $I_D$ of $N4v''_{40}$, $N8v''_{40}$, and $N16v''_{40}$, respectively.

A first x-channel sub-iDAC receives the first scaled reference bank (i.e., $I1r_{40}$, $I2r_{40}$, and $I4r_{40}$) at its current switch inputs that are the source-nodes of $N1x_{40}$, $N1x'_{40}$, and $N1x''_{40}$ whose gate-nodes are controlled by $x1_{40}$ bit. Accordingly, each of the $I1r_{40}$, $I2r_{40}$, and $I4r_{40}$ currents are respectively steered through, $N1x_{40}$, $N1x'_{40}$, and $N1x''_{40}$ which are gated by the $x1_{40}$ bit, to provide the scaled reference input currents to the first y-channel sub-iDAC (in accordance with $Dx_{40}$ word). Consequently, the said first y-channel sub-iDAC reference currents are steered through current switches $N1y_{40}$, $N2y_{40}$, and $N3y_{40}$ that are controlled by the first y-channel sub-iDAC's digital inputs $y1_{40}$, $y2_{40}$, and $y3_{40}$ bits, respectively. The drain-node currents of $N1y_{40}$, $N2y_{40}$, and $N3y_{40}$ are summed together and coupled to $Ixy_{40}$, which is the analog current output port of the $XD_iI_{O\ 40}$ multiplier.

Similarly, a second x-channel sub-iDAC receives the second scaled reference bank (i.e., $I2r_{40}$, $I4r_{40}$, and $I8r_{40}$) at its current switch inputs that are the source-nodes of $N2x_{40}$, $N2x'_{40}$, and $N2x''_{40}$ whose gate-nodes are controlled by $x2_{40}$ bit. Accordingly, each of the $I2r_{40}$, $I4r_{40}$, and $I8r_{40}$ currents are respectively steered through, $N2x_{40}$, $N2x'_{40}$, and $N2x''_{40}$ which are gated by the $x2_{40}$ bit, to provide the scaled reference input currents to the second y-channel sub-iDAC (in accordance with $Dx_{40}$ word). Consequently, the said second y-channel sub-iDAC reference currents are steered through current switches $N1y'_{40}$, $N2y'_{40}$, and $N3y'_{40}$ that are controlled by the second y-channel sub-iDAC's digital inputs $y1_{40}$, $y2_{40}$, and $y3_{40}$ bits, respectively. The drain-node currents of $N1y'_{40}$, $N2y'_{40}$, and $N3y'_{40}$ are summed together and coupled to $Ixy_{40}$, which as noted earlier is the analog current output port of the $XD_iI_{O_{40}}$ multiplier.

Lastly, a third x-channel sub-iDAC receives the third scaled reference bank (i.e., $I4r_{40}$, $I8r_{40}$, and $I16r_{40}$) at its current switch inputs that are the source-nodes of $N3x_{40}$, $N3x'_{40}$, and $N3x''_{40}$ whose gate-nodes are controlled by $x3_{40}$ bit. Accordingly, each of the $I4r_{40}$, $I8r_{40}$, and $I16r_{40}$ currents are respectively steered through, $N3x_{40}$, $N3x'_{40}$, and $N3x''_{40}$ which are gated by the $x3_{40}$ bit, to provide the scaled reference input currents to the third y-channel sub-iDAC (in accordance with $Dx_{40}$ word). Consequently, the said third y-channel sub-iDAC reference currents are steered through current switches $N1y''_{40}$, $N2y''_{40}$, and $N3y''_{40}$ that are controlled by the third y-channel sub-iDAC's digital inputs $y1_{40}$, $y2_{40}$, and $y3_{40}$ bits, respectively. The drain-node currents of $N1y'''_{40}$, $N2y''_{40}$, and $N3y''_{40}$ are summed together and coupled to $Ixy_{40}$, which as just noted is the analog current output port of the $XD_iI_{O_{40}}$ multiplier.

In summary, the outputs of the first and second and third y-channel iDACs are summed at $Ixy_{40}$ to generate the analog multiplicand representation, proportion to a unit scaled reference current signal, that is the X·Y digital multiplications. Note that for a binary (linear) multiplier, the scaled reference network (bank) is also binarily weighted, but the reference network can be scaled in other fashions (e.g., thermometer or non-linear) for multipliers with different input-to-output transfer functions.

In conclusion, some of the benefits of the $XD_iI_O$ multiplier embodiment disclosed in FIG. 40 are as follows:

First, the disclosed embodiment benefits from operating in current mode that has been discussed in this disclosure Second, the dynamic response of $XD_iI_O$ multiplier is fast also in part because the scaled reference network banks are constant current sources whose current are steered by single MOFET switches which are inherently fast.

Third, current mirror loop associated with conventional multiplying iDACs (where a first iDAC's output signal supplies the reference signal to a second iDAC, generally through a current mirror) is avoided which helps the speed.

Fourth, the minimum power supply can be lowered since it is chiefly limited by the drain-to-source voltage of current sources of the scaled reference network.

Fifth, for multiple channels of $XD_iI_O$ multiplier required in AI & ML applications, the disclosed embodiment enjoys substantial benefits attributed to the multiple-channel data-converter method summarized in section 19. There is an area savings, in utilizing the multiple-channel data-converter method, in part because the requirement for individually weighted current sources (e.g., binary weighted or non-linearly weighted) is decoupled from requiring individually scaled current sources. Here, utilization of $RBN_{40}$ to generate a common reference voltage bus that is shared between plurality of sub-iDACs reduces the size of sub-iDACs current reference (cells in the) reference network of each sub-iDACs which lowers cost. Moreover, it lowers the combined associated parasitic and stray capacitance associated with current reference cells, which improves each of the sub-iDAC's dynamic response, lowers glitch, lowers digital injections into power supplies, and reduces the disclosed sub-iDAC's dynamic power consumption. The small size and improved performance on each sub-iDAC used in arranging each $XD_iI_O$ multipliers are thus enjoyed by the plurality of plurality of such $XD_iI_O$ multipliers.

Sixth, despite area savings attainable by the disclosed multiple-channel data-converter method in the sub-iDACs and the $XD_iI_O$ multipliers, the accuracy of individual the sub-iDACs and the $XD_iI_O$ multipliers are not substantially deterred. All else substantially equal, the matching of MOSFETs that form a data-converter's reference current network dominate the accuracy of a current-mode data-converter. The scaled MOSFETs in both the (central) reference bias network ($RBN_{40}$) match the 1X scaled MOSFETs in each of the sub-iDACs and the $XD_iI_O$ multipliers because they are all arranged with the same (non-minimum W/L size) cell layout and same orientation.

Seventh, the disclosed sub-iDACs and the $XD_iI_O$ multipliers substantially reduces the number of MOSFETs that for example form the sub-iDAC's binary weighted current source network, and as such the fewer MOSFETs can be placed closer to each other on a chip. Similarly oriented and physically closer MOSFETs, that form the current reference network of the sub-iDACs and the $XD_iI_O$ multipliers, generally match better which in turn improves the accuracy of each of the sub-iDACs and the $XD_iI_O$ multipliers and the matching between them in plurality of the sub-iDACs and the $XD_iI_O$ multipliers in one chip.

Eight, in AI & ML applications the output current of plurality of the $XD_iI_O$ multipliers could be coupled together and coupled to the input of iADCs. Generally and all else substantially equal, the larger the W/L size of a FET current source of the $XD_iI_O$ multipliers, the larger the capacitance of the $XD_iI_O$ multiplier's output port and the slower the of the $XD_iI_O$ multipliers output node. Moreover, the $XD_iI_O$ multiplier's output can capacitively load an iADC's input port which can also reduce the speed of the iADC right at its input port. As noted earlier, the multiple-channel data-converter method here enables decoupling the weight of a current source from the scaling of the sizes of FETs utilizing in forming the data-converter's reference current sources. By keeping each of the W/L sizes of the current source FETs the same at 1x and small for example (despite each of their binary weighted currents), the out node capacitances of the $XD_iI_O$ multipliers that feeds the input of the iADC can be kept small which can help speeds up the dynamic response of the iADC.

Ninth, there are no passive devices in the disclosed sub-iDACs and the $XD_iI_O$ multipliers, and as such there is no need for resistors or capacitors, which reduces manufacturing size and cost.

Tenth, the disclosed sub-iDACs and the $XD_iI_O$ multipliers utilize same type of MOSFET current sources and MOSFET switches which are symmetric and matched. Such arrangement facilitates device parameters to track each other over process-temperature-operation conditions variations. Accordingly, each of the data-coefficient, power supply coefficient, and AC power supply rejection performance can be enhanced and matched between the plurality of data-converters.

Eleventh, the disclosed embodiment enjoys the benefits of a second power supply desensitization (PSR) method, which helps eliminate a cascode FET from the scaled current reference sources which saves area and improves the dynamic response of the sub-iDAC and that of the meshed multiplier.

Twelfth, in an embodiment of the disclosed sub-iDACs and the $XD_iI_O$ multipliers that utilizes the multiple-channel data-converter method wherein the central RBN is trimmed or calibrated for accuracy, the accuracy of each of the plurality of data-converters, sub-iDACs, and the $XD_iI_O$ multipliers whose reference current network is biased from the same central RBN can be improved.

Thirteenth, in an embodiment of the sub-iDACs and the $XD_iI_O$ multipliers that utilizes multiple-channel data-converter method wherein the central RBN is desensitized from power supply variations (e.g., by utilizing the second power supply desensitization method or the second PSR method disclosed in FIG. 40 and FIG. 41), the power supply insensitivity of each of the plurality of data-converters whose reference current network is biased from the same central RBN can be improved.

Fourteenth, the disclosed embodiment enjoys the benefits of meshed digital-to-analog multiplication ($mD_iS_O$) method summarized in sections 32' and 33.

Fifteenth, the benefits of the sub-iDACs and the $XD_iI_O$ multipliers utilizing the multiple-channel data-converter method can be attained in other higher-order systems including but not limited to multiply-accumulate (MAC), and artificial-neural-network (ANN) that utilize the multiple-channel data-converter method.

Section 41—Description of FIG. 41

FIG. 41 is a simplified circuit schematic illustrating another embodiment of the digital-input to analog current output multiplier ($XD_iI_O$), which can be extended for applications requiring plurality of $XD_iI_O$ multipliers by sharing a central reference bias network (RBN) that bias the current reference network of each of the $XD_iI_O$ multipliers. The $XD_iI_{O_{41}}$ multiplier utilizes a pair of non-linear iDACs, namely $iNDAC_{P41}$ and $iNDAC_{Q41}$, which receive a sum and a difference of two digital words (X and Y) wherein for example P'=X+Y and Q'=X−Y. The outputs of the $iNDAC_{P41}$ and $iNDAC_{Q41}$ are then subtracted via $SUB_{41}$ circuit which generates a scaled multiplicand analog current of the multiplication on digital P' word and digital Q' words. Here, by subtracting the current outputs of $iNDAC_{P41}$ and $iNDAC_{Q41}$ a multiplicand 4X. Y can be generated, wherein the first $iNDAC_{P41}$ receives the sum of two digital words and generates $(X+Y)^2$ and the second $iNDAC_{Q41}$ receives the difference of the same two digital words and generates $(X-Y)^2$.

The $XD_iI_{O_{41}}$ multiplier utilizes the following circuit and methods disclosed earlier: (a) A $RBN_{41}$ circuit that utilizes the multiple-channel data-converter method disclosed in section 19, (b) a pair of $iNDAC_{P41}$ and $iNDAC_{Q41}$ that utilizes the second non-linear digital-to-analog converter or the NDAC method disclosed in section 36'. Each of $iNDAC_{P41}$ and $iNDAC_{Q41}$ are generally identical and similarly configured as the embodiment depicted in FIG. 39, except it does not use AND gate decoding; (c) The linear multiplication sections of $iNDAC_{P41}$ and $iNDAC_{Q41}$ are similar to the embodiments of FIG. 40 and FIG. 33, wherein the linear multiplication sections utilized the meshed digital-to-analog multiplication or $mD_iS_O$ method summarized in sections 32', and (d) the $PSR_{41}$ circuit is substantially similar to the second power desensitization circuit embodiment and method or PSR summarized in section 40.

The $RBN_{41}$ circuit generates the following reference bias voltages (bus) on diode connected NMOSFETs for mostly the linear sub-iDACs of $iNDAC_{P41}$ and $iNDAC_{Q41}$: $V_1$ via $V_{GS}$ of $N_1$ whose $I_D$ is set by $P_1$'s $I_D=1i_r$; $V_2$ via $V_{GS}$ of $N_2$ whose $I_D$ is set by $P_2$'s $I_D=2i_r$; $V_4$ via $V_{GS}$ of $N_4$ whose $I_D$ is set by $P_4$'s $I_D=4i_r$; $V_8$ via $V_{GS}$ of $N_8$ whose $I_D$ is set by $P_8$'s $I_D=8i_r$; $V_{16}$ via $V_{GS}$ of $N_{16}$ whose $I_D$ is set by $P_{16}$'s $I_D=16i_r$; $V_{32}$ via $V_{GS}$ of $N_{32}$ whose $I_D$ is set by $P_{32}$'s $I_D=32i_r$.

Additionally, the $RBN_{41}$ circuit generates the following reference bias voltages (bus) on diode connected NMOSFETs for mostly the non-linear iDACs of $iNDAC_{P41}$ and $iNDAC_{Q41}$ (e.g., iDACs whose input-output transfer functions approximates a square profile): $V_{24}$ via $V_{GS}$ of $N_{24}$ whose $I_D$ is set by $P_{24}$'s=$24i_r$; $V_{40}$ via $V_{GS}$ of $N_{40}$ whose $I_D$ is set by $P_{40}$'s $I_D=40i_r$; $V_{56}$ via $V_{GS}$ of $N_{56}$ whose $I_D$ is set by $P_{56}$'s $I_D=56i_r$; $V_{72}$ via $V_{GS}$ of $N_{72}$ whose $I_D$ is set by $P_{72}$'s $I_D=72i_r$; $V_{88}$ via $V_{GS}$ of $N_{88}$ whose $I_D$ is set by $P_{88}$'s $I_D=88i_r$; $V_{104}$ via $V_{GS}$ of $N_{104}$ whose $I_D$ is set by $P_{104}$'s $I_D=104i_r$.

Similar to the circuit in section 40 and illustrated in FIG. 40, also in the $PSR_{41}$ circuit here, the gate port of $Pd_{41}$ (through the loop comprised of $Nd_1$, $Nd_2$, $Pd_2$, and $Pd_3$ and $i_{r1}$) regulates the scaled current reference sources (e.g., $P_1$ through $P_{104}$) in order for the output currents of $iNDAC_{P41}$ and $iNDAC_{Q41}$ to be substantially desensitized to $V_{DD}$ variations.

The $SUB_{41}$ is a simple embodiment of a current mirror that can perform the subtraction of the outputs current signals of the $iNDAC_{P41}$ and the $iNDAC_{Q41}$ and generate the analog multiplicand current signal of $4I_{XY}$. Note that to arrange a MAC which requires the summation of a plurality of multiplication results, the output of plurality of pairs of non-linear multiplier's outputs (e.g., plurality of $iNDAC_{P41}$ and $iNDAC_{Q41}$) can be coupled to the opposite side of the same current mirror circuit. As such, the current mirror can perform the function of subtraction (needed for pairs of non-linear DACs to generate the multiplicand results) and the function of addition (needed in MAC) with one subtractor circuit and in one shot, which save area, helps speed, and improves accuracy.

Next, the different sections of $iNDAC_{P41}$ circuit is described in accordance with the partitioning of the second non-linear digital-to-analog converter or the NDAC method disclosed in section 36':

The first linear offset LSP iDAC section of $iNDAC_{P41}$ is a linear binary weighted iDAC whose current reference network is comprised of (NMOSFETs scaled with W/L of 1X) $N_{1P}$, $N_{2P}$, and $N_{3P}$ which operate at $I_D$ of $1i_r$, $2i_r$, and $4i_r$, respectively. The current switches $N_{1P_f}$, $N_{2P_f}$, and $N_{3P_f}$ are controlled by the Least-Significant-Bit (LSB) bank word (e.g., $P'_1$, $P'_2$, and $P'_3$ bits) which respectively steer the reference currents $1i_r$, $2i_r$, and $4i_r$ to the output port of the $iNDAC_{P41}$.

The linear multiplication section of $iNDAC_{P41}$ utilizes the meshed digital-to-analog multiplication or $mD_iS_O$ method summarized in sections 32', which is described next:

As described earlier, the linear multiplication section that utilizes the meshed multiplication in $iNDAC_{P41}$ is also arranged with a plurality of scaled reference current signals proportional to $ir_{40}$ (that utilize NMOSFETs that are each scaled with W/L of 1X) comprising of 3 banks namely: The first scaled reference current bank is comprised of $I_D=2i_r$ through $N_{4P}$, $I_D=4i_r$ through $N_{5P}$, and $I_D=8i_r$ through $N_{6P}$. The second scaled reference current bank is comprised of $I_D=4i_r$ through $N_{7P}$, $I_D=8i_r$ through $N_{8P}$, and $I_D=816$ through $N_{9P}$. The third scaled reference current bank is comprised of $I_D=8i_r$ through $N_{10P}$, $I_D=16i_r$ through $N_{11P}$, and $I_D=32i_r$ through $N_{12P}$.

A first MSP sub-iDAC utilized in the meshed multiplication section of $iNDAC_{P41}$ receives the first scaled reference bank (i.e., $2i_r$, $4i_r$, and $8i_r$) at its current switch inputs that are the source-nodes of $N_{4p}$ and $N_{4p'}$ and $N_{4p''}$. These current switches are controlled by $P'_4$ bit. Accordingly, each of $2i_r$, $4i_r$, and $8i_r$ currents, which are gated by the $P'_4$ bit, are respectively steered through current switches $N_{4p}$ and $N_{4p'}$ and $N_{4p''}$ to provide the scaled reference input currents to the first LSP sub-iDAC. Next, the said first LSP sub-iDAC reference currents are steered through current switches $N_{1p}$ and $N_{2p}$ and $N_{3p}$ that are controlled by the first LSP sub-iDAC's digital inputs $P'_1$, $P'_2$, and $P'_3$ bits, respectively. The output of current switches $N_{1p}$ and $N_{2p}$ and $N_{3p}$ are summed together and coupled to the output port of the $iNDAC_{P41}$.

Similarly, a second MSP sub-iDAC utilized in the meshed multiplication section of $iNDAC_{P41}$ receives the second scaled reference bank (i.e., $4i_r$, $8i_r$, and $16i_r$) at its current switch inputs that are the source-nodes of $N_{5p}$ and $N_{5p'}$ and $N_{5p''}$. These current switches are controlled by $P'_5$ bit. Accordingly, each of $4i_r$, $8i_r$, and $16i_r$ currents, which are gated by the $P'_5$ bit, are respectively steered through current switches $N_{5p}$ and $N_{5p'}$ and $N_{5p''}$ to provide the scaled reference input currents to the first LSP sub-iDAC. Next, the said first LSP sub-iDAC reference currents are steered through current switches $N_{1p'}$ and $N_{2p'}$ and $N_{3p'}$ that are controlled by the first LSP sub-iDAC's digital inputs $P'_1$, $P'_2$, and $P'_3$ bits, respectively. The output of current switches $N_{1p'}$ and $N_{2p'}$ and $N_{3p'}$ are summed together and coupled to the output port of the $iNDAC_{P41}$.

Furthermore, a third MSP sub-iDAC utilized in the meshed multiplication section of $iNDAC_{P41}$ receives the second scaled reference bank (i.e., $8i_r$, $16i_r$, and $32i_r$) at its current switch inputs that are the source-nodes of $N_{6p}$ and $N_{6p'}$ and $N_{6p''}$. These current switches are controlled by $P'_6$ bit. Accordingly, each of $4i_r$, $8i_r$, and $16i_r$ currents, which are gated by the $P'_6$ bit, are respectively steered through current switches $N_{6p}$ and $N_{6p'}$ and $N_{6p''}$ to provide the scaled reference input currents to the first LSP sub-iDAC. Next, the said first LSP sub-iDAC reference currents are steered through current switches $N_{1p''}$ and $N_{2p''}$ and $N_{3p''}$ that are controlled by the first LSP sub-iDAC's digital inputs $P'_1$, $P'_2$, and $P'_3$ bits, respectively. The output of current switches $N_{1p''}$ and $N_{2p''}$ and $N_{3p''}$ are summed together and coupled to the output port of the $iNDAC_{P41}$.

The non-linear MSP iDAC section of the $iNDAC_{P41}$ is arranged as a non-linear (e.g., to approximate a square transfer function) thermometer iDAC. Here, the non-linear thermometer reference current network is comprised of NMOSFETs that are scaled with W/L of 1x, namely $N_{13P}$ through $N_{19P}$. The gate-ports $N_{13P}$ through $N_{19P}$) are respectively coupled to the reference network voltage bus $V_8$, $V_{24}$, $V_{40}$, $V_{56}$, $V_{72}$, $V_{88}$, and $V_{104}$, which are supplied from $RBN_{41}$ circuit. The drain currents of $N_{13P}$ through $N_{19P}$ are scaled to $8i_r$, $24i_r$, $40i_r$, $56i_r$, $72i_r$, $88i_r$, and $104i_r$ wherein $i_r$ is programmed by $Ir_1$. By inputting the proper polarity of the MSB bank word ($xP'_6$, $xP'_5$, and $xP'_4$) to a 3-bit input to 7-bit output digital encoder ($ENC_P$), a 7-bit digital word is generated. The 7-bit output word of $ENC_P$ control the NMOSFET current switches comprising of $N_{t1p}$, $N_{t2p}$, $N_{t3p}$, $N_{t4p}$, $N_{t5p}$, $N_{t6p}$, and $N_{t7p}$ whose inputs are couple to their respective non-linear current source segments (e.g., $8i_r$, $24i_r$, $40i_r$, $56i_r$, $72i_r$, $88i_r$, and $104i_r$) of the respective non-linear thermometer reference current network. As such, the current switches control the steering of the non-linear current source segments onto the outputs of the said current switches which are coupled together at the output node of the $iNDAC_{P41}$.

The $iNDAC_{Q41}$ is arranged and operates the same as $iNDAC_{P41}$.

As noted earlier, an analog multiplicand current signal of 4X. Y can be generated by (setting P'=X+Y and Q'=X−Y and) inputting the proper polarity of P' and Q' into the digital input ports of $iNDAC_{P41}$ and $iNDAC_{Q41}$, and then subtracting the outputs of $iNDAC_{P41}$ and $iNDAC_{Q41}$ via $SUB_{41}$. Bear in mind that as such, the $iNDAC_{P41}$ receives the sum of two digital words and generates $(X+Y)^2$ and the $iNDAC_{Q41}$ receives the difference of the same two digital words and generates $(X-Y)^2$ and the $(X+Y)^2-(X-Y)^2=4XY$.

In conclusion, some of the benefits of the $XD_iI_O$ multiplier embodiment disclosed in FIG. 41 are as follows:

First, the disclosed embodiment benefits from operating in current mode that has been discussed in this disclosure Second, the dynamic response of $XD_iI_O$ multiplier is fast also in part because the scaled reference network banks are constant current sources whose current are steered by single MOFET switches which are inherently fast.

Third, current mirror loop associated with conventional multiplying iDACs (where a first iDAC's output signal supplies the reference signal to a second iDAC, generally through a current mirror) is avoided which reduces die size and helps improve dynamic response.

Fourth, the minimum power supply can be lowered since it is chiefly limited by the drain-to-source voltage of current sources of the scaled reference network.

Fifth, the disclosed embodiment of $XD_iI_{O_{41}}$ multiplier enjoys the benefits of the $RBN_{41}$ circuit that utilizes the multiple-channel data-converter method disclosed in section 19.

Sixth, the disclosed embodiment of $XD_iI_{O_{41}}$ multiplier enjoys the benefits of the pair of $iNDAC_{P41}$ and $iNDAC_{Q41}$ that utilizes the second non-linear digital-to-analog converter method disclosed in section 36'.

Seventh, the disclosed embodiment of $XD_iI_{O_{41}}$ multiplier enjoys the benefits of $iNDAC_{P41}$ and $iNDAC_{Q41}$ which are similarly configured to the embodiment disclosed in section 39.

Eight, the disclosed embodiment of $XD_iI_{O_{41}}$ multiplier enjoys the benefits of the linear multiplication sections of $iNDAC_{P41}$ and $iNDAC_{Q41}$ which are similar to the embodiments disclosed in sections 40 and 33, wherein the linear multiplication sections utilized the meshed digital-to-analog multiplication method summarized in sections 32', and Ninth, the disclosed embodiment of $XD_iI_{O_{41}}$ multiplier enjoys the benefits of the $PSR_{41}$ circuit that is substantially similar to the second power desensitization circuit embodiment and method summarized in section 40.

An inherent benefit of the disclosed embodiment of $XD_iI_{O_{41}}$ multiplier is that since both digital inputs to the $XD_iI_{O_{41}}$ multiplier (e.g., x+y and x−y) are squared and subsequently the $(x+y)^2$ term and the $(x-y)^2$ term are subtracted from one another, the 4xy multiplicand result can be bi-directional which is beneficial for multi-quadrant signal processing.

Section 42—Description of FIG. 42

FIG. 42 is a SPICE circuit simulations that illustrates the linearity error in % between an ideal output current ($Io_{ideal}$) of a $XD_iI_O$ versus the simulated output current ($Io_{simulation}$) of a $XD_iI_O$ that is arranged similar to that of FIG. 34 but with a 4-bit resolution.

Keeping in mind that 4-bit of resolution computes to about 6% of accuracy, FIG. 42 indicates DNL (differential non-linearity) and INL (integral non-linearity) of less than about ±3%. The X and Y digital input words span in the opposite direction, between zero and full scale, while stepping the digital words with one LSB increments each 1 micro-seconds (μs). The lower graph in FIG. 42 indicates a power consumption of less than about 80 nano-ampere.

Figure 43:
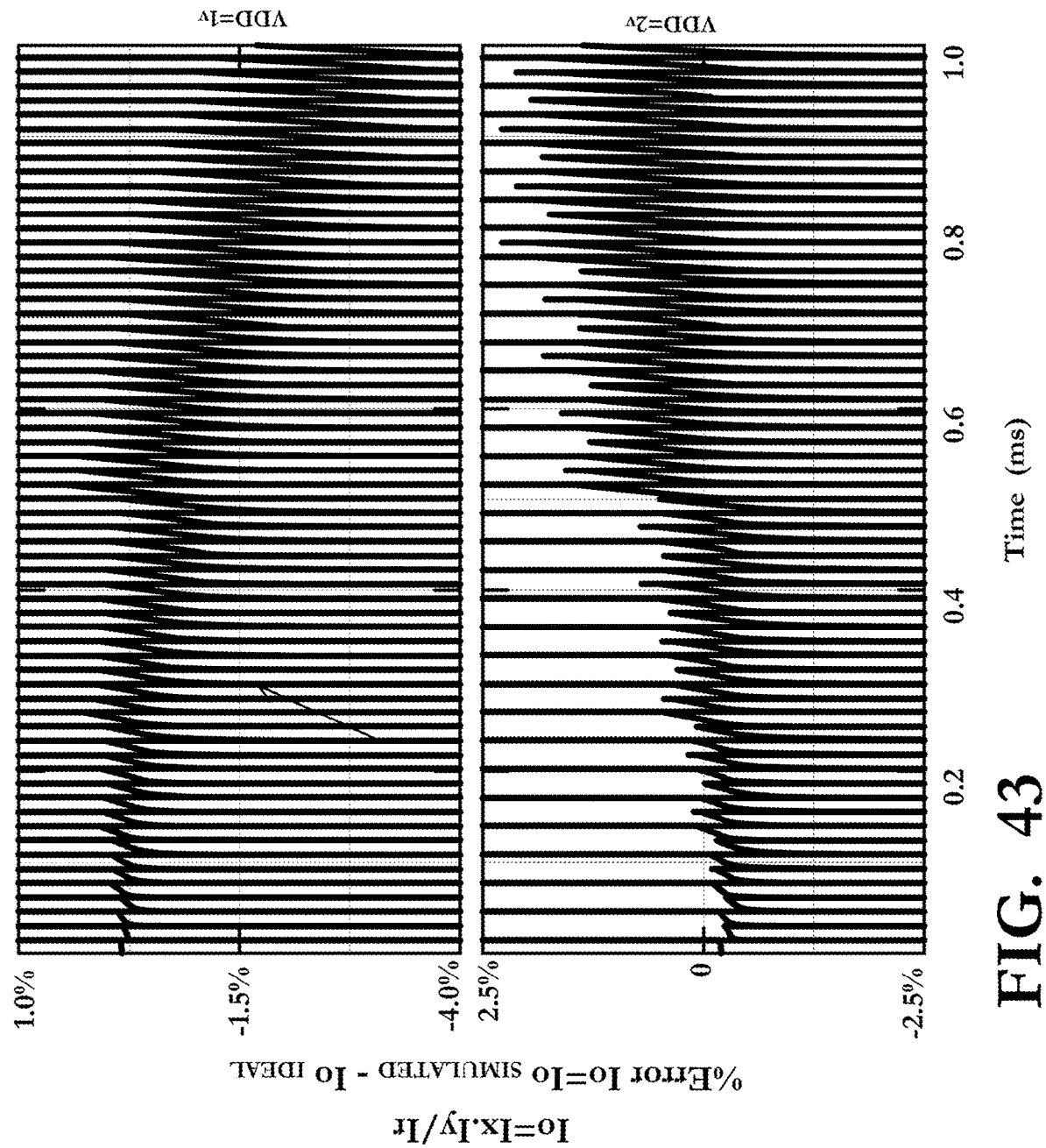
FIG. 43 is a SPICE circuit simulations that illustrates the linearity error in % between an ideal output current (Io$_{ideal}$) of a XD$_i$I$_o$ multiplier versus the simulated output current (Io$_{simulation}$) of a XD$_i$I$_o$ multiplier that is arranged similar to that of FIG. 40 but with a 6-bit resolution.

Section 43—Description of FIG. 43

FIG. 43 is a SPICE circuit simulations that illustrates the linearity error in % between an ideal output current $Io_{ideal}$) of a $XD_iI_O$ versus the simulated output current ($Io_{simulation}$) of a $XD_iI_O$ multiplier that is arranged similar to that of FIG. 40 but with a 6-bit resolution.

As noted, the $XD_iI_O$ multiplier of FIG. 43 is inputted with an 6-bit (X-word digital input) by an 6-bit (Y-word digital input) wherein the X and Y digital input words are ramped in the same direction between zero-scale to full scale. Here, the linearity of $XD_iI_O$ is illustrated for power supply $V_{DD}$=2V (in the lower waveform of FIG. 43) and $V_{DD}$=2V (in the upper waveform of FIG. 43).

Keeping in mind that 6-bit of resolution computes to about 1.6% of accuracy, FIG. 43 indicates DNL (differential non-linearity), INL (integral non-linearity), and GE (gain-error) of less than about ±1.6% for $V_{DD}$ between 1V to 2V. By utilizing the multiplier power supply desensitization method combined with the multiple-channel iDAC method in a $XD_iI_O$, FIG. 43 indicates that the $XD_iI_O$ is substantially desensitized from power supply variations.

Figure 44:
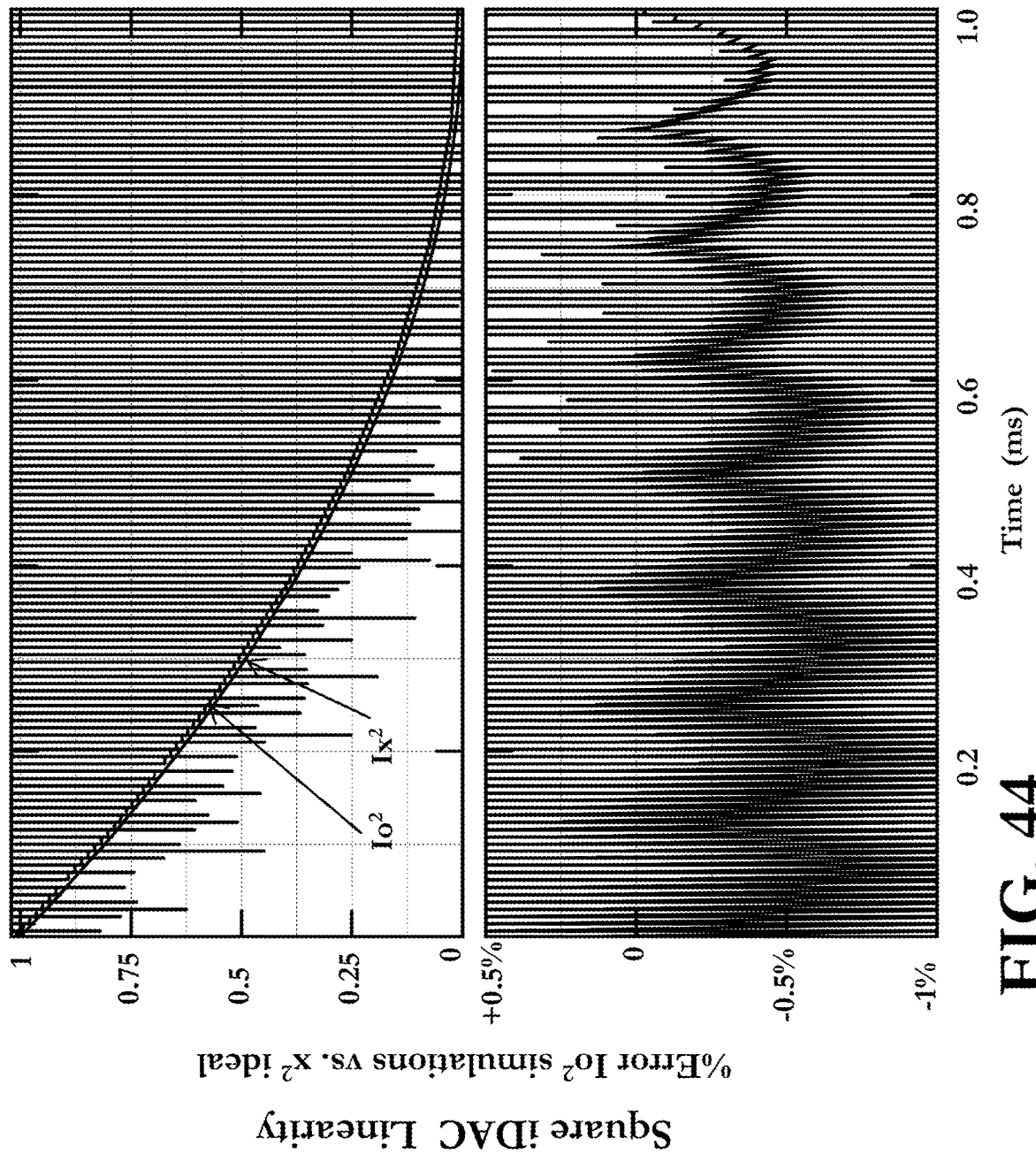
FIG. 44 illustrates a SPICE circuit simulations comprising of an ideal square iDAC's output current (I$_x^2$) plot versus the simulated output current (I$_o^2$) plot of a square iDAC that is arranged similar to that of FIG. 38 but with a 7-bit resolution.

Section 44—Description of FIG. 44

FIG. 44 illustrates SPICE circuit simulations comprising of an ideal square iDAC's output current (IX) plot versus the simulated output current ($I_O^2$) plot of a square iDAC that is arranged similar to that of FIG. 38 but with a 7-bit resolution.

Keeping in mind that 7-bit of resolution computes to about 0.8% of accuracy, the lower graph in FIG. 44 indicates a % error between IX and to indicating less than about ±0.8% error in DNL (differential non-linearity) and INL (integral non-linearity). The X and Y digital input words span in the same direction, between full scale and zero. The upper graph in FIG. 44 is a plot of the square iDAC's I° output current simulation versus that of an ideal square iDAC (offset by a few % for clarity of the illustration).

Figure 45:
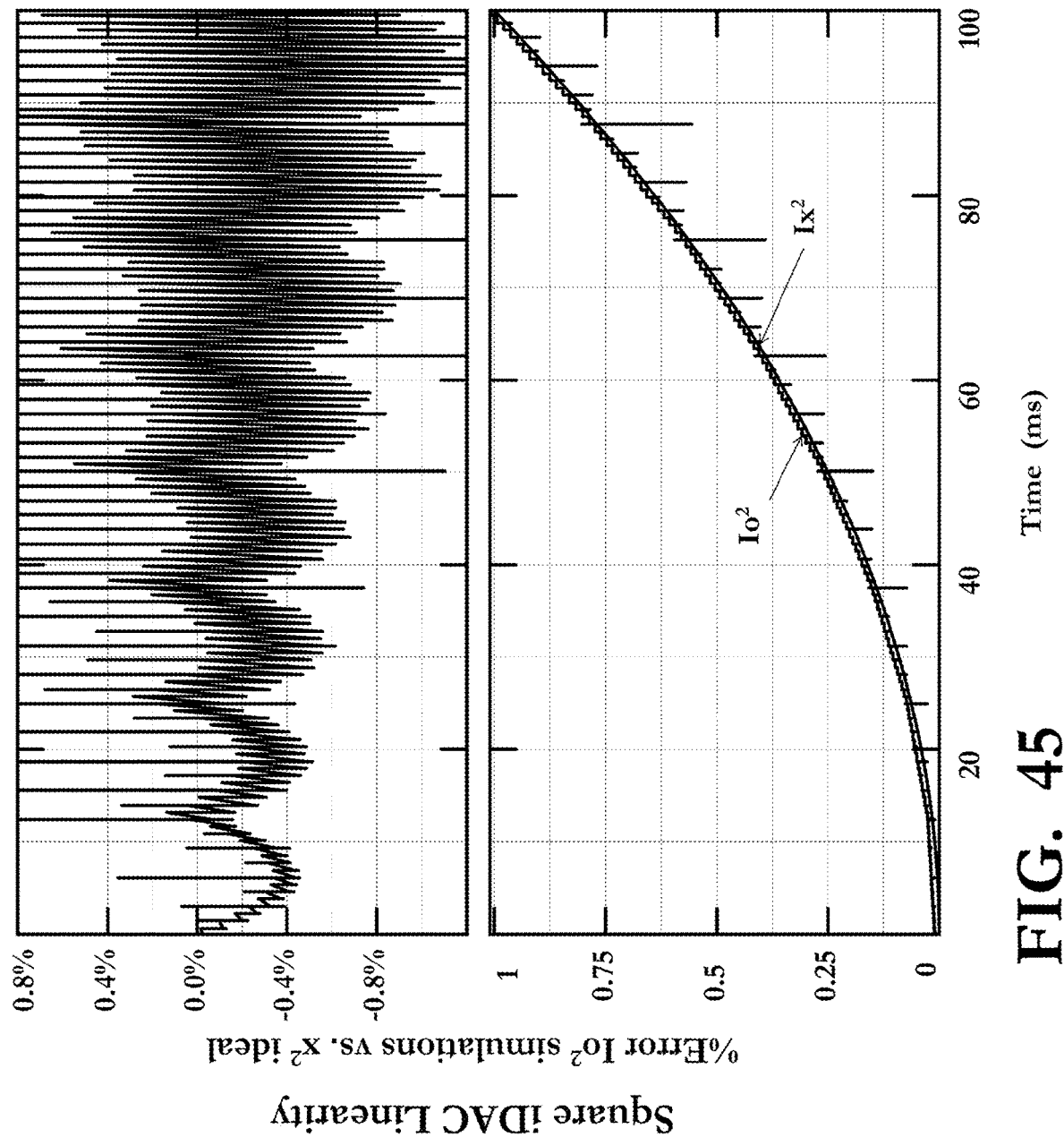
FIG. 45 illustrates SPICE circuit simulations comprising of an ideal square iDAC's output current (I$_x^2$) plot versus the simulated output current (I$_o^2$) plot of a square iDAC that is arranged similar to that of FIG. 39 but with a 7-bit resolution.

Section 45—Description of FIG. 45

FIG. 45 illustrates SPICE circuit simulations comprising of an ideal square iDAC's output current ($I_X^2$) plot versus the simulated output current ($I_O^2$) plot of a square iDAC that is arranged similar to that of FIG. 39 but with a 7-bit resolution.

Keeping in mind that 7-bit of resolution computes to about 0.8% of accuracy, the upper graph in FIG. 45 indicates a % error between $I_X^2$ and $I_O^2$ indicating less than about ±0.8% error in DNL (differential non-linearity) and INL (integral non-linearity). The X and Y digital input words span in the same direction, between zero and full scale. The lower graph in FIG. 44 is a plot of the square iDAC's $I_o$ output current simulation versus that of an ideal square iDAC (offset by a few % for clarity of the illustration).

Figure 46:
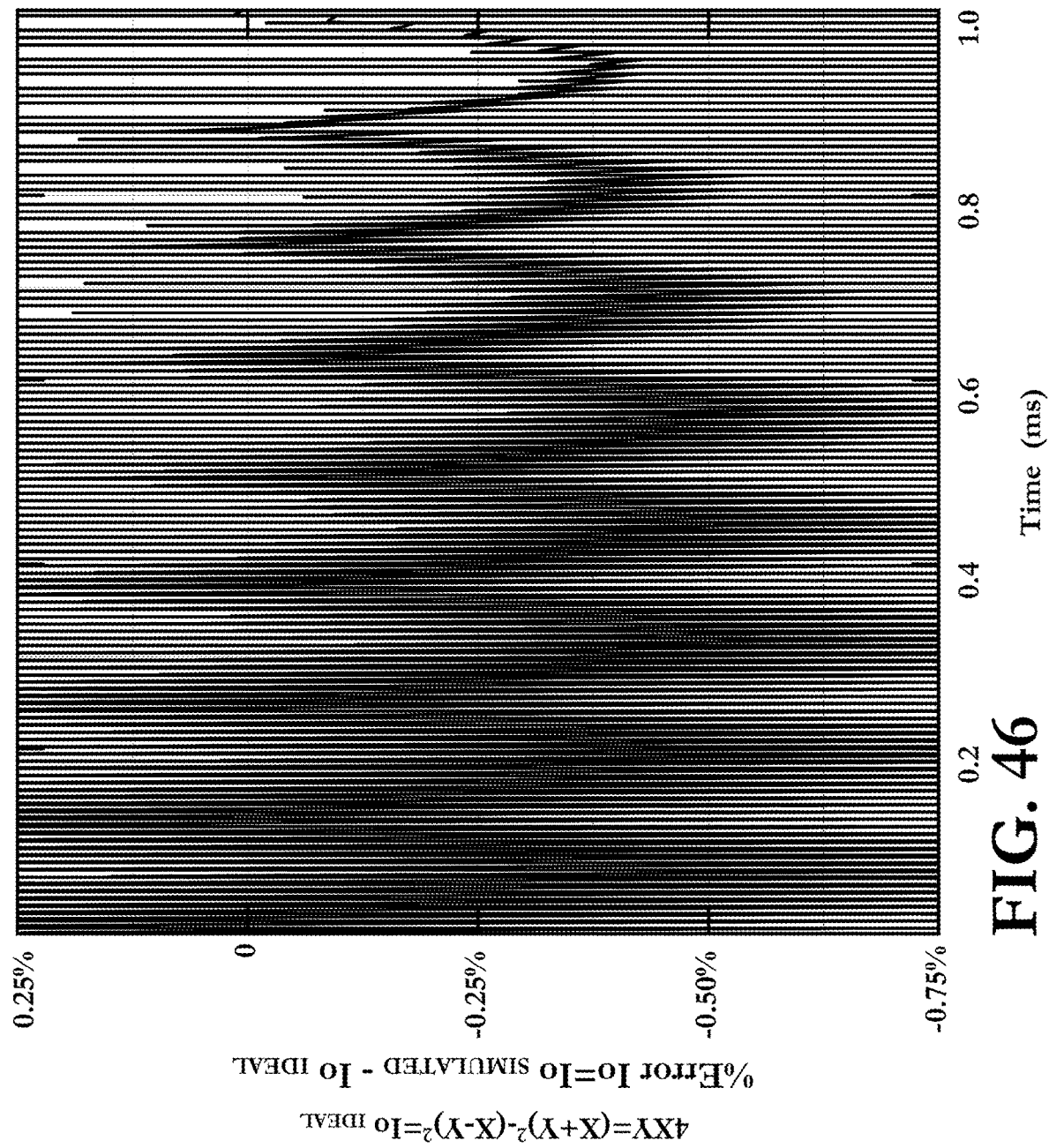
FIG. 46 illustrates SPICE circuit simulations comprising of an ideal XD$_i$I$_o$ multiplier's output current (Io$_{ideal}$) plot versus the simulated output current (Io$_{simulation}$) plot of a XD$_i$I$_o$ multiplier that is arranged similar to that of FIG. 41 but with a 7-bit resolution.

Section 46—Description of FIG. 46

FIG. 46 illustrates SPICE circuit simulations comprising of an ideal $XD_iI_O$'s output current ($IO_{ideal}$) plot versus the simulated output current ($Io_{simulation}$) plot of a $XD_iI_O$ multiplier that is arranged similar to that of FIG. 41 but with a 7-bit resolution. As a reminder the $XD_iI_O$ multiplier utilizes iDACs whose transfer functions follows an approximate square transfer function. Also, note that $Io_{ideal}=((x+y)^2-(x-y)^2)=4xy$ As noted, the $XD_iI_O$ multiplier of FIG. 41 is inputted with a 7-bit (X+Y) and a 7-bit (X−Y) digital words, wherein X and Y digital words are ramped in the same direction between zero-scale to full scale.

Keeping in mind that 7-bit of resolution computes to about 0.8% of accuracy, FIG. 46 indicates DNL (differential non-linearity) and INL (integral non-linearity) of less than about ±0.8%.

What is claimed:

1. A non-linear digital-to-analog conversion (NDAC) method in an integrated circuit, the method comprising:
   generating a non-linear Most-Significant-Portion (MSP) analog output signal ($So_{MSP}^N$) that is proportional to a MSP reference signal ($Sr_{MSP}$), and is responsive to a bank of Most-Significant-Bits (MSBs) of a digital input word ($Di_{MSP}$);
   generating a linear Least-Significant-Portion (LSP) analog output signal ($So_{LSP}^L$) that is proportional to a LSP reference signal ($Sr_{LSP}$), and is responsive to a bank of Least-Significant-Bits (LSBs) of a digital word ($Di_{LSP}$), and is responsive to the $Di_{MSP}$ word;
   combining the $So_{MPS}^N$ signal and the $So_{LSP}^L$ signal to generate a non-linear analog output signal ($So_N$) that is proportional to a reference signal ($S_R$), and is responsive to a digital word ($D_I$),
   wherein the $So_{LSP}^L$ signal is a straight-line approximation between non-linear segments of the ($So_{MSP}^N$) signal;
   wherein the $Sr_{MSP}$ signal, and the $Sr_{LSP}$ signal, are each proportional to the $S_R$ signal; and
   wherein the $D_I$ word is comprised of the $Di_{MSP}$ word and the $Di_{LSP}$ word;
   generating the $So_{LSP}^L$ signal by a plurality of linear LSP Digital-to-Analog Converters ($DAC_{LSP}^L$)s comprised of a first linear LSP DAC ($DAC1_{LSP}^L$), and a second linear LSP DAC ($DAC2_{LSP}^L$);
   generating an output signal ($So1_{LSP}^L$) by the $DAC1_{LSP}^L$ that is proportional to a first LSP reference signal ($Sr1_{LSP}$), and is responsive to the $Di_{MSP}$ word;
   combining the $So1_{LSP}^L$ signal with a reference offset signal ($Sr_{OFS}$) to generate a second reference signal ($Sr2_{LSP}^L$);
   receiving the $Sr2_{LSP}^L$ signal into a reference input port ($Ar2_{LSP}^L$) of the $DAC2_{LSP}^L$; and
   generating the $So_{LSP}^L$ signal at an output port ($Ao2_{LSP}^L$) of the $DAC2_{LSP}^L$ that is responsive to the $Di_{LSP}$ word and the $Di_{MSP}$ word.

2. A non-linear digital-to-analog conversion (NDAC) method in an integrated circuit, the method comprising:
   generating a non-linear Most-Significant-Portion (MSP) analog output signal ($So_{MSP}^N$) that is proportional to a MSP reference signal ($Sr_{MSP}$), and is responsive to a bank of Most-Significant-Bits (MSBs) of a digital input word ($Di_{MSP}$);
   generating a linear Least-Significant-Portion (LSP) analog output signal ($So_{LSP}^L$) that is proportional to a LSP reference signal ($Sr_{LSP}$), and is responsive to a bank of Least-Significant-Bits (LSBs) of a digital word ($Di_{LSP}$), and is responsive to the $Di_{MSP}$ word;
   combining the $So_{MPS}^N$ signal and the $So_{LSP}^L$ signal to generate a non-linear analog output signal ($So_N$) that is proportional to a reference signal ($S_R$), and is responsive to a digital word ($D_I$);
   wherein the $So_{LSP}^L$ signal is a straight-line approximation between non-linear segments of the ($So_{MSP}^N$) signal;
   wherein the $Sr_{MSP}$ signal, and the $Sr_{LSP}$ signal, are each proportional to the $S_R$ signal; and wherein the $D_I$ word is comprised of the $Di_{MSP}$ word and the $Di_{LSP}$ word;
   multiplying the $Di_{LSP}$ word and the $Di_{MSP}$ word to generate a multiplicand digital word ($Di_{LSP} \times Di_{MSP}$);
   generating an output signal ($So1_{LSP}^L$) by a first LSP Digital-to-Analog Converter ($DAC1_{LSP}^L$), wherein the $So1_{LSP}^L$ signal is proportional to a first LSP reference signal ($Sr1_{LSP}$), and is responsive to the $Di_{LSP} \times Di_{MSP}$ word;
   generating an output offset signal ($Sfo_{LSP}^L$) by a second LSP Digital-to-Analog-Converter ($DAC2_{LSP}^L$), wherein $Sfo_{LSP}^L$ signal is proportional to a second LSP reference signal ($Sr2_{LSP}$), and is responsive to the $Di_{LSP}$ word; and
   combining the $So1_{LSP}^L$ signal and the $Sfo_{LSP}^L$ signal to generate the $So_{LSP}^L$ signal.

3. A non-linear digital-to-analog conversion (NDAC) method in an integrated circuit, the method comprising:
   generating a non-linear Most-Significant-Portion (MSP) analog output signal ($So_{MSP}^N$) that is proportional to a MSP reference signal ($Sr_{MSP}$), and is responsive to a bank of Most-Significant-Bits (MSBs) of a digital input word ($Di_{MSP}$);
   generating a linear Least-Significant-Portion (LSP) analog output signal ($So_{LSP}^L$) that is proportional to a LSP reference signal ($Sr_{LSP}$), and is responsive to a bank of Least-Significant-Bits (LSBs) of a digital word ($Di_{LSP}$), and is responsive to the $Di_{MSP}$ word;
   combining the $So_{MPS}^N$ signal and the $So_{LSP}^L$ signal to generate a non-linear analog output signal ($So_N$) that is proportional to a reference signal ($S_R$), and is responsive to a digital word ($D_I$);
   wherein the $So_{LSP}^L$ signal is a straight-line approximation between non-linear segments of the ($So_{MSP}^N$) signal;
   wherein the $Sr_{MSP}$ signal, and the $Sr_{LSP}$ signal, are each proportional to the $S_R$ signal; and wherein the $D_I$ word is comprised of the $Di_{MSP}$ word and the $Di_{LSP}$ word;
   receiving the $Di_{LSP}$ word and the $Di_{MSP}$ word into a linearly meshed digital-input to analog-output multiplier ($mDiSo_{LSP}^L$) to generate an output signal ($So1_{LSP}^L$) that is proportional to a first LSP reference signal ($Sr1_{LSP}$);
   generating an output offset signal ($Sfo_{LSP}^L$) by a second LSP Digital-to-Analog-Converter ($DAC2_{LSP}^L$) that is proportional to a second LSP reference signal ($Sr2_{LSP}$), and is responsive to the $Di_{LSP}$ word; and combining $So1_{LSP}{}^L$ signal and the $Sfo_{LSP}{}^L$ signal to generated the $So_{LSP}{}^L$ signal.

4. A non-linear digital-to-analog conversion (NDAC) method in an integrated circuit, the method comprising:

generating a non-linear Most-Significant-Portion (MSP) analog output signal ($So_{MSP}{}^N$) that is proportional to a MSP reference signal ($Sr_{MSP}$), and is responsive to a bank of Most-Significant-Bits (MSBs) of a digital input word ($Di_{MSP}$);

generating a linear Least-Significant-Portion (LSP) analog output signal ($So_{LSP}{}^L$) that is proportional to a LSP reference signal ($Sr_{LSP}$), and is responsive to a bank of Least-Significant-Bits (LSBs) of a digital word ($Di_{LSP}$), and is responsive to the $Di_{MSP}$ word;

combining the $So_{MPS}{}^N$ signal and the $So_{LSP}{}^L$ signal to generate a non-linear analog output signal ($So_N$) that is proportional to a reference signal ($S_R$), and is responsive to a digital word ($D_I$), wherein the $So_{LSP}{}^L$ signal is a straight-line approximation between non-linear segments of the ($So_{MSP}{}^N$) signal;

wherein the $Sr_{MSP}$ signal, and the $Sr_{LSP}$ signal, are each proportional to the $S_R$ signal; and wherein the $D_I$ word is comprised of the $Di_{MSP}$ word and the $Di_{LSP}$ word;

generating at least one ($So_{MSP}{}^N$) by at least one non-linear MSP Digital-to-Analog Converter ($DAC_{MSP}{}^N$);

generating at least one $So_{LSP}{}^L$ by at least one linear LSP Digital-to-Analog Converter ($DAC_{LSP}{}^L$);

generating at least one $So_N$ signal that is proportional to the reference signal ($S_R$), wherein the at least one $So_N$ signal is responsive to at least one $D_i$ word;

wherein the reference network of each of the $DAC_{MSP}{}^N$ is comprised of a sequence of non-linearly scaled MSP reference signals ($Sr_{MSP}{}^N$) that are proportional to the $Sr_{MSP}$ signal;

wherein the reference network of each of the $DAC_{LSP}{}^L$ is comprised of a sequence of scaled LSP reference signals ($Sr_{LSP}{}^L$) that are proportional to the $Sr_{LSP}$ signal;

wherein each of the sequence of $Sr_{MSP}{}^N$ signals is at least one of squarely weighted, logarithmically weighted, non-linearly weighted, and individually weighted;

wherein each of the sequence of $Sr_{LSP}{}^L$ signals is at least one of binary weighted, linearly weighted, and individually weighted; and wherein each of the sequence of $Sr_{MSP}{}^N$ signals and each of the sequence of $Sr_{LSP}{}^L$ signals are biased from a common reference bias network (RBN).

5. The non-linear digital-to-analog conversion (NDAC) method in an integrated circuit of claim 4, the method further comprising:

wherein a plurality of the at least one $So_N$ signal has a square profile;

wherein a p-channel $So_N$ signal, of the plurality of $So_N$ signals, is responsive to a p-channel D word;

wherein a q-channel $So_N$ signal, of the plurality of $So_N$ signals, is responsive to a q-channel D word;

wherein the p-channel $So_N$ and the q-channel $So_N$ signals are subtracted from one another to generate a scaled $So_{xy}$ signal;

wherein the p-channel D word is comprised of a scaled X digital word and a scaled Y digital word that are added to one another;

wherein the q-channel D word is comprised of a scaled Y digital word and a scaled Y digital word that are subtracted from one another; and wherein the scaled $So_{XY}$ signal is proportional to the $S_R$, and is an analog representation of a scaled multiplication product of the scaled X digital word and the scaled Y digital word.

6. A non-linear digital-to-analog converter (NDAC) system in an integrated circuit, the system comprising:

a first non-linear Digital-to-Analog-Converter ($DAC_{QM}$), the $DAC_{QM}$ comprised of a digital input port ($D_{QM}$), an analog output port ($Ao_{QM}$), and an analog reference input port ($Ar_{QM}$);

a first linear Digital-to-Analog-Converter ($DAC_{1L}$), the $DAC_{1L}$ comprised of a digital input port ($D_{1L}$), an analog output port ($Ao_{1L}$), and an analog reference input port ($Ar_{1L}$);

a second linear Digital-to-Analog-Converter ($DAC_{2L}$), the $DAC_{2L}$ comprised of a digital input port ($D_{2L}$), an analog output port ($Ao_{2L}$), and an analog reference input port ($Ar_{2L}$);

a digital input word (D) comprised of a Most-Significant-Bits (MSB)s bank word ($D_{MSP}$), and a Least-Significant-Bits (LSB)s bank word ($D_{LSP}$);

a digital multiplier ($X_{ML}$), the $X_{ML}$ comprised of an M input digital word port (M), an N input digital word port (N), and an output digital word port (M×N);

the M port for receiving the $D_{MSP}$ bank word;

the N port for receiving the $D_{LSP}$ bank word;

the $D_{1L}$ port coupled to the output digital word port M×N;

the $D_{2L}$ port coupled to the digital word N port;

the $D_{QM}$ port coupled to the digital word M port;

wherein the $Ar_{QM}$ port for receiving a first reference signal ($Sr_{QM}$);

wherein the $Ar_{1L}$ port for receiving a second reference signal ($Sr_{1L}$);

wherein the $Ar_{2L}$ port for receiving a third reference signal ($Sr_{2L}$);

wherein a sum of signals at the $Ao_{1L}$ and $Ao_{2L}$ ports is a straight-line approximation between non-linear segments of a signal at the $Ao_{QM}$ port;

wherein a sum of signals at the $Ao_{QM}$, $Ao_{1L}$, and $Ao_{2L}$ ports generates a non-linear analog output signal ($So_N$) at an analog output port $Ao_N$;

wherein an analog reference signal ($S_R$) is proportionally scaled to the $Sr_{QM}$, the $Sr_{1L}$, and the $Sr_{2L}$ signals;

wherein a sequence of non-linear reference signals ($Sr_{MSP}{}^N$), which form a transfer function of the $DAC_{QM}$, are proportional to the $S_R$ signal;

wherein the sequence of $Sr_{MSP}{}^N$ signals are at least one of squarely weighted, logarithmically weighted, non-linearly weighted, and individually weighted;

wherein a sequence of linear reference signals ($Sr_{LSP}{}^L$), which form a transfer function of the $DAC_{1L}$ and $DAC_{2L}$, are proportional to the $S_R$ signal;

wherein the sequence of $Sr_{LSP}{}^L$ signals are at least one of binary weighted, linearly weighted, and individually weighted; and wherein the $So_N$ signal substantially follows one of a square, logarithmic, and non-linear profile, is proportional to the $S_R$ signal, and responsive to the D word.

7. The non-linear digital-to-analog converter (NDAC) system in an integrated circuit of claim 6, the system further comprising:

wherein the sequence of $Sr_{MSP}{}^N$ signals, and the sequence of $Sr_{LSP}{}^L$ signals, are biased from a common reference bias network (RBN).

8. The non-linear digital-to-analog converter (NDAC) system in an integrated circuit of claim 6, the system further comprising:

wherein a plurality of $So_N$ signals following a square profile;

wherein a p-channel $So_N$ signal, of the plurality of $So_N$ signals, is responsive to a p-channel D word;

wherein a q-channel $So_N$ signal, of the plurality of $So_N$ signals, is responsive to a q-channel D word;

wherein the p-channel $So_N$ and the q-channel $So_N$ signals are subtracted from one another to generate a scaled $So_{xy}$ signal;

wherein the p-channel D word is comprised of a scaled X digital word and a scaled Y digital word that are added to one another;

wherein the q-channel D word is comprised of a scaled Y digital word and a scaled Y digital word that are subtracted from one another; and wherein the scaled $So_{xy}$ signal is proportional to the $S_R$, and is an analog representation of a scaled multiplication product of the scaled X digital word and the scaled Y digital word.

9. The non-linear digital-to-analog converter (NDAC) system in an integrated circuit of claim 6, the system further comprising:

the $Ao_{QM}$ port, $Ao_{1L}$ port, and $Ao_{2L}$ port are coupled to an output port $Ao_Q$; and wherein the $DAC_{QM}$, $DAC_{1L}$, and $DAC_{2L}$ operate in current mode.

10. A non-linear digital-to-analog converter (NDAC) system in an integrated circuit, the system comprising:

a first non-linear digital-to-analog-converter ($DAC_{QM}$), the $DAC_{QM}$ comprised of a digital input port ($D_{QM}$), an analog output port ($Ao_{QM}$), and an analog reference input port ($Ar_{QM}$);

a first linear digital-to-analog-converter ($DAC_{1L}$), the $DAC_{1L}$ comprised of a digital input port ($D_{1L}$), an analog output port ($Ao_{1L}$), and an analog reference input port ($Ar_{1L}$);

a second linear digital-to-analog-converter ($DAC_{2L}$), the $DAC_{2L}$ comprised of a digital input port ($D_{2L}$), an analog output port ($Ao_{2L}$), and an analog reference input port ($Ar_{2L}$);

a digital input word (D) comprised of a Most-Significant-Bits (MSB)s bank word ($D_{MSP}$) and a Least-Significant-Bits (LSB)s bank word ($D_{LSP}$);

an MSB bank port (M) for receiving the $D_{MSP}$ word;

an LSB bank port (N) for receiving the $D_{LSP}$ word;

the $D_{1L}$ port coupled to the M port;

the $D_{2L}$ port coupled to the N port;

the $D_{QM}$ port coupled to the M port;

wherein the $Ar_{QM}$ port for receiving a first reference signal ($Sr_{QM}$);

wherein the $Ar_{1L}$ port for receiving a second reference signal ($Sr_{1L}$);

wherein a signal at the $Ao_{1L}$ port ($So_{1L}$) combined with a third reference offset signal ($Sfr_{2L}$) for being received by the $Ar_{2L}$ port;

wherein a signal at the $Ao_{1L}$ port is a straight-line approximation between non-linear segments of a signal at the $Ao_{QM}$ port;

wherein a sum of signals at the $Ao_{QM}$ and the $Ao_{1L}$ ports generates a non-linear analog output signal ($So_N$) at an analog output port $Ao_N$;

wherein an analog reference signal ($S_r$) is proportionally scaled to the $Sr_{QM}$, the $Sr_{1L}$, and the $Sr_{2L}$ signals;

wherein a sequence of non-linear reference signals ($Sr_{MSP}^N$), which form the transfer function of the $DAC_{QM}$, are proportional to the $S_R$ signal;

wherein the sequence of $Sr_{MSP}^N$ signals are at least one of squarely weighted, logarithmically weighted, non-linearly weighted, and individually weighted;

wherein the sequence of linear reference signals ($Sr_{LSP}^L$), which form the transfer function of the $DAC_{1L}$ are proportional to the $S_R$ signal;

wherein the sequence of $Sr_{LSP}^L$ signals are at least one of binary weighted, linearly weighted, and individually weighted; and wherein the $So_N$ signal substantially follows one of a square, logarithmic, and non-linear profile, is proportional to the $S_R$ signal, and responsive to the D word.

11. The non-linear digital-to-analog converter (NDAC) system in an integrated circuit of claim 10, the system further comprising:

wherein each of the sequence of $Sr_{MSP}^N$ signals, and each of the sequence of $Sr1_{LSP}^L$ signals are biased from a common reference bias network (RBN).

12. The non-linear digital-to-analog converter (NDAC) system in an integrated circuit of claim 10, the system further comprising:

wherein a plurality of $So_N$ signals following a square profile;

wherein a p-channel $So_N$ signal, of the plurality of $So_N$ signals, is responsive to a p-channel D word;

wherein a q-channel $So_N$ signal, of the plurality of $So_N$ signals, is responsive to a q-channel D word;

wherein the p-channel $So_N$ and the q-channel $So_N$ signals are subtracted from one another to generate a scaled $So_{xy}$ signal;

wherein the p-channel D word is comprised of a scaled X digital word and a scaled Y digital word that are added to one another;

wherein the q-channel D word is comprised of a scaled Y digital word and a scaled Y digital word that are subtracted from one another; and wherein the scaled $So_{xy}$ signal is proportional to the $S_R$ and is an analog representation of a scaled multiplication product of the scaled X digital word and the scaled Y digital word.

13. The non-linear digital-to-analog converter (NDAC) system in an integrated circuit of claim 10, the system further comprising:

the $Ao_{QM}$ port and $Ao_{2L}$ port are coupled to an output port $Ao_Q$; and wherein the $DAC_{QM}$, $DAC_{1L}$, and $DAC_{2L}$ operate in current mode.

* * * * *